(12) United States Patent
Moriyama et al.

(10) Patent No.: US 7,380,961 B2
(45) Date of Patent: Jun. 3, 2008

(54) LIGHT SOURCE COUPLER, ILLUMINANT DEVICE, PATTERNED CONDUCTOR, AND METHOD FOR MANUFACTURING LIGHT SOURCE COUPLER

(75) Inventors: Hideo Moriyama, Tokyo (JP); Munehiko Yanagita, Tokyo (JP)

(73) Assignee: Moriyama Sangyo Kabushiki Kaisha, Tokyo (JP)

( * ) Notice: Subject to any disclaimer, the term of this patent is extended or adjusted under 35 U.S.C. 154(b) by 724 days.

(21) Appl. No.: 10/475,816

(22) PCT Filed: Apr. 24, 2002

(86) PCT No.: PCT/JP02/04100

§ 371 (c)(1),
(2), (4) Date: Apr. 20, 2004

(87) PCT Pub. No.: WO02/089222

PCT Pub. Date: Nov. 7, 2002

(65) Prior Publication Data

US 2004/0252501 A1 Dec. 16, 2004

(51) Int. Cl.
*H01L 23/495* (2006.01)
*F21S 4/00* (2006.01)

(52) U.S. Cl. .............. 362/238; 362/240; 362/249; 362/800; 313/500; 257/676

(58) Field of Classification Search ............ 362/238, 362/240, 249, 800, 545, 646; 313/500; 257/99, 676
See application file for complete search history.

(56) References Cited

U.S. PATENT DOCUMENTS

| | | | |
|---|---|---|---|
| 4,173,035 A | 10/1979 | Hoyt | |
| 5,404,282 A | 4/1995 | Klinke et al. | |
| 5,519,596 A | 5/1996 | Woolverton | |
| 5,746,497 A | 5/1998 | Machida | |
| 6,386,733 B1 * | 5/2002 | Ohkohdo et al. | 362/249 |
| 6,422,716 B2 * | 7/2002 | Henrici et al. | 362/249 |
| 6,450,663 B1 | 9/2002 | Reinbach | |
| 6,483,623 B1 * | 11/2002 | Maruyama | 398/182 |

FOREIGN PATENT DOCUMENTS

| | | |
|---|---|---|
| DE | 199 33 060 A1 | 4/2001 |
| EP | 0 653 586 B1 | 5/1995 |

(Continued)

*Primary Examiner*—Stephen F. Husar
*Assistant Examiner*—Peggy A. Neils
(74) *Attorney, Agent, or Firm*—Marshall & Melhorn, LLC

(57) ABSTRACT

To provide a light source assembly that does not use a printed circuit board and can be manufactured at a low cost even when produced in small quantities, a light source assembly according to the present invention comprises a plurality of light sources and a connective conductor structure extending in a direction of arrangement of the light sources to join the light sources, wherein the connective conductor structure is formed by cutting off parts of a substantially plate-like patterned conductor as required, the patterned conductor being provided with a prescribed pattern. Thus, by changing the parts to be cut off in the patterned conductor, it is possible to manufacture light source assemblies having various light source connection patterns in a single manufacturing line, allowing efficient and low cost manufacture of the light source assemblies to be achieved even when the light sources are manufactured in small quantities.

21 Claims, 79 Drawing Sheets

FOREIGN PATENT DOCUMENTS

| | | |
|---|---|---|
| JP | 58-002080 A | 1/1983 |
| JP | 59178375 | 8/1984 |
| JP | 61-032483 A | 2/1986 |
| JP | 61-070306 U | 5/1986 |
| JP | 62-023467 U | 2/1987 |
| JP | 0 523 54 13 A | 9/1993 |
| JP | 5-235413 A | 9/1993 |
| JP | 0 701 50 45 A | 1/1995 |
| JP | 7-015045 A | 1/1995 |
| JP | 7-106634 | 4/1995 |
| JP | 7106634 | 4/1995 |
| JP | 8-316531 A | 11/1996 |
| JP | 8-339707 A | 12/1996 |
| JP | 11-163411 A | 6/1999 |
| JP | 2000-260206 A | 9/2000 |
| JP | 3075996 Z1 | 12/2000 |
| JP | 2002-057371 A | 2/2002 |

* cited by examiner

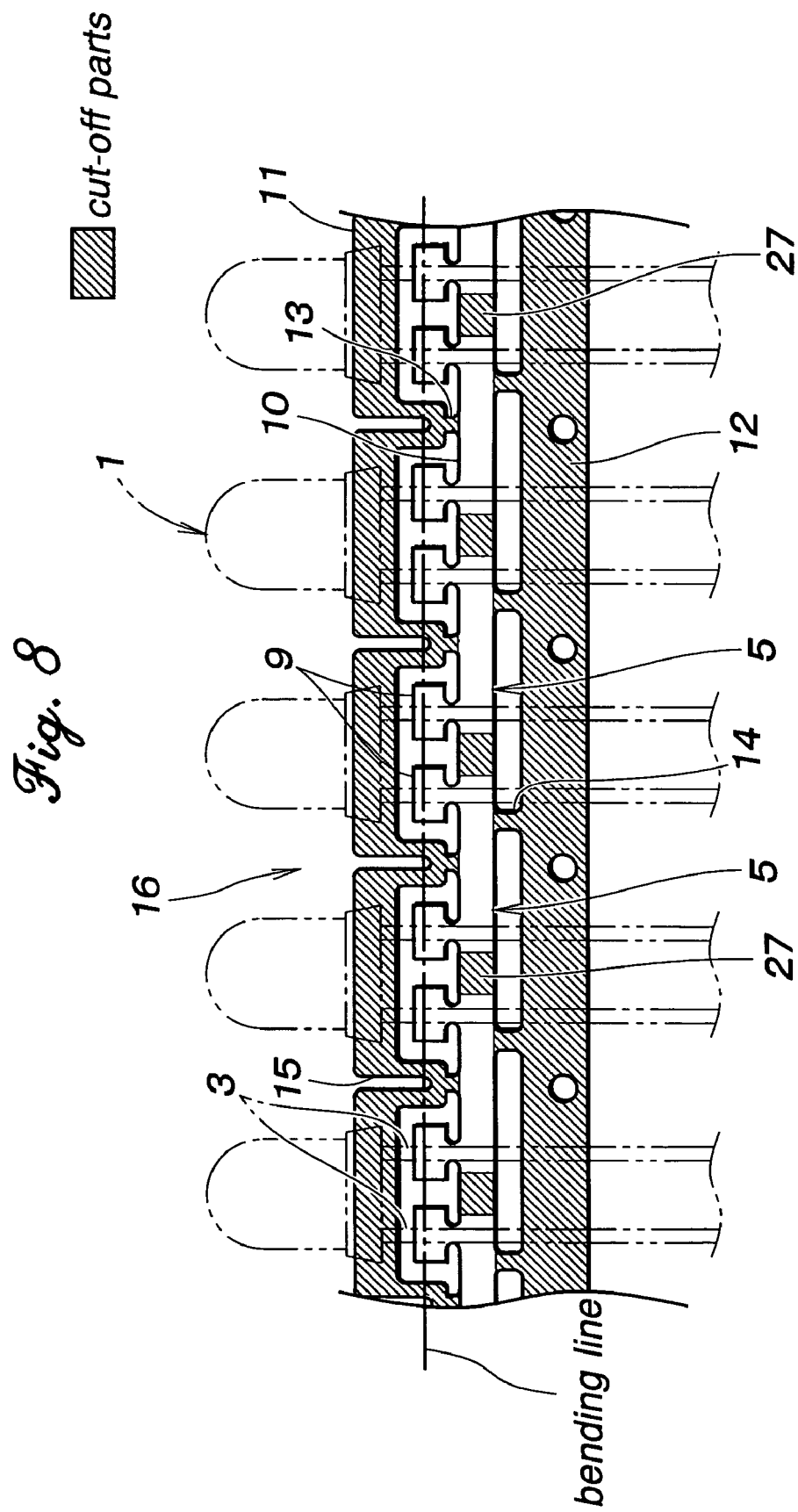

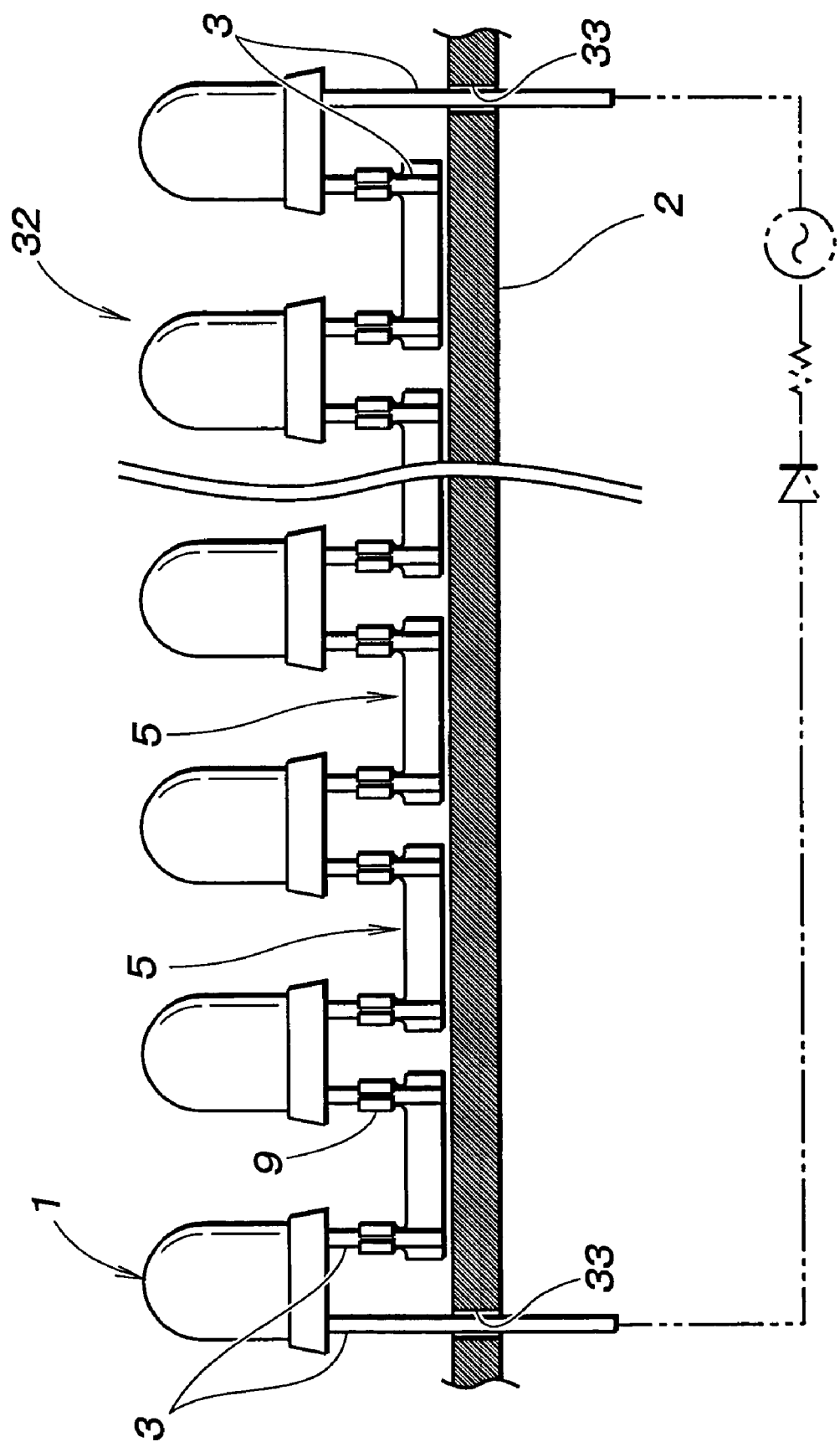

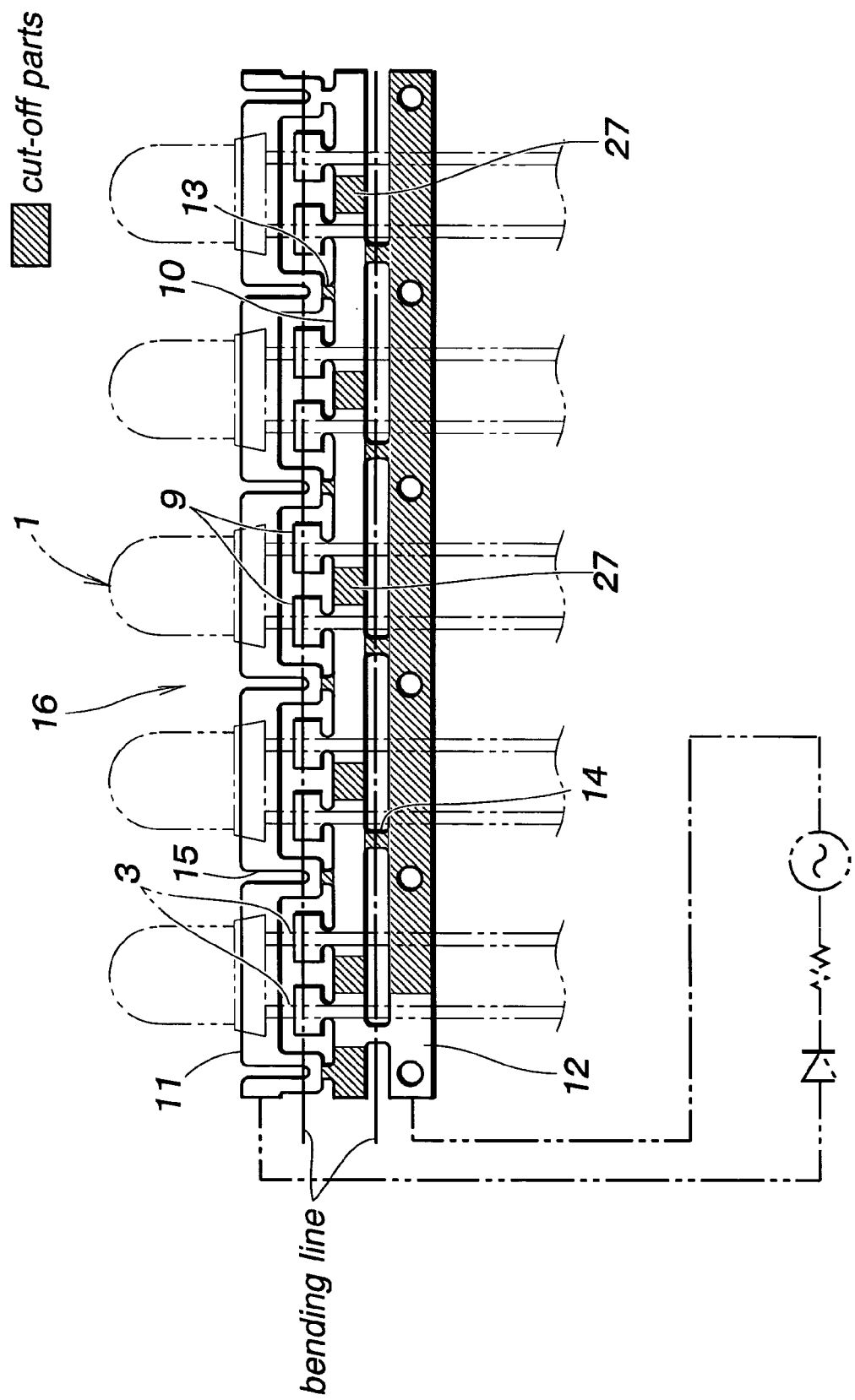

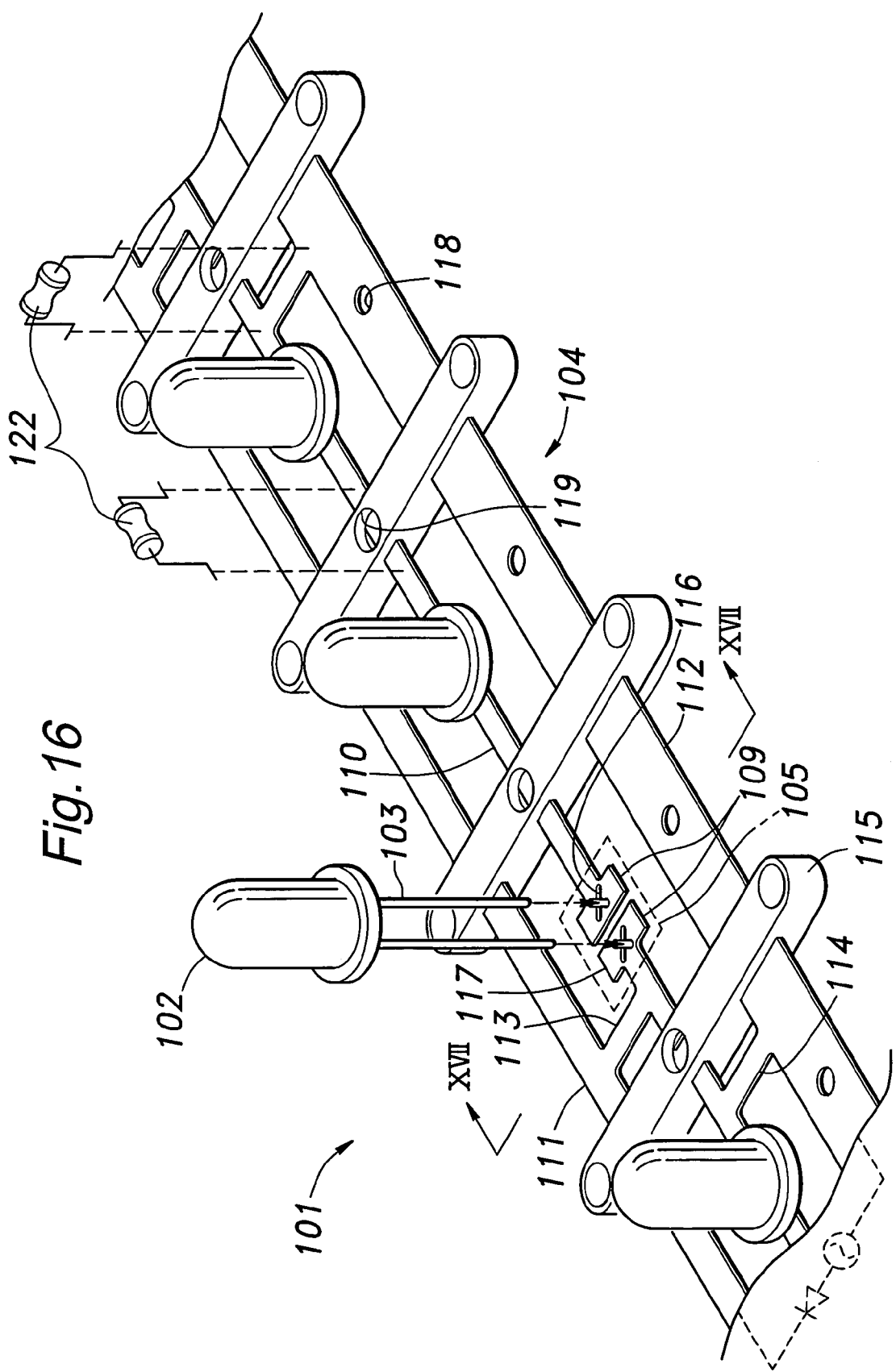

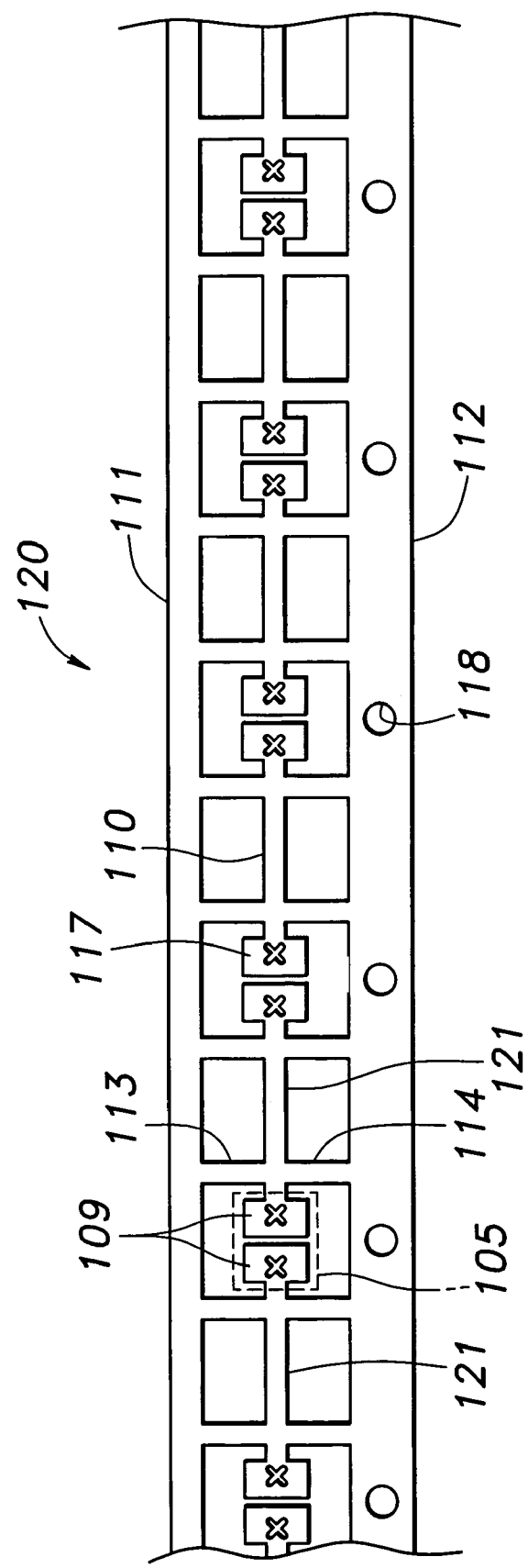

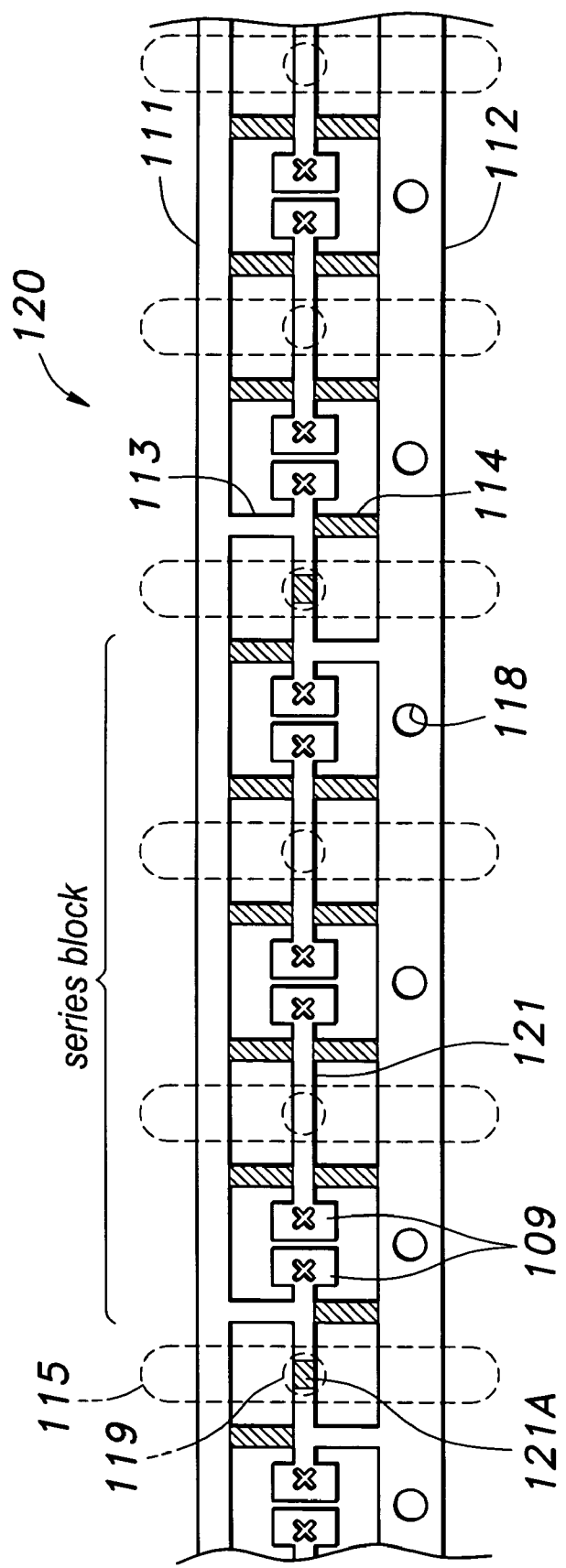

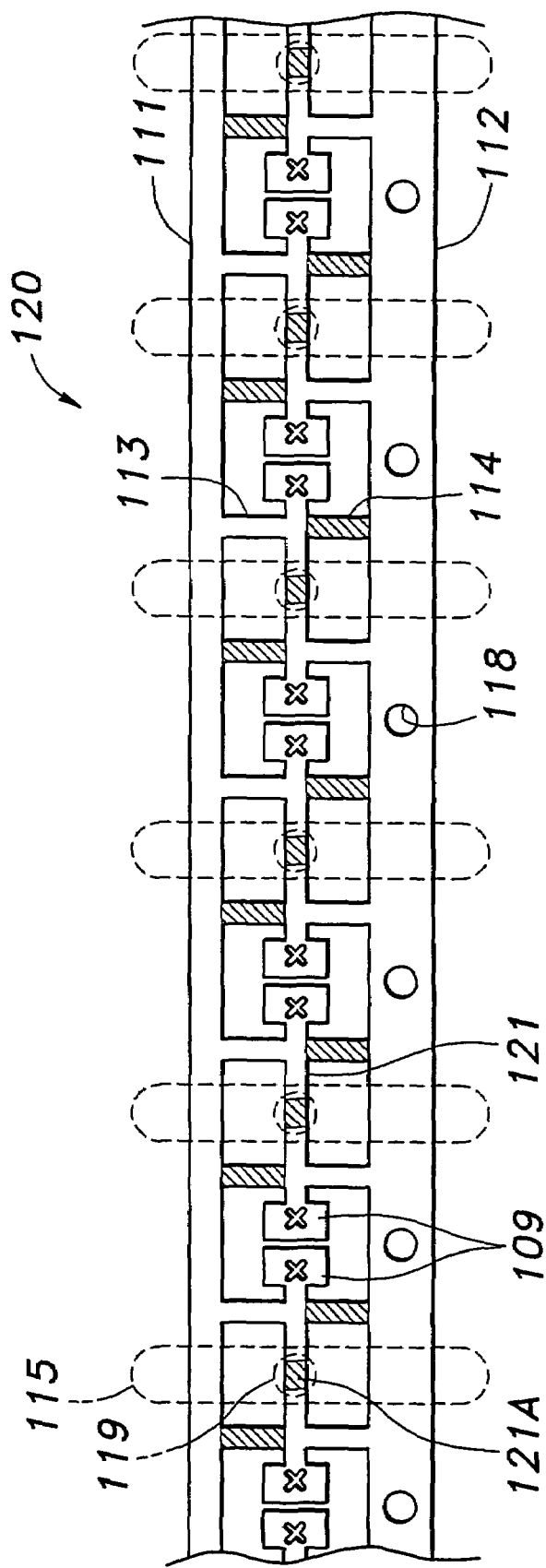

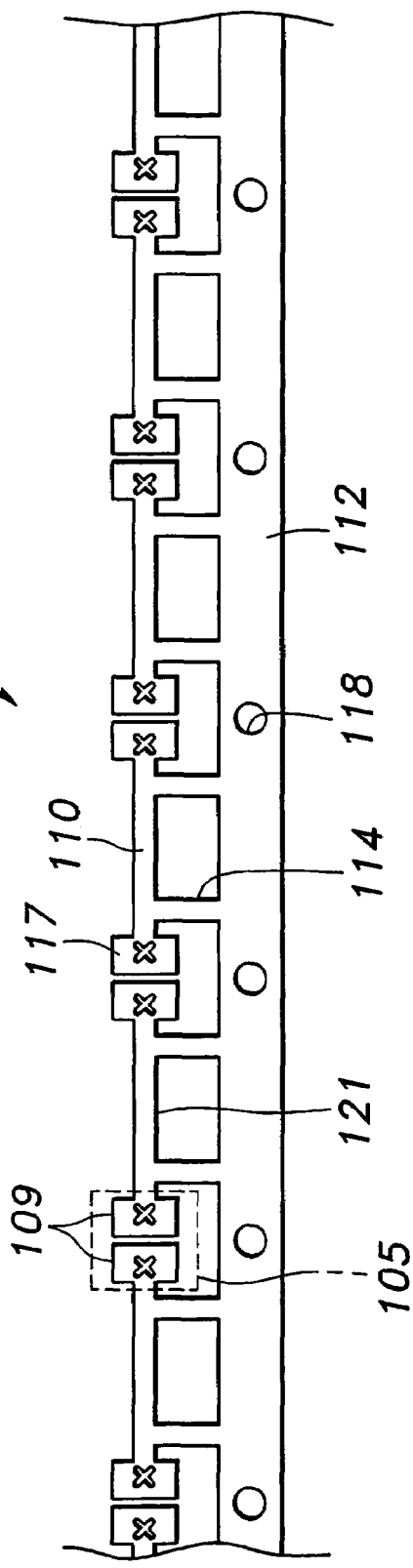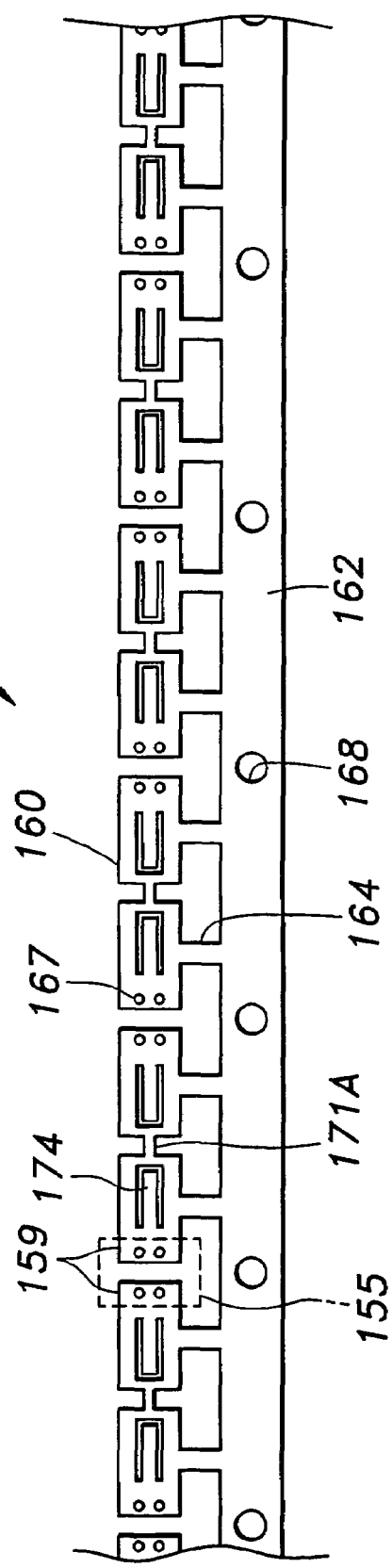

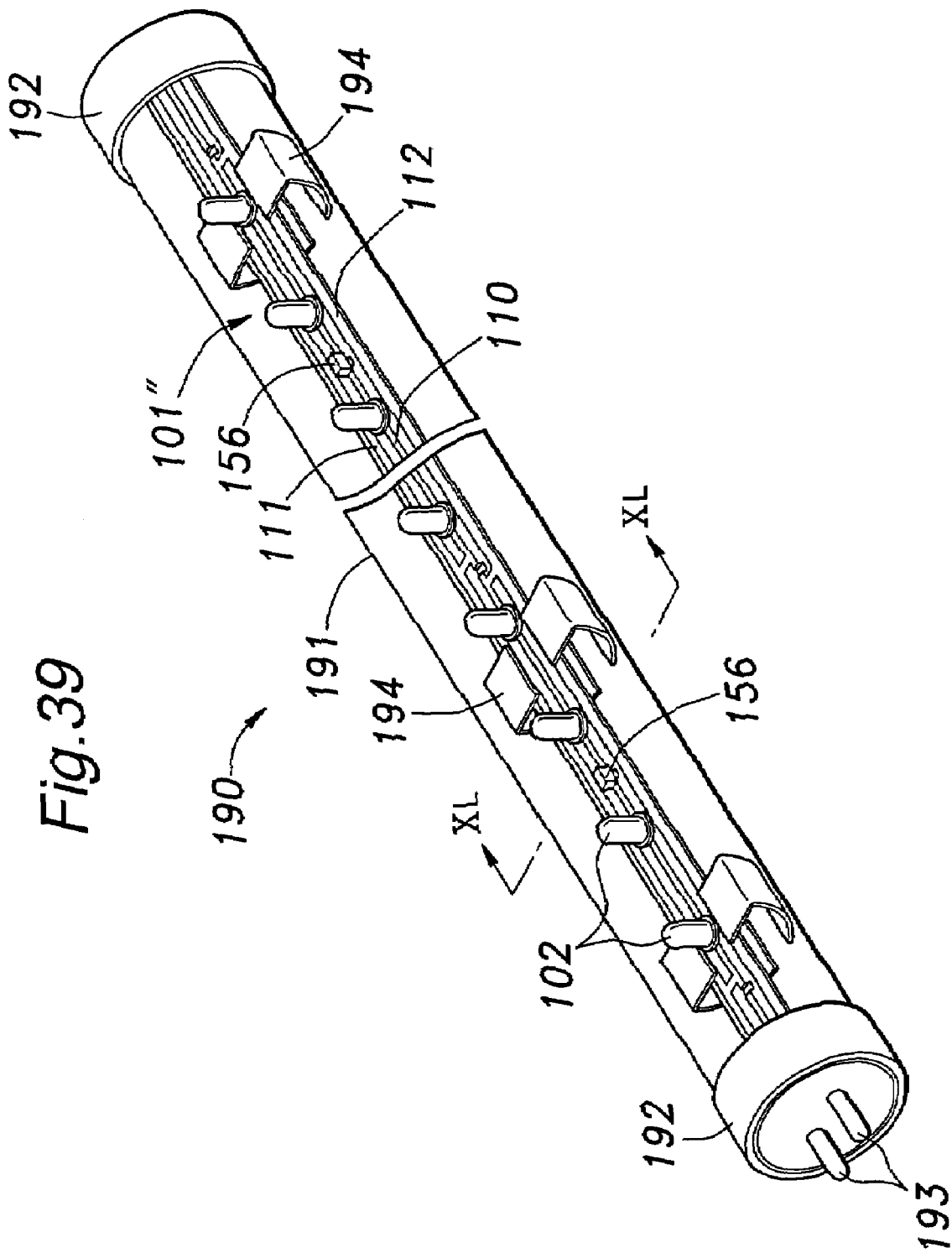

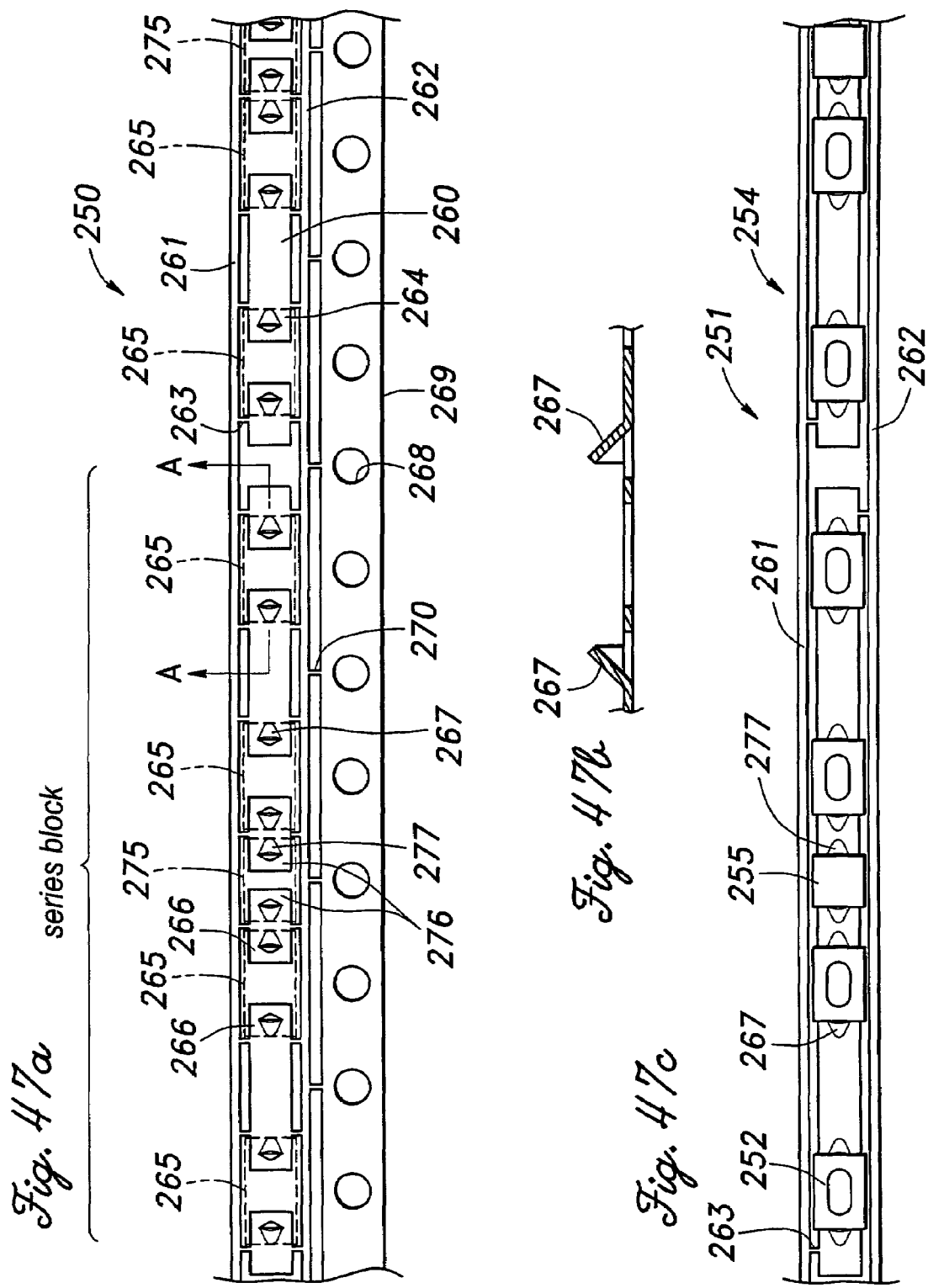

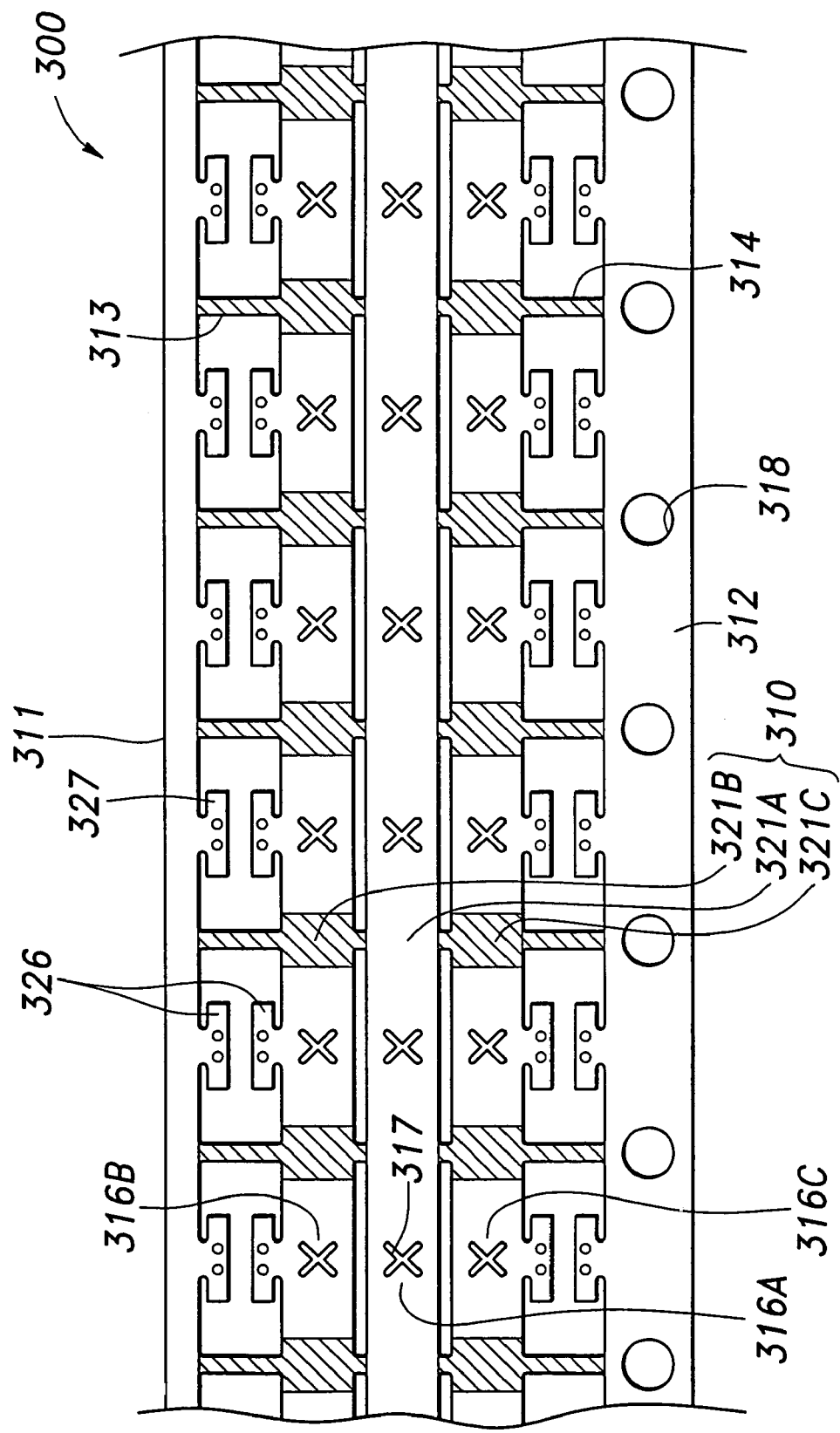

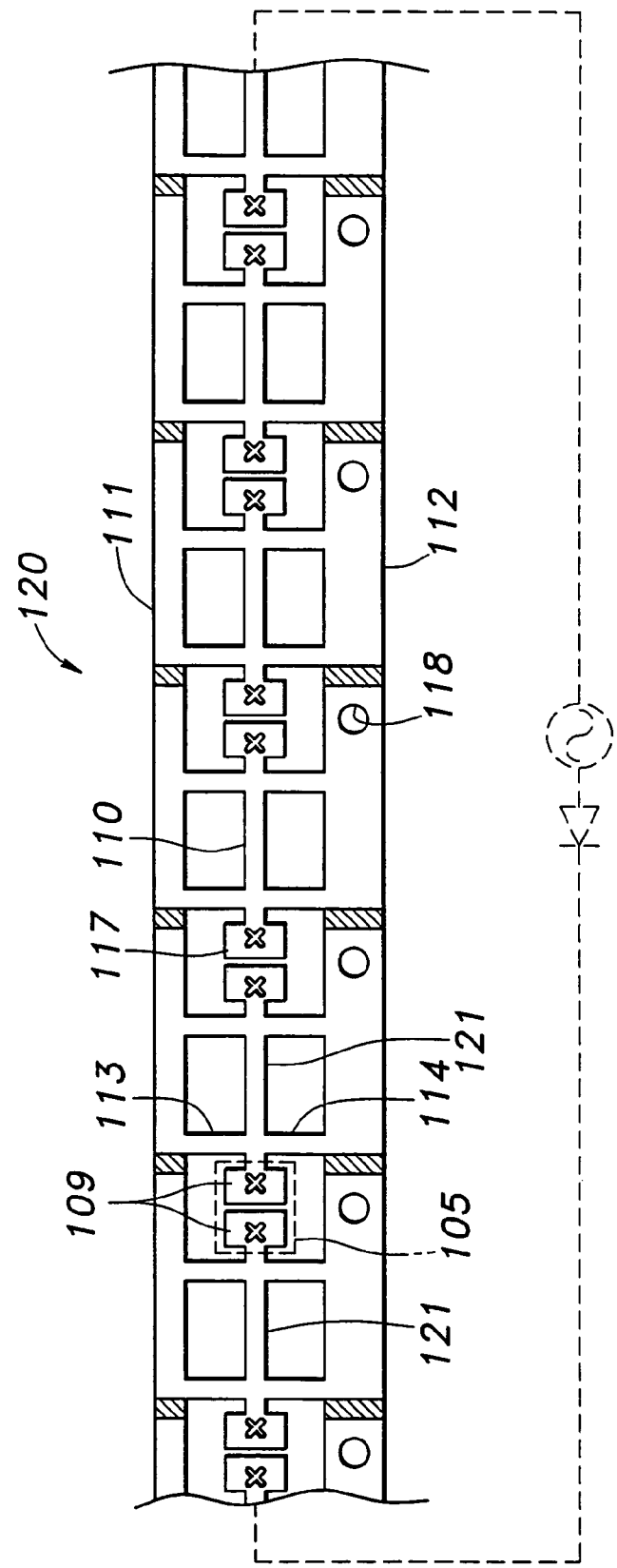

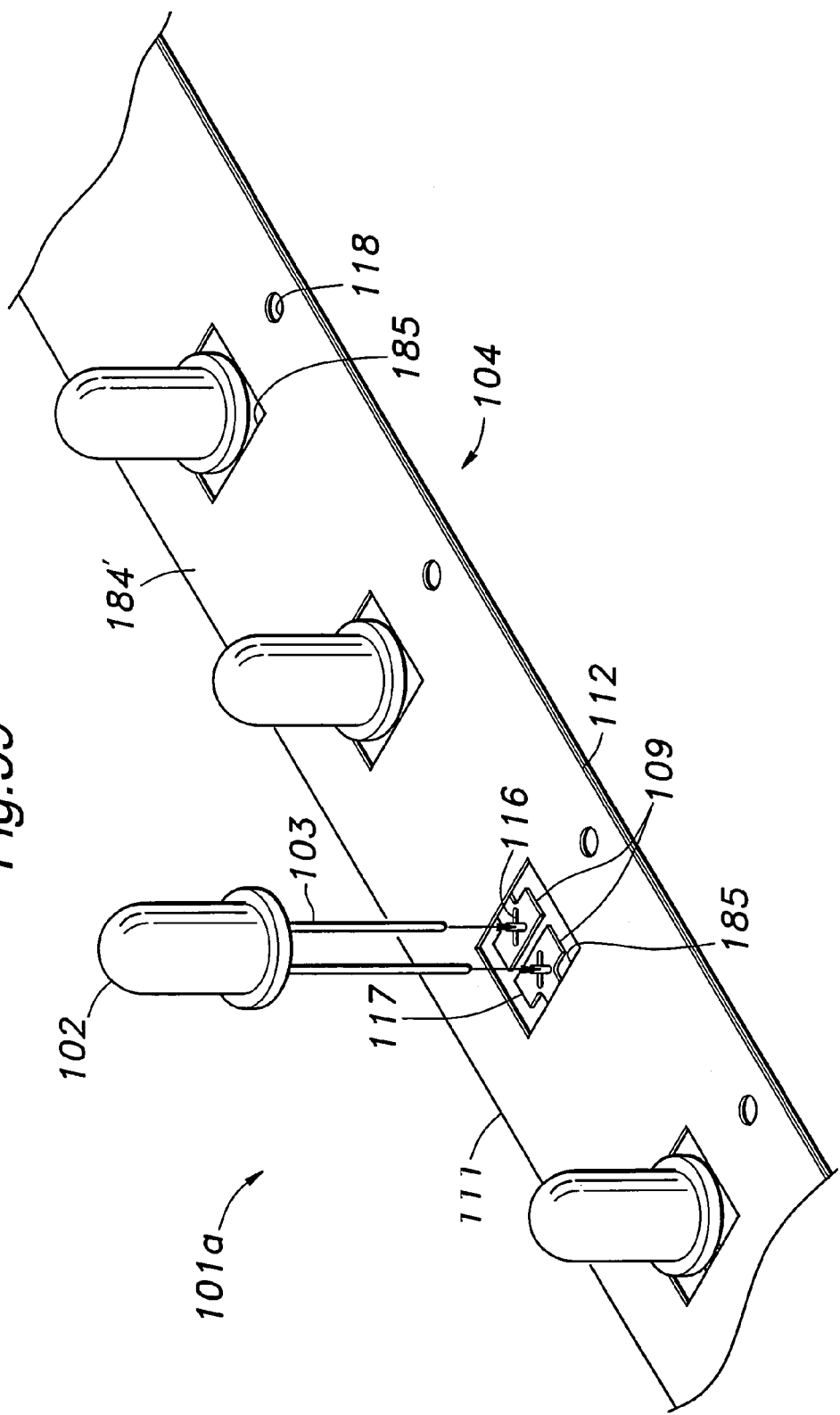

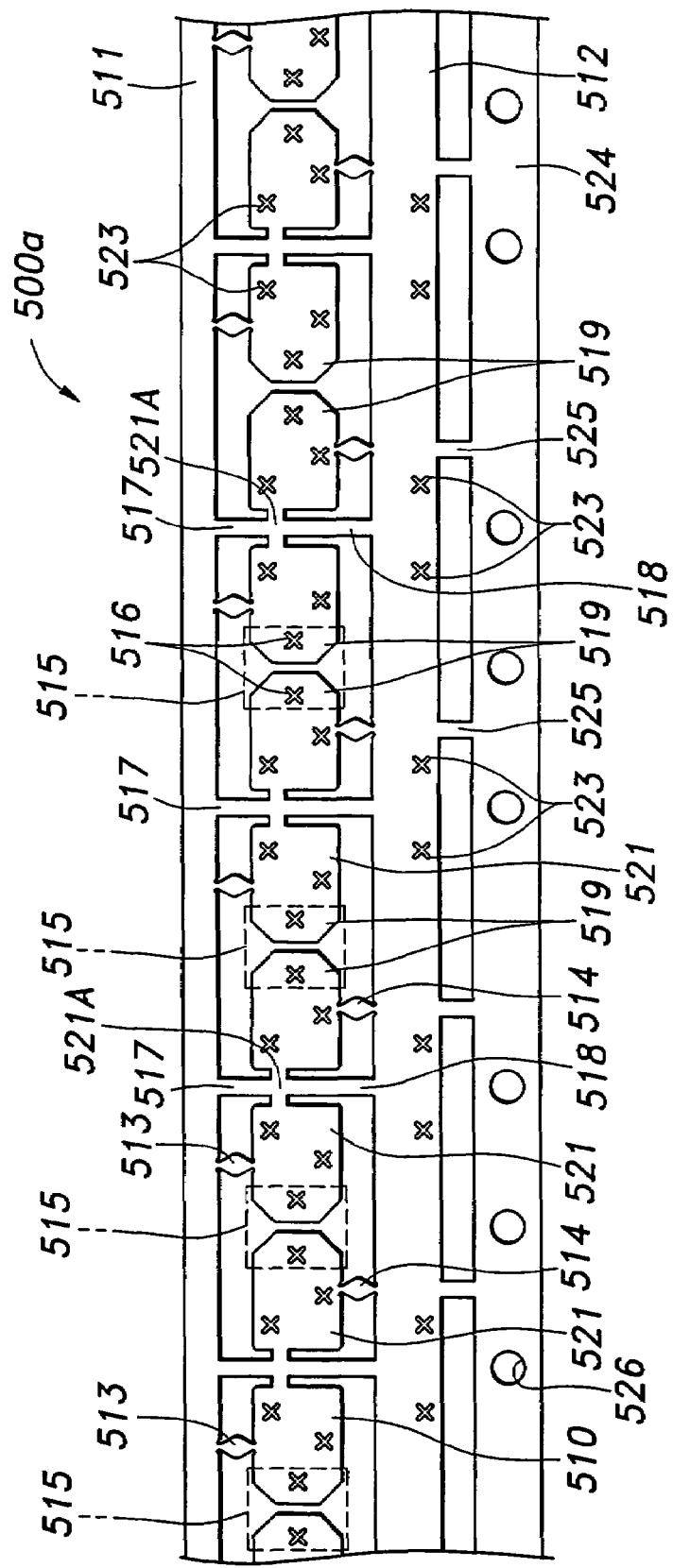

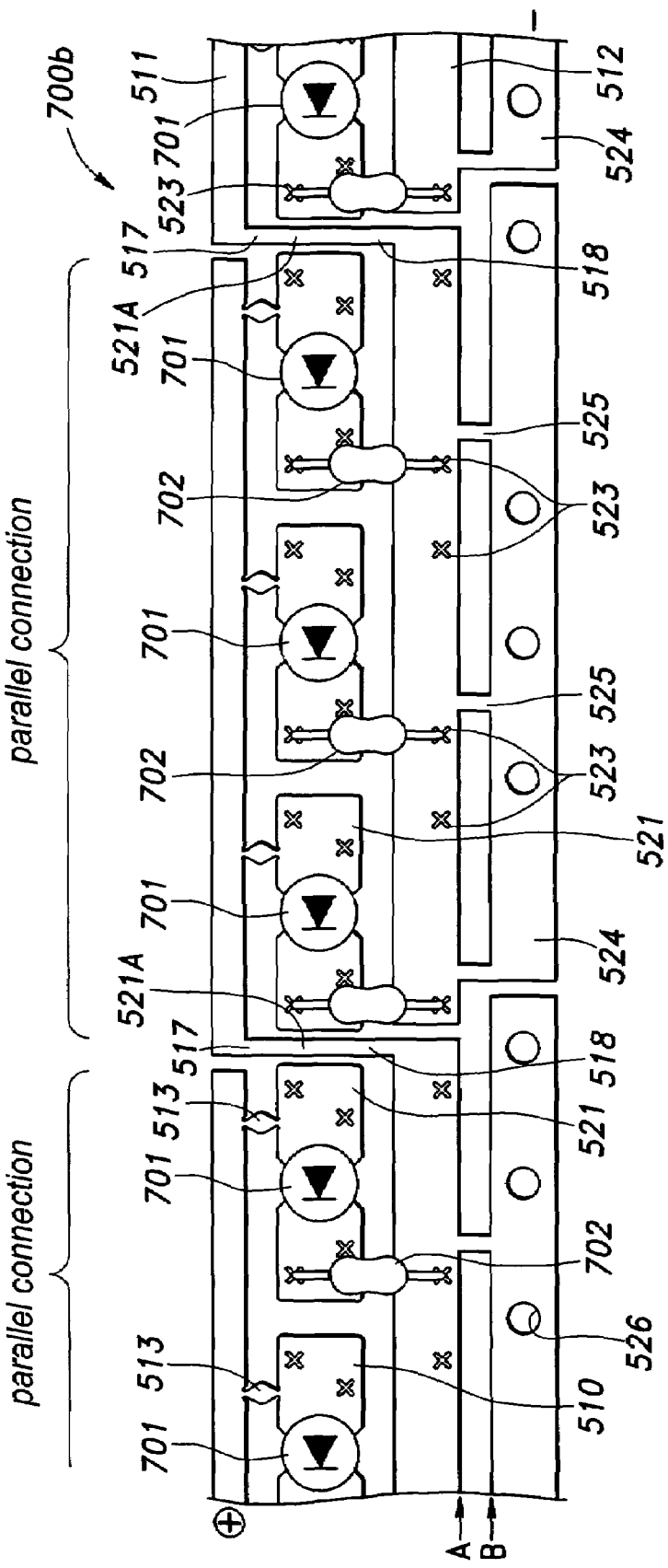

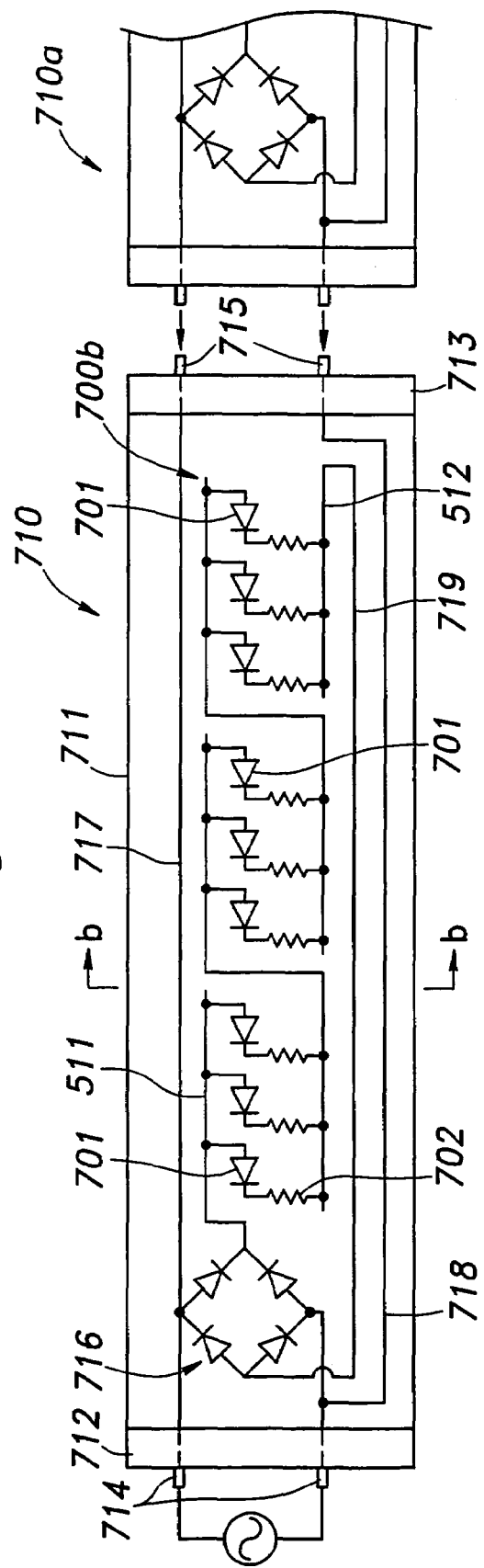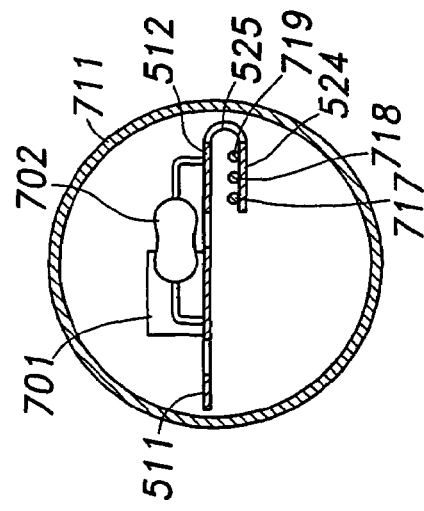
Fig.72a
Fig.72b

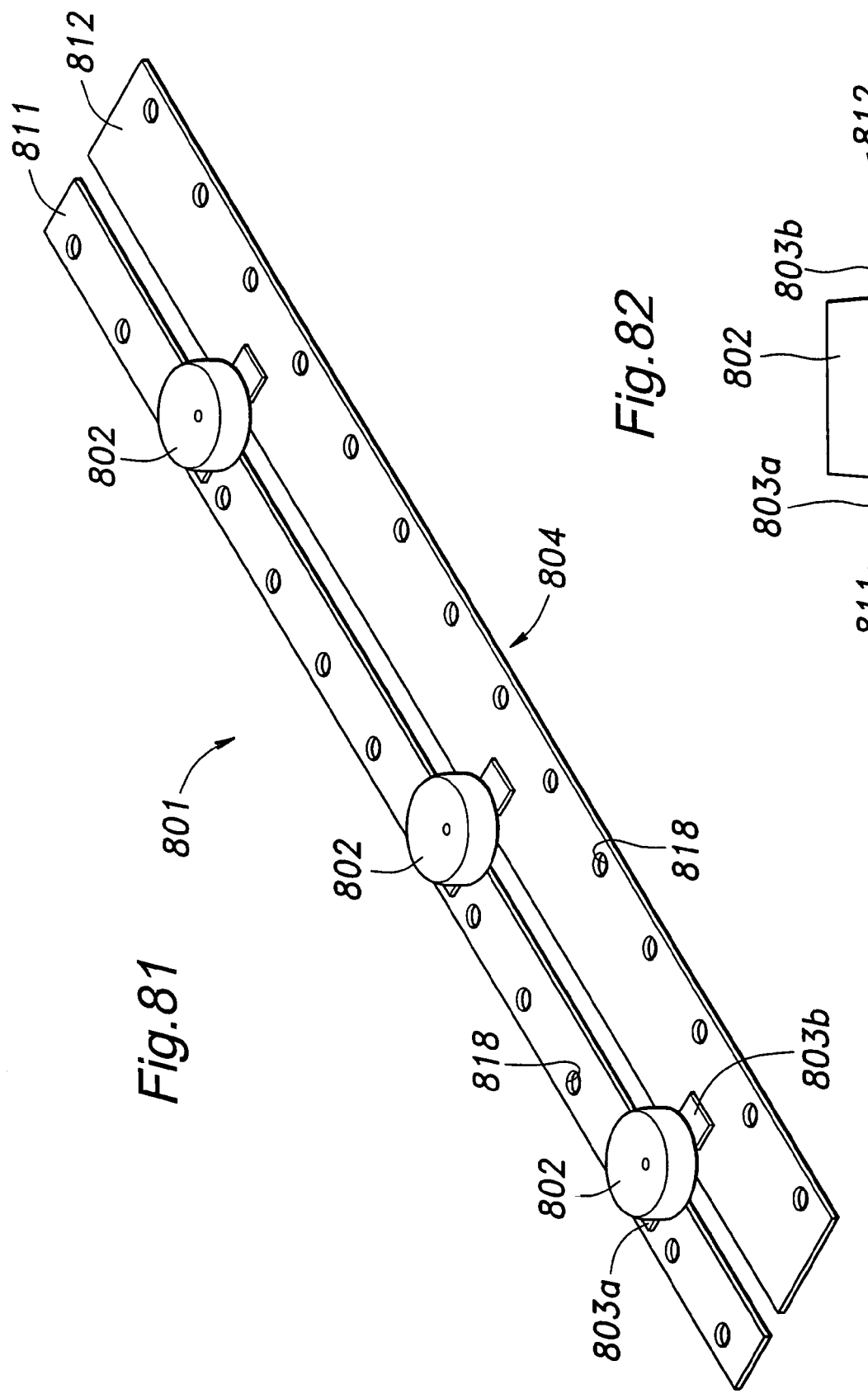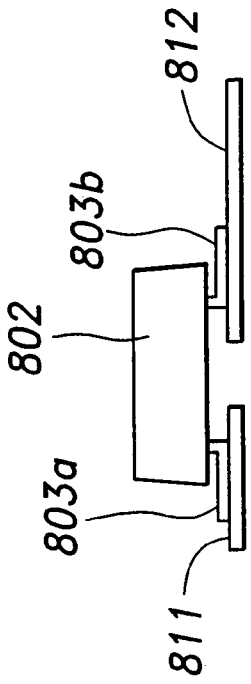

LIGHT SOURCE COUPLER, ILLUMINANT DEVICE, PATTERNED CONDUCTOR, AND METHOD FOR MANUFACTURING LIGHT SOURCE COUPLER

TECHNICAL FIELD

The present invention relates to a light source assembly formed by electrically connecting a plurality of light sources, a light emitting apparatus using the light source assembly, a patterned conductor for forming the light source assembly and a method for forming the light source assembly.

BACKGROUND OF THE INVENTION

Light emitting apparatuses having a plurality of light sources arranged on a surface of a holder are used not only in general illumination but also in various usages such as advertisement, decoration, signaling and the like. In order to form such a light emitting apparatus, it may be conceived to use bullet-type LED light sources having lead wires and a printed circuit board formed with through-holes into which the lead wires of the light sources are inserted and a conductor pattern for transmitting electric power to the light sources, and to connect the lead wires of the light sources to the conductor pattern of the printed circuit board by means of flow soldering.

Such a structure that utilizes a printed circuit board as a holder of the light sources can bring about an economic benefit when manufactured on a large scale. However, in a case that a variety of light emitting apparatuses having different light source arrangements and connection patterns are produced in small quantities, it can rather lead to a higher manufacturing cost. Further, contact with the molten solder in the soldering process will expose the printed circuit board to a high temperature, and this is undesirable to LEDs, which can be easily damaged by heat. Further, the solder typically contains lead, and thus the use thereof necessitates environmental measures. It may be conceived to use a leadless solder, but the leadless solder is higher in price as well as in melting temperature, which can worsen the detrimental effects of heat against the LEDs. Furthermore, the printed circuit board makes it difficult to arrange the light sources on a curved surface. In the case that flexible conductive wires are used to connect light sources, the process of connection may become cumbersome and this can lead to a higher manufacturing cost. The printed circuit board also has a problem that recycling thereof is quite difficult because the printed circuit board has unitary wirings and support board.

To provide a light emitting module without a printed circuit board and solder, Japanese Patent Application Laid-Open No. 7-106634 has disclosed to connect a plurality of LEDs between an anode bus bar and cathode bus bar by means of mechanical engagement. Further, Japanese Patent Application Laid-Open No. 8-316531 has disclosed a light emitting module comprising a plurality of bus bar pairs, a plurality of LEDs attached between each bus bar pair, and flexible joints for electrically and mechanically connecting adjacent bus bar pairs, so that a three-dimensional configuration of the light emitting module is possible. In these laid-open publications, however, there is no disclosure regarding a light source assembly that can allow easy selection of various light source connection patterns and yet can be manufactured with high production efficiency, nor is there a disclosure regarding a manufacturing method therefor.

BRIEF SUMMARY OF THE INVENTION

The present invention was made to solve the above prior art problems, and a primary object of the present invention is to provide a light source assembly comprising a plurality of light sources that can be manufactured with high efficiency and at low cost without using a printed circuit board, and to provide a manufacturing method therefor.

A second object of the present invention is to provide a light source assembly that can eliminate or considerably reduce an amount of solder used therein, and to provide a manufacturing method therefor.

A third object of the present invention is to provide a light source assembly that can easily achieve various arrangements of light sources, and to provide a manufacturing method therefor.

A fourth object of the present invention is to provide a light source assembly as mentioned above and utilizing a chip-type LED as a light source, and to provide a manufacturing method therefor.

A fifth object of the present invention is to provide a light emitting apparatus using a light source assembly as mentioned above.

A sixth object of the present invention is to provide a tape-shaped conductor for use in forming a light source assembly as mentioned above.

In order to accomplish such objects, according to one aspect of the present invention, there is provided a light source assembly comprising: a plurality of electrically connected light sources; and a connective conductor structure extending in a direction of arrangement of the light sources to join the light sources, wherein the connective conductor structure is formed by cutting off parts of a substantially plate-like patterned conductor as required, the patterned conductor being provided with a prescribed pattern. The patterned conductor can be formed by press working a conductive plate material. According to such a structure, because the light source assembly can be manufactured without using a printed circuit board, the solder used for attachment with the printed circuit board is no longer necessary. This can eliminate concern about environmental problems as well as a possibility that LEDs may be damaged due to heat generated in use of solder. Further, by varying the parts to be cut off in the patterned conductor, it is possible to form connective conductor structures having various light source connection patters by using the same patterned conductor in a single manufacturing line, and thus efficient and low cost manufacture is possible even when light source assemblies having various light source connection patterns are manufactured in small quantities. The light source assembly can be made deformable into a desired shape by providing an appropriate flexibility to the patterned conductor when forming it from a conductive plate material, so that various arrangement of light sources can be attained easily. The nonuse of the printed circuit board also allows easy recycling of the light source assembly when it is no longer used. Further, if the patterned conductor is of a longitudinal tape-like shape, it is possible to conduct various processes such as attachment of the light sources and press working of the patterned conductor while transporting the patterned conductor in a manufacturing line, to thereby allow continuous fabrication of the light source assembly. It can be also easily attained to provide a light source assembly of a desired length by cutting the patterned conductor at an appropriate length.

According to one embodiment of the present invention, the plurality of light sources comprise a chip-type LED, and a socket for receiving the chip-type LED is attached to the connective conductor structure by insert molding. Typically, the socket comprises a bottom wall and a side wall defining a cavity having an upper opening, and the chip-type LED is received in the cavity. In this way, even when a chip-type LED without lead wires is used as a light source, it is possible to easily attach the chip-type LED to the connective conductor structure to obtain a light source assembly.

Preferably, the bottom wall of the socket is formed with a hole so that the LED received in the socket can be pushed through the hole and thereby removed from the socket. This can allow quick replacement of a malfunctioning LED with a normal one. It will be also preferable in view of quick installment of the LED into the socket if a portion of the connective conductor structure is exposed in the cavity of the socket so as to contact electric terminals of the chip-type LED received in the socket. Further preferably, the portion of the connective conductor structure exposed in the cavity of the socket has projections for contacting the electric terminals of the LED. This can ensure electric connection between the LED and the connective conductor. If a portion of the connective conductor structure is bent so as to engage with the LED received in the socket to thereby prevent removal of the LED from the socket, inadvertent removal of the LED can be preferably prevented even when the light source assembly is placed upside-down.

In another embodiment of the present invention, the chip-type LED is of a side-view type having a light emitting portion on its side, and at least part of the side wall of the socket has an opening for allowing light from the light emitting portion of the LED to pass through the side wall. Thus, it is possible to use side-view LEDs According to yet another embodiment of the present invention, the plurality of light sources comprise a light source having a lead wire, and the connective conductor structure has a hole corresponding to the lead wire of the light source. Preferably, a portion of the connective conductor structure defining the hole comprises projections extending into the hole. Typically, the lead wire of the light source is inserted into the hole of the connective conductor structure, whereby electrical/mechanical connection between the light source and the connective conductor structure is achieved. Further, it will be favorable in view of preventing inadvertent removal of the light sources if the lead wire is cramped by a portion of the connective conductor structure near the hole of the connective conductor structure to achieve attachment of the light source to the connective conductor structure. Instead of directly inserting the lead wire of the light source into the hole of the connective conductor structure, it may be possible that a pin portion of a socket pin is inserted into the hole of the connective conductor structure, and the lead wire is inserted into a socket portion of the socket pin.

According to yet another embodiment of the present invention, each of the plurality of light sources has a pair of lead wires extending substantially in parallel to each other, and the plurality of light sources are arranged in a direction substantially perpendicular to the lead wires, wherein the connective conductor structure is disposed such that its principal surface extends substantially along the lead wires, and attached to the lead wires to join the light sources. In such a case, it is preferable that the patterned conductor is of a longitudinal tape-like shape, and comprises a plurality of connection parts for the lead wires of the light sources, the connection parts being arranged corresponding to an arrangement of the light sources held by a radial taping. This can allow the attachment of the light sources to the patterned conductor to be carried out in a state where the plurality of light sources are unitarily held by the radial taping, and thus improve the work efficiency. After attaching the light sources to the patterned conductor, the lead wires are cut at a predetermined position and parts of the patterned conductor are cut off as required to form a connective structure, to thereby obtain a light source assembly. Further, it will be preferred if a cross-sectional shape of the connective conductor structure taken along a plane perpendicular to the longitudinal direction is bent. This can prevent undesirable contact between the connective conductor structure and the lead wires and thus avert inadvertent short-circuit even in a simple configuration that the connective conductor structure is exposed without being coated with insulating material. The exposed connective conductor structure without insulating coating provides improved heat dissipation and thus can favorably cope with high density arrangement of the light sources. Further, because the longitudinal flexion is limited, the light source assembly can be easily handled when attaching it to the holder.

Preferably, the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; at least one trunk path widthwise spaced from the interconnection path and the light source attachment portions and extending in the longitudinal direction; and a plurality of branch paths widthwise connecting the trunk path to the interconnection path. Thus, by cutting off prescribed portion of the branch paths, interconnection path or trunk path, a connective conductor structure for connecting the light sources in any of various connection patterns can be formed. In the light source assembly having the connective conductor structure thus formed, the trunk path can be used to connect the light sources to a power supply, favorably eliminating the need for additional wirings. In a case where parts of the trunk path are cut off so that the connective conductor structure connects the light sources in series, remaining parts of the trunk path can be connected to the light source attachment portions via the branch paths so that they can serve as heat dissipating portions for dissipating heat generated from the light sources, to thereby contribute preventing excessive increase in the temperature around the light sources.

In the light source assembly manufactured by using such a patterned conductor, it is possible that a resistor is connected between at least one pair of adjoining light sources, and the interconnection path is cut at a position between the pair of adjoining light sources. Thus, a resistor for preventing an excessive voltage from being applied to a light source, for example, can be connected to the light source.

Further preferably, the light source assembly may comprise a joint member extending in a widthwise direction of the connective conductor structure to hold the interconnection path and the trunk path in a unit. In this way, when pats of patterned conductor are cut off as required to form the connective conductor structure, it is possible to prevent the parts of the resulting connective conductor structure from being separated apart. Further, the joint member improves the mechanical strength of the connective conductor structure. Such a joint member can be preferably formed by insert molding. In the case that the joint member is formed by insert molding, it is favorable that the trunk path is formed with a widthwise recess of through-hole, and the joint member extends through the widthwise recess or through-hole because this can firmly engage the joint member to the trunk path. Further preferably, the joint member is formed with a hole at a position aligned with the interconnection path such that the hole exposes the interconnection path, thereby allowing a part of the interconnection path exposed by the hole to be cut off. In this way, it is possible to form a connective conductor structure having a desired light source connection pattern by cutting the interconnection path after forming the joint member. The part of the interconnection path exposed by the hole of the joint member may have a smaller width than the other part of the interconnection path so that it can be cut off easily. The joint member may comprise one or a plurality of insulating sheets. A plurality of insulating sheets may extend widthwise at predetermined positions or alternatively, a single insulating sheet may extend substantially a whole length of the connective conductor structure. By using such insulating sheets, the resultant light source assembly can be smaller (or thinner) compared with that manufactured using the joint member formed by insert molding. If the insulating sheet is attached to a light source attachment surface of the connective conductor structure, it is prevented that a part applied with the power supply voltage is exposed on the light source attachment surface where a personnel may touch with a relatively high possibility, and thus the safety is improved. Further, since the insulating sheet can reflect the light from the light sources, illumination efficiency can be increased.

When the light source assembly does not have insert molded joint members or when such joint members are removed after the light sources are attached to the connective conductor structure, it is possible that the branch paths connecting the trunk path to the interconnection path are bent such that a principal surface of the trunk path is substantially perpendicular to a principal surface of the interconnection path. In this way, by inserting the trunk path into an aligned recess or hole formed in the holder, the light source assembly can be easily attached to the holder.

In place of the joint member or in addition to the joint member, it is possible to provide a socket for receiving a chip-type LED, such that the socket extends in a widthwise direction of the connective conductor structure to hold the interconnection path and the trunk path in a unit.

In the case where the plurality of light sources comprise a chip-type LED, a light source attachment portion associated with the chip-type LED may have terminal connection parts corresponding to terminals of the chip-type LED, and at least one of the terminal connection parts may have an extension which is bent to form a wall for positioning or holding the chip-type LED. Preferably the terminal connection parts of the light source attachment portion associated with the chip-type LED have a pair of extensions opposing to each other. This can eliminate the need for a socket formed by insert molding or the like.

It is not necessary to attach a light source to every light source attachment portion, and it is possible that at least one of the light source attachment portions is not attached with a light source. This can flexibly vary the interval between the light sources. When the light sources are connected in series or in series-parallel connections, for example, such non-attachment of the light source can be achieved by coupling the terminal connection parts in each light source attachment portion when the patterned conductor is formed (primary processing), and in the secondary processing of the patterned conductor, separating the terminal connection parts only in the light source attachment portions where the light sources are actually attached.

When at least one of the plurality of light sources consists of a light source having a pair of terminals, the pair of terminals of the light source may be arranged in a widthwise direction of the light source assembly. In this way, when the light source assembly is flexed in the longitudinal direction, there is no force produced for urging the terminals of the light sources away from the connective conductor structure, and thus undesirable removal of the light sources from the connective conductor structure can be prevented. This can be preferably realized by that the light source attachment portion to which the light source having a pair of terminals is attached has a pair of terminal connection parts corresponding to the pair of terminals, and the pair of terminal connection parts are arranged in the widthwise direction of the patterned conductor.

When each of the light sources has a pair of terminals, it is preferable that the patterned conductor is provided with a pattern that can be commonly used in connecting the light sources in series, parallel or series-parallel connection. This can allow a light source assembly having light sources connected in any of series, parallel or series-parallel connections to be formed from the same patterned conductor, and thus can achieve increase in the production efficiency and decrease in the manufacturing cost. According to a preferred embodiment of the present invention, the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection path and the light source attachment portions therebetween and extending in the longitudinal direction; and a plurality of branch paths widthwise connecting the trunk paths to the interconnection path. In such a structure, it is possible to cut off a portion of the branch paths, interconnection path or trunk paths as required to form connective conductor structures having various light source connection patterns from the common patterned conductor in a single manufacturing line easily and efficiently, and thus the manufacturing cost can be reduced even when the light source assemblies are manufactured in small quantities. Preferably, each of the light source attachment portions has a pair of terminal connection parts corresponding to the pair of terminals of the light sources, and the interconnection path comprises a plurality of connection paths each connecting the terminal connection parts contained in adjoining light source attachment portions.

When the plurality of light sources comprise a three-pole LED lamp having two different color LED chips and three terminals, it will be preferable if the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection path and the light source attachment portions therebetween and extending in the longitudinal direction; and a plurality of branch paths widthwise connecting the trunk paths to the interconnection path, wherein each of the light source attachment portions has three widthwise arranged terminal connection parts corresponding to the three terminals of the three-pole LED lamp, and the interconnection path comprises a plurality of connection paths each connecting the widthwise aligned terminal connection parts contained in adjoining light source attachment portions. In this way, a light source assembly using three-pole LED lamps as light sources can be realized, which, when connected to an appropriate power supply and switches, can variously change the color of the illuminated light.

When the plurality of light sources comprise a four-pole LED lamp having first and second LED chips of different colors and four terminals, and two of the four terminals are connected to the first LED chip while the remaining two are connected to the second LED chip, it will be preferable if the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection path and the light source attachment portions therebetween and extending in the longitudinal direction; and a plurality of branch paths widthwise connecting the trunk paths to the interconnection path, wherein each of the light source attachment portions has four terminal connection parts corresponding to the four terminals of the four-pole LED chip, two of the four terminal connection parts corresponding to the terminals connected to the first LED chip being aligned in the longitudinal direction of the patterned conductor while two of the four terminal connection parts corresponding to the terminals connected to the second LED chip being aligned in the longitudinal direction of the patterned conductor and spaced from the other two terminal connection parts in a widthwise direction of the patterned conductor, wherein the interconnection path comprises a plurality of connection paths each connecting the widthwise aligned connection parts contained in adjoining light source attachment portions, and longitudinally aligned ones of the plurality of connection paths are connected by widthwise extending branch paths, and wherein the patterned conductor further comprises a third trunk path disposed at a widthwise outer side of one of the first and second trunk paths and extending in the longitudinal direction, and branch paths for widthwise connecting the third trunk path to the one of the first and second trunk paths. In this way, a light source assembly using four-pole LED lamps as light sources can be realized, which, when connected with an appropriate power supply and switches, can variously change the color of the illuminated light.

Preferably, the patterned conductor is essentially made of aluminum. It will be preferable if the light sources are attached to the connective conductor structure by laser welding because the attachment can be highly reliable. Further, a resistor for forming a prescribed circuit together with the light sources may be connected to the connective conductor structure by laser welding. Typically, the light source attached to the connective conductor structure by laser welding consists of a chip-type LED (or surface-mount type LED), and the resistor consists of a chip-type resistor (or surface-mount type resistor), but they may not be limited to the chip-type devices, and the laser welding may be applied to the light source having lead wires as terminals for electric connection.

It is also possible that at least one of the plurality of light sources consists of a light emitting element assembly comprising a plurality of light emitting elements. Further, it will be convenient if the patterned conductor comprises projections for defining attachment positions of the light sources.

In yet another preferred embodiment of a light source assembly according to the present invention, the patterned conductor comprises a pair of trunk paths extending substantially in parallel in a longitudinal direction and a plurality of branch paths connecting the pair of trunk paths to each other, the light sources are connected between the pair of trunk paths, and the cut-off parts of the patterned conductor include the branch paths. This embodiment is particularly suitable for embodying a light source assembly in which the plurality of light sources are connected in parallel between the pair of trunk paths. Since the pair of trunk paths are connected to each other by the branch paths, the patterned conductor can be handled quite easily, which can improve the production efficiency. If a gap between the pair of trunk paths is not straight (for example, bent in a rectangular wave), the attachment positions of the light sources (LEDs) connected between the pair of trunk paths can be adjusted not only in the longitudinal direction but also in the widthwise direction. Thus, in a case that the light source assemblies are used in forming automobile lamps, for example, it is possible to cope with a situation where different LED arrangement patterns are required for different vehicle types. This can lead to parts sharing and bring about significant economic benefits.

When each of the light sources consists of an LED having a plate-shaped cathode terminal and anode terminal, it is preferred that a portion of the patterned conductor to which the cathode terminal of each LED is attached has a larger area than a portion of the same to which the anode of each LED is attached. This is because that in such an LED, an LED chip encapsulated within a package is usually mounted on the cathode terminal and connected to the anode terminal via thin lead wire, and thus the heat generated from the LED chip is mainly discharged via the cathode terminal. When a portion of the patterned conductor to which the cathode terminal of each LED is attached has a larger area, the heat discharged via the cathode terminals can be efficiently dissipated. In the case where the patterned conductor comprises a pair of trunk paths extending substantially in parallel in a longitudinal direction, and the LEDs are connected between the pair of trunk paths, the trunk path to which the cathode terminals of the LEDs are attached may preferably have a larger width than the trunk path to which the anode terminals of the LEDs are attached.

According to another aspect of the present invention, there is provided a light emitting apparatus comprising a light source assembly having a plurality of electrically connected light sources and a holder for holding the light source assembly, wherein the light source assembly comprises a connective conductor structure extending in a direction of arrangement of the light sources to join the light sources, the connective conductor structure being formed by cutting off parts of a substantially plate-like patterned conductor as required, the patterned conductor being provided with a prescribed pattern, wherein the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection path and the light source attachment portions therebetween and extending in the longitudinal direction; and a plurality of branch paths widthwise connecting the trunk path to the interconnection path, and wherein the branch paths connecting the trunk paths to the interconnection path are bent such that a principal surface of each trunk path is substantially perpendicular to a principal surface of the interconnection path, and the trunk paths are inserted into corresponding holes or recesses provided to the holder to achieve attachment of the light source assembly to the holder. In this light emitting apparatus, the light source assembly can be attached to the holder by just inserting the trunk paths into the recesses or holes of the holder, and thus the efficiency of process of attaching can be improved.

According to another embodiment, there is provided a light emitting apparatus comprising a light source assembly having a plurality of electrically connected light sources each having lead wires and a holder for holding the light source assembly, the light sources being arranged in a direction substantially perpendicular to the lead wires, wherein the light source assembly comprises a connective conductor structure extending in the direction of arrangement of the light sources to join the light sources, and wherein one or both of the lead wires and the connective conductor structure protrude toward the holder and are inserted into holes or recesses provided to the holder to achieve attachment of the light source assembly to the holder. In such a light emitting apparatus, it is only necessary for the holder to be formed with holes or recesses, and thus no complicated processes are needed. This makes it possible to easily manufacture various light emitting apparatuses having different light source arrangements, and thus can reduce the cost when various light emitting apparatuses are manufactured in small quantities. Further, the light emitting apparatus can be securely attached to the holder with a simple structure. Also, since the connective conductor structure is disposed between the holder and the light source bodies, the light source bodies can be held spaced apart from a surface of the holder, which improves heat dissipation.

According to yet another aspect of the present invention, there is provided a tape-shaped patterned conductor having a prescribed pattern and used for forming a light source assembly by electrically connecting a plurality of light sources, comprising: a plurality of light source attachment portions arranged in a longitudinal direction for connection with the light sources; an interconnection path connecting the light source attachment portions in the longitudinal direction; at least one trunk path widthwise spaced from the interconnection path and the light source attachment portions and extending in the longitudinal direction; and a plurality of branch paths widthwise connecting the trunk path to the interconnection path. By using such a tape-shaped patterned conductor, it is possible to manufacture a light source assemblies efficiently without using a printed circuit board. Further, by cutting off a portion of the branch paths and/or interconnection path as required, light source assemblies having light sources connected in various connection patterns can be formed easily.

The cutting (secondary processing) of the patterned conductor can be achieved efficiently and at low cost if it is done by press working using a progressive press machine. Therefore, it is preferable that the trunk path is formed with a plurality of holes (pilot holes) arranged in the longitudinal direction at a predetermined interval for use in transportation or positioning of the patterned conductor in a progressive press machine. When each of the light sources has a pair of terminals for electrical connection, each of the light source attachment portions should have a pair of terminal connection parts for connection with the pair of terminals of a corresponding light source. In such a case, the interconnection path may comprise a plurality of connection paths each connecting the terminal connection parts contained in adjoining light source attachment portions. It is also possible that at least one of the connection paths and/or trunk path is formed with a hole for inserting a lead wire of a resistor having lead wires. If the pair of terminal connection parts in each light source attachment portion are spaced from each other, the number of parts need to be cut off in the secondary processing of the patterned conductor can be reduced while if the pair of terminal connection parts in each light source attachment portion are connected to each other, the part connecting the pair of terminal connection parts can be selectively cut off as needed, and thus the flexibility is improved. Further, a resistor attachment portion may be provided between at least one adjoining pair of light source attachment portions. It may be also possible that at least one of the branch paths may be replaced with a resistor. In this way, a resistor can be easily incorporated in the circuit. The trunk path may have a widthwise convexly curved portion. By bending the convexly curved portion at its root, it can be used in attachment to the holder. When a progressive press machine is used in attaching a plurality of light sources held by the radial taping to an unwound portion of the tape-shaped patterned conductor wound in a coil, the trunk path of the patterned conductor may interfere with main bodies of the light-sources. In such a case, however, if the trunk path is formed with convexly curved portions, the interference between the trunk path of the tape-shaped patterned conductor and the main bodies of the light sources can be prevented by bending the convexly curved portions in the unwound portion of the tape-shaped patterned conductor.

Further preferably, a pair of trunk paths may be disposed on either side of the patterned conductor so as to interpose the interconnection path and the light source attachment portions therebetween. In such a configuration, it is possible to form a light source assembly connecting the light sources in any of serial-parallel, parallel or series connections by cutting off a prescribed portion of the branch path and/or interconnection path. Thus, light source assemblies having various connection patters can be manufactured from the same patterned conductor in a single manufacturing line, advantageously improving the production efficiency and reducing the manufacturing cost.

According to another embodiment of the present invention, there is provided a tape-shaped patterned conductor having a prescribed pattern and used for forming a light source assembly by electrically connecting a plurality of light sources, wherein parts of the patterned conductor are to be cut off by a progressive press machine as required to form a connective conductor structure for connecting the light sources, and wherein the patterned conductor is formed with a plurality of holes arranged in a longitudinal direction at a predetermined interval for use in transportation or positioning of the patterned conductor in the progressive press machine. According to still another embodiment, there is provided a tape-shaped patterned conductor having a prescribed pattern and used for forming a light source assembly by electrically connecting a plurality of light sources each having lead wires, the light sources being arranged in a direction substantially perpendicular to the lead wires, the patterned conductor comprising: a plurality of connection parts arranged in a longitudinal direction for connection with the lead wires of the plurality of light sources; and an interconnection path for connecting the connection parts in the longitudinal direction, wherein the interconnection path is formed with pilot holes for engagement with pilot pins of a progressive press machine. Thus, by providing the patterned conductor with a plurality of holes used for transportation or positioning of the patterned conductor in the progressive press machine, the handling of the patterned conductor by the progressive press machine can be facilitated and the production efficiency of the light source assembly using the patterned conductor can be improved.

According to still another aspect of the present invention, there is provided a manufacturing method of a light source assembly comprising a plurality of light sources and a connective conductor structure for electrically connecting the plurality of light sources, the method comprising the steps of: forming a substantially plate-like patterned conductor having a prescribed pattern; attaching the patterned conductor to the light sources; and cutting off parts of the patterned conductor as required to form the connective conductor structure. In this way, by changing the parts to be cut out in the patterned conductor, it is possible to form a light source assembly comprising a connective conductor structure having various light source connection patterns. Also this manufacturing method can eliminate use of solder which is usually used in a printed circuit board or for connection with the printed circuit board.

Preferably, the step of forming the tape-shaped patterned conductor comprises a step of press working a conductive plate material. It will be further preferable in view of work efficiency if the step of cutting off parts of the patterned conductor and/or attaching the patterned conductor to the light sources is carried out by a progressive press machine. If the manufacturing method further comprises a step of attaching a joint member to the patterned conductor so as to hold parts of the connective conductor structure made from the patterned conductor, and the step of cutting off parts of the patterned conductor is carried out after the step of attaching the joint member, it is possible to prevent the parts of the connective conductor structure from being separated apart. In such a case, it is preferable that the joint member is formed with at least one hole to expose a part of the patterned conductor to be cut off, whereby allowing the part of the patterned conductor exposed by the hole can be cut as required. If the light sources comprise a chip-type LED, and the present method comprises a step of attaching a socket to the patterned conductor for receiving the chip-type LED, the step of cutting off parts of the patterned conductor can be carried out after the step of attaching the socket.

If the light sources comprise a light source having lead wires, the step of attaching the patterned conductor to the light sources may comprise a step of inserting the lead wires of the light source into corresponding holes provided to the connective conductor structure.

It may be also possible that the step of cutting off parts of the patterned conductor is carried out after the step of attaching the patterned conductor to the light sources. This can prevent the parts of the connective conductor structure, which is formed by cutting off parts of the patterned conductor as required, from being separated apart without using the joint member. Further, if each of the light sources has a pair of lead wires for electric connection, the step of attaching may preferably comprise step of cramping the lead wires with prescribed portions of the patterned conductor, to thereby eliminate use of solder. The engagement by cramping is also preferred for the reason that it is suitable to be carried out by progressive press working. The method may further comprise the step of bending the patterned conductor along a bending line extending in the longitudinal direction, so as to prevent undesirable contact between the patterned conductor (or the connective conductor structure made therefrom) and the lead wires of the light sources.

According to a further embodiment of the present invention, there is provided a manufacturing method of a light source assembly having a plurality of light sources each having lead wires, wherein the light sources are arranged in a direction substantially perpendicular to the lead wires, comprising the steps of: supplying the plurality of light sources arranged in the direction perpendicular to the lead wires and held by a carrier tape for radial taping; and electrically connecting the light sources in a state that the light sources are held by the carrier tape to thereby continuously obtain the light sources. In this method, the connecting of the light sources is conducted while the light sources are held unitarily, and thus the workability in the manufacture of the light source assembly can be improved.

According to another aspect of the present invention, there is provided a light emitting apparatus comprising: a light source assembly having a plurality of electrically connected light sources, a light transmissive tubular member for accommodating the light source assembly therein; and a pair of cap members attached to either end of the tubular member, wherein the light source assembly comprises a connective conductor structure for connecting the light sources, and the connective conductor structure is formed by cutting off parts of a substantially plate-like patterned conductor as required, the patterned conductor being provided with a prescribed pattern. In such a light emitting apparatus, the connective conductor structure can be significantly thicker (0.1-0.3 mm) than a circuit-forming copper film (typically 35 µm) of a printed circuit board to thereby improve heat conducting property. Thus, it is possible to transfer heat generated from the light sources or other elements (resistors) quickly and prevent excessive increase in temperature around the light sources or other elements to thereby prevent damage to them.

Preferably, the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; at least one trunk path widthwise spaced from the interconnection path and the light source attachment portions and extending in the longitudinal direction; and a plurality of branch paths widthwise connecting the trunk path to the interconnection path. When a conductive pin for connection with an outside circuit is held in at least one of the pair of cap members, it will be preferable that the trunk path is connected to the conductive pin because it can eliminate the need for additional wirings and thus improve work efficiency.

According to yet another aspect of the present invention, there is provided a light emitting apparatus comprising a light source assembly having a plurality of electrically connected light sources, wherein the light source assembly comprises a connective conductor structure for connecting the light sources, and the connective conductor structure is formed by cutting off parts of a substantially plate-like patterned conductor as required, the patterned conductor being provided with a prescribed pattern, and wherein the light emitting apparatus comprises: a housing for accommodating the light source assembly therein; and a heat transmission member contacting the connective conductor structure of the light source assembly and an inner surface of the housing to transmit heat therebetween. In such a configuration, the heat generated from the light sources or the like is transmitted from the connective conductor structure to the housing, and then dissipated to outside from the housing, and therefore, it is possible to suppress increase in the temperature within the housing, and thus prevent damage to the light sources or other elements or performance decrease of the same. In other words, the use of heat transmission member can make the housing work as a heat sink.

The heat transmission member can also serve as a support member for supporting the light source assembly in the housing, and this can make an additional support member unnecessary. Preferably, the heat transmission member is elastic, and pressed against the inner surface of the housing because this can improve the heat transmission to the housing as well as securely support the light source assembly without undesirable play. The housing is preferably made of a material having a favorable heat transmission property such as glass. If the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; at least one trunk path widthwise spaced from the interconnection path and the light source attachment portions and extending in the longitudinal direction; and a plurality of branch paths widthwise connecting the trunk path to the interconnection path, the heat transmission member can be connected to the trunk path.

According to another aspect of the present invention, there is provided a light emitting apparatus comprising a light source assembly having a plurality of electrically connected light sources and a holder for holding the light source assembly, wherein the light source assembly comprises a connective conductor structure extending in a direction of arrangement of the light sources to join the light sources, the connective conductor structure being formed by cutting off parts of a substantially plate-like patterned conductor as required, the patterned conductor being provided with a prescribed pattern, wherein the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection path and the light source attachment portions therebetween and extending in the longitudinal direction; and a plurality of branch paths widthwise connecting the trunk path to the interconnection path, and wherein at least one surface of the holder is formed with a channel having opposing side walls in which longitudinally extending guide grooves are formed corresponding to the pair of trunk paths so that the light source assembly is attached to the holder by sliding the pair of the trunk paths into the guide grooves. In such a light emitting apparatus, the attachment of the light source assembly to the holder can be achieved readily.

If both surfaces of the holder are formed with a channel, and opposing side walls of each channel are formed with longitudinally extending guide grooves corresponding to the pair of trunk paths, it is possible that each surface of the holder is attached with the corresponding light source assembly with the pair of trunk paths slid into the guide grooves, so that the light can be emitted on both sides of the holder.

According to yet another aspect of the present invention, there is provided a tape-shaped patterned conductor having a prescribed pattern and used for forming a light source assembly by electrically connecting a plurality of light sources, comprising: more than two trunk paths extending in a longitudinal direction and mutually spaced apart in a widthwise direction; a plurality of light source attachment portions for electrical connection with the light sources, the light source attachment portions being arranged in the longitudinal direction between adjoining trunk paths; interconnecting paths for connecting the plurality of light source attachment portions in the longitudinal direction; and a plurality of branch paths for widthwise connecting each of the interconnection paths to the trunk paths interposing the interconnection path therebetween. By using such a patterned conductor, it is possible to easily form a light source assembly having light sources arranged in a plurality of lines, and thus improve production efficiency.

According to still another aspect of the present invention, there is provided a light emitting apparatus comprising a plurality of light source assemblies each having a plurality of electrically connected light sources, wherein each of the light source assemblies comprises a connective conductor structure extending in a direction of arrangement of the light sources to join the light sources, the connective conductor structure being formed by cutting off parts of a substantially plate-like patterned conductor as required, the patterned conductor being provided with a prescribed pattern, and wherein the plurality of light sources are arranged in the widthwise direction, and adjoining light sources are connected to each other so that the plurality of light source assemblies are connected in series. Thus, it is possible to use light source assemblies to constitute a light emitting apparatus in which light sources are connected in a matrix pattern. Such a light emitting apparatus is suitable for a traffic light, for example, because even if a single light source breaks down and stops current conduction, its influence on the other light sources is small.

When each of the light sources consists of an LED and each LED is connected in series with a resistor, if a single LED suffers a short-circuiting malfunction, the voltage can be maintained by the resistor connected in series to the malfunctioning LED, and therefore, the LEDs connected in parallel with the malfunctioning LED can continue emitting light so that a significant decrease in the amount of emitted light can be avoided.

According to another aspect of the present invention, there is provided a light source assembly comprising a plurality of electrically connected light sources, wherein the light source assembly comprises a connective conductor structure extending in a direction of arrangement of the light sources to join the light sources, the connective conductor structure being formed by cutting off parts of a substantially plate-like patterned conductor as required, the patterned conductor being provided with a prescribed pattern, wherein the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection path and the light source attachment portions therebetween and extending in the longitudinal direction; and a plurality of branch paths widthwise connecting the trunk path to the interconnection path, and wherein parts of the interconnection path are cut off to form a plurality of light source parallel connections each comprising a plurality of light sources connected in parallel between the pair of trunk paths, and further, parts of the trunk paths are cut such that the light source parallel connections are connected in series. This can provide a light source assembly comprising light sources spatially arranged in a line and electrically connected in a matrix pattern.

When each of the light sources consists of an LED, the above light source assembly can be easily embodied if orientations of the LEDs contained in adjoining light source parallel connections are opposite to each other so that cathodes of the LEDs contained in an electrically upstream one of the adjoining light source parallel connections are connected to anodes of the LEDs contained in a downstream one via one of the pair of trunk paths, and if the pair of trunk paths are cut such that anodes of the LEDs contained in the upstream one of the adjoining parallel connections are separated from cathodes of the LEDs contained in the downstream one and that ends of each LED are not short-circuited.

Alternatively, the above light source assembly can be embodied by connecting portions of the pair of trunk paths to each other via the branch paths and the light source attachment portions such that cathodes of the LEDs contained in an electrically upstream one of the adjoining light source parallel connections are connected to anodes of the LEDs contained in a downstream one, and cutting the pair of trunk paths such that anodes of the LEDs contained in the upstream one of the adjoining parallel connections are separated from cathodes of the LEDs contained in the downstream one and that ends of each LED are not short-circuited.

According to yet another aspect of the present invention, there is provided a light emitting apparatus comprising a plurality of light source assemblies each having a plurality of electrically connected light sources, wherein the plurality of light source assemblies are each arranged to form a spiral extending toward a central portion from their respective starting points which are circumferentially spaced substantially evenly from each other in a periphery of a light emitting surface of the light emitting apparatus. In this way, a surface light emitting body can be made easily by using light source assemblies each constituted by joining a plurality of light sources arranged in a line. Particularly, if the plurality of light source assemblies comprise at least two light source assemblies emitting lights of different colors, the light sources of different colors can be mixedly arranged substantially evenly.

According to yet another aspect of the present invention, there is provided a light emitting apparatus, comprising a plurality of LED parallel connections each having a plurality of parallel connected LEDs, wherein the plurality of LED parallel connections are connected in series, and wherein each LED is connected to an associated resistor in series. In this light emitting apparatus, if a single LED suffers a short-circuiting malfunction, a voltage is produced across the resistor connected in series to the malfunctioning LED, and therefore, the ends of the LEDs connected in parallel with the malfunctioning LED are kept from short-circuiting and thus the light emission can be maintained. Thus, if a single LED suffers a short-circuiting malfunction, significant decrease in the amount of emitted light can be prevented.

According to still another aspect of the present invention, there is provided a patterned conductor having a prescribed pattern and used for forming a light source assembly by electrically connecting a plurality of light sources, wherein the patterned conductor comprises an expandable portion at a prescribed longitudinal position. In this way, even after the light source assembly is fabricated, arrangement positions of the light sources can be adjusted by deforming the expandable portion. Further, it is possible to easily achieve various light source arrangements. For example, the arrangement of the light sources may not be limited to straight and the direction of light source arrangement may be bent or offset. The patterned conductor preferably comprises a deformation prohibiting portion for selectively allowing deformation of the expandable portion. It is preferred that the expandable portion and the deformation prohibiting portion are formed by blanking (or punching) because this can allow easy and efficient fabrication of these portions. In such a case, it is desirable that deformation of the expandable portion is enabled by cutting off the deformation prohibiting portion so that the enabling can be easily done. In a case where the patterned conductor further comprises a pair of trunk paths extending substantially in parallel in the longitudinal direction, and the plurality of light sources are connected between the pair of trunk paths, the expandable portion and the deformation prohibiting portion can be formed by blanking a portion of the pair of trunk paths. Alternatively, the expandable portion may have at least one crease extending in a widthwise direction of the patterned conductor.

Other and further objects, features and advantages of the invention will appear more fully from the following description.

BRIEF DESCRIPTION OF THE DRAWINGS

Now the present invention is described in the following with reference to the appended drawings, in which:

FIG. 8 shows a way of secondary processing of the tape-shaped patterned conductor for achieving a light emitting apparatus of a serial connection type;

FIG. 9 is a cross-sectional view showing a light emitting apparatus in that the light source assembly of a serial connection type obtained by the secondary processing shown in FIG. 8 is attached to a mounting board (holder);

FIG. 10 shows another embodiment of the secondary processing of the tape-shaped patterned conductor to form a light emitting apparatus of a serial connection type;

FIG. 16 is a perspective view showing an embodiment of a light source assembly according to the present invention;

FIG. 18 is a plan view of a patterned conductor used in forming a light source assembly shown in FIG. 16;

FIG. 19 shows a way of secondary processing of the patterned conductor of FIG. 18 to form a light source assembly in which the light sources are connected in series-parallel connection;

FIG. 20 shows a way of secondary processing of the patterned conductor of FIG. 18 to form a light source assembly in which the light sources are connected in parallel;

FIG. 33 is a plan view showing a modified embodiment of the patterned conductor of FIG. 18 suitable for forming a light source assembly having light sources connected in series;

FIG. 34 is a plan view showing a modified embodiment of the patterned conductor of FIG. 25 suitable for forming a light source assembly having light sources connected in series;

FIG. 39 is a perspective view of a light emitting apparatus using the light source assembly of FIG. 36;

FIG. 42b is a circuit diagram of the light emitting element assembly shown in FIG. 42a;

FIG. 43b is a circuit diagram of the light emitting element assembly shown in FIG. 43a;

FIG. 47a is a partial plan view showing another embodiment of a tape-shaped patterned conductor according to the present invention, FIG. 47b is a cross-sectional view taken along the lines A-A in FIG. 47a, and FIG. 47c is a partial plan view of a light source assembly formed by attaching chip-type LEDs and chip-type resistors to the connective conductor structure which in turn is formed by cutting off parts of the patterned conductor of FIG. 47a as required;

FIG. 48b is a circuit diagram of the three-pole LED lamp shown in FIG. 48a;

FIG. 50 is a plan view showing an example of a way of cutting off in the secondary processing of the patterned conductor shown in FIG. 49 to form a connective conductor structure having a prescribed circuit pattern;

FIG. 57 shows a way of secondary processing of the patterned conductor shown in FIG. 25 for forming a light source assembly in that the light sources are connected in series and the trunk paths can be used for heat dissipation;

FIG. 58b is a plan view showing an end conductor for allowing conductive pins to an end of the patterned conductor shown in FIG. 58a;

FIG. 59 is a perspective view showing a light source assembly having an insulating sheet attached to its surface on which the light sources are mounted;

FIG. 70 is a partial plan view showing another embodiment of a patterned conductor;

FIG. 71 is a partial plan view showing an example of a light source assembly formed by using the patterned conductor shown in FIG. 70;

FIG. 72a is a schematic view of a light emitting apparatus formed by using the light source assembly shown in FIG. 71, and FIG. 72b is a cross-sectional view taken along the lines b-b in FIG. 72a;

FIG. 81 is a perspective view showing the light source assembly used in the light emitting apparatus, the light source assembly being shown in a state before bending;

FIG. 82 is an end view of the light source assembly shown in FIG. 81;

FIGS. 85a and 85b are partial plan views showing examples of deformed states of the light source assembly formed by using the patterned conductor shown in FIG. 84a;

FIG. 89b is a partial plan view showing a light source assembly using the patterned conductor of FIG. 89a.

DETAILED DESCRIPTION OF THE PREFERRED EMBODIMENTS

In the following, embodiments of the present invention are explained with reference to the drawings.

Figure 1:
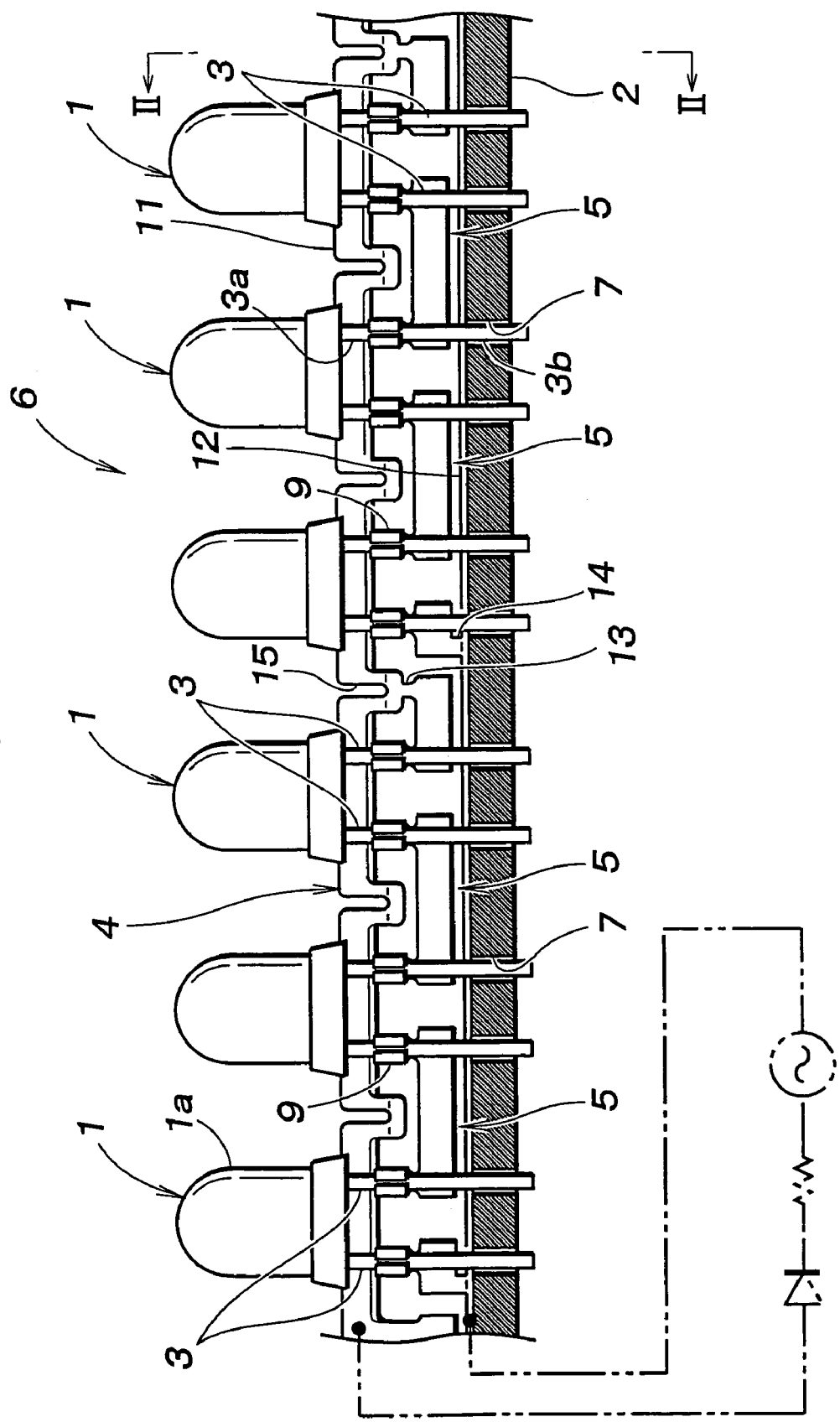
FIG. 1 is a cross-sectional view showing a light emitting apparatus according to the present invention.

FIG. 1 is a front cross-sectional view showing a preferred embodiment of a light emitting apparatus according to the present invention. As shown, the light emitting apparatus comprises a plurality of light emitting diodes (LEDs) 1 as light sources, and each LED 1 consists of a bullet-type LED (or lamp-type LED) having a pair of parallel lead wires 3 functioning as electric connection terminals and a packaging part (or main body) 1a shaped like a bullet. The light sources 1 are arranged in a row along a surface of a mount board (holder) 2 in a direction perpendicular to the lead wires 3. The light sources 1 are series-parallel connected by a connective conductor structure 4 that extends in a direction of arrangement of the light sources 1, i.e., series connections of multiple light sources 1 are connected in parallel with each other, to form a light source assembly 6. The series-parallel connection has a benefit that it can be connected to a commercial power source without using a step-down transformer by suitably adjusting a number of light sources connected in series as well as that an arbitrary number of light sources can be utilized by parallel-connecting a plurality of series connections of light sources (or series blocks).

As shown in the drawing, the connective conductor structure 4 comprises a first and second trunk paths 11, 12 supplied with a power voltage and each connected to the lead wires 3 of prescribed light sources 1, and a plurality of coupling pieces 5 for coupling between the lead wires 3 of adjacent light sources 1. Each coupling piece 5 has a pair of connection parts 9 and engages base portions 3a of the lead wires 3 of adjacent light sources 1 via the pair of connection parts 9. The first and second trunk paths 11, 12 are connected to the base portions 3a of the lead wires 3 of associated light sources 1 via branch paths 13, 14, respectively, and the connection parts 9 coupled to the branch paths. The first trunk path 11, which is closer to the main body 1a of the light sources 1, is formed with cuttings (or slits) 15 extending in a widthwise direction and whereby the first trunk path 11 assumes a tortuous shape. In other words, portions of the first trunk path 11 longitudinally aligned with the light source mount positions curve convexly. To secure the light source assembly 6 constructed as above to the mount board 2, end portions 3b of the lead wires 3 are inserted into mount holes 7 formed in the mount board 2.

Figure 2:
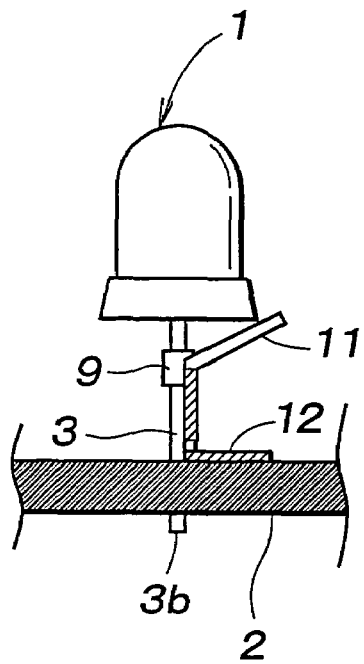
FIG. 2 is a cross-sectional view along the lines II-II in FIG. 1.
Figure 3:
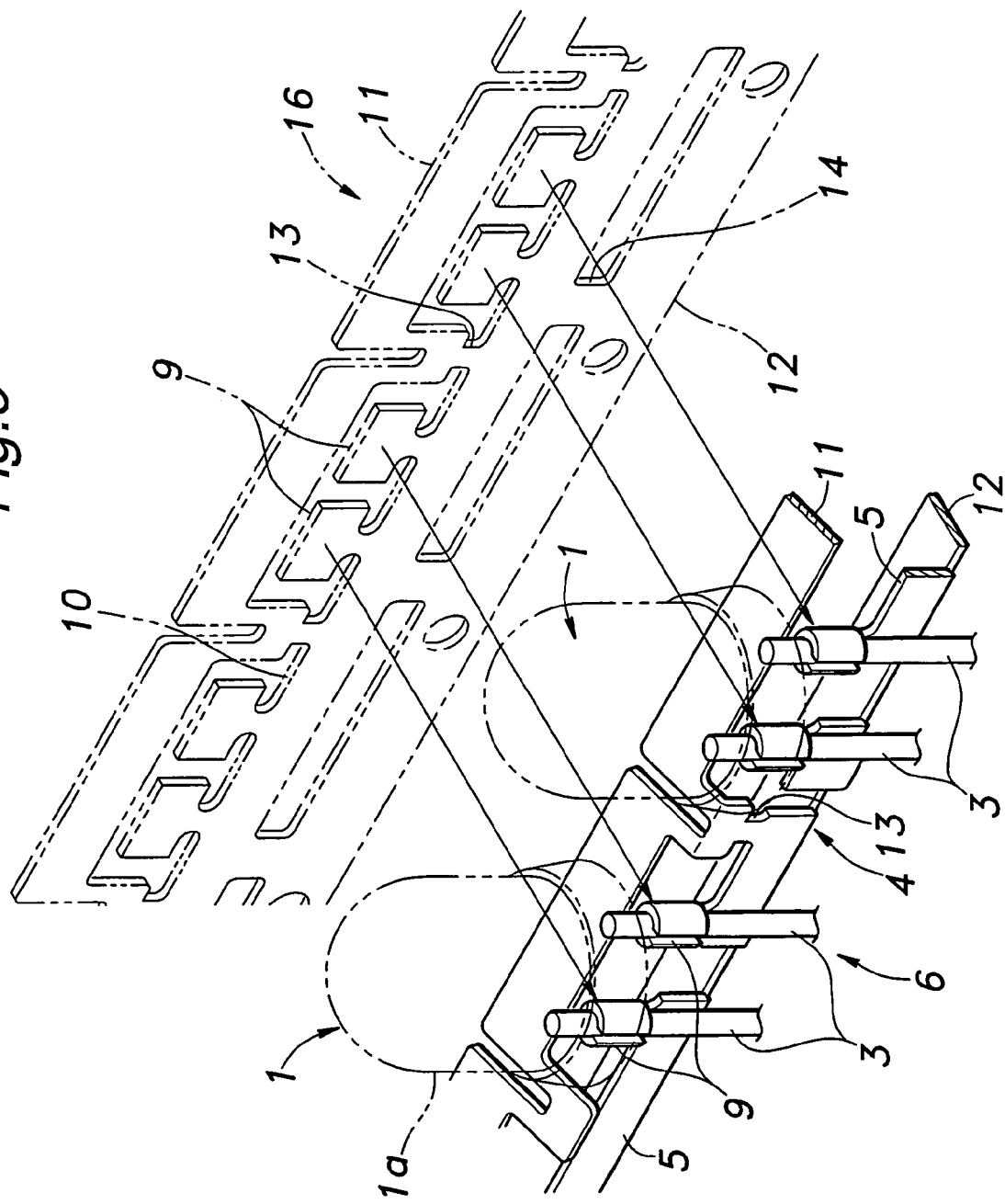
FIG. 3 is a perspective view of a light source assembly shown in FIG. 1.

FIG. 2 is a cross-sectional view taken along the lines II-II in FIG. 1, and FIG. 3 is a perspective view showing the light source assembly 6 of FIG. 1. In FIG. 3, the main bodies 1a of the light sources 1 are shown in broken lines for ease of illustration. Also in this drawing, a tape-shaped patterned conductor 16, from which the connective conductor structure 4 is made as described in detail below, is shown in broken lines.

As best shown in FIG. 3, in this embodiment, each connection part 9 has a plate-shaped member such that the connection part 9 can be engaged to the associated lead wire 3 by cramping the lead wire 3 or bending the connection part 9 to sandwich the lead wire 3. The securing of the connection part 9 to the lead wire 3 may be achieved by various means other than cramping, such as spot welding or engagement using elastic engaging pieces, but it should be noted that cramping can bring about such benefits as allowing continuous processing using a progressive press machine, eliminating use of solder, or eliminating concern about the heat deteriorating the light sources (LEDs) 1.

As shown in FIGS. 2 and 3, the connective conductor structure 4 is bent at positions substantially corresponding to a bottom of the cuttings 15 of the first trunk path 11 and at positions substantially corresponding to an intersection between the branch paths 14 and the coupling pieces 5 along bending lines extending in a longitudinal direction. This places the first and second trunk paths 11, 12 at an angle with respect to the connection parts 9, which extend along the lead wires 3, when seen in the cross-sectional view of FIG. 2. Thus, by bending the widthwise cross-sectional shape (i.e., a cross-sectional shape taken along a plane perpendicular to the longitudinal direction) of the connective conductor structure 4, it is possible not only to prevent interference between the light source main bodies 1a and the first trunk path 11 but also to achieve a simple structure with no insulating treatment applied to the connective conductor structure 4 while preventing the first and second trunk paths 11, 12 from contacting the lead wires 3 of the light sources 1 to inadvertently make a short-circuit. The connective conductor structure 4 not covered by an insulating material and hence exposed to the air can improve heat dissipation and thus favorably allows high-density arrangement of the light sources 1. The bending of the connective conductor structure 4 can limit longitudinal flexion thereof, and thus allows an easier handling when attaching it to the mount board 2. Further, the bending can cause the end portions 3b of the lead wires 3 to protrude towards the mount board 2 so that they can be easily inserted into the mount holes 7 of the mount board 2.

According to the present invention, the connective conductor structure 4 described above can be obtained by carrying out secondary processing of a tape-shaped patterned conductor 16, i.e., cutting off parts of the tape-shaped patterned conductor 16 as required when the patterned conductor 16 is attached to the light sources 1, in which the patterned conductor 16 is beforehand formed with a circuit pattern that can be used commonly in series, parallel and series-parallel connections, preferably by press working (blanking) a conductive plate material. As described in detail later, by changing the parts to be cut off in the tape-shaped patterned conductor 16, it is possible to connect the light sources 1 in any of series, parallel or series-parallel connections.

Figure 4A:
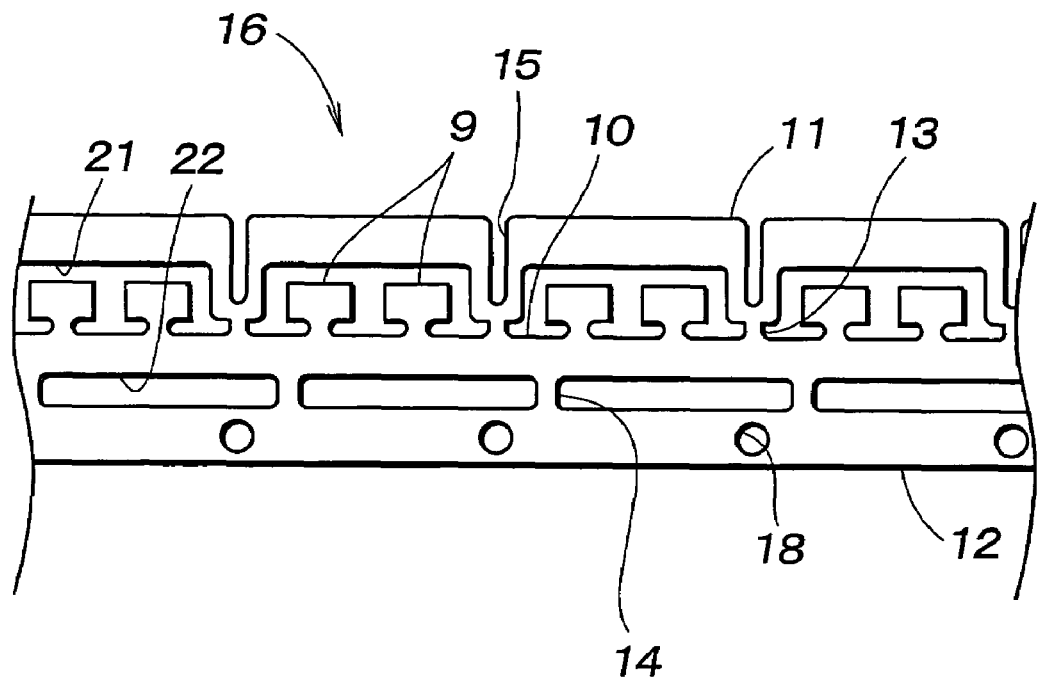
FIGS. 4a and 4b are front views each showing an embodiment of a tape-shaped patterned conductor.

FIG. 4a is a front view showing an embodiment of the tape-shaped patterned conductor 16 before the secondary processing. In this drawing, parts corresponding to those of the connective conductor structure 4 shown above are denoted with same reference numerals. In FIG. 4a, the connection parts 9 to be engaged with the lead wires 3 of the light sources 1 are shown in a state before being bent to engage with the lead wires 3. The connection parts 9 are connected by a longitudinally extending interconnection path 10, and the first and second trunk paths 11, 12 are disposed on either side of the tape-shaped patterned conductor 16 so as to interpose the interconnection path 10 and the connection parts 9 therebetween. The first and second trunk paths 11, 12 are connected to the interconnection path 10 in a widthwise direction by the plurality of branch paths 13, 14.

Figure 4B:
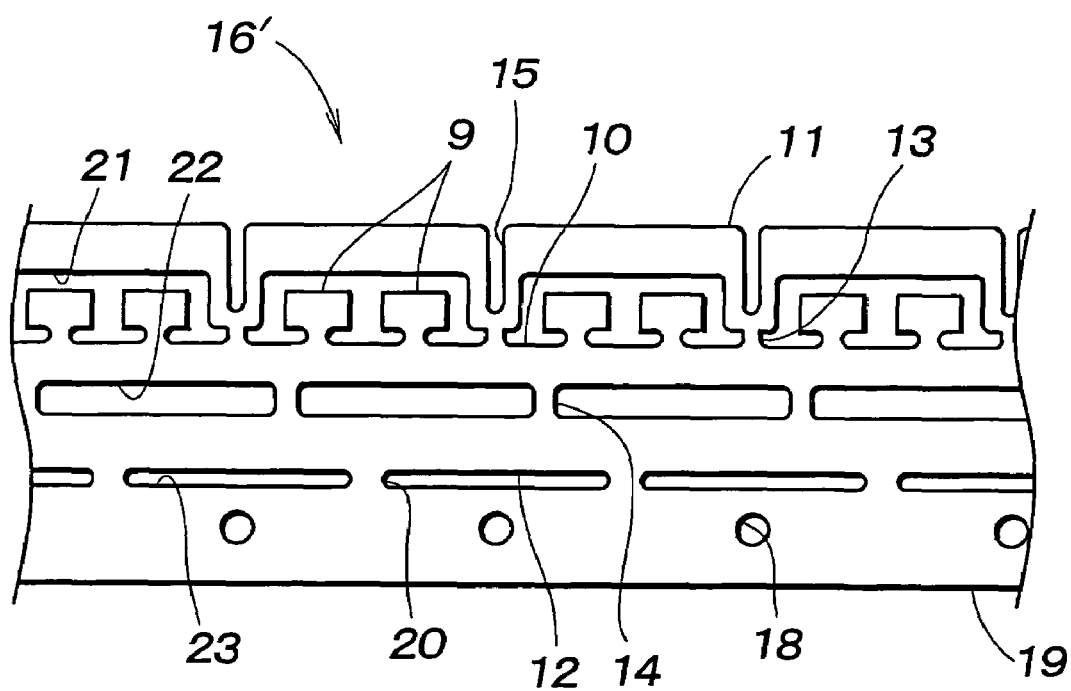

As mentioned above, the tape-shaped patterned conductor 16 is applied with a secondary processing of cutting off parts as required depending on various usages to make the connective conductor structure 4 that realizes a circuit with a desired connection pattern. It, will be preferable if such a secondary processing is carried out at the same time when the tape-shaped patterned conductor 16 and the light sources 1, which are held in a radial taping, are attached together by a progressive press machine because it can simplify the manufacturing process. For this reason, in the tape-shaped patterned conductor 16 shown in FIG. 4a, the second trunk path 12, which is away from the light source main bodies 1a, is formed with pilot holes 18 for engaging pilot pins of the progressive press machine (not shown) to thereby align the tape-shaped patterned conductor 16 with the light sources 1 and thus ensure that the light sources 1 are mounted at predetermined positions on the tape-shaped patterned conductor 16. Alternatively, as in a tape-shaped patterned conductor 16 shown in FIG. 4b, it is possible to provide a side frame 19 connected to the second trunk path 12 via joints 20, and form the pilot holes 18 for engaging the pilot pins of the progressive press machine in the side frame 19, although the additional side frame 19 will necessitate a larger amount of material compared with the embodiment of FIG. 4a.

The tape-shaped patterned conductor 16 can be obtained by press working (more specifically, blanking) a conductive plate material. Specifically, cut-out holes 21 are first formed such that the cut-out holes 21 define the connection parts 9 projecting from the interconnection path 10 in a direction along the lead wires 3, divide the first trunk path 11 from the interconnection path 10, and define the branch paths 13 connecting therebetween. The cut-out holes 21 also provide a space into which a tool for bending the connection parts 9 can be inserted. Then the first trunk path 11 is formed with the cuttings 15. Further, cut-out holes 22 for dividing the interconnection path 10 from the second trunk path 12 as well as defining the branch paths 14 connecting between them are formed. The branch paths 13, 14 for connecting the first and second trunk paths 11, 12 to the interconnection path 10 are preferably formed at positions offset from the lead wires 3 so that inadvertent cutting of the lead wires 3 can be prevented when cutting off the branch paths 13, 14. This can allow a proper length of the lead wires 3 to project toward the mount board 2, for example, whereby when the light source assembly 6 is attached to the mount board 2, the lead wires 3 can be inserted into the mount holes 7 in the mount board 2 to achieve a secure mounting of the light source assembly 6 (see FIG. 1).

The tape-shaped patterned conductor 16 is flexible and can be curved or bent, and this allows the patterned conductor 16 to be wound in a coil or folded in an accordion fashion so that it can be easily stored, transported or packaged.

Figure 5:
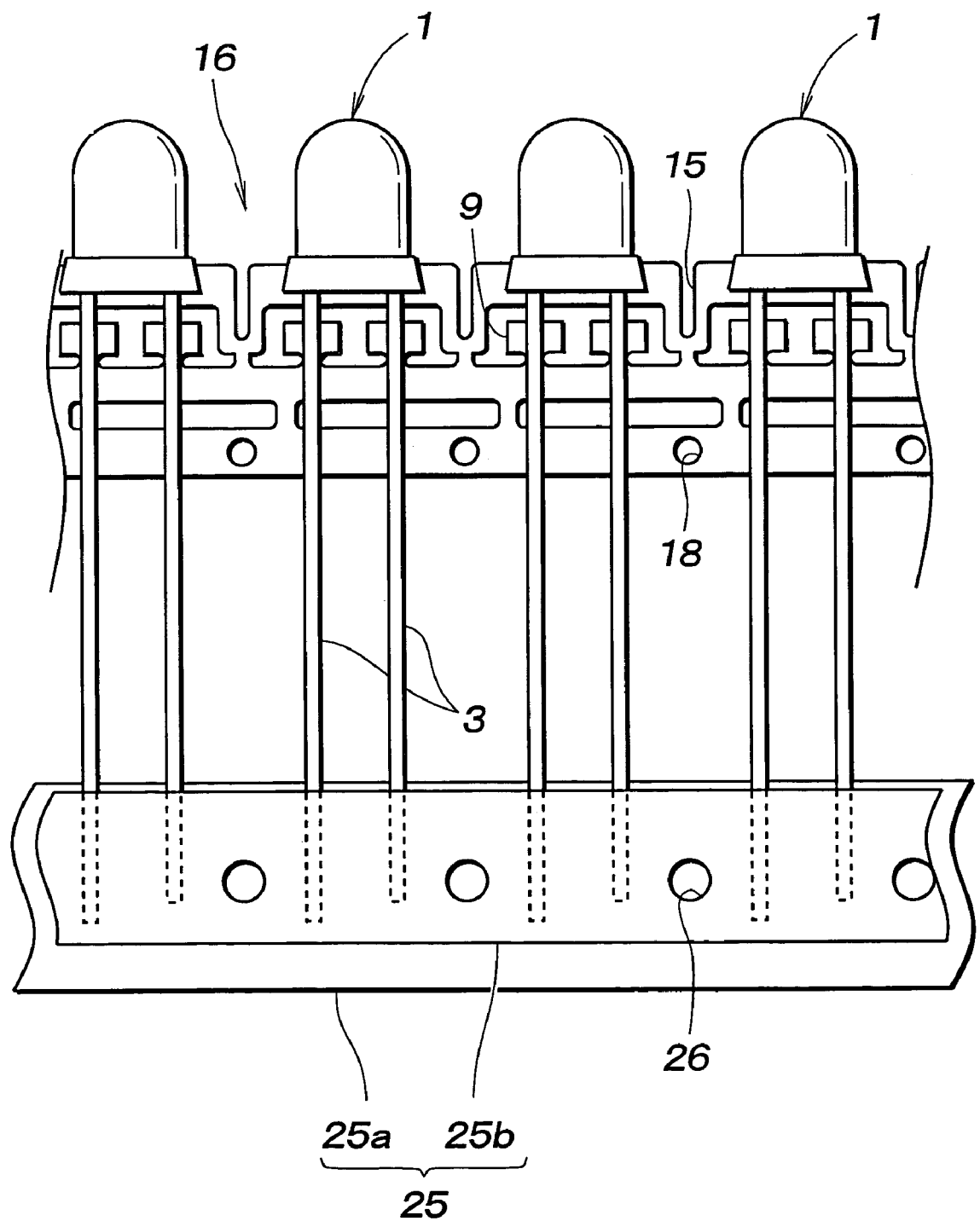
FIG. 5 is a view for showing a state of the light emitting apparatus of FIG. 1 under fabrication.

FIG. 5 shows a state of the light emitting apparatus of FIG. 1 during a manufacturing process. The light sources 1 each consist of a bullet-type LED lamp having a pair of lead wires 3 extending in the same direction, and are held in the radial taping so as to be arranged in a direction perpendicular to the direction of extension of the lead wires 3. A carrier tape 25 for the radial taping consists of a pair of tape members 25a, 25b which are stuck together, and the lead wires 3 are held between the pair of tape members 25a, 25b to retain the light sources 1. Like the tape-shaped patterned conductor 16, the carrier tape 25 is formed with pilot holes 26 so that aligning the pilot holes 18, 26 of the tape-shaped patterned conductor 16 and carrier tape 25 can achieve an axial alignment of the connection parts 9 formed in the patterned conductor 16 and the lead wires 3 of the light sources 1 held by the carrier tape 25. The connection parts 9 are brought into engagement with the lead wires 3 held by the tape 25, and then, the secondary processing of the tape-shaped patterned conductor 16 is carried out. It should be noted, that when the lead wires 3 and the connection parts 9 are engaged, the tape-shaped patterned conductor 16 need be bent along the longitudinal bending line so as to prevent the first trunk path 11 of the patterned conductor 16 from interfering with the main bodies 1a of the light sources 1.

It will be preferable in view of high production efficiency and easy handling to prepare the tape-shaped patterned conductor 16 wound in a coil, and then carry out the above described engagement between the patterned conductor 16 and the light sources 1 while unwinding the patterned conductor 16 in the progressive press machine. Since the first trunk path 11 of the tape-shaped patterned conductor 16 of the present invention is formed with the widthwise cuttings 15 so that the first trunk path 11 comprises a plurality of convexly curved portions, it is possible that the convexly curved portions in an unwound part of the tape-shaped patterned conductor 16 can be bent individually although the rest of the patterned conductor 16 is still wound in coil, to thereby avoid interference between the main bodies 1a of the light sources 1 and the first trunk path 11 of the patterned conductor 16.

Figure 6:
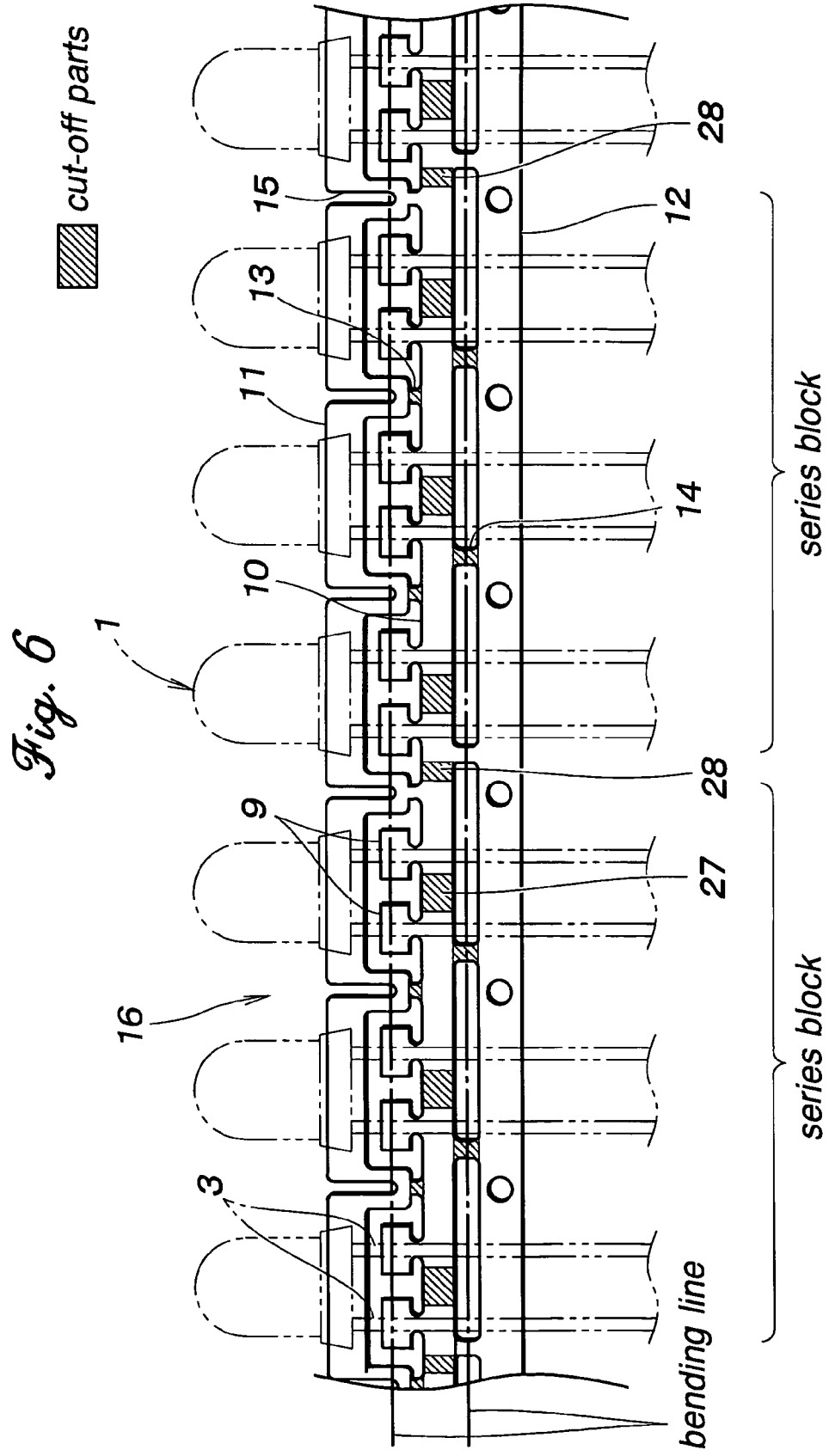
FIG. 6 shows a way of secondary processing of the tape-shaped patterned conductor for achieving a light emitting apparatus of a serial-parallel connection type.

FIG. 6 shows a way of secondary processing of the tape-shaped patterned conductor 16 for forming the light emitting apparatus of a series-parallel connection type shown in FIG. 1. In this drawing, the parts to be cut off are shown by hatching. As shown, parts 27 of the interconnection path 10 located between respective pairs of connection parts 9 each corresponding to a pair of lead wires 3 of a same light source 1 are removed. Further, the branch paths 13, 14 except for those located at ends of a range corresponding to each series connection of the light sources 1 (series block) are cut off. Also, parts 28 of the interconnection path 10 between adjoining series blocks are-cut off. It will be understood that in this way, the coupling pieces 5 of the connective conductor structure 4, for example, can be formed from the interconnection path 10 of the tape-shaped patterned conductor 16. As described above, in the secondary processing, the tape-shaped patterned conductor 16 (or connective conductor structure 4) is bent along the longitudinal bending lines on either side of the interconnection path 10 and secured to the lead wires 3 preferably by cramping them with the connection parts 9. In order to facilitate the bending, it may be possible to beforehand provide the tape-shaped patterned conductor 16 with a notch extending along the bending line. The tape-shaped patterned conductor 16 can be severed at appropriate points such that the resulting light source assembly 6 has a proper length that is easy to handle. The secondary processing of the tape-shaped patterned conductor 16 that can comprise the steps of cutting off, bending, cramping and severing as described above can be carried out by a progressive press machine. It should be noted that the bending of the tape-shaped patterned conductor 16 on a side of the second trunk path 12 that is formed with the pilot holes 18 for engaging the pilot pins of the progressive press machine should be done at a final stage of the progressive press machine. Alternatively, the bending may be done after the light source assembly 6 has been removed from the progressive press machine.

The parts 27 of the interconnection path 10 located between respective pairs of connection parts 9 each for a pair of lead wires 3 of a same light source 1 need be cut off in any connection pattern, and therefore, the tape-shaped patterned conductor 16 may not comprise the parts 27. However, with the parts 27, the connection parts 9 can be steadily supported when engaging the connection parts 9 with the lead wires 3.

Figure 7:
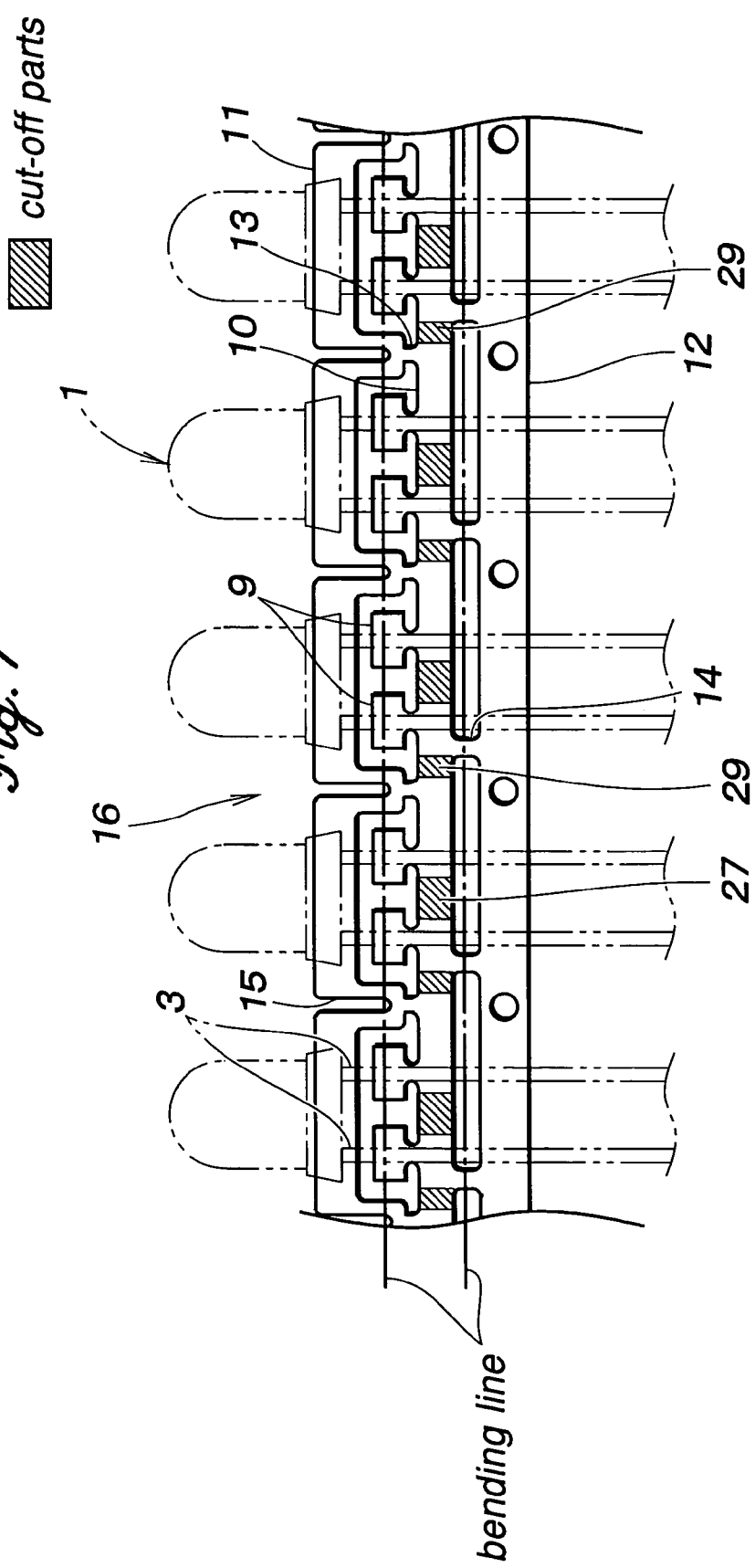
FIG. 7 shows a way of secondary processing of the tape-shaped patterned conductor for achieving a light emitting apparatus of a parallel connection type.

FIG. 7 shows a way of secondary processing of the tape-shaped patterned conductor 16 for making a light source assembly of a parallel connection type. As in the above example, the parts to be cut off are shown by hatching. In addition to the parts 27 of the interconnection path 10 located between respective pairs of connection parts 9 each corresponding to a pair of lead wires 3 of a same light source 1, parts 29 of the interconnection path 10 between connection parts 9 corresponding to the lead wires 3 of adjoining light sources 1 are removed. Further, in a similar manner as in the above example, the patterned conductor 16 is bent along the longitudinal bending lines on either side of the interconnection path 10, and the connection parts 9 are engaged to the lead wires 3 by cramping. In this connection pattern, the branch paths 13, 14 are left without being cut off.

FIG. 8 shows a way of secondary processing of the tape-shaped patterned conductor 16 for making a light source assembly of a series connection type. As in the above examples, the parts to be cut off are shown by hatching. As seen, all the parts 27 of the interconnection path 10 located between respective pairs of connection parts 9 each for a pair of lead wires 3 of a same light source 1 are cut off, and further, all the branch paths 13, 14 as well as the pair of trunk paths 11, 12 are cut off, leaving the mutually separate coupling pieces 5 behind. Each coupling piece 5 comprises a main body extending in the direction perpendicular to the lead wires 3, and the pair of connection parts 9 extend from either end portions of the main body in the direction along the lead wires 3. The lead wires 3 of each light source 1 are electrically and mechanically connected to the lead wires 3 of the adjacent light source 1 via the coupling pieces 5 to form the light source assembly. Thus, in this embodiment; the connective conductor structure 4 is formed only by the coupling pieces 5;

FIG. 9 is a cross-sectional view showing a light emitting apparatus in that a series connection type light source assembly 32 obtained by the secondary processing shown in FIG. 8 is attached to the mount board (holder) 2. In this embodiment, the lead wires 3 at both ends are not engaged with the coupling piece 5, and the other lead wires 3 are cut at the same time when the coupling pieces 5 are separated so that the lead wires 3 do not protrude toward the mount board 2. The lead wires 3 at both ends are cut at a desired length and inserted into mount holes 33 formed in the mount board 2 and connected to a power supply.

FIG. 10 shows another way of secondary processing of the tape-shaped patterned conductor 16 for making a light emitting assembly of a series connection type. As in the above embodiment, the parts to be cut off are shown by hatching. As shown, the parts 27 of the interconnection path 10 located between respective pairs of lead wires 3 of a same light source 1 are removed. Further, in this embodiment, the branch paths 13 connected to the first trunk path 11 are cut off except for the one located at one end (right end in this drawing). Also, the branch paths 14 connected to the second trunk path 12 are cut off except for the one located at the other end (left end in the drawing). In contrast to the above embodiment, this embodiment retains the first and second trunk paths 11, 12 to which the supply voltage may be applied.

Figure 11A:
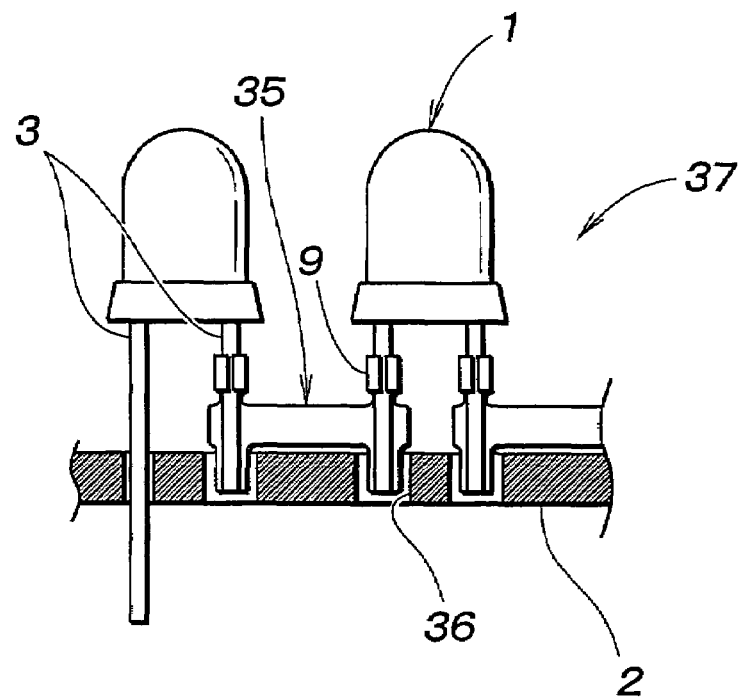
FIGS. 11a and 11b are cross-sectional views for showing different ways of attaching the light source assembly to the holder.
Figure 11B:
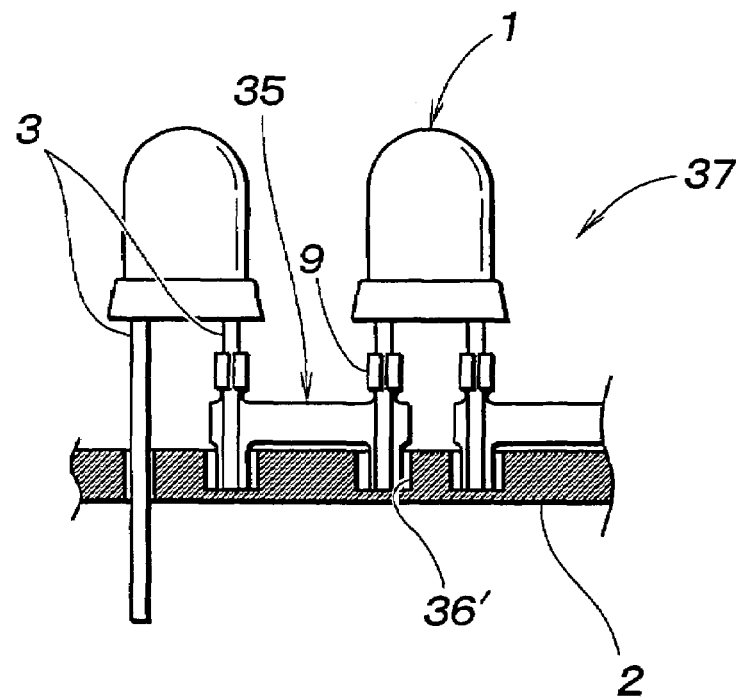

FIG. 11a is a cross-sectional view showing a different example of an attachment of the light source assembly to the holder. In this embodiment, coupling pieces 35 of a light source assembly 37 are formed on either end thereof with a protrusion extending toward the mount board 2 such that each protrusion is aligned with the end of an associated lead wire 3. The end of the lead wire 3 and the protrusion of the coupling piece 35 are together inserted into an associated mount hole 36 formed in the mount board 2 to thereby support the light source assembly 37 on the mount board 2. Such a coupling piece 35 can be formed by providing the branch paths 14 of the tape-shaped patterned conductor 16 of FIG. 4a not only for one, but for both of the pair of connection parts 9 associated with each light source 1 so as to be aligned in the longitudinal direction, and in the secondary processing of the tape-shaped patterned conductor, cutting the branch paths 14 at their root portion near the second trunk path 12 together with the lead wires of the light sources 1 attached to the tape-shaped patterned conductor. It may be possible that one for every several lead wires 3 may protrude to be inserted into the mount holes 36, and in such a case, the number of lead wires 3 inserted in the mount holes 36 can be determined so as to ensure proper support of the light source assembly 37 on the mount board 2 taking into account the rigidity of the lead wires 3 and coupling pieces 35. Further, as shown in FIG. 11b, the mount holes 36 may be recesses 36' instead of through-holes. Such recesses 36' can be formed at a unitary part when the mount board 2 is made by molding, for example, or can be formed by drilling after the molding of the mount board 2. Or the recesses 36' can be formed by providing a plurality of projections on the mount board 2.

Figure 12:
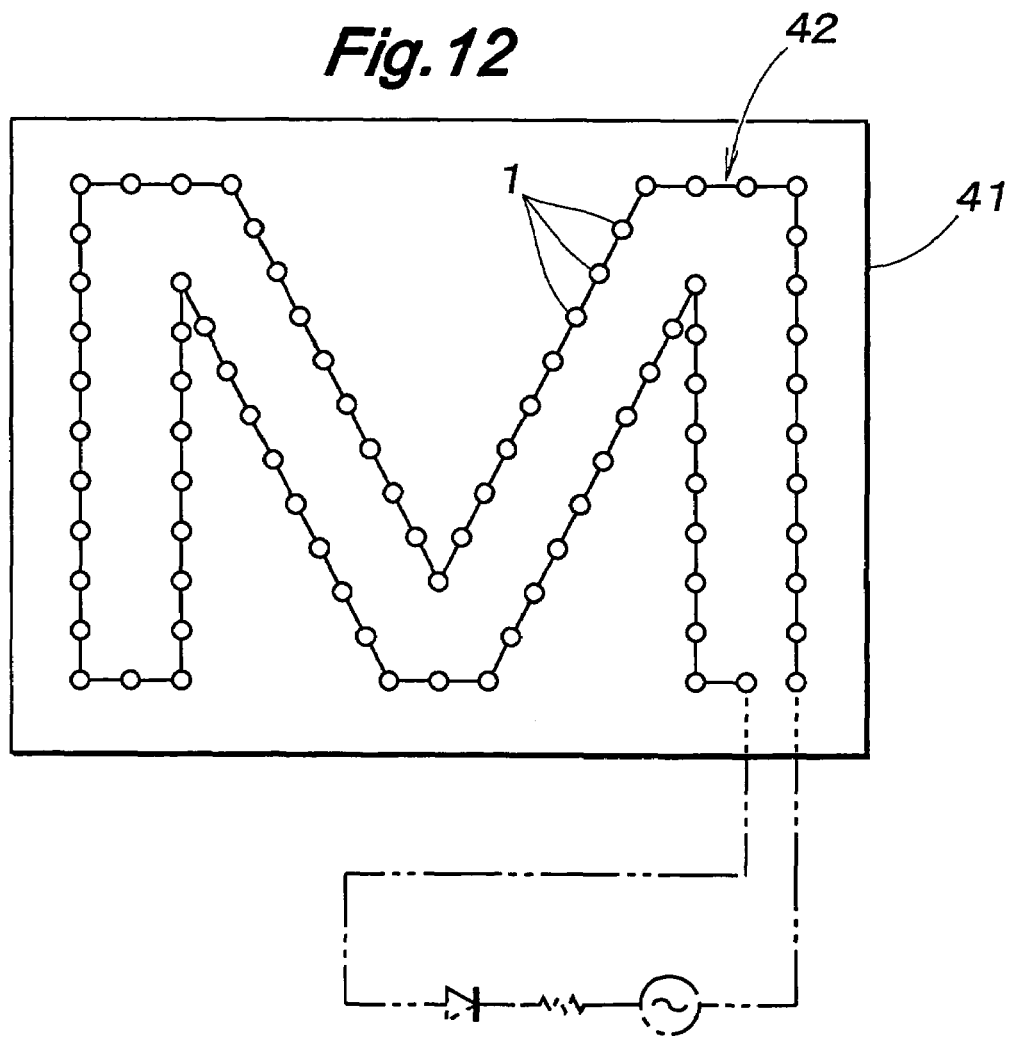
FIG. 12 is a front view showing an embodiment in which the light sources are arranged on a flat surface.
Figure 13:
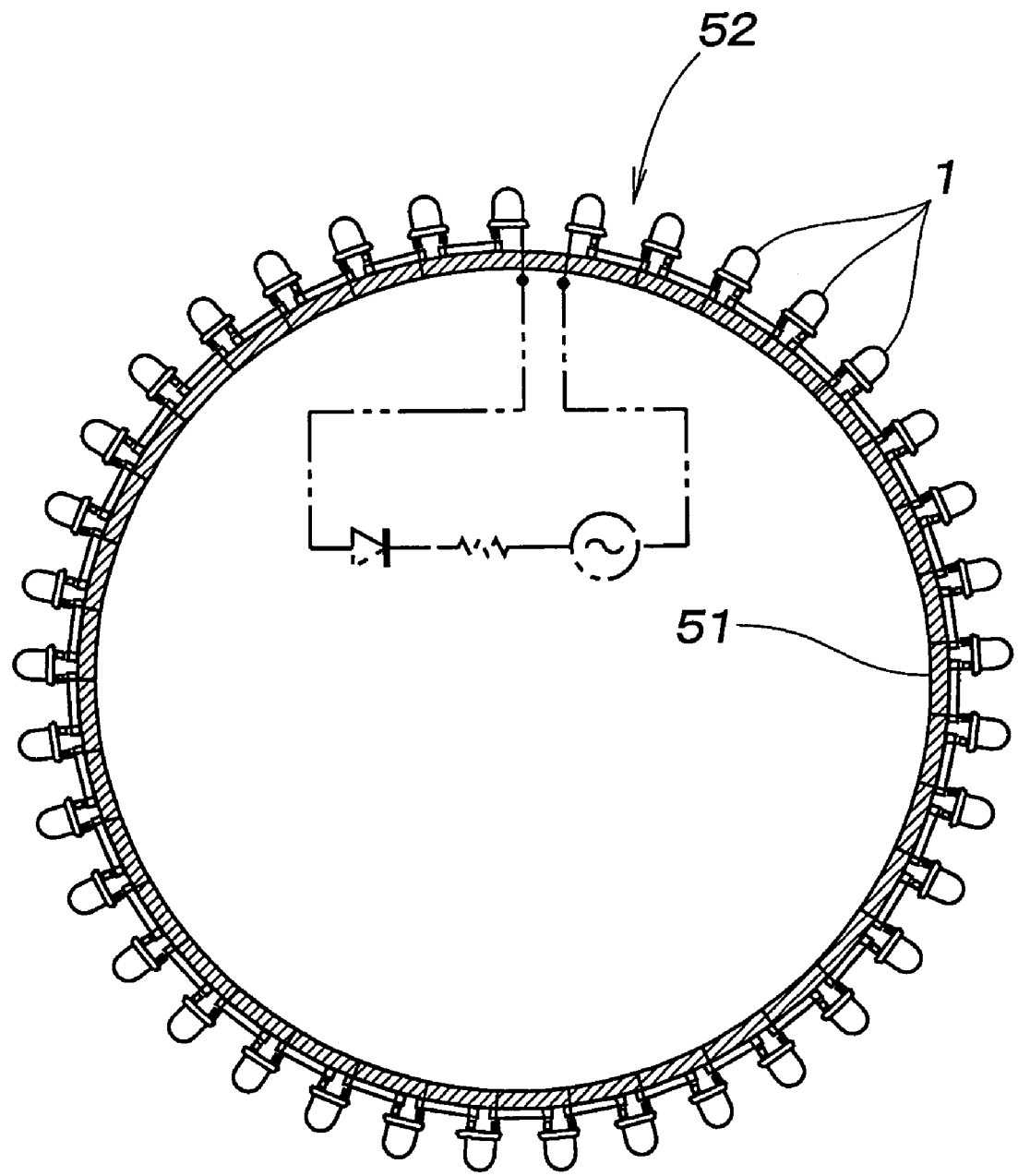
FIG. 13 is a cross-sectional view showing an embodiment in which the light sources are arranged on a curved surface.

FIGS. 12 and 13 show examples of arrangement of the light sources 1 on the holder. FIG. 12 shows an example in which the light sources are arranged on a plane. Specifically, on a surface of a flat holder (mount board) 41, a light source assembly 42 having a plurality of light sources 1 connected by the above-mentioned connective conductor structure 4 are bent at appropriate portions to form a loop such that the line of the light sources of the light source assembly 42 represents a profile of a letter. FIG. 13 shows an example in that the light sources 1 are arranged on a curved surface, and specifically, a light source assembly 52 having a plurality of light sources 1 connected by the above-mentioned connective conductor structure 4 is wound around a holder 51 having a closed shape in cross-section. It is also possible to form a surface light emitting body by arranging light sources densely on a surface of a holder.

Figure 14:
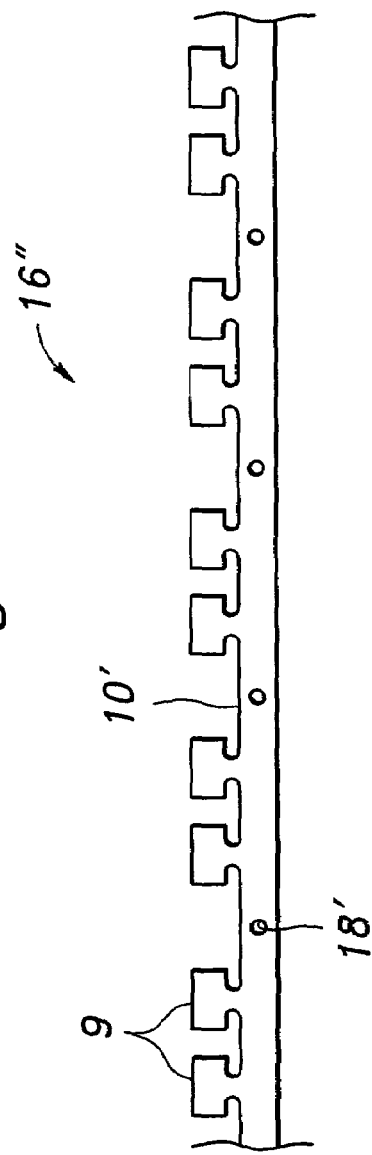
FIG. 14 is a front view showing an embodiment of a tape-shaped patterned conductor suitable for achieving a light emitting apparatus of a serial connection type.
Figure 15:
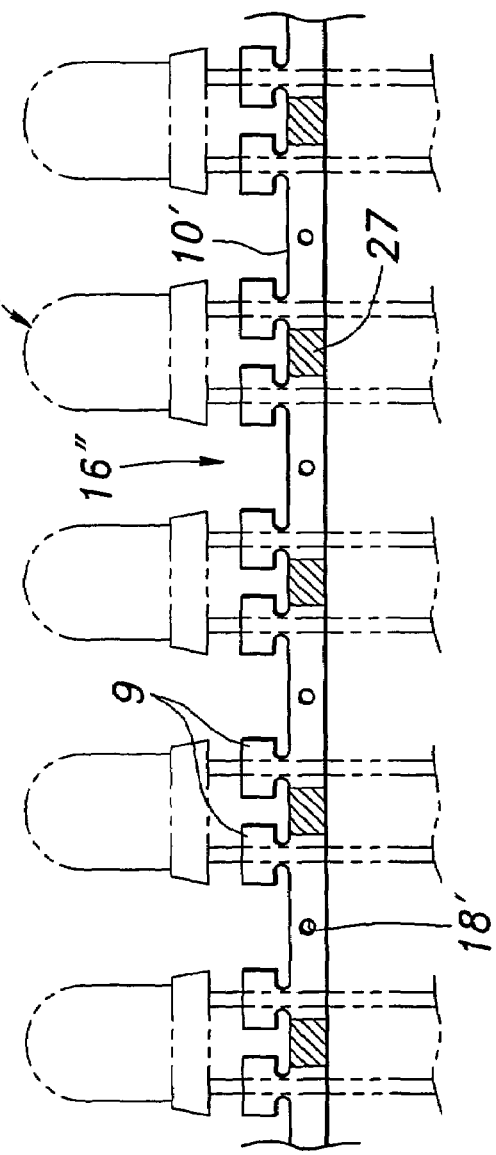
FIG. 15 shows a way of secondary processing of the patterned conductor shown in FIG. 14.

FIG. 14 is a front view showing a modified embodiment of the patterned conductor suitable for forming a series connection of light sources, and FIG. 15 shows a way of secondary processing carried out when attaching the patterned conductor to the light sources (parts to be cut off are shown by hatching). In these drawings, parts similar to those in FIG. 4a or FIG. 6 are denoted with same numerals and detailed explanation thereof is omitted. As shown in the drawings, a patterned conductor 16" for forming a series connection of light sources comprises an interconnection path 10' formed with pilot holes 18' for alignment or transportation in the manufacturing line, and does not poses the first and second trunk paths 11, 12 and the branch paths 13, 14 for connecting the first and second trunk paths 11, 12 to the interconnection path 10 as shown in FIG. 4, and accordingly has a narrower width. In this way, an amount of material not used in the final light source assembly can be reduced to significantly lower the manufacturing cost.

In the above embodiments, LEDs are used as light sources. However, the present invention should not be limited to them, and may be similarly applied to the lamps having lead wires such as cap-less miniature lamps.

As described above, according to the embodiments of the present invention, various light source assemblies having different light source connection patterns can be formed in the same manufacturing line by using a tape-shaped patterned conductor formed with a commonly usable prescribed circuit pattern, whereby advantageously reducing the manufacturing cost of the light emitting apparatus using such a light source assembly. The light sources are unitarily connected in the light source assembly before being attached to the holder, and thus various light source arrangements can be easily achieved. Further, since no complicated machining processes are required in preparing the holder a, it is possible to suppress increase in the manufacturing cost even when a small amount of light source assemblies of various types are manufactured.

In the above embodiments, each light source has a pair of substantially parallel lead wires, which extend along a primary surface of the connective conductor structure (or patterned conductor). However, there may be a case where it is desired to attach the light sources such that the lead wires extend substantially perpendicular to the primary surface of the connective conductor structure or where the light source consists of a so-called chip-type LED having no lead wires. The embodiments below are suitable for such cases.

FIG. 16 is a partial perspective view showing another preferred embodiment of a light source assembly according to the present invention. As shown, the light source assembly 101 uses a plurality of light emitting diodes (LEDs) 102 as light sources, and each LED 102 consists of a bullet-type LED (or lamp-type LED) having a pair of parallel extending lead wires 103. The LEDs 102 are arranged in a direction perpendicular to the lead wires 103, and electrically connected by a substantially plate-like connective conductor structure 104 extending in the direction of arrangement of the LEDs. In the shown embodiment, the LEDs 102 are in a series-parallel connection (i.e., a plurality of series connections of LEDs are connected in parallel), but as described later, may be in a series connection or parallel connection depending on the configuration of the connective conductor structure 104.

The connective conductor structure 104 has first and second trunk paths 111, 112 extending in a longitudinal direction and applied with a power supply voltage, and arranged between the pair of trunk paths 111, 112 are light source attachment portions 105 for connection with the lead wires 103 of the LEDs 102 and an interconnection path 110 for connecting the light source attachment portions 105 in the longitudinal direction. As shown in the drawing, each light source attachment portion 105 has a pair of terminal connection parts 109 for engagement with the pair of lead wires (terminals) 103 of an associated one of the LEDs 102, and in this embodiment, the pair of terminal connection parts 109 are spaced from each other in the longitudinal direction. The first and second trunk paths 111, 112 are electrically connected to the interconnection path 110 at predetermined positions by branch paths 113, 114 extending in a lateral (widthwise) direction, and in the shown embodiment, form a conductor pattern connecting the LEDs 102 in a series-parallel connection. The interconnection path 110 and the first and second trunk paths 111, 112 are mechanically joined by widthwise-extending insulating joint members 115, which are preferably formed by insert molding, so that they are held in a unit.

Figure 17A:
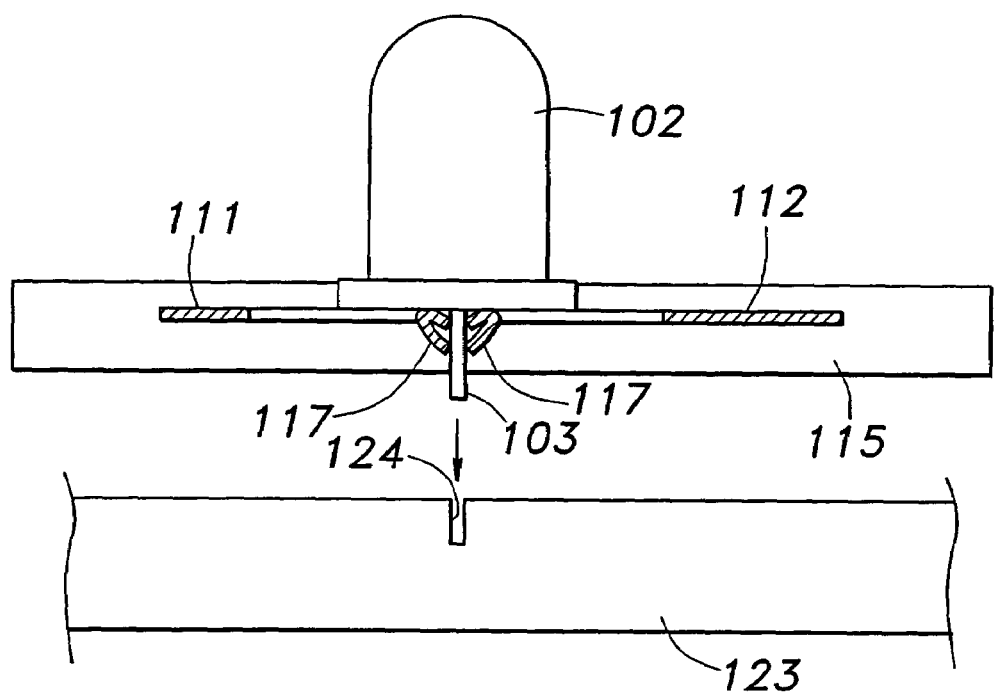
FIG. 17a is a cross-sectional view taken along the lines XVII-XVII in FIG. 16.

Each terminal connection part 109 of the connective conductor structure 104 is formed with a cross-shaped hole 116 so that inserting the lead wire 103 into the hole 116 can achieve mechanical/electrical connection between the LED 102 and the connective conductor structure 104. The cross-shape of the hole 116 provides four internally extending projections, which flex as the lead wire 103 is pushed into the hole 116, to thereby securely hold the lead wire 103. As best shown in FIG. 17a, which is a cross-sectional view taken along the lines XVII-XVII in FIG. 16, after each lead wire 103 is inserted into the associated hole 116, extensions 117, which are provided on both sides of the hole 116 and extend in the widthwise direction, are bent to sandwich or cramp the lead wire 103 therebetween. This contributes to reliably preventing inadvertent escape of the lead wire 103 from the hole 116. After being cramped by the extensions 117, the lead wires 103 are cut so as to have an appropriate length. The lead wires 103 may have been cut to a prescribed length beforehand. As shown, the lead wires 103 may be inserted into associated recesses or holes 124 formed in a mount board (holder) 123 to attach the light source assembly 101 to the holder 123

Other than inserting the lead wire 103 into the hole 116 and cramping the lead wire 103 by the extensions 117, the connection between the lead wire 103 and the terminal connection part 109 can be accomplished by spot welding, supersonic welding, laser welding, etc. It should be noted, however, above described cramping may have advantages such as enabling continuous processing by the progressive pressing machine, eliminating the use of solder and eliminating concern about the heat that would impart undesirable effects on the LEDs 102. It may be possible to adopt both the insertion of the lead wire 103 into the hole 116 and the laser welding. In such a case, the hole 116 having the inward projections as shown in the drawing can contribute to achieving more reliable laser welding because the inward projections are bent and pressed against the lead wire 103 as the lead wire 103 is inserted into the hole 116 and thus can increase the contact area. It may be possible to make a cut in a part of the interconnection path 110 adjacent the hole 116 so as to form a tongue piece, and bend the tongue piece such that the tongue piece and the pair of extensions 117 cramp the lead wire 103 from three directions.

Figure 17B:
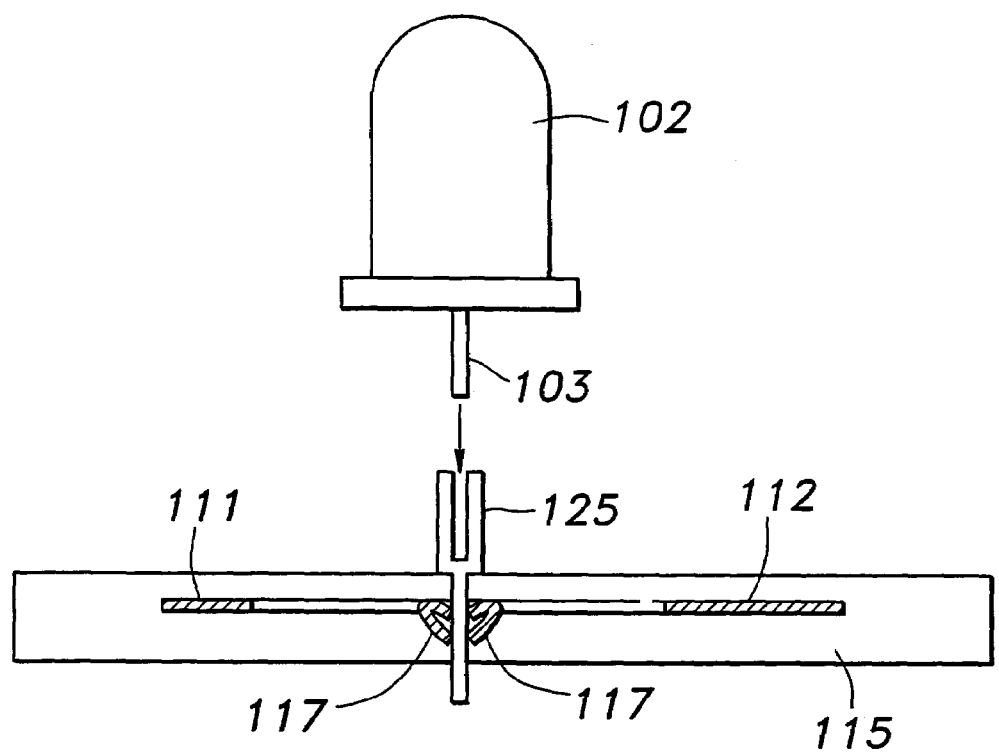
FIG. 17b is a cross-sectional view corresponding to FIG. 17a and showing an embodiment utilizing a socket pin.

Further, as shown in a cross-sectional view of FIG. 17b, a so-called "socket pin" 125 may be inserted into the hole 116 for connection with the lead wire 103. A socket pin comprises a conductor having a pin portion (protruding or male portion) with a socket portion (recessed or female portion) formed on a back side of the pin portion, and may be available as a PD series provided from Mac-Eight, for example. By pushing the pin portion into the hole 116 beforehand, the electrical connection between the LED and the connective conductor structure 104 can be readily achieved by inserting the lead wire 13 into the socket portion of the socket pin.

According to the present invention, the connective conductor structure 104 as described above can be obtained by cutting off parts of a patterned conductor as required in a secondary processing thereof, where the patterned conductor is beforehand formed with a circuit pattern that can be commonly used in series, parallel or series-parallel connections preferably by press working (blanking) a conductive plate material in a primary processing. In this way, by changing the parts to be cut off in the patterned conductor, it is possible to connect the light sources 102 in any of series, parallel or series-parallel connections.

FIG. 18 is a partial plan view showing a preferred embodiment 120 of the patterned conductor before the secondary processing. In this drawing, parts corresponding to those of the connective conductor structure 104 shown above are denoted with same reference numerals. As shown in the drawing, the patterned conductor 120 has a longitudinal tape-like shape with a self-supportive feature (or its parts are unitary), wherein the interconnection path 110 extends in the longitudinal direction to connect the light source attachment portions 105. The first and second trunk paths 111, 112 are disposed on either side of the patterned conductor 120 so as to interpose the interconnection path 110 and the light source attachment portions 105 therebetween. Each terminal connection part 109 of each light source attachment portion 105 is connected to the first and second trunk paths 111, 112 via associated branch paths 113, 114. The interconnection path 110 comprises a plurality of connection paths 121 each coupling a pair of terminal connection parts 109 that are to engage lead wires 103 of adjoining, different LEDs 102 (i.e., that are contained in adjoining light source attachment portions 105). The joint members 115 formed by insert molding can be disposed on the connection paths 121 (see FIG. 16). In forming the joint members 115, a part of each joint member 115 aligned with the associated connection paths 121 is formed with a hole 119 to expose the connection path 121 (a part of the connection path 121 exposed by the hole 119 is called a bridge portion 121A (see FIGS. 19-21)). In this way, after the joint members 115 are formed, a punch of a press machine (not shown) can be inserted into the hole 119 to cut off the bridge portion 121A to whereby separate the terminal connection parts 109 that were connected by the connection path 121.

As described above, the patterned conductor 120 is converted into the connective conductor structure 104 having a circuit with a prescribed connection pattern by carrying out the secondary processing to cut off parts as required depending on usages, and the secondary processing can be preferably conducted after the trunk paths 111, 112 and the interconnection path 110 are joined together by the joint members 115 formed by insert molding. By doing so, it is possible to prevent the parts of the resulting connective conductor structure 104 from being separated apart. It will be efficient if such formation of the joint members 115 by insert molding as well as secondary processing of the patterned conductor 120 are carried out in a continuous manufacturing line. Therefore, in order to allow transportation/alignment in the manufacturing line, the second trunk path 112 is formed with pilot holes 118 for engagement with pilot pins of a progressive press machine (not shown), for example.

The patterned conductor 120 as described above can be preferably obtained by press working (more specifically, blanking) a conductive plate material made of metal such as aluminum or copper. Aluminum is not used in printed circuit board because of its poor affinity with solder, but has an advantage of a low specific gravity (about one third of that of copper) and thus is suitable for making a lighter product. Further, aluminum is also preferred in view of having a high thermal conductivity (several times that of copper) as well as a high electric conductivity. Also, while the copper film on a printed circuit board is about 35 μm, the patterned conductor can be as thick as 100-300 μm, allowing a larger electric current to flow. This is also favorable in view of heat dissipation. The patterned conductor 120 may be alternatively formed by photo-etching the conductive plate material, or cutting the same by means of wire-cutting, laser or electrical discharge machining. Die-casting such as magnesium molding may also be used. The patterned conductor 120 is flexible and can be freely curved or bent, and thus, can be wound in a coil or folded in an accordion fashion so that it can be easily stored, transported or packaged.

Figure 21:
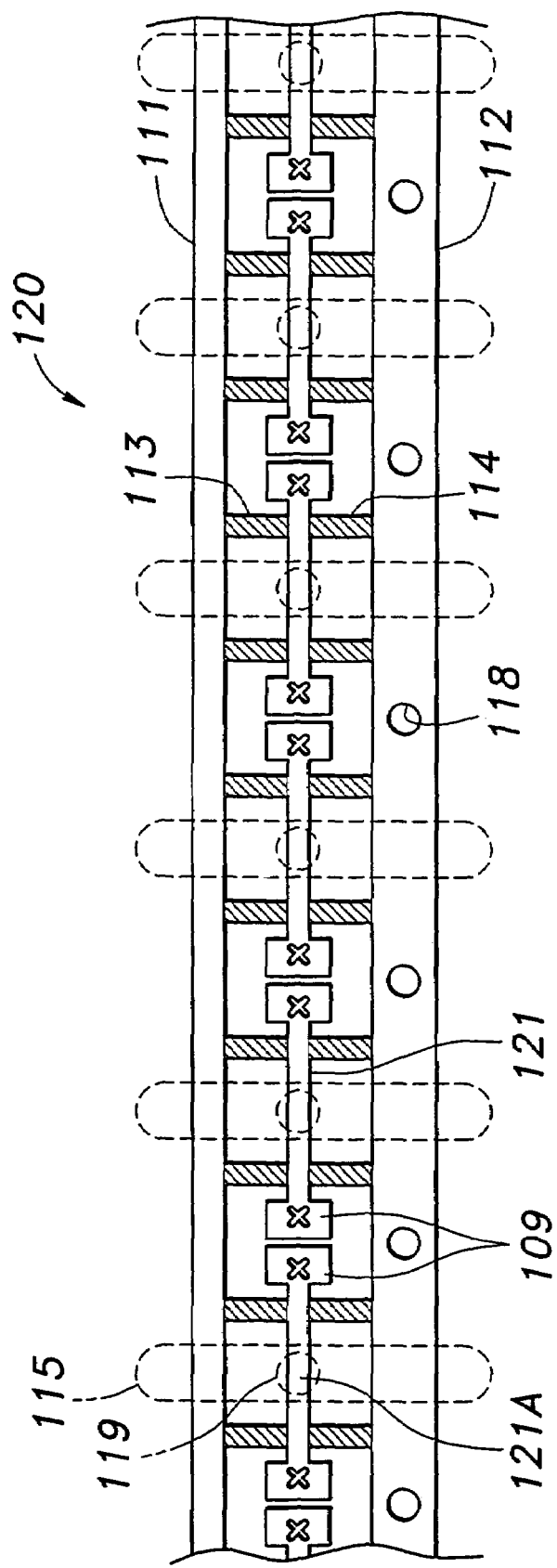
FIG. 21 shows a way of secondary processing of the patterned conductor of FIG. 18 to form a light source assembly in which the light sources are connected in series.

FIGS. 19-21 show ways of secondary processing of the patterned conductor 120 for connecting the LEDs 102 in series-parallel, series, and parallel connections, respectively. In these drawings, parts to be cut off are shown by hatching. Further, in order to help understand the positions to be cut off, the joint members 115 having the hole 119 are shown in broken lines.

The example of FIG. 19 provides a connective conductor structure that can connect a plurality of series connections of three LEDs 102 (series blocks) in parallel between the trunk paths 111, 112. Specifically, the bridge portions 121A of the connection paths 121 located between adjoining series blocks are cut off, and the connection paths 121 coupling the terminal connection parts 109 within each series block remain intact. The branch paths 113, 114 within each series block are cut off except for a branch path 113 connecting to the first trunk path 111 at one end and a branch path 114 connecting to the second trunk path 112 at the other end. It should be understood that the number of LEDs 102 contained in each series block can be varied by changing the removed branch paths 113, 114 and bridge portions 121A, and thus is not limited to three. In the example of FIG. 19, the bridge portions 121A connecting the adjoining LEDs 102 contained in the same series block (or connecting the terminal connection parts contained in the adjoining light source attachment portions 105) remain uncut. However, as shown by broken lines in the perspective view in FIG. 16, when a resistor 122 is connected to the interconnection path 110 by spot welding or laser welding, for example, to insert the resistor 122 between adjoining LEDs 102, the bridge portion 121A to be located between a pair of terminals of the resistor 122 may be cut off. Similarly, as also shown by broken lines, when the resistor 122 is connected between the interconnection path 110 and the second trunk path 112, the branch path 114 at the corresponding position should be cut off. This similarly applies to the case where a resistor is connected between the interconnection path 110 and the first trunk path 111.

In an example of FIG. 20, the bridge portions 121A are all cut off, and the branch paths 113, 114 are cut off such that one of the pair of terminal connection parts 109 connected to each LED 102 (or in a same light source attachment portion 105) is connected to the trunk path 111 while the other is connected to the trunk path 112. This provides a connective conductor structure for connecting the LEDs 102 mounted to the light source attachment portions 105 in parallel between the trunk paths 111, 112.

In an example of FIG. 21, all of the branch paths 113, 114 are cut off while the bridge portions 121A are all left uncut so that a series connection of the LEDs 102 is formed between the trunk paths 111, 112. It can be said that each connection path 121 and the pair of terminal connection parts 109 connected by the connection path 121 form a coupling piece for connecting adjacent LEDs 102. In the light source assembly 101 comprising thus-formed connective conductor structure for connecting the LEDs 102, the supply voltage may be applied to the lead wires 103 of the LEDs 102 positioned at the ends of the LED series connection, for example, without using the trunk paths 111, 112. However, it may be also possible to retain appropriate branch paths 113, 114 so as to connect the LED series connection to the trunk paths 111, 112, whereby the LED series connection is supplied with a voltage via the trunk paths 111, 112 connected to the power supply. Only one of the trunk paths 111, 112 may be used for such connection to the power supply.

As described above, according to the preferred embodiments of the present invention, connective conductor structures 104 having various connection patterns (and the light source assembly 101 using them) can be formed from the commonly used patterned conductor by varying the cut off branch paths 113, 114 and bridge portions 121a. The secondary processing of the patterned conductor for forming the connective conductor structure 104 can be preferably achieved by press working in which selection of the branch paths 113, 114 and bridge portions 121A to be cut off for forming connective conductor structures 104 having different connection patterns can be computer controlled, and therefore, there is no need to replace a die of the press machine, and this eliminates the time loss or erroneous operations which may result from the die replacement work, and thus contributes to improvement in the production efficiency and reduction in the manufacturing cost. Further, because no printed circuit boards are used in forming the light source assembly 101, it is possible to eliminate solder which is usually used for connection with the printed circuit board. This not only reduces undesirable affects on environment but also eliminates undesirable effects of heat generated when using the solder on the light sources (LEDs). The light source assembly is of quite a simple structure constituted by the light sources (LEDs) and the connective conductor structure, and thus can be disassembled easily and, in combination with no use of the printed circuit board which typically is hard to recycle, can be recycled efficiently.

Figure 22:
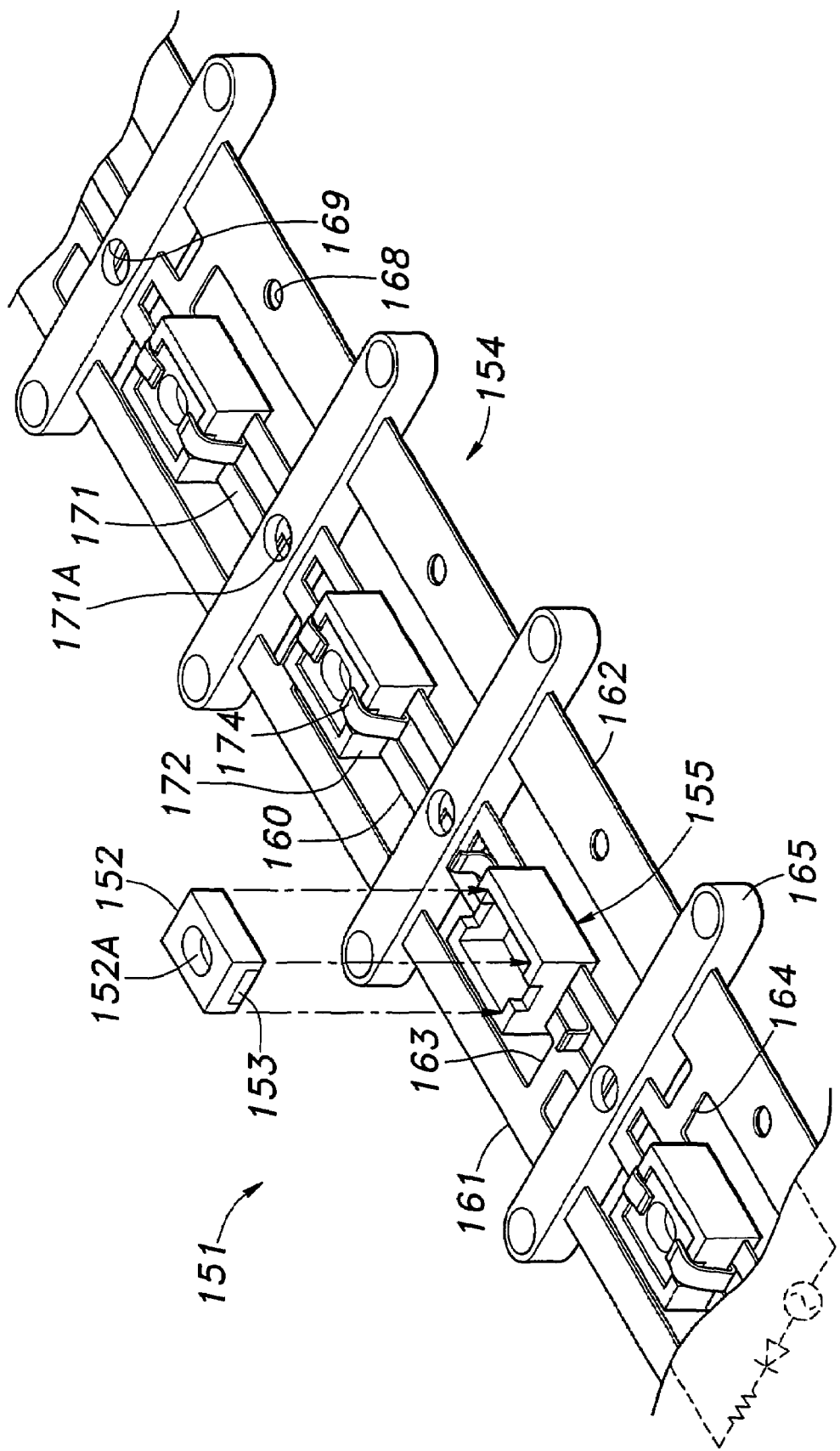
FIG. 22 is a perspective view showing another embodiment of a light source assembly according to the present invention.

FIG. 22 is a partial perspective view showing another embodiment of a light source assembly according to the present invention. A light source assembly 151 shown in FIG. 22 uses normal-view chip-type LEDs (or surface mount type LEDs) 152 each of which has, instead of the lead wires 103, a pair of electric connection terminals 153 extending from its side to bottom and has a light emitting portion 152A on its top. Commercially available chip-type LEDs comprise quite small ones having longitudinal, lateral and height dimensions each less than few millimeters, and therefore, the light source assembly 151 using such LEDs can have a small size.

Figure 25:
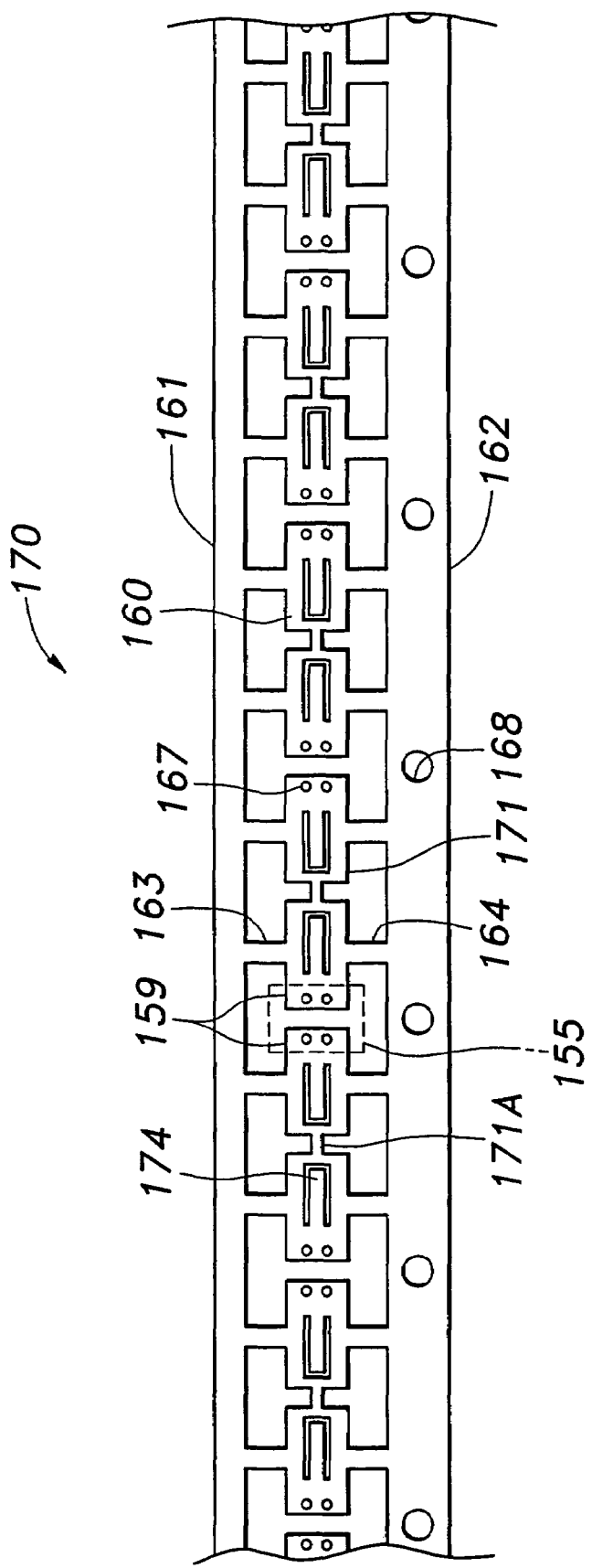
FIG. 25 is a plan view of a patterned conductor used in forming the light source assembly shown in FIG. 16.

In a similar manner as in the embodiment shown before, the LEDs 152 are electrically connected by a connective conductor structure 154 formed by carrying out secondary processing of a substantially plate-like patterned conductor 170 (see FIG. 25). Also similarly, the connective conductor structure 154 comprises first and second trunk paths 161, 162 extending in the longitudinal direction and applied with power supply voltage, and arranged between the pair of trunk paths 161, 162 is an interconnection path 160 for longitudinally connecting light source attachment portions 155 (see FIG. 25) for connection with the LEDs 152. The first and second trunk paths 161, 162 are electrically connected to the interconnection paths 160 at predetermined positions by branch paths 163, 164 extending in a widthwise direction, and in the shown embodiment, form a conductor pattern connecting the LEDs 152 in a series-parallel connection. In a similar manner as in the embodiment of FIG. 16, the second trunk path 162 is formed with pilot holes 168 for facilitating handling in the progressive press machine. Further, the interconnection path 160 and the first and second trunk paths 161, 162 are mechanically joined by widthwise-extending insulating joint members 165, which are formed by insert molding.

In this embodiment, substantially box-shaped sockets 172 each having an opening in its top for receiving an associated chip-type LED 152 are formed at positions aligned with the light source attachment portions 155 of the connective conductor structure 154. Such a socket 172 can be preferably formed by insert molding.

Figure 23:
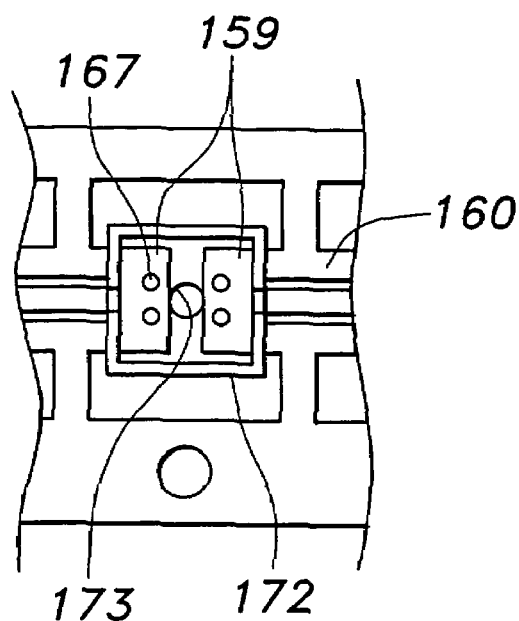
FIG. 23 is a top view of a socket without an LED.
Figure 24:
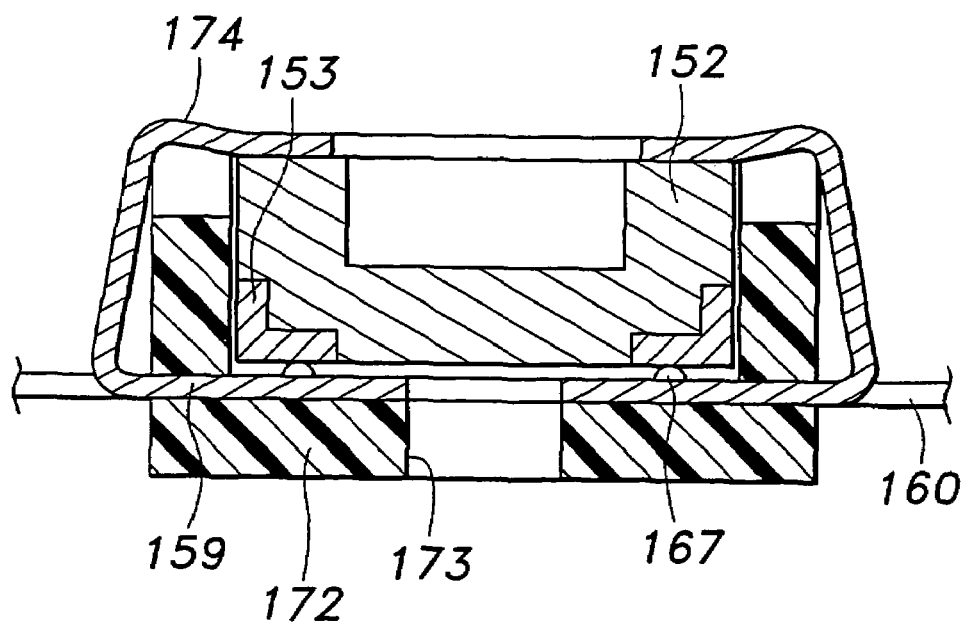
FIG. 24 is a cross-sectional view showing the socket with the LED installed therein.

FIG. 23 is a top view showing the socket 172 without the LED 152 fitted therein (the one second to the left in FIG. 22), and FIG. 24 is a side cross-sectional view showing the socket 172 fitted with the LED 152 (left end one in FIG. 22, for example). As seen in these drawings, each of the light source attachment portions 155 of the connective conductor structure 154 has a pair of longitudinally spaced terminal connection parts 159, which are positioned over a bottom wall of the associated socket 172 and exposed-so that upon insertion of the LED 152 into the socket 172, the terminals of the LED 152 and the terminal connection parts 159 of the connective conductor structure 154 contact each other. In order to ensure the contact between the terminals 153 of the LED 152 and the terminal connection parts 159, a small projection 167 is provided on a surface of each terminal connection part 159. The bottom wall of each socket 172 is formed with a hole 173, making it possible to push the LED 152 in the socket 172 through the hole 173 to thereby remove the LED 152 from the socket 172. This can facilitate replacement of a malfunctioning LED 152 with a normal one.

As in the embodiment of FIG. 16, the connective conductor structure 154 in the embodiment shown in FIGS. 22-24 also can be preferably formed by cutting off parts of a plate-shaped patterned conductor as required in a secondary processing thereof, where the patterned conductor has a prescribed circuit pattern. FIG. 25 is a plan view showing a patterned conductor 170 suitable for use in the embodiment of FIGS. 22-24 in a state before being applied with the secondary processing. In this drawing, parts corresponding to those shown in FIGS. 22-24 are denoted with same reference numerals.

Like the patterned conductor 120 shown in FIG. 18, this patterned conductor 170 is also has a longitudinal tape-like shape, in which the interconnection path 160 extends longitudinally to connect the light source attachment portions 155 in the longitudinal direction. The first and second trunk paths 161, 162 are disposed on either side of the patterned conductor 170 so as to interpose the interconnection path 160 and the light source attachment portions 155 therebetween. Each terminal connection part 159 of each light source attachment portion 155 is connected to the first and second trunk paths 111, 112 via associated branch paths 163, 164. The interconnection path 160 comprises a plurality of connection paths 171 each coupling a pair of terminal connection parts 159 that are to engage lead wires 153 of adjoining, different LEDs 152 (i.e., that are contained in adjoining light source attachment portions 155). The joint members 165 formed by insert molding can be disposed on a longitudinally middle portion of the associated connection paths 171 (see FIG. 22). In forming the joint members 165, a portion of each joint member 165 aligned with the associated connection path 171 is formed with a hole 169 to expose the connection path 171 (a part of the connection path 171 exposed by the hole 169 is referred to as a bridge portion 171A). In this way, after the joint members 165 are formed, a punch of a press machine (not shown) can be inserted into the hole 169 to cut off the bridge portion 171A to whereby separate the terminal connection parts 159 that were connected by the connection path 171. In this embodiment, each bridge portion 171A exposed by the associated hole 169 of the joint member 165 is formed with a relatively narrow width to ensure the exposure of the bridge portion 171A by the hole 169 and to facilitate cutting off of the same. It should be noted that the bridge portion 171A may have an arbitrary shape, and may comprise two narrow paths crossing each other, for example. Further, in order to facilitate cutting, it is possible to form perforations in appropriate portions of the connection path 171

In this embodiment, longitudinally extending tongue pieces 174 are formed by making a cut in portions of the connection paths 171 adjacent to the terminal connection parts 159 of the light source attachment portions 155. As shown in the perspective view of FIG. 22 and in the cross-sectional view of FIG. 24, in the assembled state, the tongue pieces 174 are raised to stand upright and bent to press the top of the LEDs 152 received in the sockets 172 so as to prevent inadvertent removal of the LEDs 152 from the sockets 172.

Figure 26:
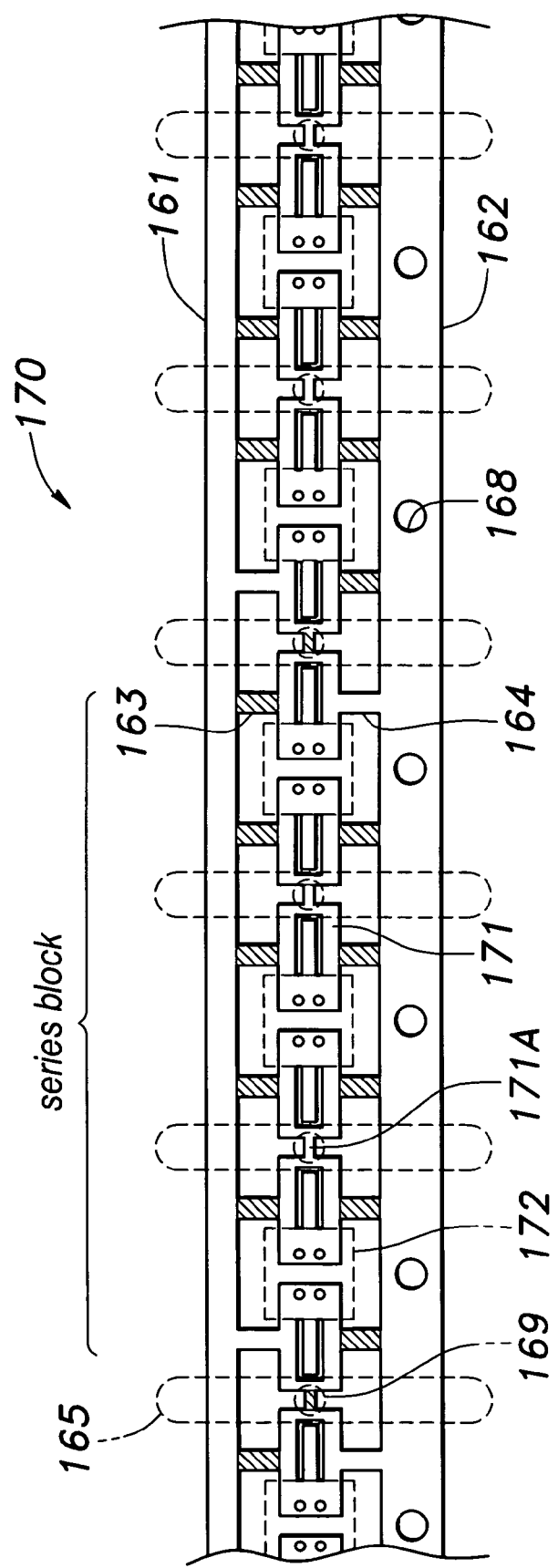
FIG. 26 shows a way of secondary processing of the patterned conductor shown in FIG. 25 to form a light source assembly in which the light sources are connected in series-parallel connection.
Figure 27:
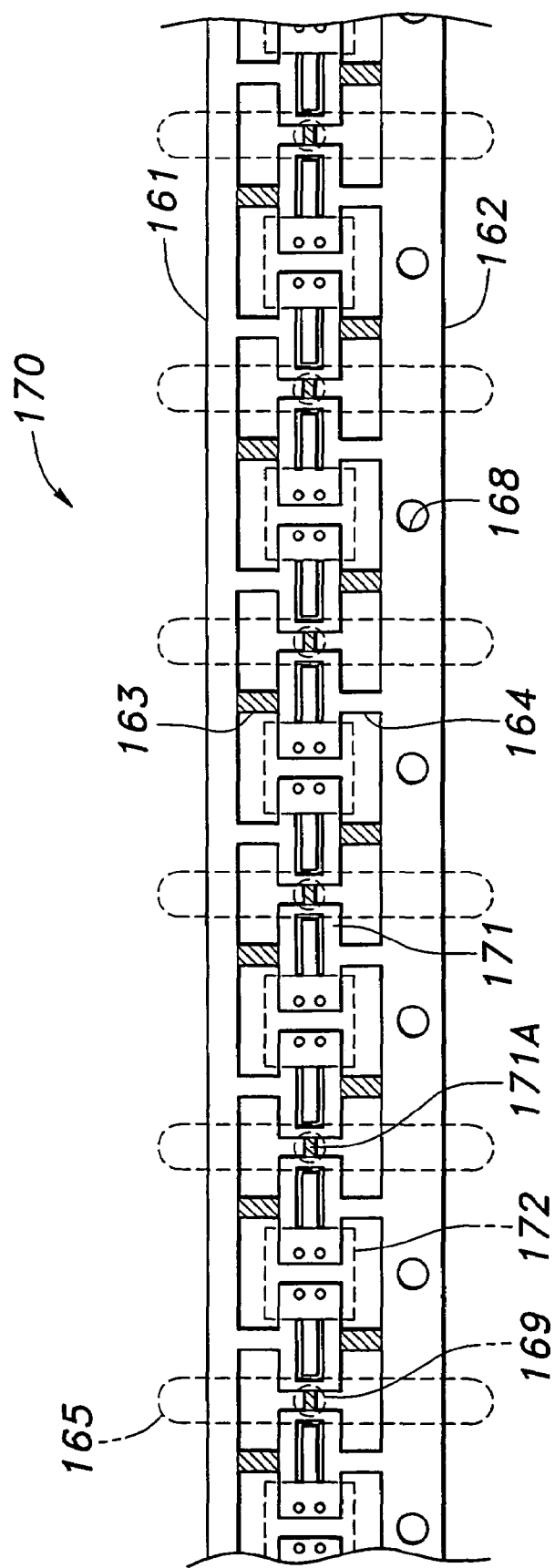
FIG. 27 shows a way of secondary processing of the patterned conductor shown in FIG. 25 to form a light source assembly in which the light sources are connected in parallel.
Figure 28:
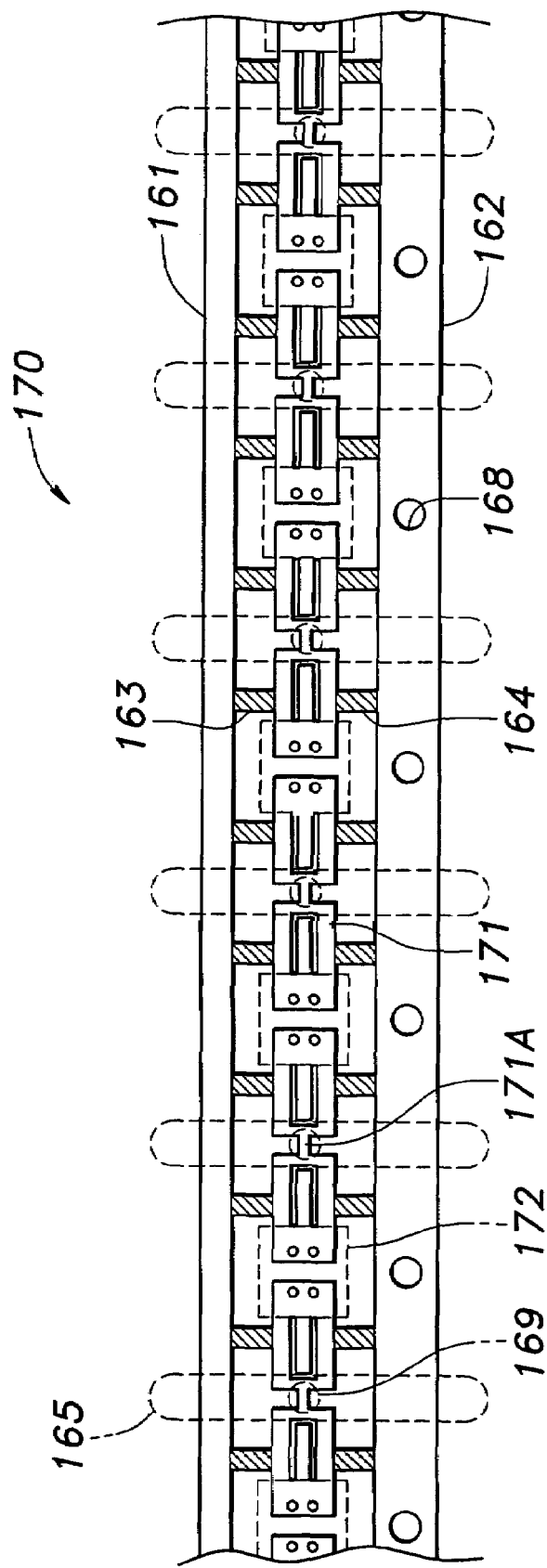
FIG. 28 shows a way of secondary processing of the patterned conductor shown in FIG. 25 to form a light source assembly in which the light sources are connected in series.

FIGS. 26-28 show ways of secondary processing of the patterned conductor 170 for forming the connective conductor structure 154 adapted for series-parallel, series, and parallel connections, respectively. As in FIGS. 19-21, parts to be cut off are shown by hatching. Further, in order to help understand the positions to be cut off, the joint members 165 and the sockets 172 are shown in broken lines. Since FIGS. 26-28 are substantially the same as FIGS. 19-21, detailed explanation thereof is omitted, but it will be understood from the drawings that connective conductor structures 154 having various connection patterns can be formed from the patterned conductor 170.

Figure 29:
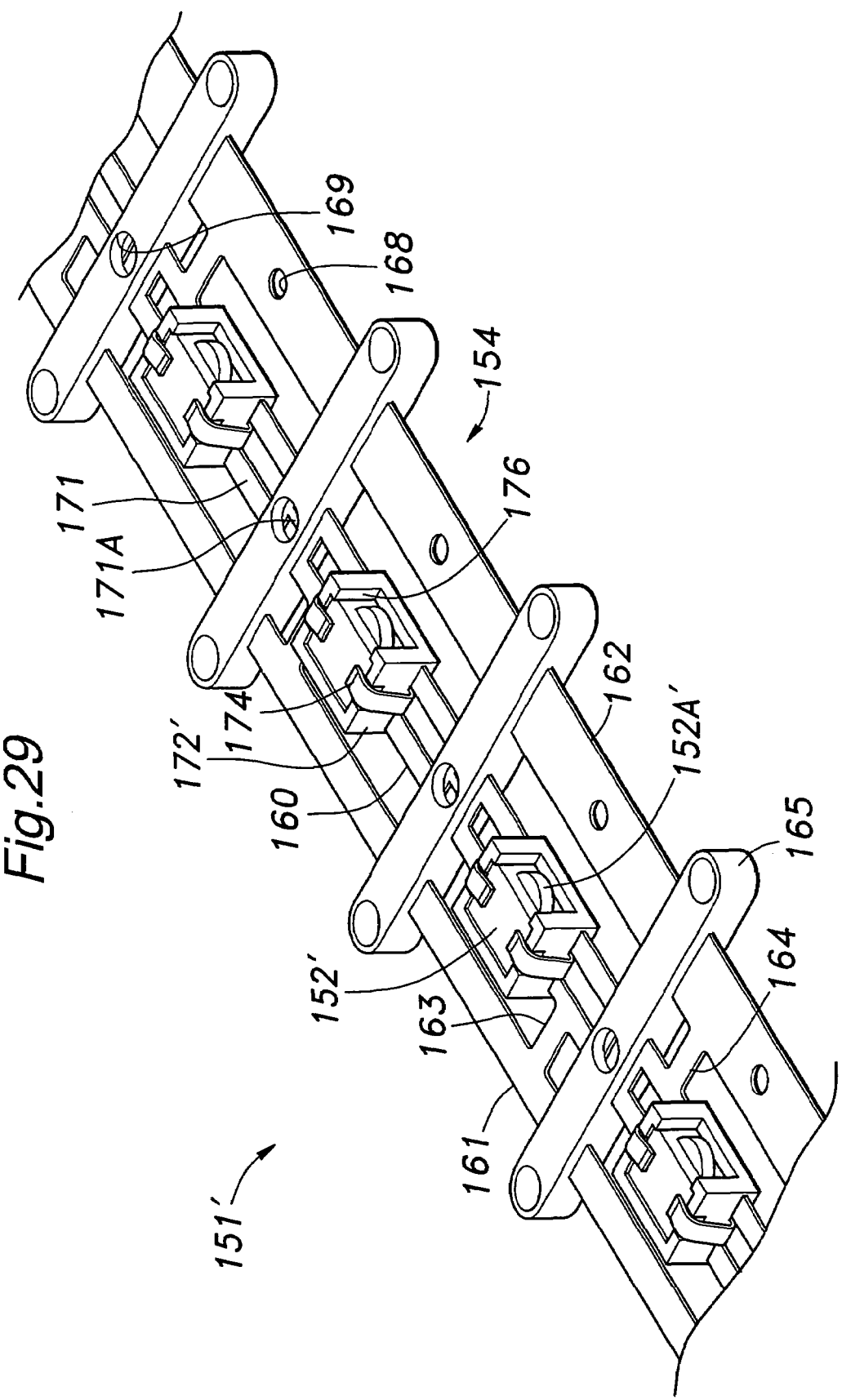
FIG. 29 is a perspective view showing a modified embodiment of the light source assembly shown in FIG. 22.

FIG. 29 is a partial perspective view showing an embodiment modified from that of FIG. 22. In FIG. 29, parts similar to those in FIG. 22 are denoted with same reference numerals and detailed description thereof is omitted. This light source assembly 151' is different from the embodiment shown in FIG. 22 in that so-called side-view LEDs 152' which have a light emitting portion on a side surface are used as light sources in the light source assembly 151'. Sockets 172' for receiving the LEDs 152' have a side wall, part of which is cut away to form an opening 176 so as not to block the light emitted from the LED 152'. Is should be noted that both lateral side walls of each of the sockets 172' may be provided with an opening so that the LEDs 152' can be situated to face different ways to emit light in both lateral directions.

Figure 30:
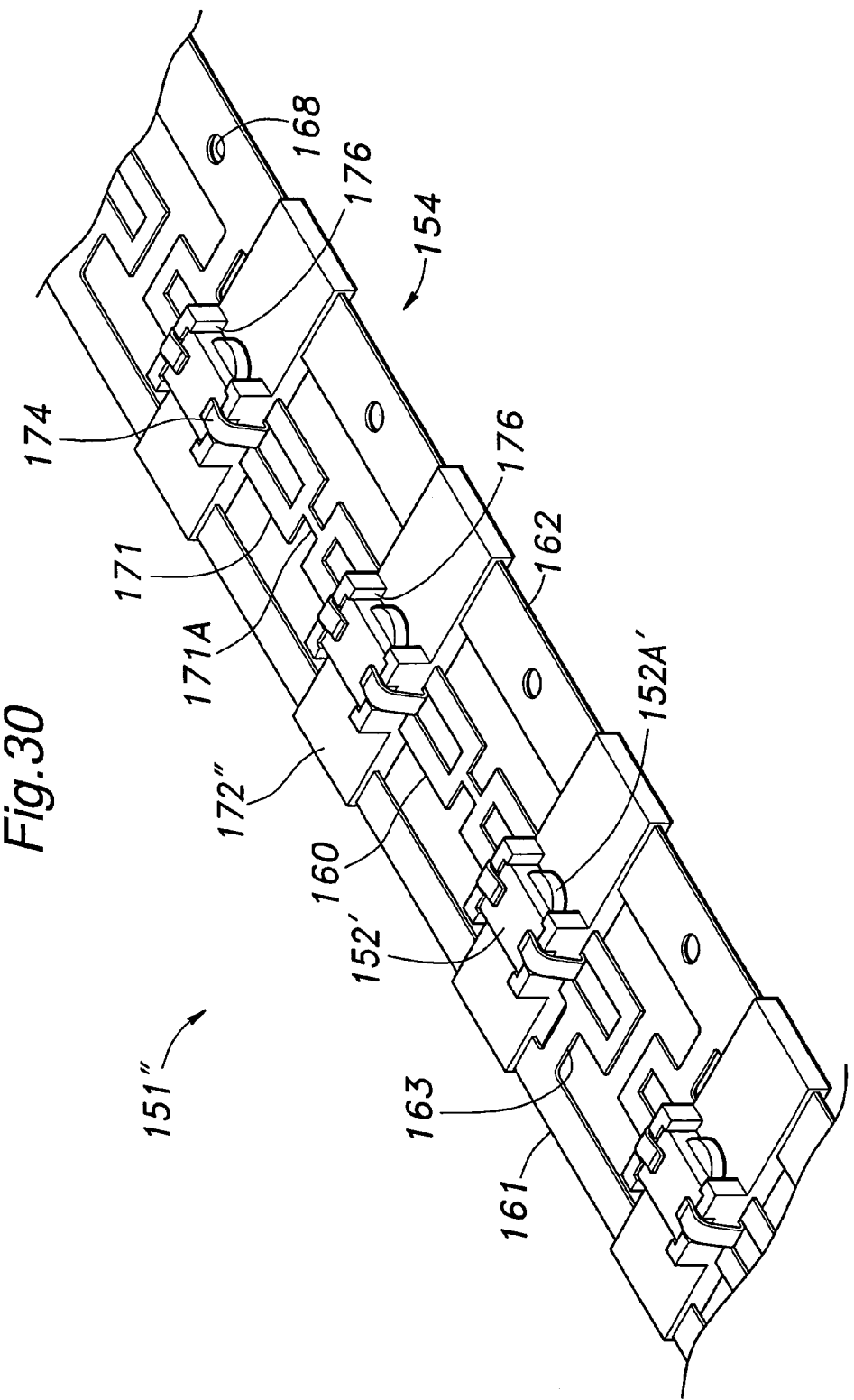
FIG. 30 a perspective view showing another modified embodiment of the light source assembly shown in FIG. 22.

FIG. 30 is a partial perspective view showing another embodiment modified from that of FIG. 22. In FIG. 30, parts similar to those in FIGS. 22, 29 are denoted with same reference numerals and detailed description thereof is omitted. This light source assembly 151" is different from the embodiment shown in FIG. 22 in that the light source assembly 151" comprises sockets 172" each extending over a whole width of the connective conductor structure 154 so as to function as joint members as well. This can reduce the number of parts formed by insert molding to thereby lower the manufacturing cost. Further, in a similar fashion to the embodiment of FIG. 29, part of side walls of each socket 172" is cut away to form an opening 176 so that the side-view LED 152' may be used as a light source. Since the opening 176 is provided on both lateral sides of each socket 172", the LEDs 152' can be disposed to face opposite direction from that shown in FIG. 30. It is of course possible to use the normal-view LEDs 152 as light sources.

Figure 31:
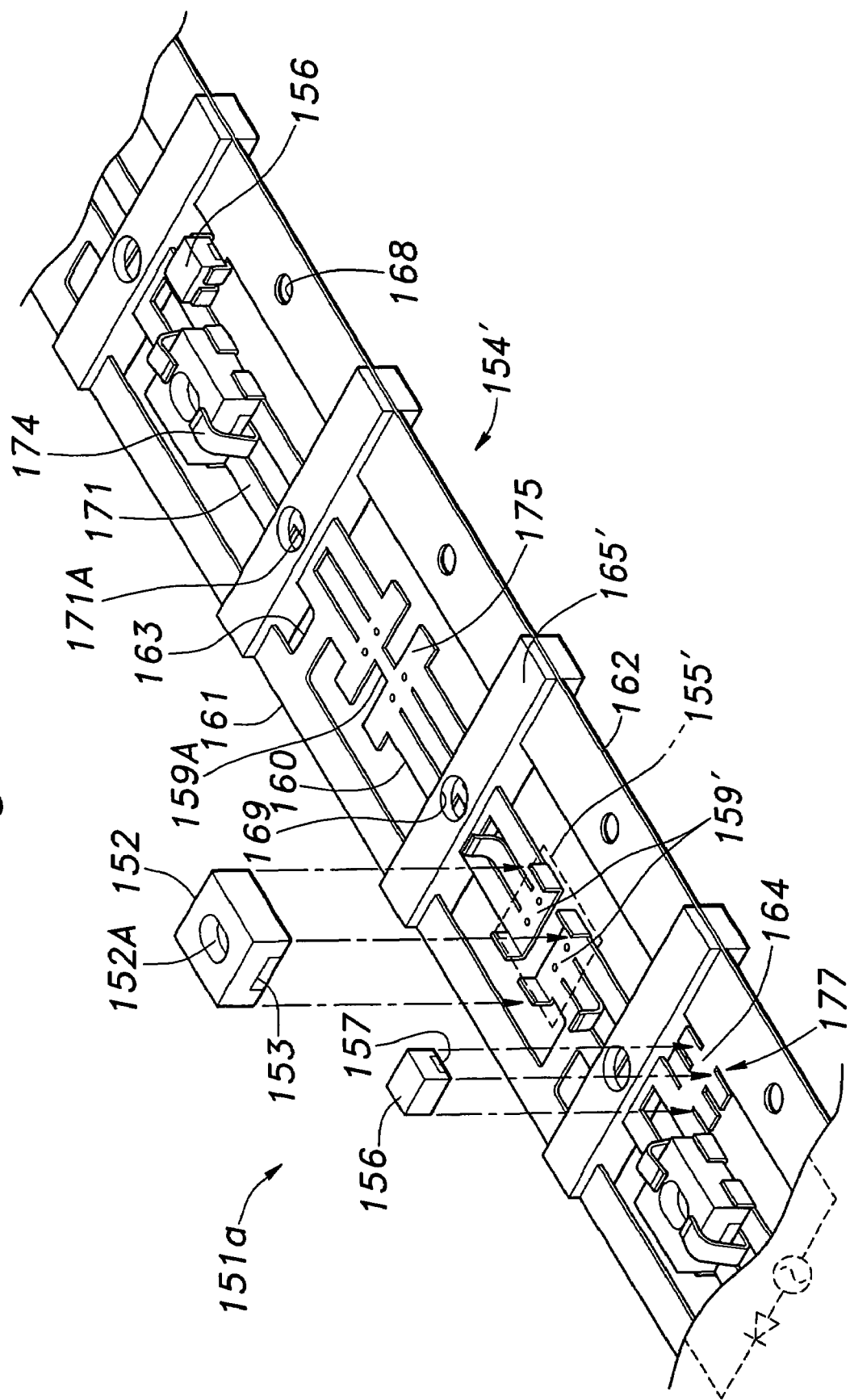
FIG. 31 a perspective view showing a yet another modified embodiment of the light source assembly shown in FIG. 22.

FIG. 31 is a partial perspective view showing yet another embodiment modified from that of FIG. 22. In FIG. 31, parts similar to those in FIGS. 22 are denoted with same reference numerals and detailed description thereof is omitted. Each terminal connection part 159' of each light source attachment portion 155' of a connective conductor structure 154' of this light source assembly 151a is formed with a pair of lateral extensions 175. These lateral extensions 175 are bent by a press machine so as to form opposing walls substantially perpendicular to a primary surface of the connective conductor structure 154' to hold the chip-type LED 152 therebetween to whereby achieve mounting of the LED 152 to the connective conductor structure 154'. This can eliminate the need for the sockets 172 of FIG. 22 formed by insert molding, and thus can accordingly reduce the manufacturing cost and time. In a similar manner as in the embodiments of FIG. 22, it will be preferable that the chip-type LEDs 152 electrically connected to the terminal connection parts 159' of the light source attachment portions 155' of the connective conductor structure 154' are pressed from above by the tongue pieces 174, which are formed by making a longitudinal cut in portions of the connection paths 172 adjacent the connection parts 159' and are raised to stand upright and bent, to thereby prevent inadvertent drop of the LEDs 152.

Further, in the embodiment of FIG. 31, no LED 152 is attached to the pair of terminal connection parts 159' of the second to the right light source attachment portion 155', and the pair of terminal connection parts 159' are connected to each other by a bridge portion 159A to thereby connect the second to left LED 152 and the right end LED 152 in series. As described in detail below with reference to FIG. 32, this can be achieved by forming the bridge portions 159A, during a primary processing for conducting press work to make a tape-shaped patterned conductor 170', from which the connective conductor structure 154' is made, such that the bridge portions 159A connect the terminal connection parts 159' in respective pairs, and then in a secondary processing, cutting off only the bridge portions 159A in the light source attachment portions 155' to which the LEDs 152 are attached while retaining the bridge portions 159A of the light source attachment portions 155' to which no LEDs are attached. In this way, it is possible to adjust a distance between adjacent LEDs 152 in the completed light source assembly 151a. It should be noted that although in the embodiment of FIG. 31 the LEDs 152 are all mounted on the same side of the connective conductor structure 154' (on the upper side in the drawing), it is also possible to attach the LEDs 152 on the other side (under side in the drawing) by bending the extensions 175 and tongue pieces 174 in the opposite direction.

In the embodiment of FIG. 31, chip-type resistors (or surface mount type resistors) 156 are connected between the interconnection path 160 and the second trunk path 162. To achieve this, the connective conductor structure 154' is formed with a pair of resistor terminal connection parts 178 at portions of the interconnection path 160 and the second trunk path 162 where the resistors 156 are mounted such that the pair of resistor terminal connection parts 178 extend from the interconnection path 160 and the trunk path 162, respectively, toward each other. Thus, the pair of resistor terminal connection parts 178 form a resistor attachment portion 177. Similarly to the (light source) terminal connection parts 159', each resistor terminal connection part 178 has a pair of extensions 179 which are bent by the press machine to form opposing walls. The chip-type resistor 156 is fitted between the opposing walls 179, and a pair of terminals 157 of the chip-type resistor 156 are bonded to the resistor terminal connection parts 178 by laser welding or the like. The laser welding can be preferably carried out by irradiating a laser beam onto a point or points on a side of the resistor terminal connection parts 178 opposite to that on which the resistor 156 is mounted, but it may also possible to irradiate the laser beam on the side on which the resistor 156 is mounted. The welding can prevent inadvertent removal of the chip-type resistor 156 from the connective conductor structure 154'. It is preferred that the connective conductor structure 154' is made of aluminum in view of achieving the laser welding reliably. It may be further preferable if the connecting structure 154' is plated with tin. Arc welding, supersonic welding or spot welding (resistance welding) may also be used. However, because the terminals 157 of the chip-type resistor 156 are typically very thin and can be easily damaged by heat, laser welding is preferred in view of minimizing possibility of such damage. Further, it may be possible to use an electroconductive adhesive such as that containing aluminum nitride powders, for example, although in view of mechanical strength, laser welding is generally preferred. By allowing the resistors 156 to be connected between the interconnection path 160 and the second trunk path 162, it is possible to connect the resistors 156 and LEDs 152 in series so as to prevent an excessive voltage from being applied to the LEDs 152.

Further, in the embodiment of FIG. 31, the joint members 165', which are formed by insert molding so as to extend in the widthwise direction of the connective conductor structure 154' for joining together the interconnection path 160 and the pair of trunk paths 161, 162, have a length equal to the width of the connective conductor structure 154'. This can be achieved by forming a widthwise recess 166A or through-hole 166B in portions of the pair of trunk paths 161, 162 as shown in FIG. 32 later, so as to allow part of the insert-molded joint members 165' to extend vertically through the widthwise recess 166A or through hole 166B, whereby the joint members 165' can securely engage with the trunk paths 161, 162 and thus are prevented from sliding in the longitudinal direction.

Figure 32:
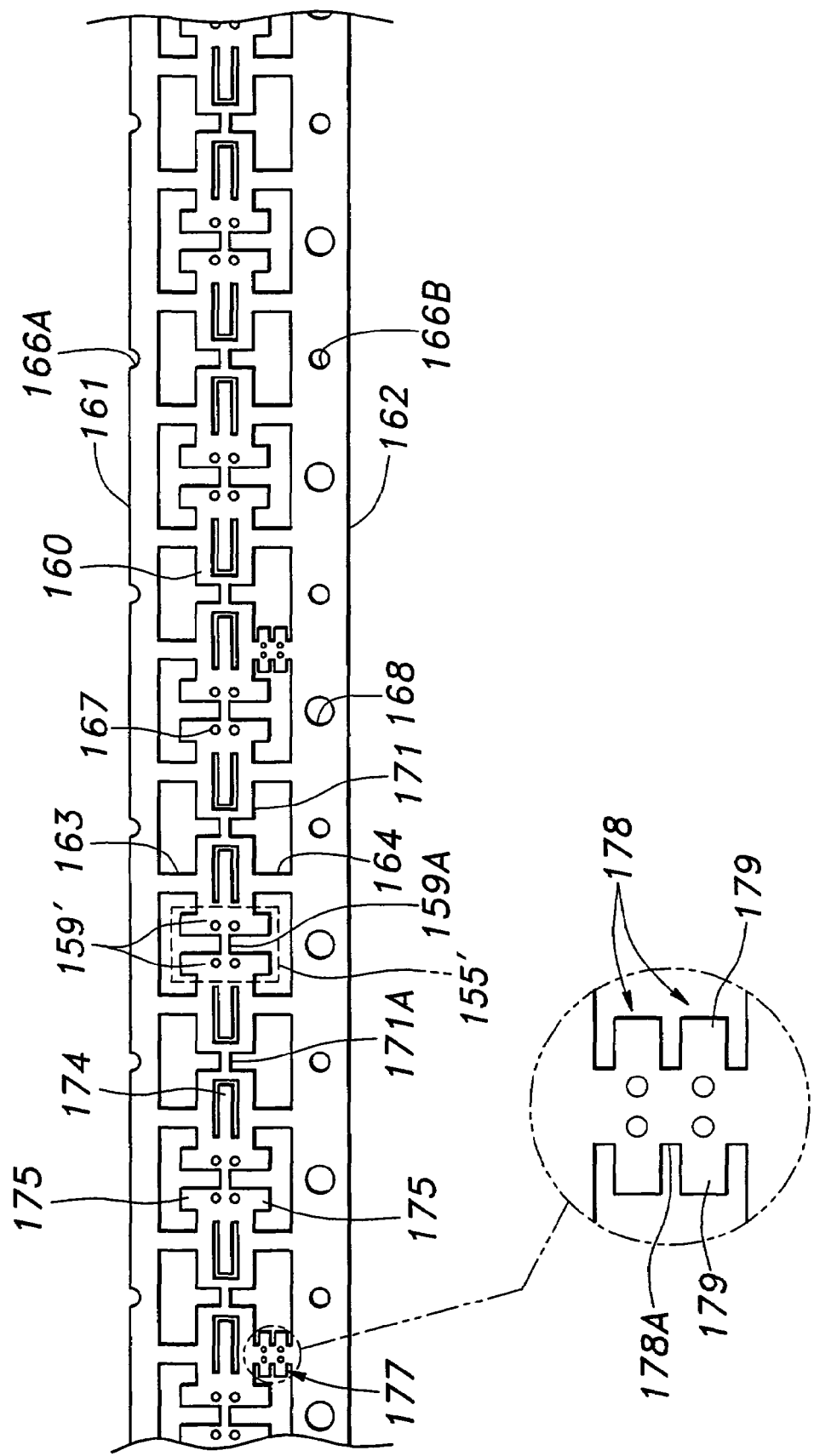
FIG. 32 is a plan view of a patterned conductor used in forming the light source assembly shown in FIG. 31.

FIG. 32 is a plan view of a patterned conductor 170' used to form the light source assembly 151a of FIG. 31. In this drawing, parts similar to those in FIG. 25 are denoted with same reference numerals and detailed explanation thereof is omitted. As shown in the drawing, the patterned conductor 170' comprises a plurality of light source attachment portions 155' for mounting the chip-type LEDs 152, and each light source attachment portion 155' has a pair of terminal connection parts 159' corresponding to a pair of electric connection terminals 153 of the chip-type LED 152. Each terminal connection part 159' has a pair of oppositely extending widthwise extensions 175, which are bent in the secondary processing (press work) of the patterned conductor 170' for providing the connective conductor structure 154', to form the walls for holding or positioning the chip-type LED 152 as shown in FIG. 31. In order to facilitate the bending, a notch (groove) may be formed at a base portion of each extension 175.

In the patterned conductor 170' of FIG. 32, as described above in connection with FIG. 31, the pair of terminal connection parts 159' of each light source attachment portion 155' are coupled by the associated bridge portion 159A so that only the bridge portions 159A of the attachment portions 155' to which the LEDs 152 are mounted can be cut off in the secondary processing of the patterned conductor 170' for forming the connective conductor structure 154'. In the patterned conductor 170', some of the branch paths 164 connecting the interconnection path 1 60 to the second trunk path 162 are replaced by the resistor attachment portions 177 for attaching the chip-type resistor 156. Each resistor attachment portion 177 comprises a pair of resistor terminal connection parts 178 corresponding to the pair of electric connection terminals 157 of the chip-type resistor 156, and the pair of resistor terminal connection parts 178 are coupled to each other by an associated bridge portion 178A before the secondary processing of the patterned conductor 170', so that the bridge portion 178A is cut off in the secondary processing only when the resistor 156 is attached thereto. Thus, when the resistor 156 is not attached and the bridge portion 178A is retained, the resistor attachment portion function 177 functions as a conductor just connecting the interconnection path 160 and the second trunk path 162. Although some of the branch paths 164 are replaced by the resistor attachment portions 177 in the embodiment of FIG. 32, all of the branch paths 164 may be replaced by the resistor attachment portions 177. Further, although in the embodiment shown FIGS. 31, 32, the resistor attachment portions 177 for mounting the resistors 156 are provided between the interconnection path 160 and the second trunk path 162, they may be provided between the interconnection path 160 and the first trunk path 161.

As mentioned before, in the patterned conductor 170' of FIG. 32, the first trunk path 161 is formed with a semi-circular widthwise recesses 166A and the second trunk path 162 is formed with through-holes 166B at positions where the joint members 165' are to be formed. In this way, part of the insert-molded joint members 165' extend through the widthwise recess 166A and the through holes 166B to allow the joint members 165' to be securely engaged with the trunk paths 161, 162 even when the joint members 165' have a length same as or shorter than the width of the patterned conductor 170'. In FIG. 32, the relatively narrow first trunk path 161 is formed with the widthwise recess while the relatively wide second trunk path 162 is formed with through-holes, but of course, the opposite is also possible. It is only required that part of each joint member 165' can extend through the trunk paths 161, 162 in the up-down direction. The widthwise recess 166A and the through holes 166B may be of any shape and are not limited to the semi-circular or circular shape.

FIG. 33 is a partial plan view showing an embodiment of the patterned conductor modified from that of FIG. 18 so as to be suitable for forming a series connection of LEDs. In this drawing, parts similar to those of FIG. 18 are denoted with same reference numerals and detailed description thereof is omitted. As shown in the drawing, the patterned conductor 120' is not equipped with the first trunk path 111 and the branch paths 113 for connecting the first trunk path 111 to the interconnection path 110, and hence has a smaller width. In this way, an amount of material not used in the finished light source assembly can be reduced to lower the manufacturing cost. The patterned conductor 120' is identical to the patterned conductor 120 of FIG. 18 except for the absence of the trunk path 111 and branch paths 113, and therefore can be processed with the same progressive press machine as used for processing the patterned conductor 120 of FIG. 18.

FIG. 34 is a partial plan view showing an embodiment of the patterned conductor modified from that of FIG. 25 so as to be suitable for forming a series connection of LEDs. In this drawing, parts similar to those of FIG. 25 are denoted with same reference numerals and detailed description thereof is omitted. In a similar fashion as in the patterned conductor 120' shown in FIG. 33, this patterned conductor 170" is also not equipped with the first trunk path 161 and the branch paths 163, to whereby reduce the necessary amount of material and the manufacturing cost.

Figure 35:
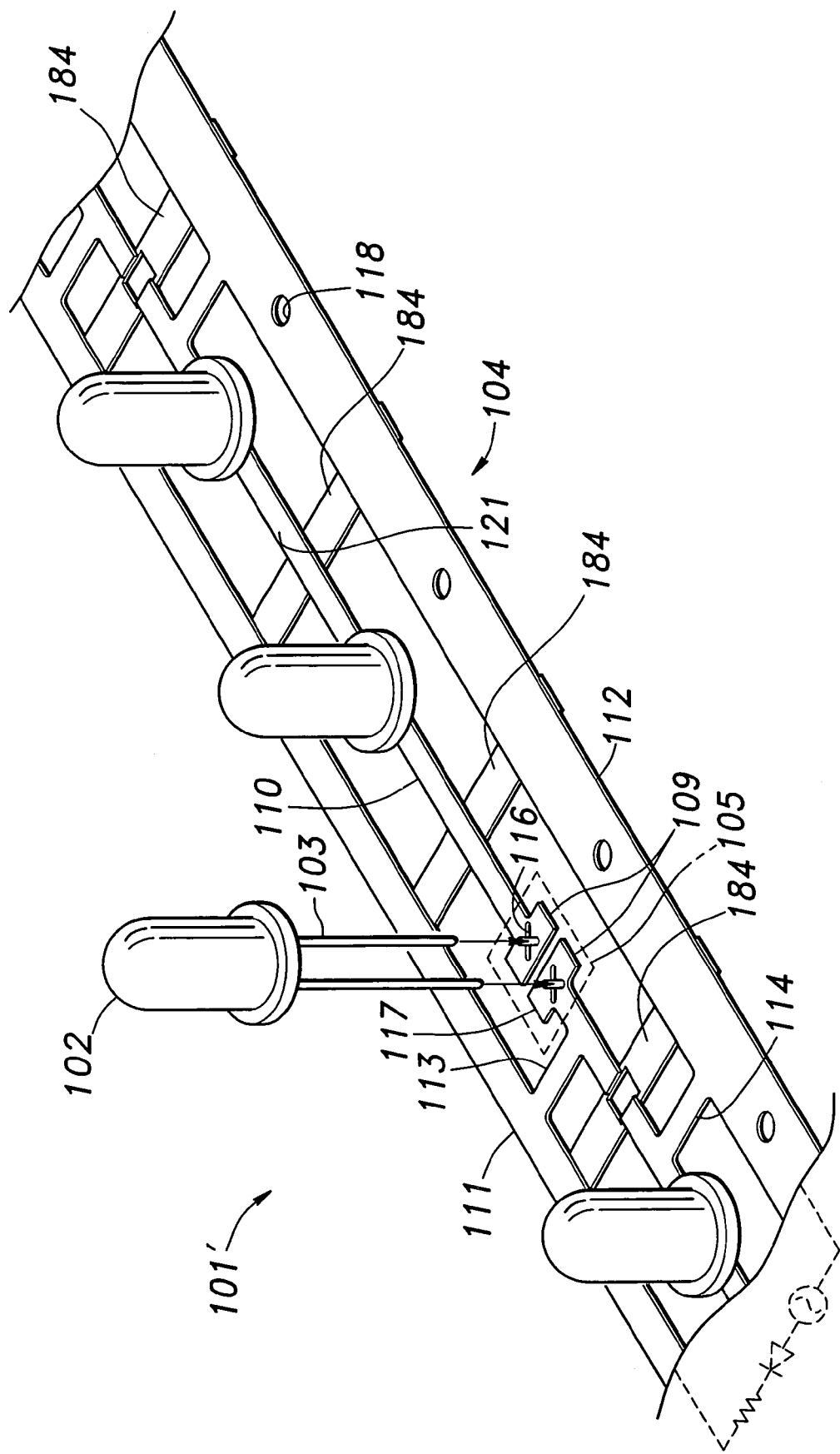
FIG. 35 is a perspective view similar to FIG. 16 and shows another embodiment of a joint member.

FIG. 35 is a partial perspective view similar to FIG. 16 and shows another embodiment of the joint members. In this drawing, parts similar to those of FIG. 16 are denoted with same reference numerals and detailed description thereof is omitted. In this light source assembly 101', a plurality of insulating sheets extending in the widthwise direction of the connective conductor structure 104 (or patterned conductor 120) and made of vinyl chloride, for example, are used as the joint member for joining the trunk paths 111, 112 and the interconnection path 110. The insulating sheets 184 can be attached to the patterned conductor 120 comprising the trunk paths 111, 112 and the interconnection path 110 before the secondary processing thereof. Such attachment can be preferably achieved by using adhesive, but other suitable means such as hot melt bonding, UV curing of resin may be used. The use of sheets 184 can achieve a smaller or thinner light source assembly though the mechanical strength may decrease. The insulating sheets 184 can be punched out by the press machine together with the patterned conductor 120 in the secondary processing of the patterned conductor 120.

Figure 36:
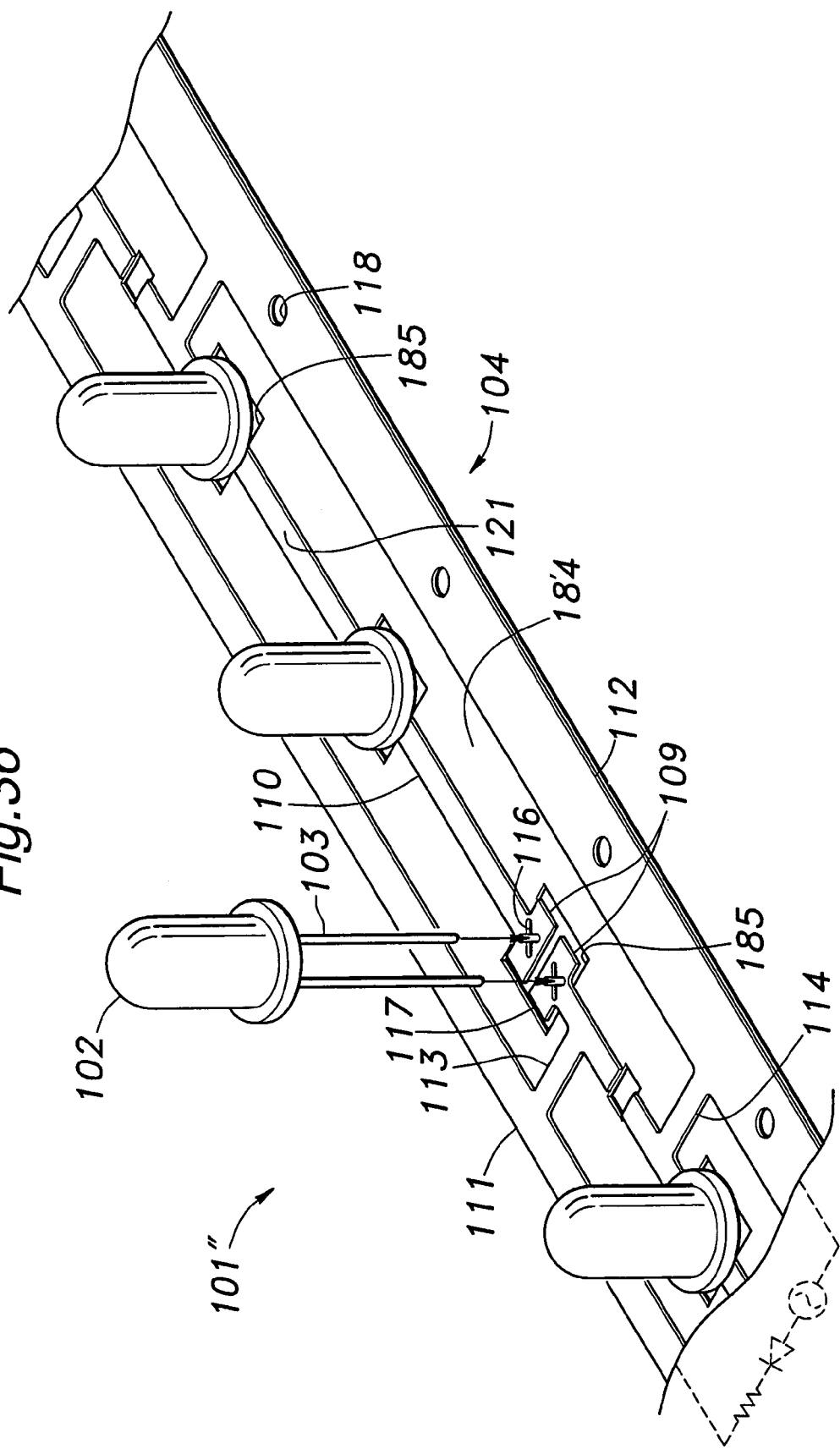
FIG. 36 is a perspective view similar to FIG. 16 and shows yet another embodiment of a joint member.
Figure 37:
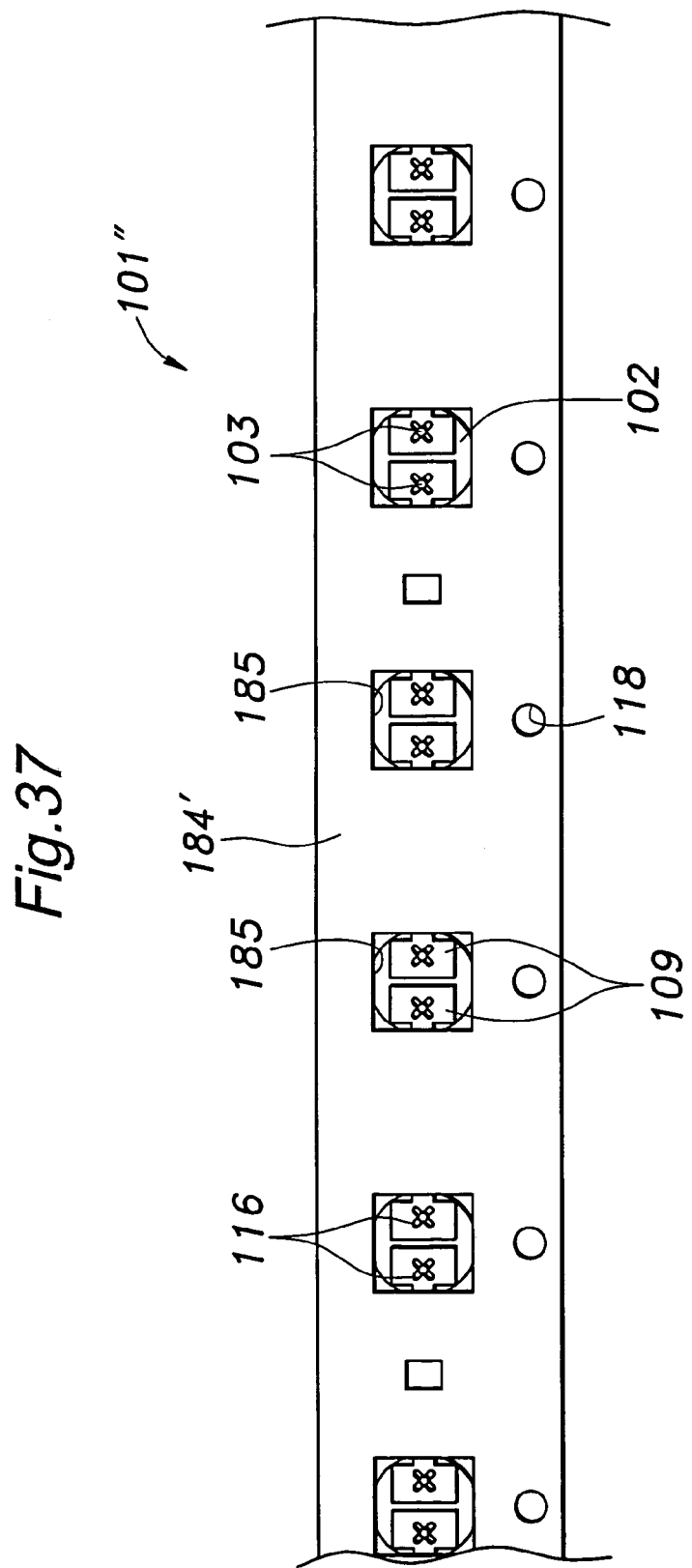
FIG. 37 is an underside view of the light source assembly of FIG. 36.

FIG. 36 is a partial perspective view similar to FIG. 16 and shows yet another embodiment of the joint members, and FIG. 37 is an underside view thereof. In these drawing, parts similar to those of FIG. 16 are denoted with same reference numerals and detailed description thereof is omitted. In this light source assembly 101", an insulating sheet 184' extending in the widthwise direction of the connective conductor structure 104 (or patterned conductor 120) as well as extending in the longitudinal direction for a predetermined length and made of vinyl chloride, for example, is used as the joint member for joining the trunk paths 111, 112 and the interconnection path 110. The insulating sheet 184' may extend a whole length of the patterned conductor 120. Such an insulating sheet 184' also can be attached to the patterned conductor 120 by suitable means such as adhesive before the secondary processing of the patterned conductor 120. Further, it may be possible to make holes in predetermined portions of the insulating sheet 184' (e.g., portions aligned with the pilot holes 118 or portions for receiving the lead wires 103 of the LEDs 102). As best shown in the underside view of FIG. 37, in the present invention, openings 185 are provided so as to expose the terminal connection parts 109 (i.e., light source attachment portions 105) of the connective conductor structure 104, whereby allowing the laser beam for laser welding can impinge on the exposed parts from underside. Like the embodiment of FIG. 35 that uses the plurality of insulating sheets 184, the embodiment of FIG. 36 can also achieve a smaller or thinner light source assembly compared with those that utilize insert molding. Further, compared with the plurality of insulating sheets 184, the insulating sheet 184' of FIG. 36 can be attached to the patterned conductor 120 more easily and with shorter time. In FIG. 36, the insulating sheet 184' extends the whole width of the connective conductor structure 104. However, the insulating sheet 184' only has to join the trunk paths 111, 112 and the interconnection path 110, and thus does not have to extend the whole width. For example, it may have such a width as not closing the pilot holes 118.

Figure 38:
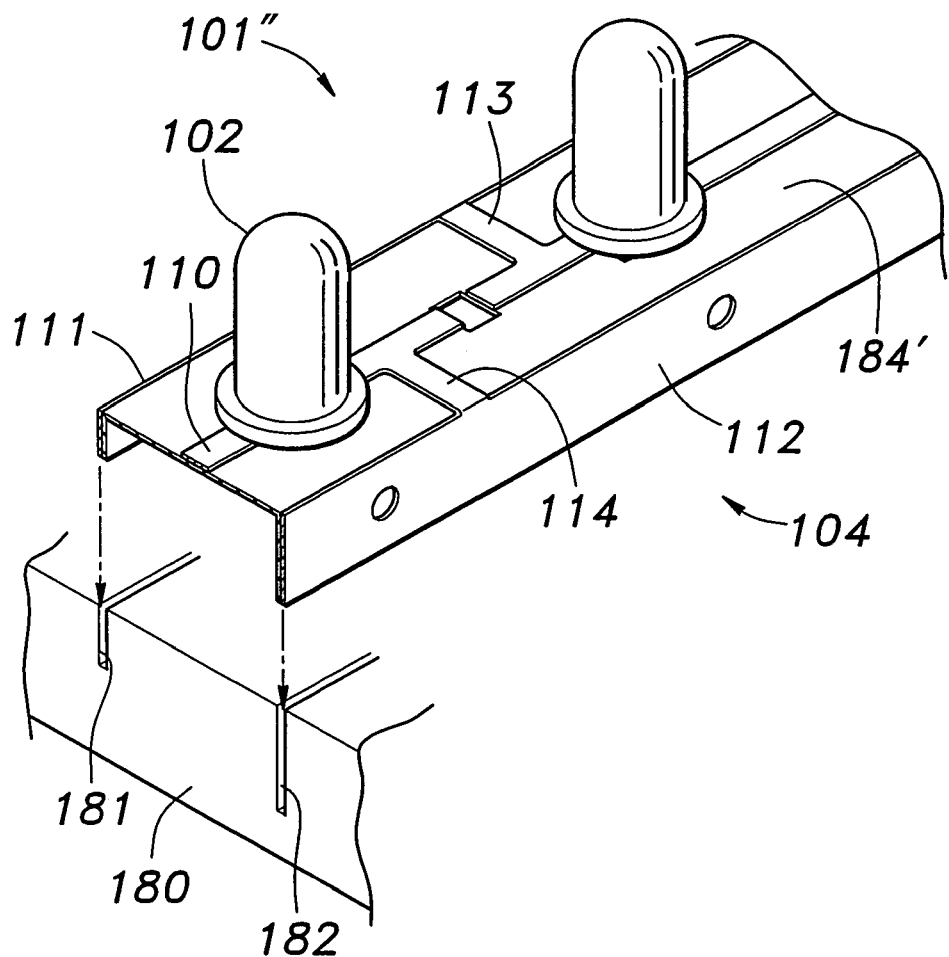
FIG. 38 is a perspective view showing an embodiment in which the light source assembly of FIG. 36 is attached to a holder.

The light source assembly 101" that uses the insulating sheet 184' as the joint member as shown in FIG. 36 can be easily attached to a mount board (holder) 180 formed with grooves 181, 182 by bending the branch paths 113, 114 so that the trunk paths 111, 112 are perpendicular to a principal surface of the interconnection path 110, and then inserting the trunk paths 111, 112 into the associated grooves 181, 182 as shown in FIG. 38. The mount board 180 may be formed with a groove or hole for receiving the parts projecting on the underside of the light source assembly 101" such as the lead wires 103 of the LEDs 102. The mount board 180 may be formed by molding so as to be unitary to the light source assembly 101. Further, it may be possible to arrange a plurality of light source assemblies 101" in the widthwise direction to form a two-dimensional light source. In such a case, it is preferable that the longitudinal and lateral pitches of the LEDs 102 are adjusted to be identical. In the light source assembly 101 shown FIG. 16, the trunk paths 111, 112 and interconnection path 110 of the connective conductor structure 104 are joined together by the joint member 115 formed by insert molding. However, after the LEDs 102 have been attached to the connective conductor structure 104, the trunk paths 111, 112 and interconnection path 110 are held unitarily by the LEDs 102 and the branch paths 113, 114, and therefore, the joint members 115 can be removed. In such a case also, the light source assembly 101 can be attached to the mount board in a similar manner as shown in FIG. 38. This also applies to the light source assembly shown in FIG. 22.

Figure 40:
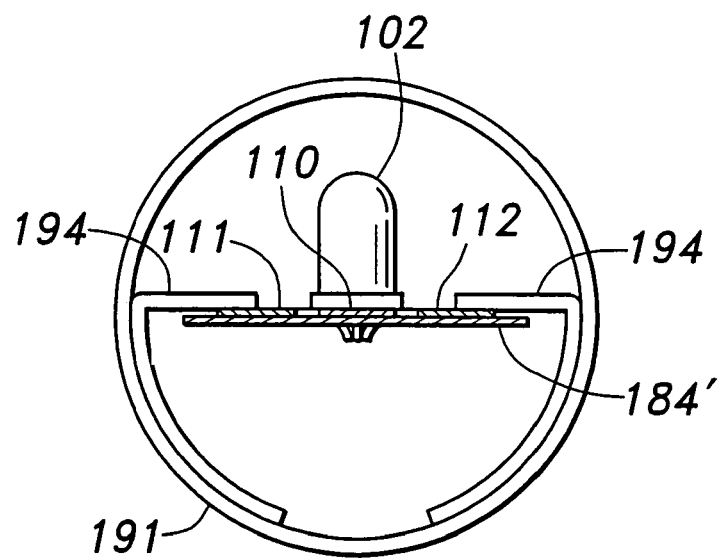
FIG. 40 is a cross-sectional view taken along the lines XL-XL in FIG. 39.
Figure 41:
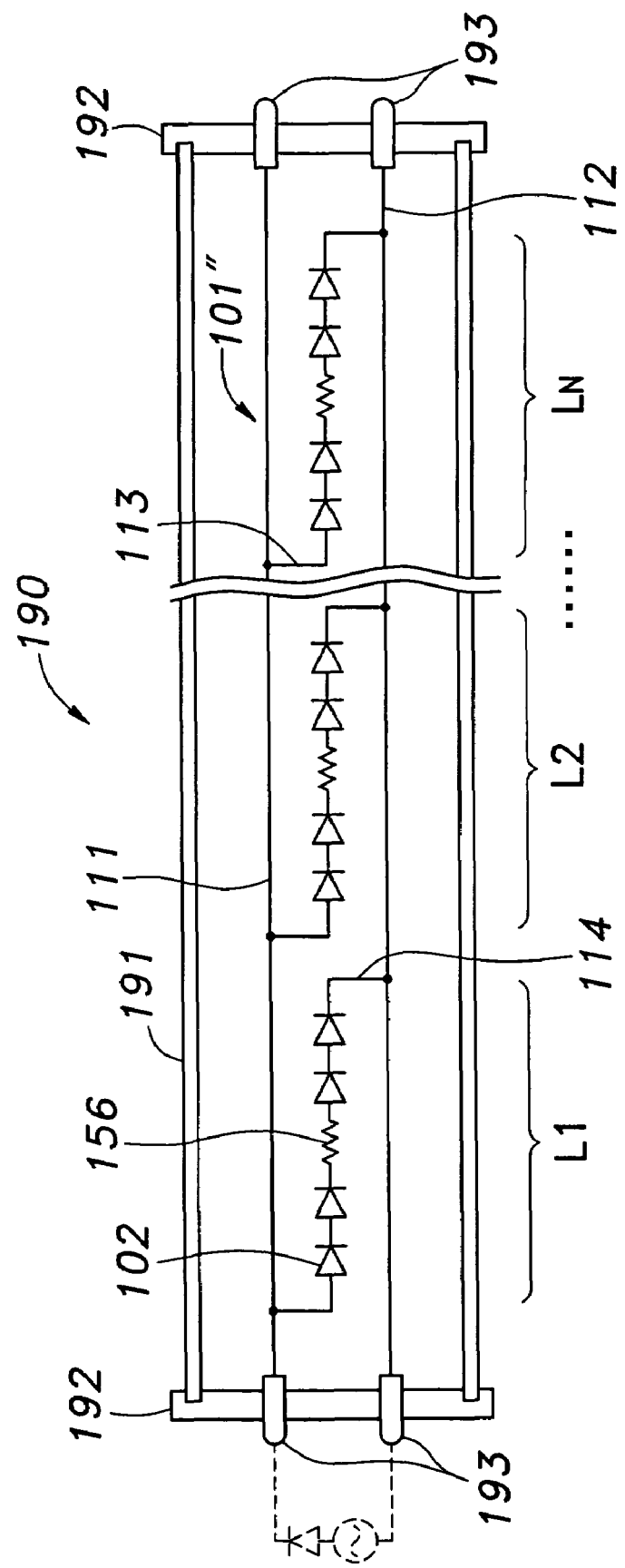
FIG. 41 is a top plan view for schematically showing the light emitting apparatus of FIG. 39.

FIG. 39 is a perspective view showing an embodiment 190 of a light emitting apparatus using the light source assembly 101" that uses the insulating sheet 184' as the joint member as shown in FIG. 36, FIG. 40 is a lateral cross-sectional view thereof taken along the lines XL-XL, and FIG. 41 is a schematic top view thereof. In these drawings, parts similar to those of FIG. 36 are denoted with same reference numerals and detailed description thereof is omitted. As best seen in FIG. 41, in this embodiment, each of N number of LED series connections $L_1$-$L_N$ included in the light source assembly 101" comprises four LEDs 102 and a chip-type resistor 156 (see FIG. 31) connected in series with the LEDs 102. The attachment of the chip-type resistor 156 can be achieve by cutting off a part of the interconnection path 110 (or connection path 121) between adjoining LEDs 102, placing the chip-type resistor 156 across the cut off portion, and then laser welding the terminals of the resistor 156 to the connection paths 121. Of course, the number of LEDs 102 contained in each LED series connection $L_1$-$L_N$ may be varied arbitrarily.

The light emitting apparatus 190 shown in the drawings comprises a light-transmissive tubular member 191 having a cylindrical shape and functioning as a housing for accommodating the light source assembly 101" therein. When the LEDs 102 having a sufficiently small size are used, the tubular member 191 can have a small diameter such as 0.5-2 cm. The light-transmissive tubular member 191 can be made of a plastic material, but in view of efficient heat dissipation, it is preferred that the tubular member 191 consists of a glass tube, which has a favorable heat conductivity.

Each end of the tubular member 191 is fitted with a cap member 192 holding a pair of conductive pins 193. One of the pair of conductive pins 193 on each end of the tubular member 191 is connected to the first trunk path 111 of the light source assembly 101", while the other is connected to the second trunk path 112. In this way, by connecting a pair of conductive pins 193 provided on one end of the tubular member 191 to the power supply, the power supply voltage can be provided to the LEDs of the light source assembly 101" via the trunk paths 111, 112.

Thus, in this embodiment, the trunk paths 111, 112 of the light source assembly 101" can be used as wirings (or electric paths) for connecting the LEDs 102 to the power supply. This can significantly improve the efficiency in assembling process compared with a case where additional wirings are needed. Further, the light emitting apparatus can be connected to another light emitting apparatus 190 via associated conductive pins 193, and by repeating it, it is possible to connect an arbitrary number of light emitting apparatuses 190. In such a case, for the purpose of easy connection, it is possible that the conductive pines 193 on one end are of male-type while the conductive pines 193 on the other are of female-type. It is also possible to use a connector cable specifically designed for such connection. It should be noted that if it is intended to use the apparatus 190 stand-alone, the first and second trunk paths 111, 112 of the light source assembly 151 may be connected only to the conductive pins 193 on one end of the tubular member 191.

In the light emitting apparatus 190 shown in FIGS. 39-41, heat is generated from the resistors 122 or LEDs 102 in an operating state. Further, because the ends of the tubular member 191 are sealed by the cap members 192, little heat convection will be caused if the tubular member 191 has a small diameter such as 0.5-2 cm. Thus, if a printed circuit board with a circuit-forming copper film of about 35 µm and thus with a poor heat conductivity (or low heat conduction rate) were used, the heat generated from the elements such as the resistors 122 and LEDs 152 would be trapped around the surfaces of the elements, causing a rapid increase in temperature of the atmosphere around the elements. This could cause damage to the elements or lower the performance thereof. However, the light emitting apparatus 190 shown in FIGS. 39-41 uses the light source assembly 101"

comprising the connective conductor structure 104 (FIG. 38) that can be formed from a conductive plate material through (primary and secondary) press working, and the typical thickness of the plate material can be about 0.1-0.3 mm, which is considerably larger than the thickness of the copper film of the printed circuit board. Thus, the heat conducting property can be much improved compared with the printed circuit board, and the heat generated from the elements can be quickly dissipated. This can prevent excessive temperature increase around the elements, and achieve substantially even temperature distribution within the tubular member 191.

Moreover, the first and second trunk paths 111, 112 are attached with a plurality of elastic, arcuate heat transmission plates 194 by such means as welding or screws, where the heat transmission plates 194 are preferably formed of metal such as aluminum and serve as heat transmission members. The heat transmission plates 194 also function as support members for supporting the light source assembly 101" in the tubular member 191. As shown in the cross-sectional view, the heat transmittance plates 194 each have a cross-sectional shape extending along the inner surface of the tubular member 191 and pressedly contact the tubular member 191. This can allow the heat to be transmitted from the first and second trunk paths 111, 112 to the glass tubular member 191 via the heat transmission plates 194, and then to be dissipated from the tubular member 191 to the outside, whereby suppressing the temperature increase within the tubular member 191. In other words, the use of heat transmission plates 194 allows the tubular member 191 to function as a heat sink. Besides the case where the glass tubular member 191 is used, when the light source assembly 101" is accommodated in a housing made of a material having a favorable heat conductive and electrically insulating properties such as ceramic, the above described heat transmission plates can be similarly used to transmit the heat to the housing and dissipate heat to the outside via the housing. It should be noted that though in the shown embodiment the used heat transmission plates 194 are each relatively small, it may be possible to use the heat transmission plates 194 having substantially the same length as the tubular member 191. Further, the shape of the housing may not be limited to the tubular shape, and the shape of heat transmission plates 194 also can vary depending on the shape of the housing. It will be also preferred if all or part of the upper surface and/or undersurface of the light source assembly 101" is colored in black, because this can allow heat to be radiated as infrared light. The coloring can be achieved by applying black nickel plating, black chrome plating or chromate treatment, or using black anodized aluminum as a material.

In the above embodiments, each light source consists of a single light emitting element such as the bullet-type LED 102 having a pair of lead wires or the chip-type LED 152 without the lead wires. However, a single light source may consist of a light emitting element assembly comprising a plurality of light emitting elements as shown in the following embodiments.

Figure 42A:
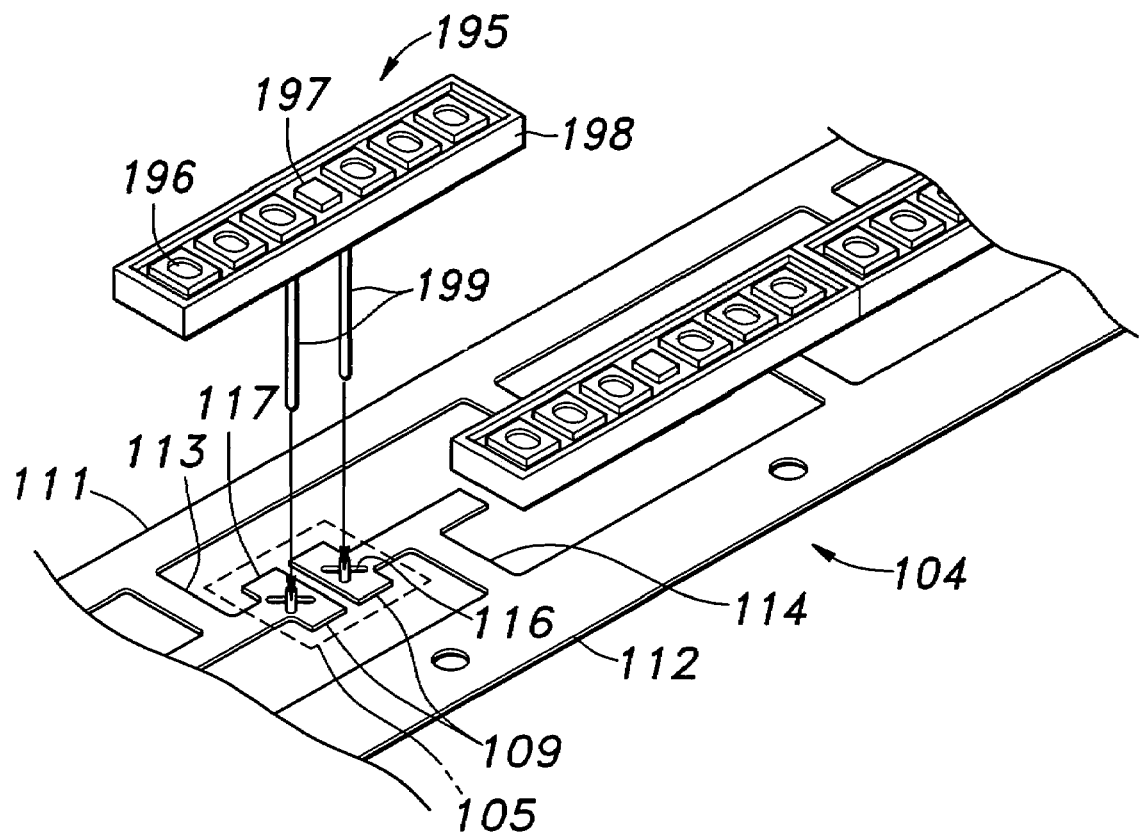
FIG. 42a is a perspective view showing an embodiment of a light source assembly that uses a light emitting element assembly as a light source.

FIG. 42a is a perspective view for explaining an embodiment using a light emitting element assembly 195 as a light source. In this embodiment, the tape-shaped patterned conductor 120 applied with the secondary processing shown in FIG. 20 for achieving parallel connection of the light sources can be used as the connective conductor structure 104. In FIG. 42a, parts similar to those of the above embodiment are denoted with same reference numerals and detailed description thereof is omitted. It should be noted that when the circuit for parallel connection is formed, the pair of terminal connection parts 109 of each light source attachment portion 105 of the connective conductor structure 104 are connected to the trunk path 111 or 112 via an associated branch path 113 or 114, and therefore, the insert-molded joint members 115 for preventing the parts of the connective conductor structure 104 from being separated apart are unnecessary.

In the embodiment of FIG. 42a, the light emitting element assembly 195 comprises six chip-type LEDs 196 and a chip-type resistor 197 arranged in a line and electrically connected on a support member 198 which may consist of a printed circuit board, for example. Further, the light emitting element assembly 195 has a pair of lead wires or conductive pins 199 mutually spaced apart a distance corresponding to that between the pair of terminal connection parts 109 of each light source attachment portion 105 of the connective conductor structure 104 and extending downwardly to serve as terminals for electrical connection. The LEDs 196 and resistor 197 of the light emitting element assembly 195 can be series-connected, for example, as shown in the circuit diagram of FIG. 42b. In this way, in a similar fashion as explained with respect to the embodiment of FIG. 16, the light emitting element assembly 195 as a light source can be connected to the connective conductor structure 104 by inserting the lead wires 199 into the connection holes 116 formed in the terminal connection parts 109. By enabling the light emitting element assembly 195 to be mounted to the connective conductor structure 104 as a light source, it is possible to provide a wider variety of illumination effects. For example, as shown in FIG. 42a, it is possible to use a plurality of light emitting element assemblies 195 as light sources such that adjacent assemblies 195 contact each other in the longitudinal direction, to thereby achieve an even, smooth illumination without dark portions between the light sources. Instead of using a printed circuit board as the support member 198 for forming the light emitting element assembly 195, it may be possible to embody the light emitting element assembly 195 by using the light source assemblies 151, 151' shown in FIGS. 22 and 31, for example.

Figure 42B:
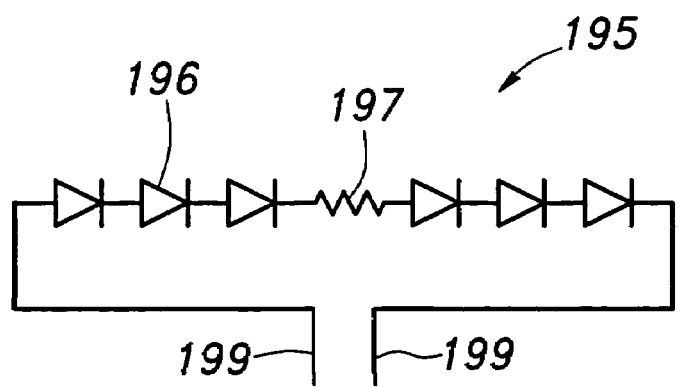
Figure 43A:
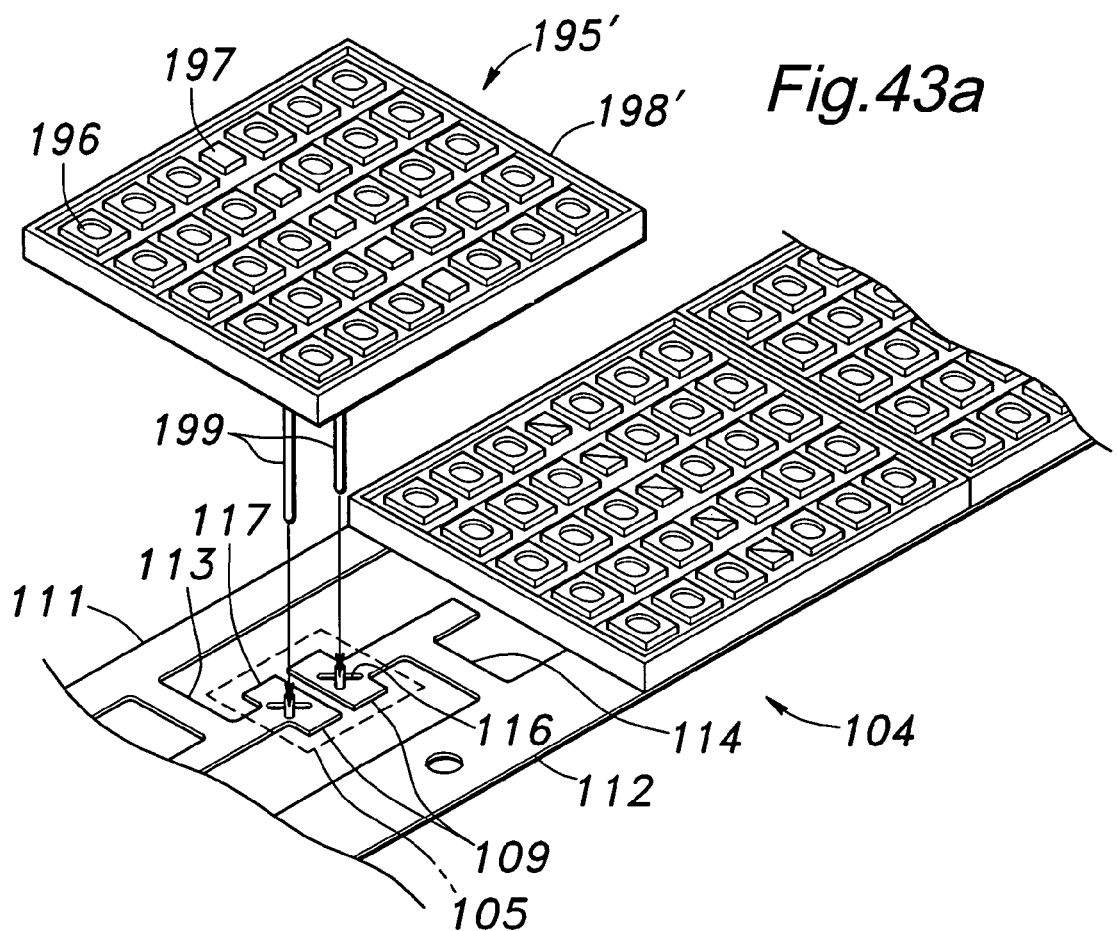
FIG. 43a is a perspective view showing another embodiment of a light source assembly that uses a light emitting element assembly as a light source.
Figure 43B:
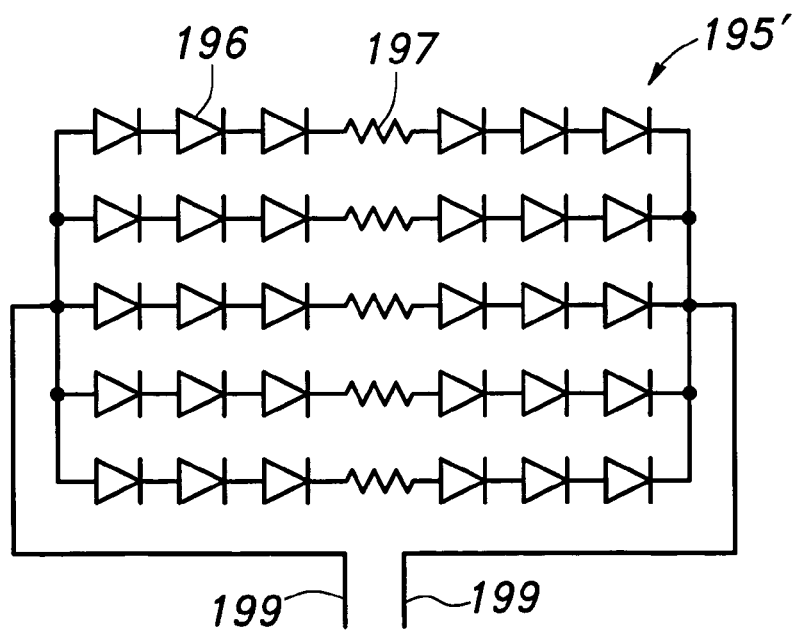

FIGS. 43a and 43b show an embodiment using another example of light emitting element assembly. FIG. 43a is a perspective view for explaining an embodiment of light source assembly using such a light emitting element assembly 195' as a light source, and FIG. 43b is a circuit diagram of the light emitting element assembly 195'. In FIGS. 43a and 43b, parts similar to those of FIGS. 42a and 42b are denoted with same reference numerals and detailed description thereof is omitted. In the light emitting element assembly 195', five series connections, each of which comprises six LEDs 196 and a resistor 197 connected in series, are juxtaposed on a support member 198' having a printed circuit board, for example, to achieve two-dimensional light emission. In this embodiment also, in a similar fashion as in the embodiment shown in FIG. 42, a pair of lead wires or conductive pins 199 are provided on a side of the support member 198' opposite to that on which the LEDs 196 and resistors 197 are mounted such that the lead wires 199 are spaced apart a prescribed distance from each other and extend substantially in parallel to function as electrical connection terminals for connection to the terminal connection parts 109 of the connective conductor structure 104. As shown in the drawings, the light emitting element assembly 195' may have a same width as the connective conductor structure 104. In this way, when a plurality of such light source assemblies using the light emitting element assembly 195' are juxtaposed in the widthwise direction, the space between adjacent light source assemblies can be properly adjusted to achieve even illumination over the whole surface. Further, the light emitting element assemblies 195' are preferably arranged without space in the longitudinal direction to eliminate dark portions between the light sources. It should be noted that the light emitting element assembly 195' is not limited to square or rectangular shapes, but may take an arbitrary shape such as a circular shape. Also, though the tape-shaped patterned conductor 120 applied with the secondary processing for forming a parallel connection of light sources was used as the connective conductor structure 104 in the above embodiments, it is of course possible to use the patterned conductor applied with the secondary processing for achieving other connections such as series-parallel connection or series connection (FIGS. 19, 21) by suitably choosing the connection pattern of the light emitting elements and/or a value of resistance of the resistors in the light emitting element assembly.

The light source assembly 151a using the chip-type LEDs 152 as light sources as shown in FIG. 31 can be flexed in the longitudinal direction because the connective conductor structure 154' is substantially plate-like and has a flexibility. In the embodiment of FIG. 31, however, the pair of electric connection terminals 153 of each chip-type LED 152 (and the associated pair of terminal connection parts 159' of the connective conductor structure 154') are spaced apart in the longitudinal direction, and therefore, when the light source assembly 151a is flexed, a force may act upon the terminal connection parts 159' of the connective conductor structure 154' and the terminals 153 of the LED 152 to urge them away from each other. Even though the tongue pieces 174 press the LEDs 152 from above in the embodiment of FIG. 31, it is not favorable that electrically contacting parts (i.e., terminals 153 and terminal connection parts 159') are subjected to a force that urges them away from each other in view of preventing false electric contact. It may be conceived to laser-weld the LEDs 152 to the connective conductor structure 154', but in such case also, a force urging the electrically contacting parts away from each other should be avoided.

Figure 44:
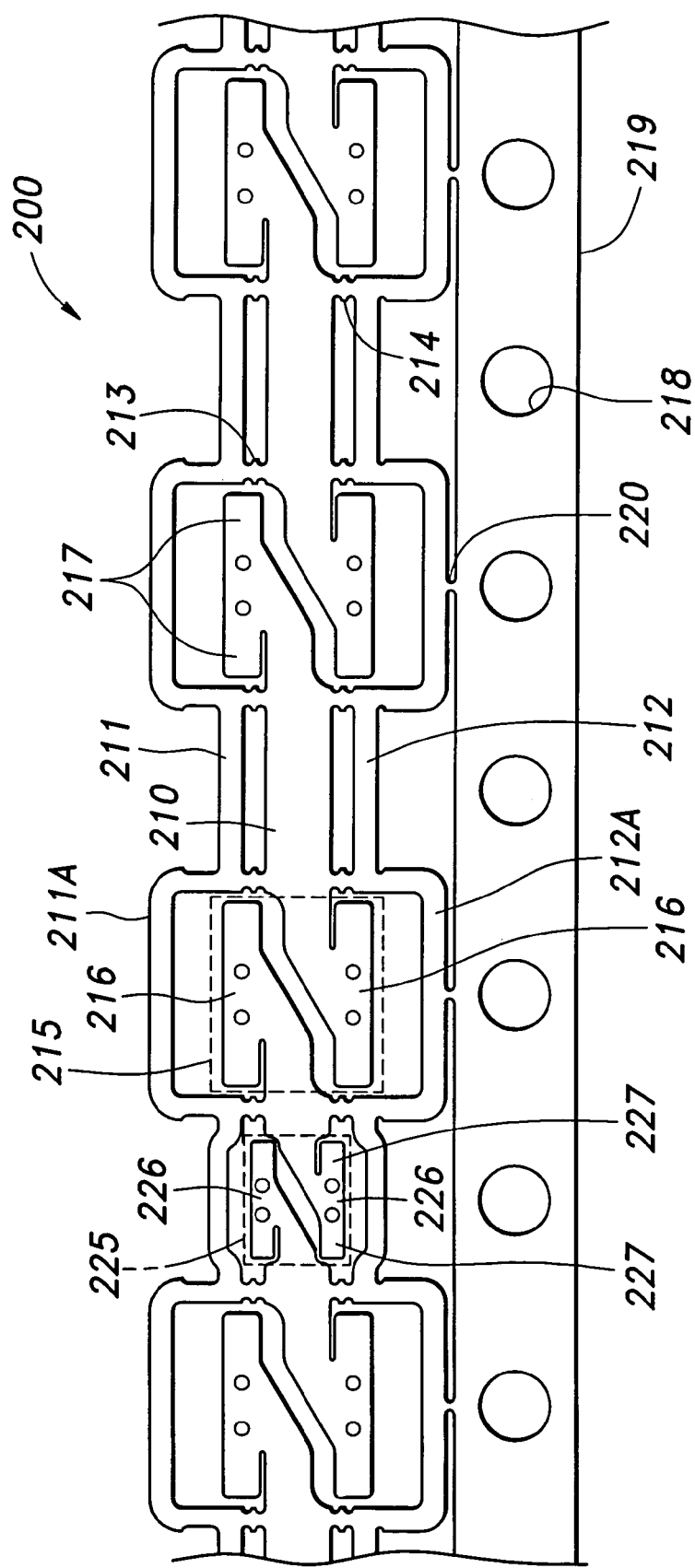
FIG. 44 is a plan view showing another embodiment of a tape-shaped patterned conductor according to the present invention.

FIG. 44 shows an embodiment of a tape-shaped patterned conductor adapted to solve such problems. As shown in the drawing, this patterned conductor 200 can be formed by press working so as to have a prescribed pattern in a similar fashion as in the above embodiments, and, with a secondary processing for cutting off appropriate parts, can make a connective conductor structure having a desired circuit configuration. Specifically, the patterned conductor 200 comprises first and second trunk paths 211, 212 extending substantially in parallel in a longitudinal direction, a plurality of light source attachment portions 215 arranged in the longitudinal direction between the first and second trunk paths 211, 212 for electrical connection with chip-type LEDs 202 (see FIG. 45) as light sources, an interconnection path 210 for longitudinally connecting the light source attachment portions 215, and a plurality of branch paths 213, 214 connecting the interconnection path 210 and the trunk paths 211, 212 in a widthwise direction, so that cutting off appropriate branch paths 213, 214 can realize a connective conductor structure for connecting the chip-type LEDs 202 in various connection patterns such as series, parallel or series-parallel connection.

In the embodiment of FIG. 44, each light source attachment portion 215 comprises a pair of light source terminal connection parts 216 which are spaced apart in a direction perpendicular to the longitudinal direction of the patterned conductor 200 (i.e., in the widthwise direction). In this way, when each chip-type LED 202 used as a light source is mounted to the associated light source attachment portion 215, the pair of terminals 203 of the chip-type LED 202 is arranged so as to be spaced apart substantially in a direction perpendicular to the longitudinal direction of the patterned conductor 200 (and hence of the connective conductor structure formed therefrom).

Each terminal connection part 216 comprises a pair of extensions 217 extending out in the longitudinal direction of the patterned conductor 200. Like the extensions 175 of the embodiment shown in FIG. 31, the extensions 217 are bent so as to be perpendicular to a primary surface of the patterned conductor 220 to form walls for holding or positioning the LEDs 202. In the shown example, the pair of terminal connection parts 216 of each light source attachment portion 215 are separated from each other, but in a similar fashion as in the embodiment shown in FIGS. 31, 32, they may be connected to each other so that they can be separated in the secondary processing of the patterned conductor 200 only when the LED 202 is actually mounted thereto.

The patterned conductor 200 of FIG. 44 is further provided with a resistor attachment portion 225 between the left two light source attachment portions 215 for attaching a chip-type resistor 205 (see FIG. 45) thereto. Like the light source attachment portions 215, the resistor attachment portion 225 comprises a pair of resistor terminal connection parts 226 which are spaced apart from each other in the widthwise direction of the patterned conductor 200.Each resistor terminal connection part 226 comprises a pair of extensions 227 extending out in the longitudinal direction of the patterned conductor 200. Like the extensions 179 of the embodiment shown in FIG. 31, the extensions 227 are bent so as to be perpendicular to the primary surface of the patterned conductor 200 to form walls for holding or positioning the resistor 205. The provision of resistor attachment portion 225 can facilitate connection of the resistor 205 between the adjacent LEDs 202 and can arrange the pair of terminals 206 of the mounted resistor 205 so as to be spaced apart in a direction substantially perpendicular to the longitudinal direction of the patterned conductor 200. Like the light source attachment portions 215, it is possible to couple the pair of resistor terminal connection parts 226 of the resistor attachment portion 225 at the time when the patterned conductor 200 is formed, and separate them in the secondary processing of the patterned conductor 200 only when the resistor 205 is attached thereto.

Further in the patterned conductor 200 in FIG. 44, the first and second trunk paths 211, 212 extending in the longitudinal direction has a tortuous shape. Specifically, portions of the trunk paths 211, 212 longitudinally aligned with the light source attachment portions 215, to which the LEDs 202 are mounted, curve convexly or outward in the widthwise direction (or in a direction away from the interconnection path 210) to form convexly curved portions 211A, 212A. Each convexly curved portion 211A, 212A as shown is curved substantially in a shape of a letter "]", but may be curved arcuately instead. In this way, it is possible to bend the convexly curved portions 211A, 212A of the trunk paths 211, 212 at their base so as to be substantially perpendicular to the principal surface of the interconnection path 210 whereby the bent portions can be used in attachment to a support plate (see FIG. 45). In this patterned conductor 200, the trunk paths 211, 212 are relatively narrow and therefore, a longitudinally extending side frame 219 is additionally provided and connected to the second trunk path 212 by a plurality of joint parts 220 wherein the side frame 219 is formed with pilot holes 218 for engagement with pilot pins of a progressive press machine (not shown) so that the tape-shaped patterned conductor 200 can be easily handled by the progressive press machine. The side frame 219 can be separated from the second trunk path 212 by cutting off the joint parts 220 in the last step of the secondary processing of the tape-shaped patterned conductor 200 by the press machine.

Figure 45:
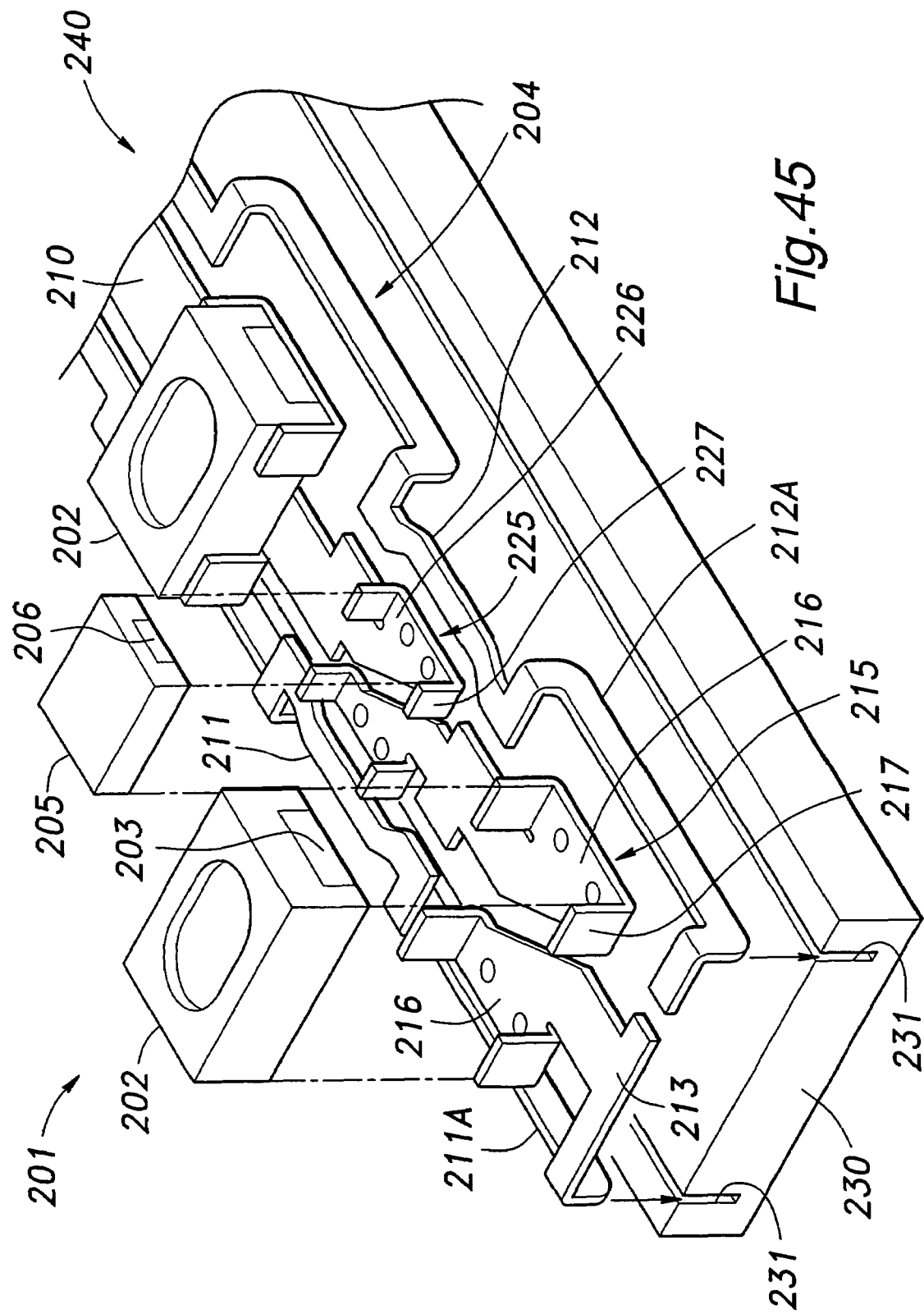
FIG. 45 is a perspective view showing a light source assembly using the patterned conductor of FIG. 44 together with a holder for supporting the light source assembly.

FIG. 45 is a perspective view showing a light source assembly 201 using the patterned conductor 200 shown in FIG. 44 and a holder 230 for holding the light source assembly 201. As shown, the light source assembly 201 comprises a connective conductor structure 204 formed by cutting off prescribed parts of the patterned conductor 200 shown in FIG. 44 so as to achieve a desired circuit structure, to which the chip-type LEDs 202 and chip-type resistors 205 are mounted. More specifically, the pair of longitudinal extensions 217 of each light source terminal connection part 216 of the connective conductor structure 204 are bent to form opposing walls between which an associated chip-type LED 202 serving as a light source is inserted and attached. It will be understood that because the pair of terminal connection parts 216 for each LED 202 are spaced apart in the widthwise direction of the light source assembly 201, the pair of electric connection terminals 203 of each LED 202 are also arranged along the widthwise direction in an assembled state. This embodiment comprises no tongue pieces 174 for pressing the LEDs 202 from above as shown in FIG. 31, and the connection between the terminal connection parts 216 and the terminals 203 of the LEDs 202 is preferably achieved by welding such as laser welding. Similarly, the chip-type resistors 205 are mounted to the resistor attachment portions 225 located between the light source attachment portions 215. The pair of longitudinal extensions 227 of each resistor terminal connection part 226 of the resistor attachment portions 225 are also bent to form opposing walls between which an associated chip-type LED 202 is inserted. Similarly to the chip-type LEDs 202, the connection between the terminals 206 of the chip-type LED 202 and the terminal connection parts 226 is also achieved by welding such as laser welding. It is preferred that the chip-type LEDs 202 and the chip-type resistors 205 are mounted on the same side of the connective conductor structure 204 because it requires the laser beam to be irradiated only onto one side of the connective conductor structure 204 and thus the manufacturing apparatus can be simplified. It should be noted that in FIG. 45, the left end LED 202 and resistor 205 are shown spaced away from the connective conductor structure 204 formed by cutting off parts of the patterned conductor 200 as required, but in practice, it is preferable that those parts (branch paths 213, 214) of the patterned conductor 200 are cut off to form the connective conductor structure after the LED 202 and the resistor 205 are welded to the patterned conductor 200 to thereby prevent the parts of the connective conductor structure 204 from being disconnected from each other. As an alternative way to prevent the parts of the connective conductor structure 204 from being separate apart, the insulating sheets 184, 184' as shown in FIGS. 35, 36 may be attached to the patterned conductor 200 before cutting off parts of the patterned conductor 200.

As described above, the convexly-curved portions 211A, 212A of the first and second trunk paths 211, 212 of the tape-shaped patterned conductor 200 are bent at their base so as to be perpendicular to the principal surface of the light source assembly 201. As seen FIG. 45, the bent convexly-curved portions 211A, 212A are tightly fitted in associated grooves 231 formed in a flexible holder 230, for example, so that the light source assembly 201 is attached to the holder 230 to form a light emitting apparatus 240.

Figure 46:
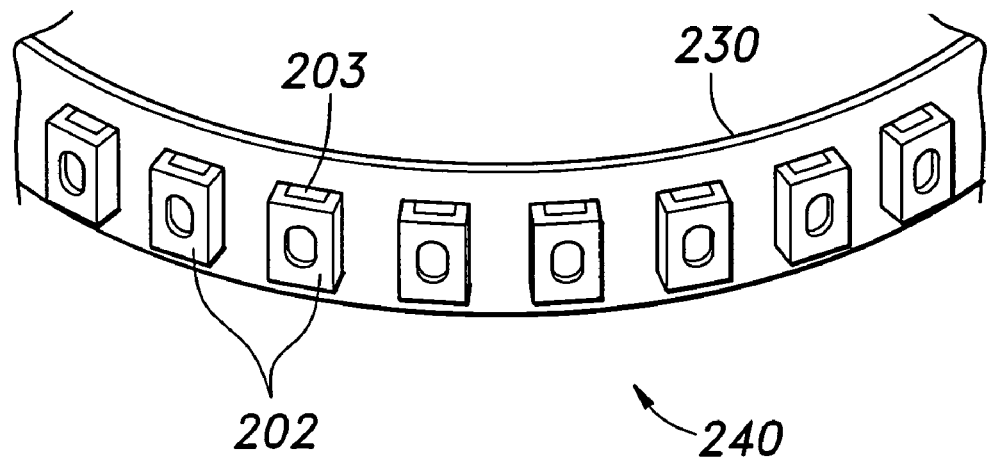
FIG. 46 is a schematic view showing the light source assembly of FIG. 45 flexed in a longitudinal direction.

FIG. 46 is a schematic perspective view showing a state of the thus-formed light emitting apparatus 240 flexed in the longitudinal direction. In this drawing, the connective conductor structure 204 is omitted. As seen in FIG. 46, the pair of terminals 203 of each LED 202 are arranged along the widthwise direction of the light emitting apparatus 240, and thus no force that urges the terminals 203 of the LEDs 202 in a direction away from the terminal connection parts 216 of the connective conductor structure 204 is generated even when the light emitting apparatus 240 is flexed in the longitudinal direction.

FIG. 47a is a plan view showing yet another embodiment of a tape-shaped patterned conductor, FIG. 47b is a cross-sectional view taken along the lines A-A in FIG. 47a, and FIG. 47c is a plan view of a light source assembly formed by attaching chip-type LEDs and chip-type resistor to a connective conductor structure formed by cutting off parts of the patterned conductor of FIG. 47a as required. The patterned conductor 250 shown in FIG. 47a has a structure suitable for forming a light source assembly 251 (FIG. 47c) of a series-parallel connection type formed by connecting a plurality of series blocks in parallel, with each series block comprising four chip-type LEDs 252 and a chip-type resistor 255 connected in series.

Similarly to the above embodiments, as shown in FIG. 47a, this tape-shaped patterned conductor 250 comprises first and second trunk paths 261, 262 extending substantially in parallel in a longitudinal direction, a plurality of light source attachment portions 265 arranged in the longitudinal direction between the first and second trunk paths 261, 262 for electrical connection with chip-type LEDs 252 as light sources, an interconnection path 260 for longitudinally connecting the light source attachment portions 265, and a plurality of branch paths 263, 264 connecting the interconnection path 260 and the trunk paths 261, 262 in a widthwise direction. In this embodiment, a resistor attachment portion 275 for attachment of the chip-type resistor 255 is formed between the second to the left and third to the left light source attachment portions 265. Each light source attachment portion 265 has a pair of terminal connection parts 266 corresponding to the pair of terminals of the chip-type LED 252, and similarly, the resistor attachment portion 275 also has a pair of terminal connection parts 276 corresponding to the pair of terminals of the resistor 255. In this embodiment, the adjoining light source attachment portions 265 and resistor attachment portion 275 in a series block are connected by the interconnection path 260, while the adjoining light sources 265 contained in different series blocks are separated beforehand. The trunk paths 261, 262 in this embodiment are relatively narrow and therefore, a longitudinally extending side frame 269 is provided and connected to the second trunk path 262 by a plurality of joint parts 270 where the side frame 269 is formed with pilot holes 268 for engagement with pilot pins of a progressive press machine (not shown) for progressive press work.

In this embodiment, each terminal connection part 266 of each light source attachment portion 265 is provided with a projection 267 for positioning the LED 252. Similarly, each terminal connection part 276 of each resistor attachment portion 275 is provided with a projection 277 for positioning the resistor 255. The projections 267, 277 can be preferably formed by making a widthwise cutting in the terminal connection parts 266, 276 at positions aligned with ends of the LEDs 252 or resistors 255 to be mounted, and then, raising portions of the terminal connection parts 266, 276 on the side opposite to the LED-mounted side with respect to the cutting by using a press machine (see FIG. 47b). The provision of such projections 267, 277 allows easy positioning of the LEDs 252 and resistors 255 on the patterned conductor 250. Thereafter, subsequent to connecting the LEDs 252 and resistors 255 to the patterned conductor by laser welding, for example, parts of the patterned conductor are cut off as required to make the connective conductor structure 254 having a desired circuit pattern to form the light source assembly 251 (FIG. 47c). Alternatively, in a similar manner as in the embodiment of FIG. 36, the insulating tape 184' may be attached to the tape-shaped patterned conductor 250 before cutting off parts of the patterned conductor 250 as required to form the connective conductor structure 254 and mounting the LEDs 252 and resistors 255 to the connective conductor structure 254. It is also possible to use widthwise-extending joint members, such as the joint members 115 shown in FIG. 19, to prevent the parts of the connective conductor structure 254 from being separated apart.

In the above embodiments, the light sources are of so-called "two-pole" type, such as the bullet type LED 102 having a pair of lead wires as electric connection terminals, or the chip-type LEDs 152, 152', 202, 252 having a pair of terminals unitary to the main body, or the light emitting element assembly 195, 195' having two lead wires. These days, however, so-called "three-pole LED lamps" or "four-pole LED lamps" having three or four electric connection terminals and containing two LED chips for emitting different color lights, for example. It will be convenient if there is a tape-shaped patterned conductor suitable for such three-pole or four-pole LED lamps, and a light source assembly obtained by combining such patterned conductor and the three-pole or four-pole LED lamps. The following embodiments are for providing such a light source assembly using the three-pole or four-pole LED lamps.

Figure 48A:
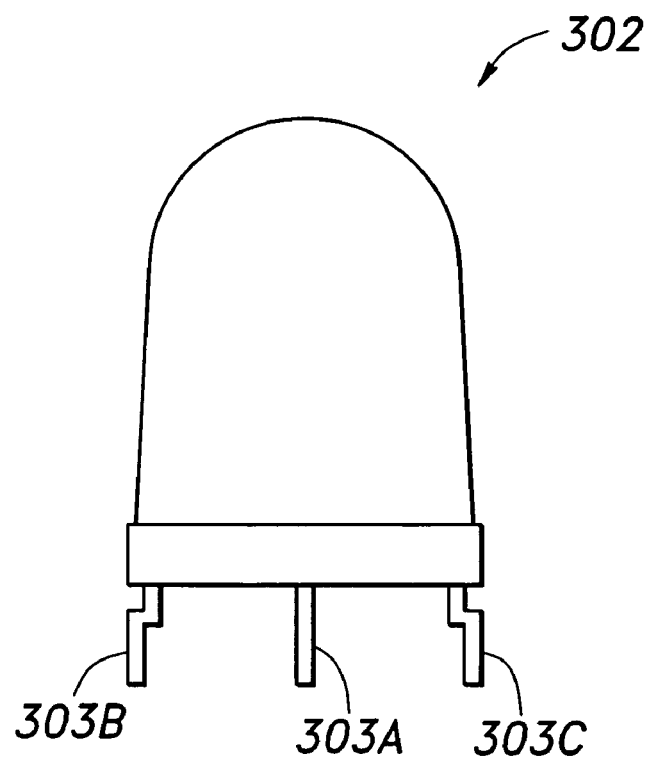
FIG. 48a is a front view of a three-pole LED lamp.
Figure 48B:
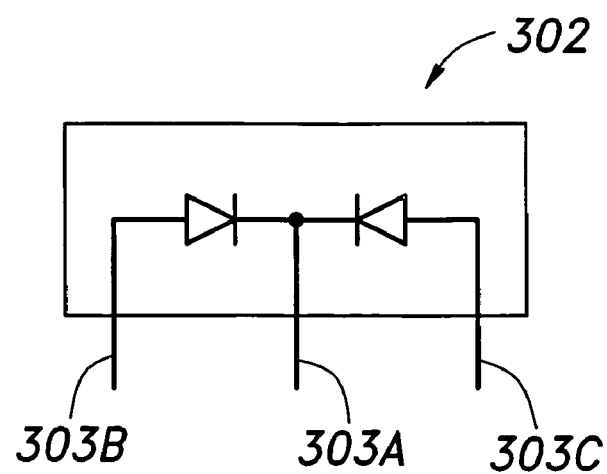

FIG. 48a is a front view of a typical three-pole LED lamp 302, and FIG. 48b is a circuit diagram thereof. As shown in the drawings, The three-pole LED lamp 302 comprises two LED chips for emitting lights of different colors such as yellow and red, and cathodes of the two LED chips are connected to each other and can be connected to an outside circuit via a first lead wire 303A. An anode of one LED chip and an anode of the other LED lamp can be connected to an outside circuit via second and third lead wires 303B, 303C, respectively. Though in the shown embodiment the cathodes of the two LEDs are connected to each other, the anodes may be connected to each other instead.

Figure 49:
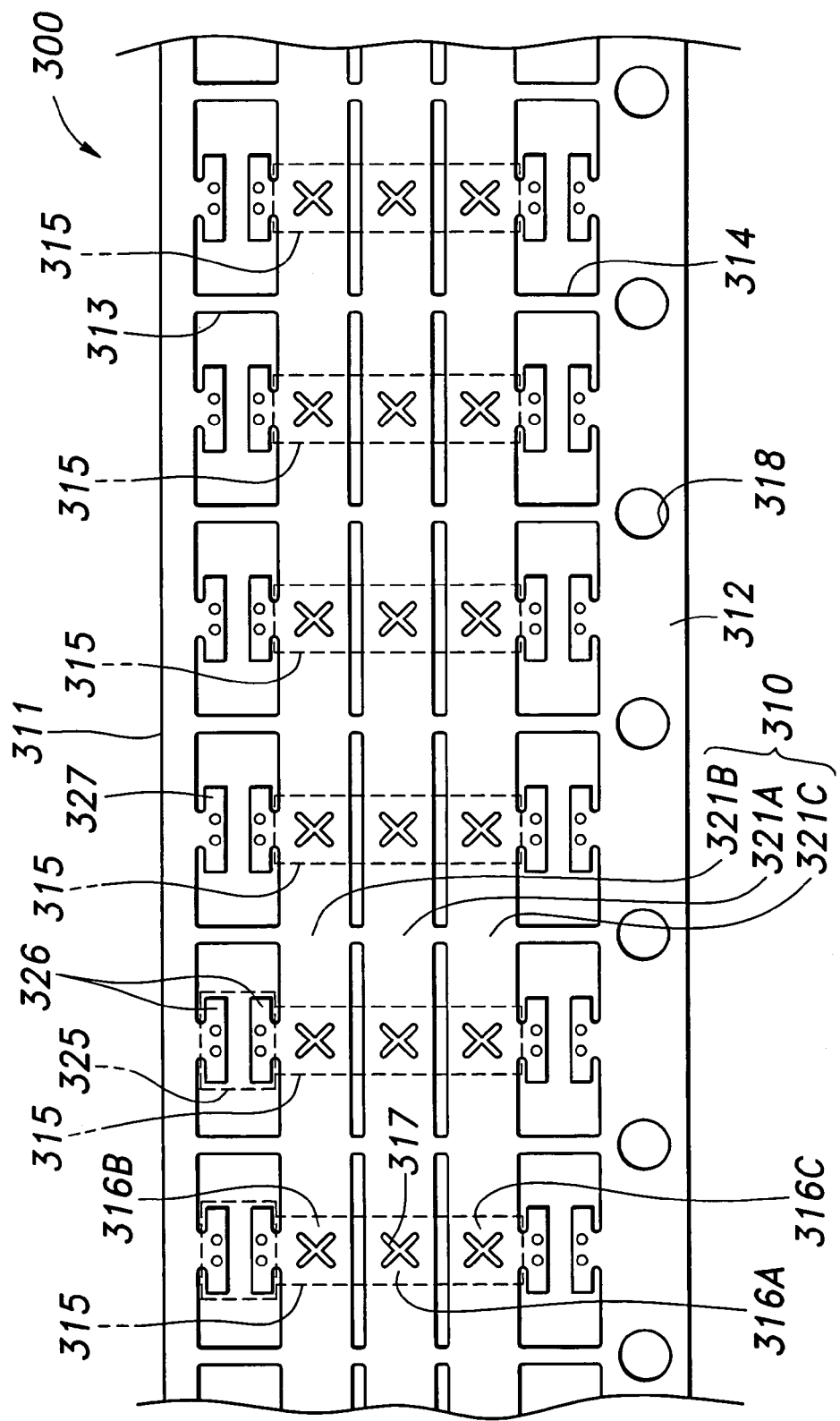
FIG. 49 is a plan view of a tape-shaped patterned conductor suitable for forming a light source assembly by connecting a plurality of three-pole LED lamps shown in FIGS. 48a and 48b.

FIG. 49 is a partial plan view of a tape-shaped patterned conductor 300 suitable for using a plurality of three-pole LED lamps 302 shown in FIG. 48 as light sources to form a light source assembly. As shown, this patterned conductor 300 has a plurality of light source attachment portions 315 for attaching the three-pole LED lamps 402 as light sources, where the light source attachment portions 315 are arranged in the longitudinal direction and connected by an interconnection path 310. Specifically, each light source attachment portion 315 comprises first-third terminal connection parts 316A, 316B, 316C corresponding to the three lead wires 303A, 303B, 303C of the three-pole LED lamp and arranged in the widthwise direction, and the interconnection path 310 comprises a plurality of first connection paths 321A for connecting the first terminal connection parts 316A of adjoining light source mount portions 315, a plurality of second connection paths 321B for connecting the second terminal connection parts 316A of adjoining light source mount portions 315, and a plurality of third connection paths 321C for connecting the third terminal connection parts 316C of adjoining light source mount portions 315. As also shown in the drawing, each terminal connection part 316A, 316B, 316C is formed with a cross-shaped hole 317 into which the corresponding lead wire 303A, 303B, 303C of the LED 302 is inserted.

Further, on either side of the patterned conductor 300, first and second trunk paths 311, 312 extend in the longitudinal direction, interposing the light source attachment portions 315 and the interconnection path 310 therebetween. Via widthwise-extending branch paths 313, 314, the first and second trunk paths 311, 312 are connected to the second and third connection paths 321B, 321C respectively connecting the second and third terminal connection parts 316B, 316C, which are positioned at either widthwise end of respective light source attachment portions 315. The second trunk path 312 is formed with pilot holes 318 for allowing easy handling of the tape-shaped patterned conductor by a progressive press machine (not shown).

In this embodiment, resistor attachment portions 325 for attachment of chip-type resistors are provided between the trunk paths 311, 312 and the terminal connection parts 316B, 316C located at widthwise ends of respective light source attachment portions 315. As shown, each resistor attachment portions 325 comprises a pair of resistor terminal connection parts 326 extending from the terminal connection parts 316B, 316C and the associated trunk paths 311, 312 toward each other. In a similar manner as in the embodiment shown in FIG. 31, each resistor terminal connection part 326 has a pair of opposite extensions 327 which can be bent by a press machine to form opposing walls.

Figure 51:
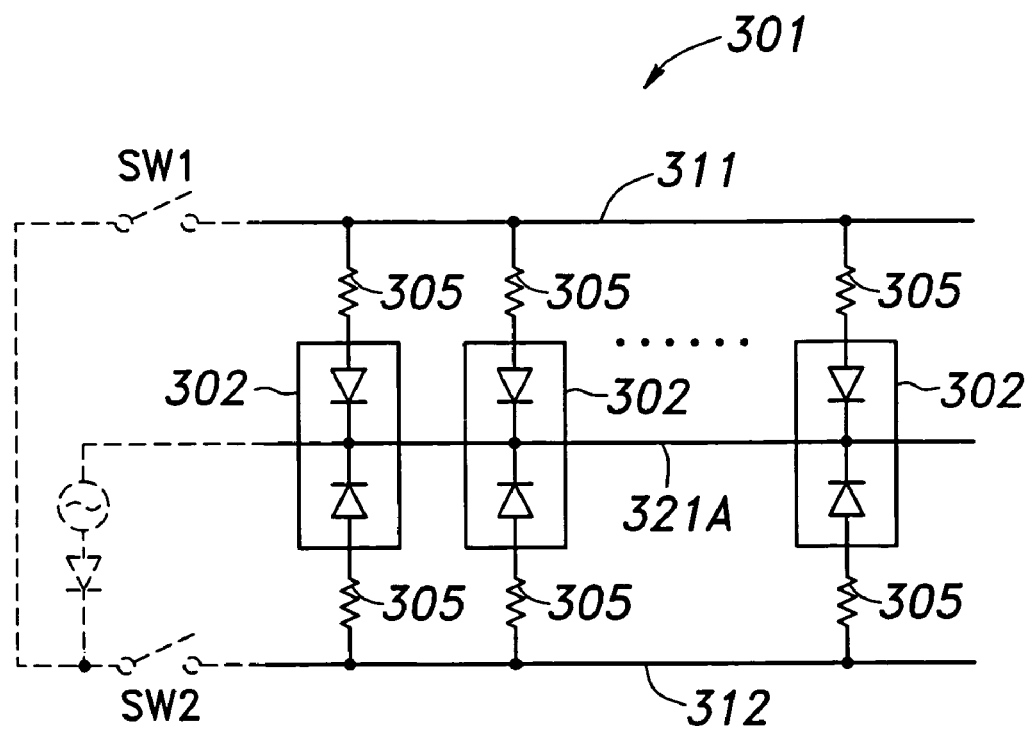
FIG. 51 is a circuit diagram of a light source assembly formed by using the connective conductor structure that is made following the way of secondary processing shown in FIG. 50.

A light source assembly 301 can be obtained by cutting off parts of the above constructed patterned conductor 300 as required to form a connective conductor structure, and mounting the three-pole LED lamps 302 serving as light sources to corresponding light source attachment portions 315 as well as mounting chip-type resistors 305 similar to the resistor 205 of FIG. 45 to the resistor attachment portions 325 (see the circuit diagram of FIG. 51). FIG. 50 shows an example of the cutting-off pattern. In this drawing, the parts to be cut off are shown by hatching. Further, FIG. 51 shows a circuit diagram of the resulting light source assembly 301. As shown by broken lines in FIG. 51, a lower voltage of a DC power source is connected to the interconnection path 321A while a higher voltage of the DC power source is connected to the first trunk path 311 via a switch SW1 as well as to the second trunk path 312 via a second switch SW2, such that closing the first switch SW1 can lighten the upper LED chip in each three-pole LED lamp 302 in the drawing and closing the second switch SW2 can lighten the lower LED chip in each three-pole LED lamp 302. Thus, when the upper and lower LED chips in each three-pole LED lamp 302 have different light colors, it is possible to vary the light color by controlling the switches SW1, SW2.

The patterned conductor 300 shown in FIG. 49 may be used to connect the bullet-type LEDs 102 having two lead wires as shown in FIG. 16 to form a light source assembly.

Figure 52A:
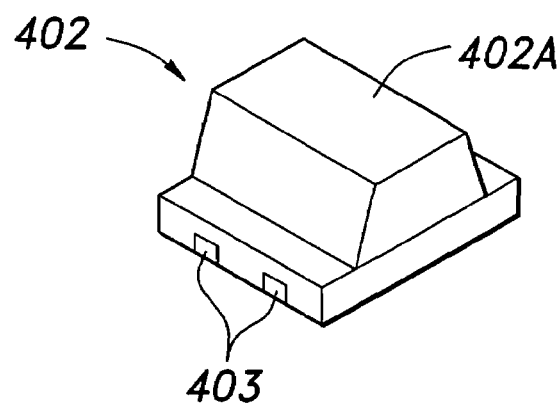
FIG. 52a is an upper perspective view of a four-pole LED lamp.
Figure 52B:
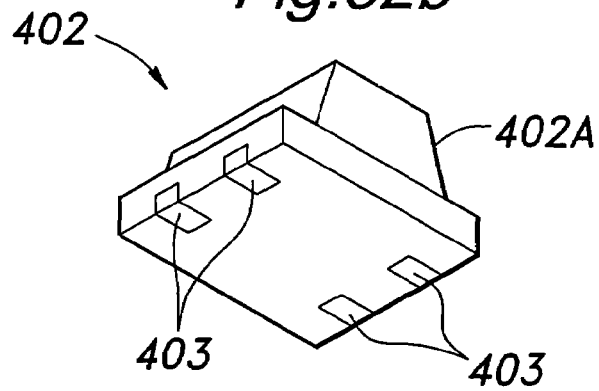
FIG. 52b is a lower perspective view of the four-pole LED lamp of FIG. 52a, and FIG. 52c is a circuit diagram thereof.
Figure 52C:
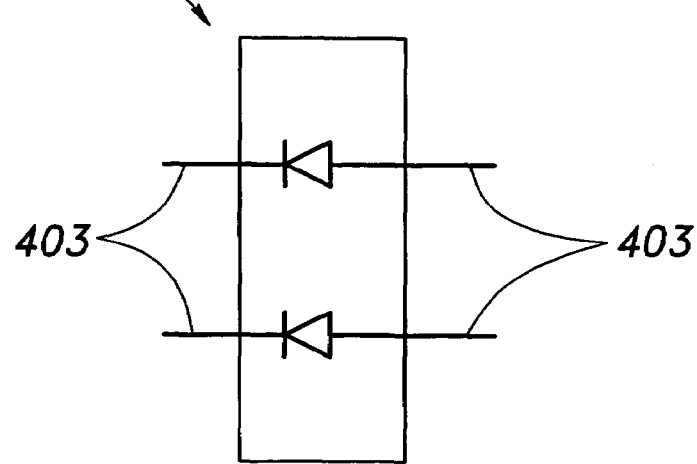

FIG. 52a is an upper perspective view of a typical four-pole LED lamp, FIG. 52b is a lower perspective view thereof, and FIG. 52c is a circuit diagram thereof. As seen in FIGS. 52a and 52b, this four-pole LED lamp 402 is of a chip-type (surface mount-type) without lead wires as terminals. The LED lamp 402 has a light emitting portion on its top. As shown in FIG. 52c, the LED lamp 402 comprises first and second LED chips having different light colors such as yellow and red, and has four terminals 403 connected to associated one of anodes and cathodes of the first and second LED chips. Two of the terminals 403 connected to the cathodes of the first and second LED chips are provided on one end of the four-pole LED lamp 402, and the other two of the terminals 403 connected to the anodes of the first and second LED chips are provided on the other end. In this way, the anodes and cathodes of the first and second LED chips contained in the four-pole LED lamp 402 can be connected to an outside circuit via associated terminals 403.

Figure 53:
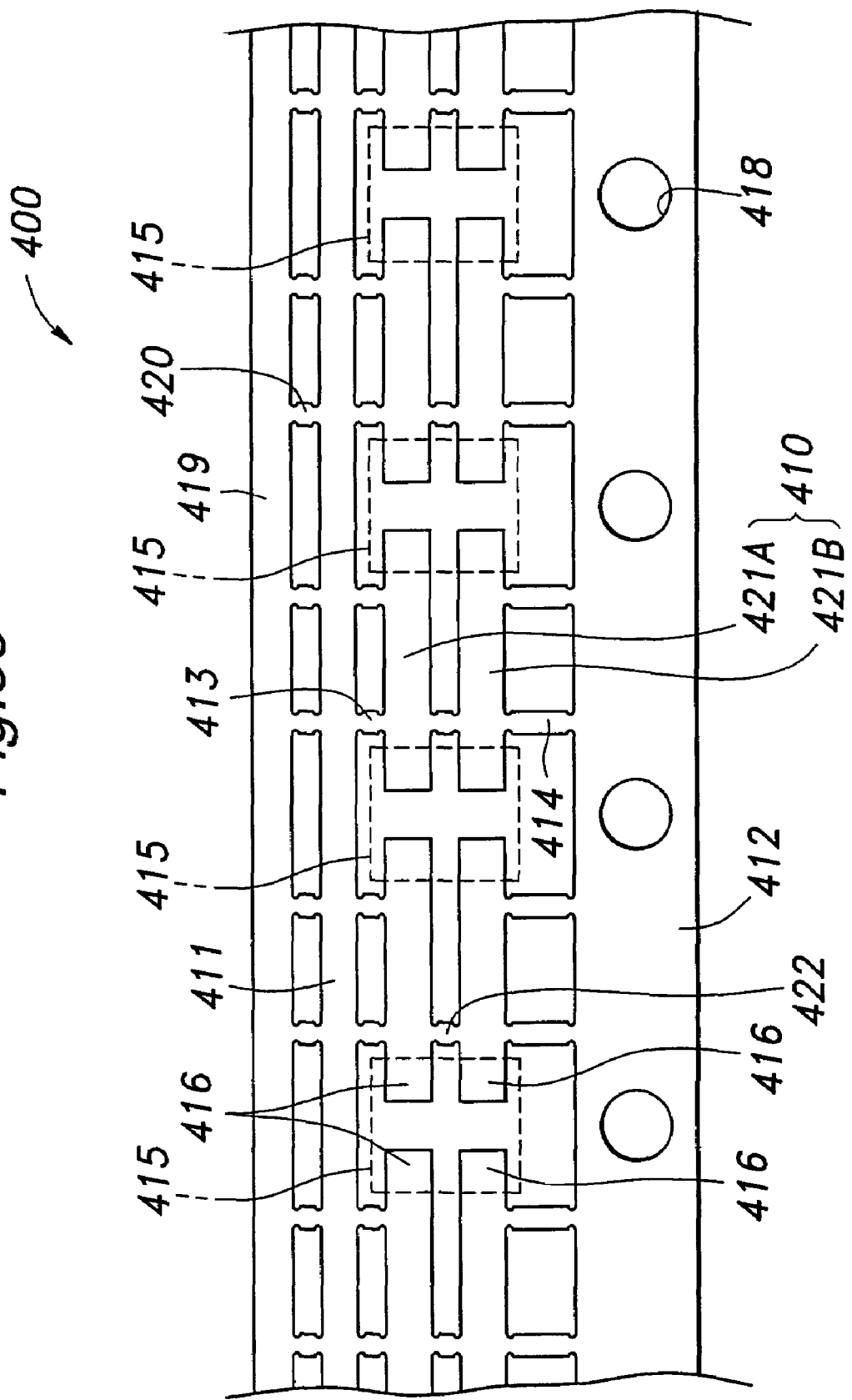
FIG. 53 is a plan view of a tape-shaped patterned conductor suitable for forming a light source assembly by connecting a plurality of four-pole LED lamps shown in FIGS. 52a-52c.

FIG. 53 is a partial plan view of a tape-shaped patterned conductor that can be used in forming a light source assembly by using a plurality of the four-pole LED lamps 402 shown in FIGS. 52a-52c. As shown, this patterned conductor 400 has a plurality of light source attachment portions 415 for attaching the four-pole LED lamps 402 as light sources, where the light source attachment portions 415 are arranged in the longitudinal direction and connected by an interconnection path 410. Specifically, each light source attachment portion 415 comprises four terminal connection parts 416 corresponding to the four terminals 403 of the four-pole LED lamp 402, two of the terminal connection parts 416 are arranged in the longitudinal direction so as to be connected to a pair of terminals 403 for the first LED chip contained in the four-pole LED lamp 402, while the remaining two are arranged in the longitudinal-direction and spaced from the former two terminal connection parts in the widthwise direction so as to be connected to a pair of terminals 403 for the second LED chip contained in the four-pole LED lamp 402. The interconnection path 410 comprises a plurality of first and second connection paths 421A, 421B for connecting the terminal connection parts 416 contained in adjoining light source attachment portions 415 and aligned in the widthwise direction. The first connection paths 421A longitudinally connect the terminal connection parts 416 associated with the first LED chips contained in the four-pole LED lamps 402, while the second connecting paths 421B longitudinally connect the terminal connection parts 416 associated with the second LED chips contained in the four-pole LED lamps 402A. Therefore, the first connection paths 421A and the second connection paths 421B are spaced from each other in the widthwise direction. The first connection paths 421A and the second connection paths 421B mutually aligned in the longitudinal direction are connected to each other in the widthwise direction by branch paths 422.

Further, first and second trunk paths 411, 412 extend in the longitudinal direction, interposing the light source attachment portions 415 and the interconnection path 410 therebetween. Via widthwise-extending branch paths 413, 414, the first and second trunk paths 411, 412 are connected to the first and second connection paths 421A, 421B. The second trunk path 412 is formed with pilot holes 418 for allowing easy handling of the tape-shaped patterned conductor by a progressive press machine (not shown). Further in this embodiment, a third trunk path 419 is provided on the widthwise outer side of the first trunk path 411 and connected to the first trunk path 411 via branch paths 420 extending widthwise.

Figure 54:
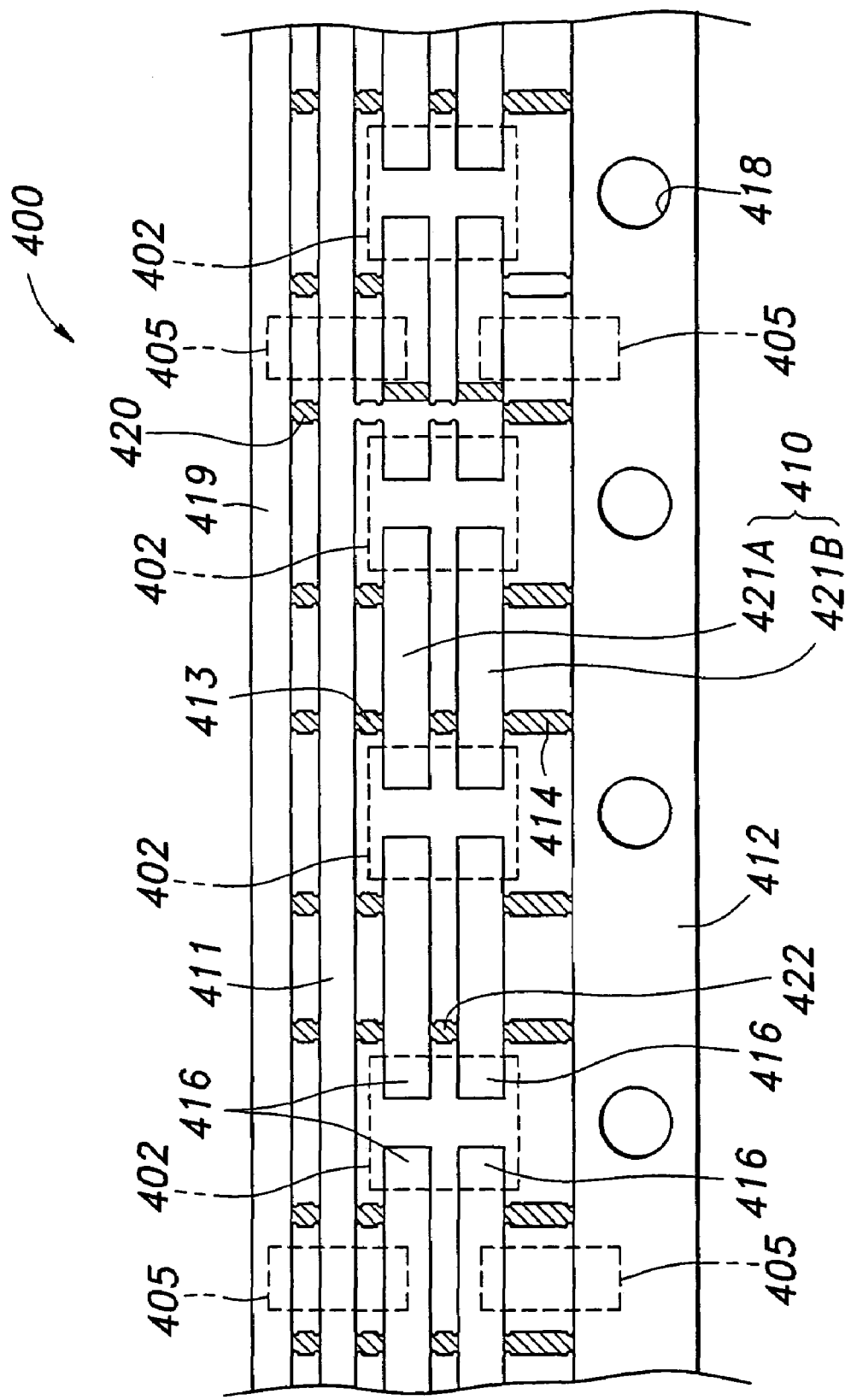
FIG. 54 is a plan view showing an example of a way of cutting off in the secondary processing of the patterned conductor shown in FIG. 49 to form a connective conductor structure having a prescribed circuit pattern.
Figure 55:
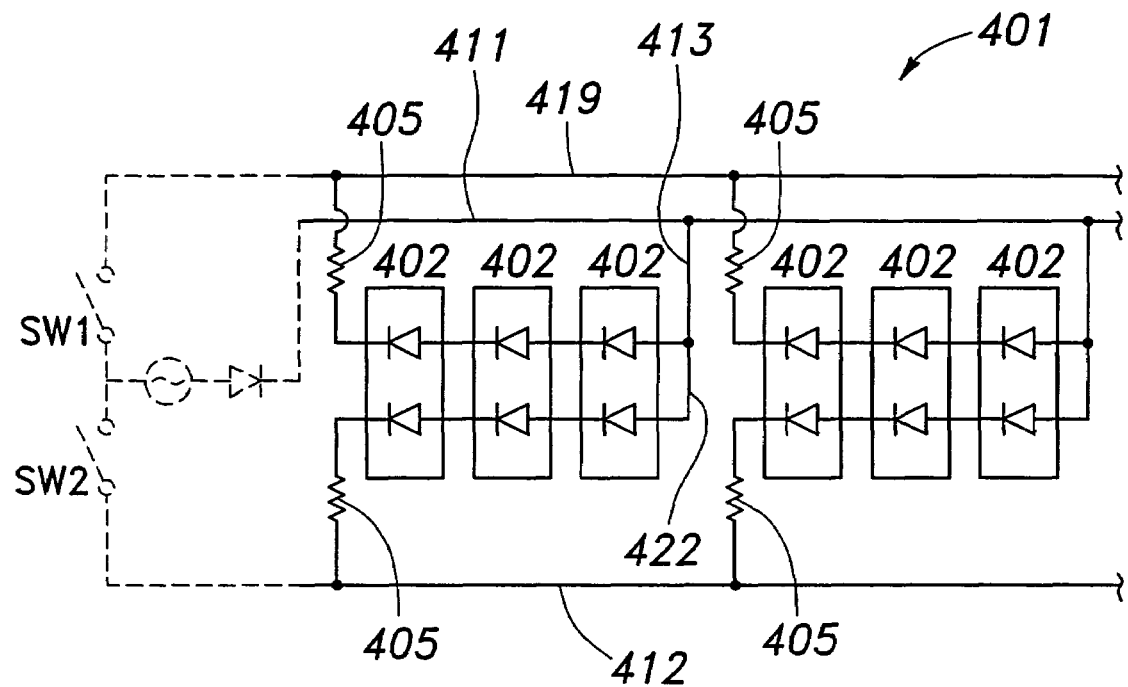
FIG. 55 is a circuit diagram of a light source assembly formed by using the connective conductor structure that is made following the way of secondary processing shown in FIG. 54.

A light source assembly 401 using the four-pole LED lamps 402 can be obtained by cutting off parts of the above constructed patterned conductor 400 as required to form a connective conductor structure, and mounting the four-pole LED lamps 402 serving as light sources to corresponding light source attachment portions 415 as well as mounting resistors at prescribed positions. FIG. 54 shows an example of such a cutting-off pattern. In this drawing, the parts to be cut off are shown by hatching. Further, the four-pole LED lamps 402 and chip-type resistors 405 to be attached are shown by broken lines. FIG. 55 shows a circuit diagram of the resulting light source assembly 401. In this embodiment, three four-pole LED lamps 402 and two resistors 405 constitute a unit circuit. At one end of each unit circuit, the first and second connection paths 421A, 421B are both connected to the first trunk path 411 while at the other end, one of the two resistors 405 is connected between the first connection path 421A and the third trunk path 419, and the other of the two resistors 405 is connected between the second connection path 421B and the second trunk path 412. It should be noted that the number of four-pole LED lamps 402 should not be limited to three.

As shown by broken lines in FIG. 55, a higher voltage of a DC power source is connected to the first trunk path 411 while a lower voltage of the DC power source is connected to the third trunk path 419 via a switch SW1 as well as to the second trunk path 412 via a second switch SW2, such that closing the first switch SW1 can lighten the upper LED chip (first LED chip) in each four-pole LED lamp 402 in the drawing and closing the second switch SW2 can lighten the lower LED chip (second LED chip) in each four-pole LED lamp 402. Thus, when the upper and lower LED chips in each LED 402 have different light colors, it is possible to vary the light color by controlling the switches SW1, SW2.

Figure 56:
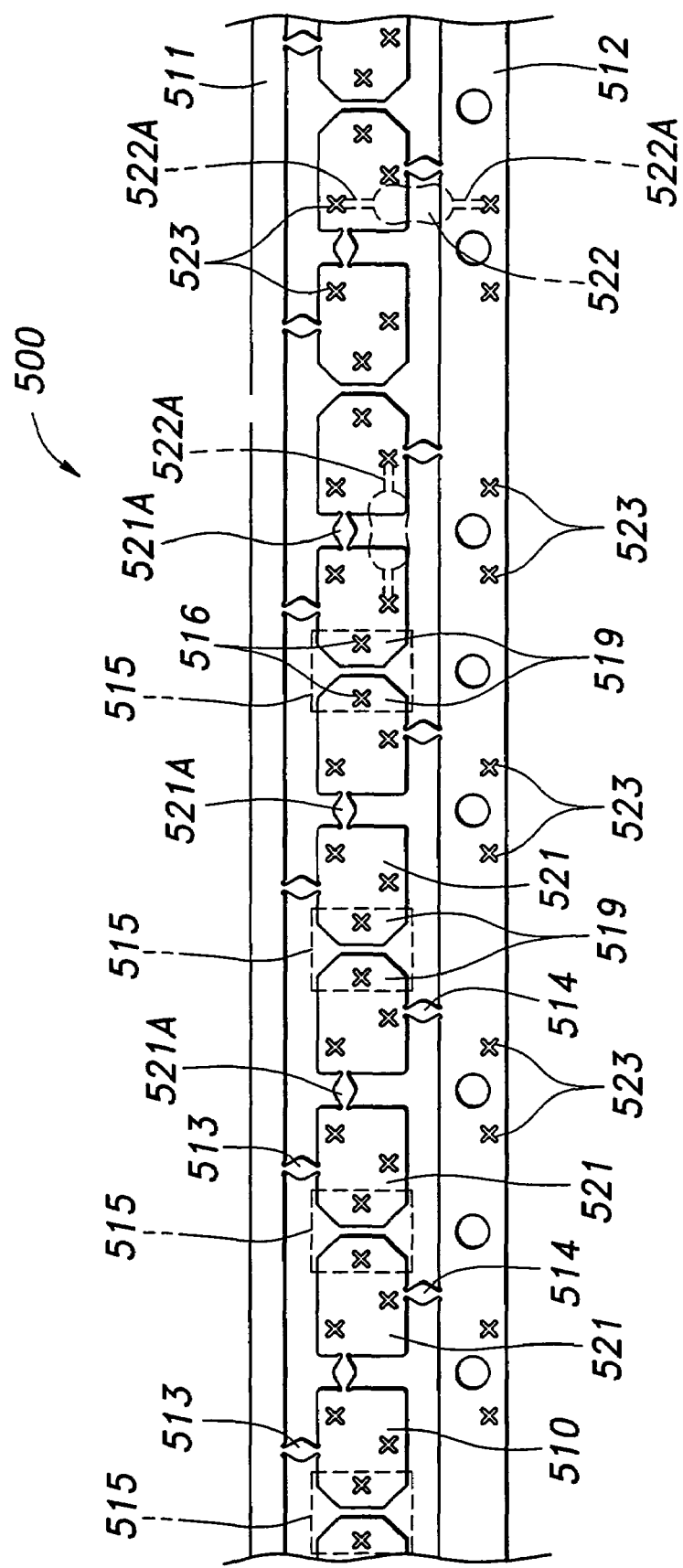
FIG. 56 is a partial plan view showing another embodiment of a patterned conductor according to the present invention.

FIG. 56 is a partial plan view showing a yet another embodiment of a tape-shaped patterned conductor according to the present invention. This patterned conductor 500 comprises a plurality of longitudinally arranged light source attachment portions 515 for mounting light sources, and these light source attachment portions 515 are connected in the longitudinal direction by interconnection path 510. Each light source attachment portion 515 includes a pair of terminal connection parts 519 corresponding to a pair of terminals of a light source, and the pair of terminal connection parts 519 are mutually spaced apart in the longitudinal direction. Each terminal connection part 519 is formed with a cross-shaped hole 519 so that if the light source consists of a bullet-type LED such as the LED 102 shown in FIG. 16, the lead wires 103 thereof may be inserted into the associated cross-shaped holes 519. If the light source consists of a chip-type LED such as the LED 152 as shown in FIG. 31, the LED 152 can be attached to the terminal connection parts 519 by laser welding. The interconnection path 510 comprises a plurality of connection paths 521 connecting the terminal connection parts 519 contained in adjoining light source attachment portions 515. In other words, a connection path 521 and a pair of terminal connection parts 519 connected by the connection path 521 constitute a coupling piece. Part of each connection path 521 constitutes a bridge portion 521A having a relatively narrow width so as to be easily cut off to separate the terminal connection parts 519 connected via the bridge portion 521A. Further, first and second trunk paths 511, 512 are disposed on either side of the patterned conductor 500, interposing the light source attachment portions 515 and the interconnection path 510 therebetween. Each light source attachment portion 515 is connected to one of the first and second trunk paths 511, 512 via corresponding one of branch paths 513, 514 such that one of the pair of terminal connection parts 519 of each light source mount portion 515 is connected to the first trunk path 511 and the other is connected to the second trunk path 512. It is of course possible to provide the branch paths 513, 524 such that each of the pair of terminal connection parts 519 is connected to both of the first and second trunk paths 511, 512.

In this embodiment, in order to reliably attach resistors having a pair of lead wires such as the resistor 122 shown in FIG. 122, the connection paths 521 and second trunk path 512 are formed with cross-shaped holes 523 into which the lead wires of the resistors are inserted. As shown by broken lines in FIG. 56, a resistor 522 can be connected between the terminal connection part 519 and the second trunk path 512 or between adjacent terminal connection parts 519 contained in adjacent light source attachment portions by inserting lead wires 522A of the resistor 522 into the holes 523 (and preferably laser welding them). When the resistor 522 is attached, an associated bridge portion 521A or branch path 514 is cut off. In this embodiment, in order to allow the bridge portions 521A and branch paths 514 to be cut off after the attachment of the resistors 522, the bridge portions 521A are offset from the widthwise center of the connection paths 521, and the resistor mount holes 523 are arranged such that when the resistors 522 are attached, the resistors 522 do not overlap the bridge portions 521A or branch paths 514.

In the connective conductor structure (FIG. 21) made by conducting secondary processing of the tape-shaped patterned conductor 120 of FIG. 18 to connect the light sources in series, for example, the branch paths 113, 114 connecting the trunk paths 111, 112 to the terminal connection parts 109 are cut off. Therefore, when the LEDs 102 (FIG. 16) are connected by such a connective conductor structure and electric current flows through the LEDs 102, the heat generated thereby cannot be dissipated via the trunk paths 111, 112, undesirably increasing the temperature around the LEDs 102. FIG. 57 shows a way of secondary processing of the patterned conductor 120 for achieving a series connection of LEDs while allowing heat dissipation through the trunk paths 111, 112 to prevent undesirable increase in the temperature around the LEDs. In FIG. 57, parts similar to those of FIG. 18 are denoted with same reference numerals and detailed description thereof is omitted.

As shown in FIG. 57, in this embodiment, parts of trunk paths 111, 112 indicated by hatching are cut off instead of the branch paths 113, 114. In this way, it is possible to electrically separate the pair of terminal connection parts 109, 109 in each light source attachment portion 5 to thereby allow series connection of LEDs 102 (FIG. 16) while retaining the trunk paths 111, 112 connected to the terminal connection parts 109. Thus, in this embodiment, the heat generated by the current flowing through the LEDs 102 can be dissipated from the trunk paths 111, 112. This can prevent the heat from staying around the LEDs 102 and excessively increasing the temperature. In the shown embodiment, each terminal connection part 109 is connected to both of the first and second trunk paths 111, 112, it may be possible that each terminal connection part 109 is connected to only one of the first and second trunk paths 111, 112.

Figure 58A:
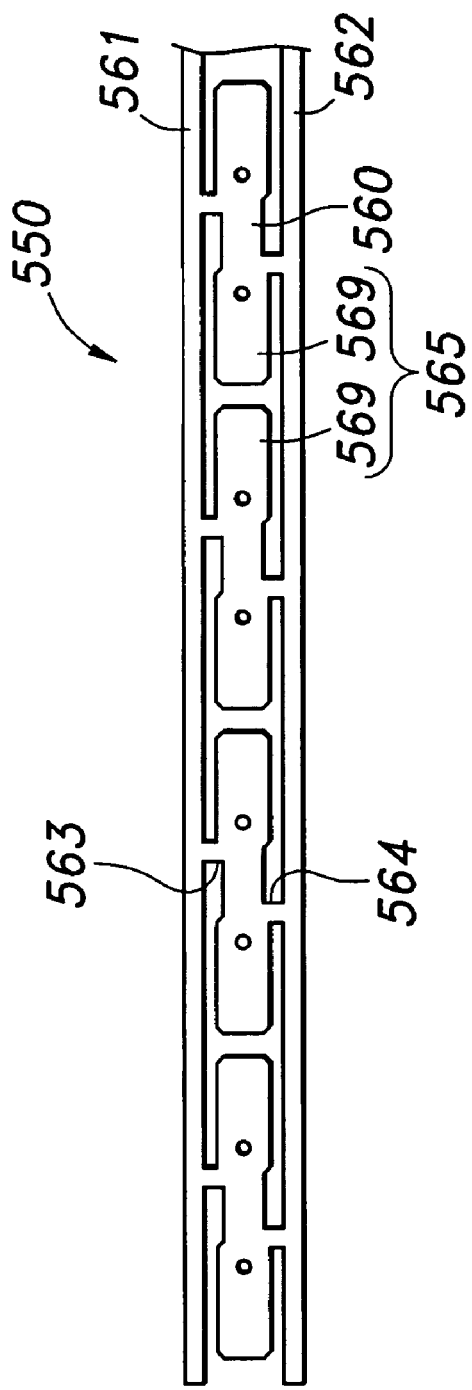
FIG. 58a is a plan view showing a patterned conductor suitable for forming a light source assembly having a reduced width.
Figure 58B:
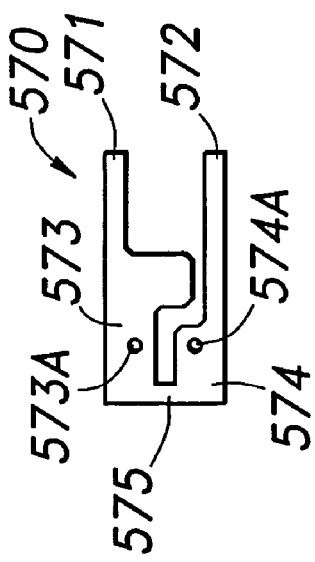

In a case that a light source assembly is accommodated in a light-transmissive glass tube or the like to form a light emitting apparatus as in the embodiment shown in FIG. 39, if the glass tube has a small inner diameter (about 5 mm, for example), it is required to use a patterned conductor having a narrow width accordingly. FIG. 58a shows such a patterned conductor 550. This patterned conductor 550 comprises terminal connection parts 569 constituting light source attachment portions 565 to which light source (not shown) are attached, an interconnection path 560 for connecting the light source attachment portions 565 in a longitudinal direction, first and second trunk paths 561, 562 laterally interposing the light source attachment portions 565 and interconnection path 560 therebetween and extending in the longitudinal direction, and a plurality of widthwise extending branch paths 563, 564 for connecting the light source attachment portions 565 to the trunk paths 561, 562 in the same way as in the above embodiments, but is characterized by the trunk paths 561, 562 having a narrow width. Owing to such characteristics, the patterned conductor can be accommodated in a glass tube having a small diameter, but it is difficult to attach terminal pins such as the conductive pins 93 as shown in FIG. 39 for connection with outer power supply to ends of the trunk paths 561, 562. FIG. 58b shows an end conductor 570 to allow terminal pins to the ends of the narrow trunk paths 561, 562 of the patterned conductor 550 shown in FIG. 58a. This end conductor 570 comprises a pair of smaller width portions 571, 572 for connection with the trunk paths 561, 562 of the patterned conductor 550, and a pair of larger width portions 573, 574 coupled to the smaller width portions 571, 572, respectively. The pair of larger width portions 573, 574 are each formed with a hole 573A, 574A that can be used to attach terminal pins to the larger width portions 573, 574. Preferably the end conductor 570 is subjected to laser welding with the pair of smaller width portions 571, 572 being placed over the corresponding trunk paths 561, 562 so as to be unitary to the patterned conductor 550. Though in the shown embodiment the lager width portions 573, 574 are mutually connected via a bridge portion 575, they are separated from each other by cutting off the bridge portion 575 before use. Thus, by using the end conductor 570 having the pair of smaller width portions 571, 572 and the pair of larger width portions 573, 574, it becomes possible to easily attach terminal pins to the patterned conductor 550 with the narrow trunk paths 561, 562.

In the embodiment shown in FIG. 36, in order to prevent the parts of the connective conductor structure 104 from being separated apart or in order to increase the mechanical strength of the connective conductor structure 104 to thereby allow easy handling thereof, the insulating sheet 184' is attached to the side of the patterned conductor 120 opposite to the side on which the light sources are mounted. However, as shown in yet another embodiment 101a of a light source assembly shown in FIG. 59, the insulating sheet 184' may be attached by hot melt bonding or the like to the side of the patterned conductor 120 (connective conductor structure 104) on which the light sources are mounted. In this drawing, parts similar to those of FIG. 36 are denoted with same reference numerals and detailed explanation thereof is omitted. As shown, the insulating sheet 184' is formed with openings 185 at prescribed positions so that light sources (LEDs) can be attached to the terminal connection parts 109 of the patterned conductor 120 in a similar manner as in the embodiment of FIG. 36. Such openings 185 can be formed before the insulating sheet 184' is attached to the patterned conductor 120 or may be formed by press work, laser processing, etc. after the attachment of the sheet 184'. By attaching the insulating sheet 1847 to the side of the patterned conductor 120 on which the light sources are mounted as described above, it is possible to prevent the parts to which power supply voltage are applied from being exposed on the light source mount side which are more likely to be touched by an operator, and thus improving the safety. Further, the insulating sheet 184' can reflex the light from the light sources 102 to increase the illumination efficiency.

Figure 60A:
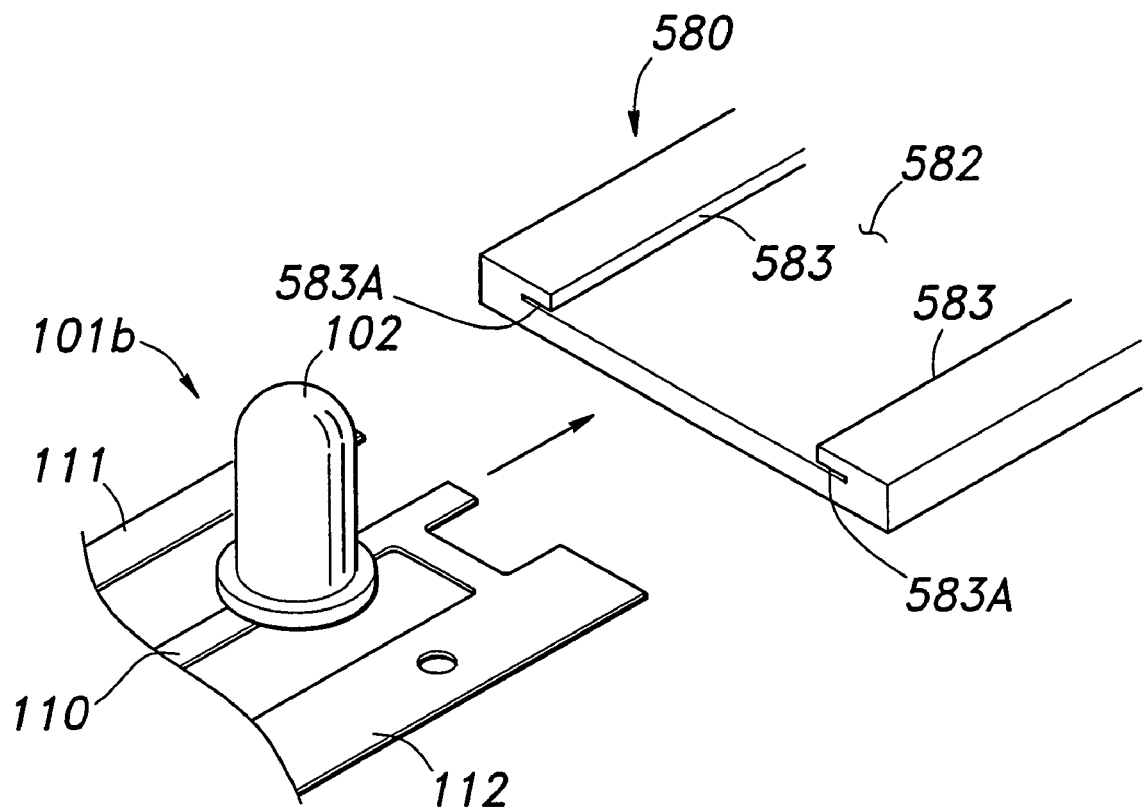
FIG. 60a is a partial perspective view showing a way of attaching the light source assembly to a holder.
Figure 60B:
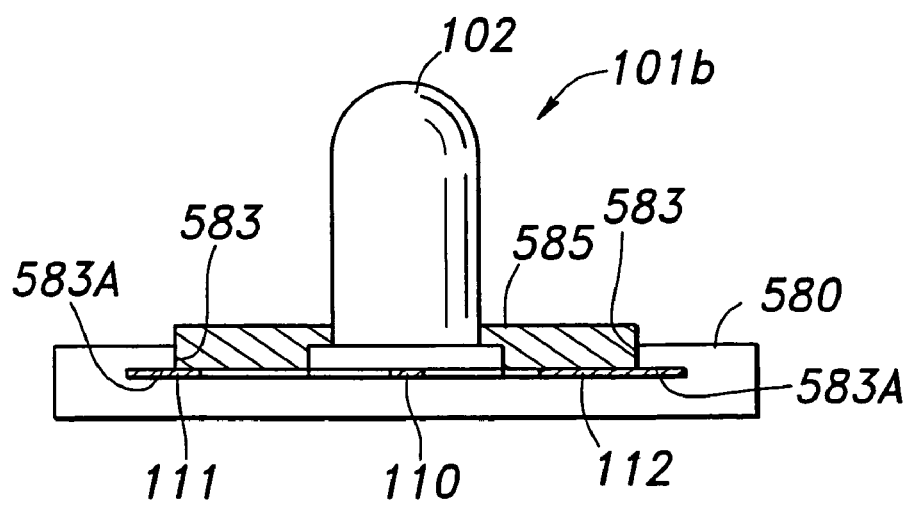
FIG. 60b is a cross-sectional view of the light source assembly attached to the holder.

In the case where the insulating sheets 184, 184' are used, as described above, to prevent the parts of the connective conductor structure 104 formed by secondary processing of the patterned conductor from being separated apart, it is preferable to attach the resulting light source 101', 101", 101a to a holder to add supplementary mechanical strength. In the case that the light sources 120 are attached to the patterned conductor 120 before cutting off parts of the patterned conductor 120 to make the connective conductor structure 104 and hence a light source assembly, it is not necessary to use joint members such as the insulating sheet 184', but the mechanical strength of the resulting light source assembly is further decreased. Therefore, in such a case also, the use of a holder is preferred. FIG. 60*a* shows a preferable way of attachment of the light source assembly to the holder. FIG. 60*b* is a cross-sectional view showing a state where the light source assembly has been attached to the holder.

As shown in FIGS. 60*a* and 60*b*, this holder 580 comprises a longitudinally extending channel 582 at its center, and mutually facing side walls 583, 583 of the channel are formed with longitudinally extending opposite guide grooves 583A, 583A corresponding to the pair of trunk paths 111, 112 of a light source assembly 101*b*. In this embodiment, the light source assembly 101*b* is formed by using the patterned conductor 120 shown in FIG. 18 but does not comprise the joint members, and the cramping of the lead wires 103 by the extensions 117 is not carried out and the lead wires 103 and the patterned conductor 120 is achieved by laser processing such that the bottom surface is substantially flat (FIG. 60*b*). As seen in FIG. 60*a*, by slidingly move the light source assembly 101*b* in the direction indicated by an arrow in the drawing with the pair of trunk paths 111, 112 being fitted in the corresponding guide grooves 583A, 583A, the light source assembly 101*b* can be easily attached to the holder 580. Thereafter, as shown in FIG. 60*b*, a cover member 585 made of an insulating material is attached to the side of the light source assembly 101*b* on which the light sources are mounted, to prevent exposure of the parts applied with a power supply voltage and avoid inadvertent short-circuit due to dust or the like. When the insulating sheet 184' is attached to the light source attachment side as shown in FIG. 59, the cover member 585 may be omitted.

Figure 61:
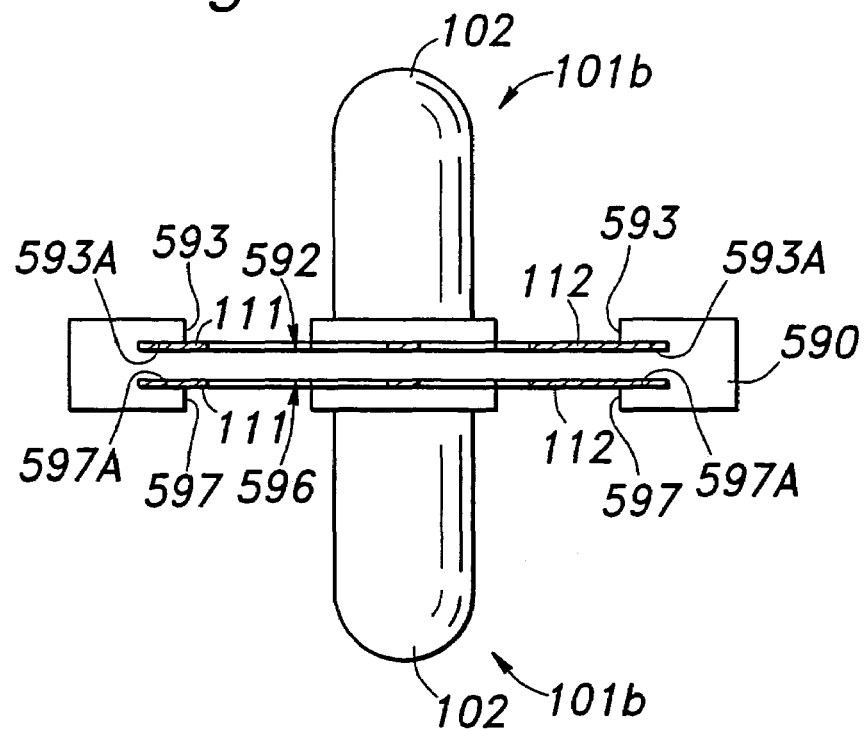
FIG. 61 is a cross-sectional view showing another embodiment of attaching the light source assembly to the holder.

FIG. 61 is a cross-sectional view showing another embodiment of a holder. The light source assemblies 101*b* are each identical to that shown in FIGS. 60*a* and 60*b*. This holder 590 has longitudinally extending channels 592, 596 on upper and under sides thereof, and has a cross-section of a shape of the letter "H". Mutually facing side walls 593, 593 and 597, 597 of the channels 592, 596 are formed with guide grooves 593A, 593A and 597A, 597A, respectively, into which the trunk paths 111, 112 of the associated light source assembly are fitted. The use of such a holder 590 allows the light source assembly 101*b* to be attached on both of the upper and under sides of the holder 590 so that the light can be generated on both of the upper and under sides.

Figure 62A:
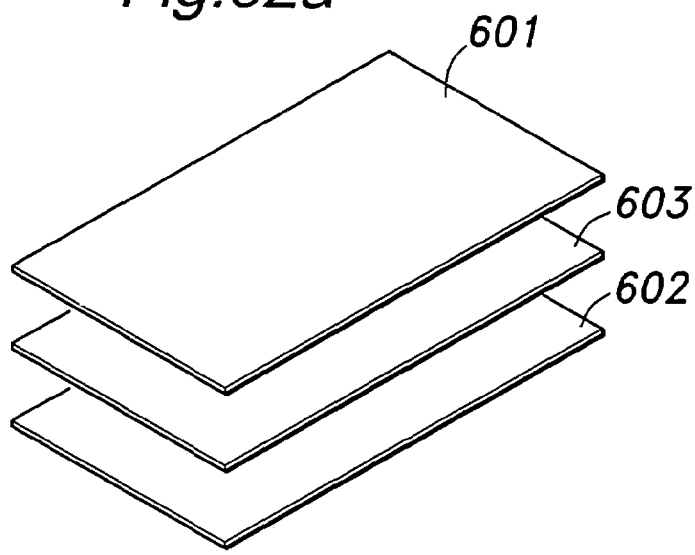
FIGS. 62a-62c schematically show a manufacturing process of the patterned conductor and light source assembly using photo-etching.
Figure 62B:
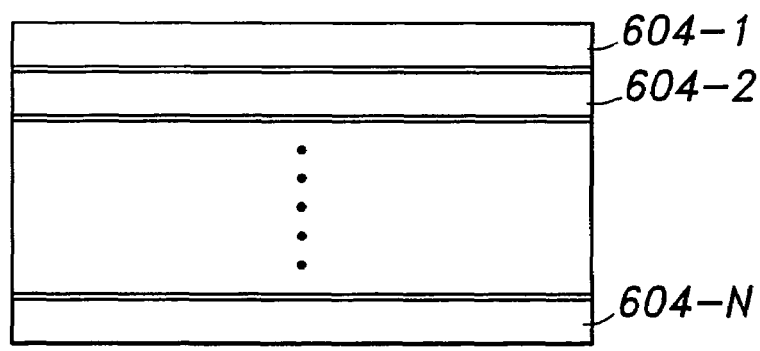
Figure 62C:
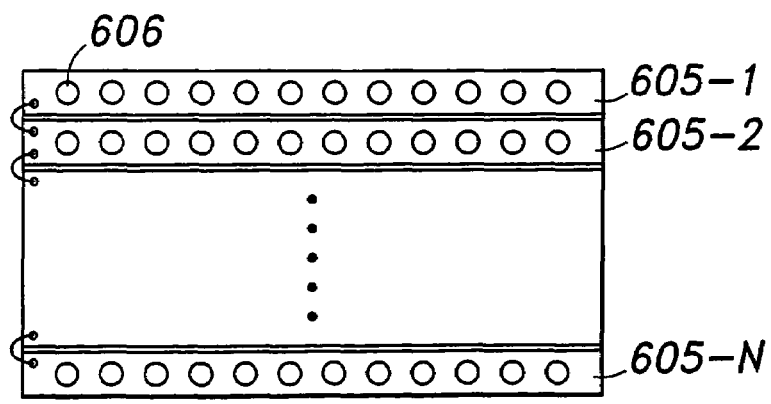

The patterned conductor (120, 200, etc.) according to the present invention can be preferably formed by a progressive press machine as described above, but it is also possible to form the patterned conductor by photo-etching. FIGS. 62*a*-62*c* show a preferable way of using photo-etching to form a patterned conductor for constituting a light source assembly. As shown in FIG. 62*a*, a conductive plate 601 made of phosphor bronze, for example, and an insulating plate 602 having substantially the same size interposing a hot melt bonding sheet 603 therebetween are pressed together at a high temperature to thereby bonding the conductive plate 601 to the insulating plate 602. Then, photo-etching is conducted to form a plurality of longitudinal patterned conductors 604-1, 604-2, . . . , 604-N each having a pattern as shown in FIG. 56. In FIG. 62*b*, the formed pattern is not shown. Press working may be conducted in addition to photo-etching to form holes for insertion of lead wires of light sources or resistors. In this state, the patterned conductors 604-1, 604-2, . . . , 604-N are all attached to the insulating plate 602. Subsequently, appropriate parts of patterned conductors 604-1, 604-2, . . . , 604-N are cut off by press working, for example, to form desired connective conductor structures, on which light sources 606 (and resistors, if necessary) are attached to make light source assemblies 605-1, 605-2, . . . , 605-N. It should be understood that in FIG. 62*c*, the light source assemblies 605-1, 605-2, . . . , 605-N joined by the insulting plate 602 constitute a surface light source. It may be also possible to cut the insulating plate 602 after or before the attachment of the light sources 606 to separate the light source assemblies (connective conductor structures) 605-1, 605-2, . . . , 605-N from each other.

Figure 63A:
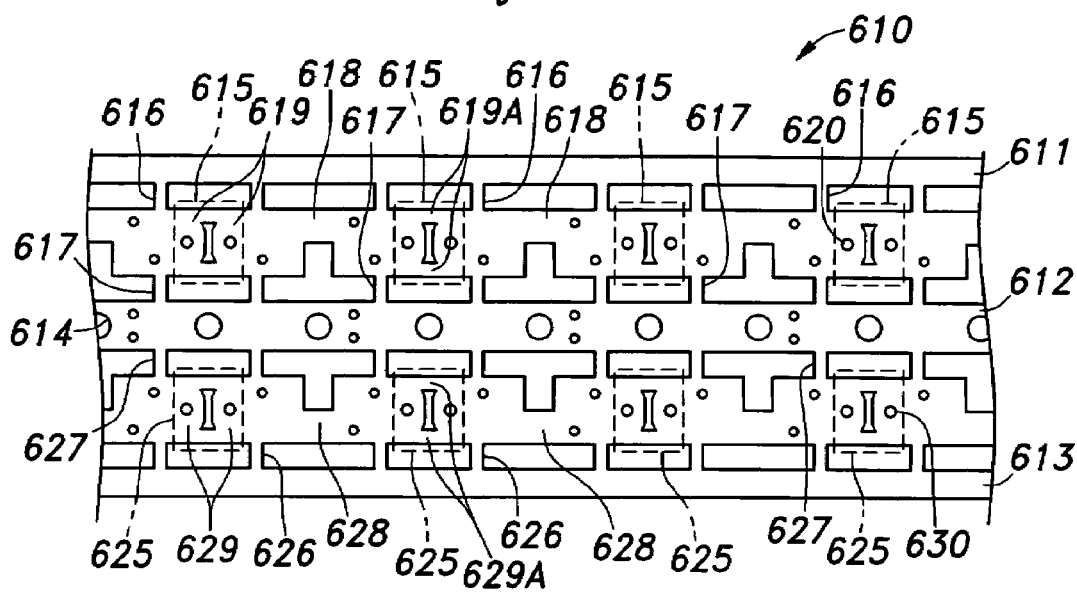
FIG. 63a is a partial plan view of a patterned conductor suitable for forming a light source assembly having light sources arranged in two rows.

In the above embodiments, light source assemblies (101, 101', 101", 201, etc.) having a plurality of light sources arranged in a line by using patterned conductors (120, 200, etc.). However, a light source assembly comprising a plurality of lines of light sources may be achieved by using a patterned conductor. FIG. 63*a* is a partial plan view showing an embodiment of a patterned conductor that can be used to form a light source assembly having, for example, two lines of light sources. As shown in the drawing, this patterned conductor 610 has a structure that results from widthwise joining two patterned conductors each for forming a light source assembly having light sources arrange in a line (patterned conductors for single-line light source arrangement). Specifically, the patterned conductor 610 for two-line light source arrangement comprises first to third trunk paths 611, 612, 613 extending in parallel in the longitudinal direction and used for connection with power source, and the central second trunk path 612 is formed with pilot holes 614 for facilitating transportation/positioning of the patterned conductor in a progressive press machine. Between the first trunk path 611 and the second trunk path 612, a plurality of light source attachment portions 615 are arranged along the longitudinal direction such that each light source attachment portion is connected to the first trunk path 611 and the second trunk path 612 by corresponding widthwise extending branch paths 616, 617, and adjoining light source attachment portions 615 are connected to each other by an interconnection path 618. Similarly, between the second trunk path 612 and the third trunk path 613, a plurality of light source attachment portions 625 are arranged in the longitudinal direction and connected by an interconnection path 628, and each of the light source attachment portions 625 is connected to the second and third trunk paths 612, 613 by corresponding widthwise extending branch paths 626, 627. It can be said that in this embodiment, two patterned conductors, each for arranging the light sources in a line, share the central second trunk path 612. Each light source attachment portion 615 located between the first and second trunk paths 611, 612 comprises a pair of terminal connection parts 619, 619 corresponding to a pair of terminals of an associated light source, and in this embodiment, the pair of terminal connection parts 619, 619 are connected by two bridge portions 619A, 619A which are cut off before attachment of the light source to separate the pair of terminal connection parts 619, 619 in each light source attachment portion 615. Each terminal connection part 619 is formed with a hole 620 so that when a light source has a lead wire, the lead wire can be inserted into the hole 620. Similarly, each light source attachment portion 625 located between the second and third trunk paths 611, 613 comprises a pair of terminal connection parts 629, 629 corresponding to a pair of terminals of an associated light source, and in this embodiment, the pair of terminal connection parts 629, 629 are connected by two bridge portions 629A, 629A. Further, each terminal connection part 629 is formed with a hole 630 so that when a light source has a lead wire, the lead wire can be inserted into the hole 630.

Figure 63B:
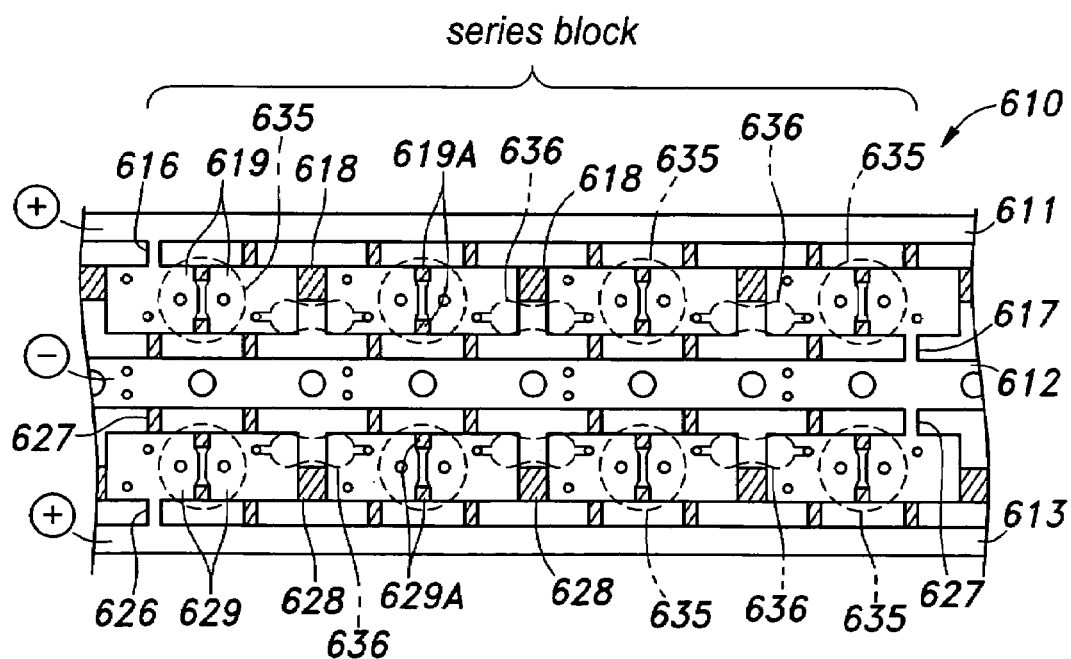
FIG. 63b is a partial plan view showing an example of secondary processing of the patterned conductor.

FIG. 63*b* shows an example of secondary processing of the patterned conductor 610 of FIG. 63*a*. In this drawing, light sources 635 and resistors 636 to be attached are shown by broken lines, and parts to be cut off are shown by hatching. The light sources 635 and resistors 636 can be of the type having lead wires such as the LEDs 102 and resistors 122 shown in FIG. 16, though chip-type LEDs and resistors without lead wires also may be used. Further, electric polarities of the power supply voltage to be applied are shown by symbols. It should be understood that in the shown example, the secondary processing of the patterned conductor is designed such that each line of light sources 635 form a series-parallel connection of light sources where a plurality of series blocks each comprising four light source 635 are connected in parallel. Of course, the secondary processing of the patterned conductor 610 for achieving series or parallel connection of the light sources 635 in each line of light sources may also be possible.

Figure 64:
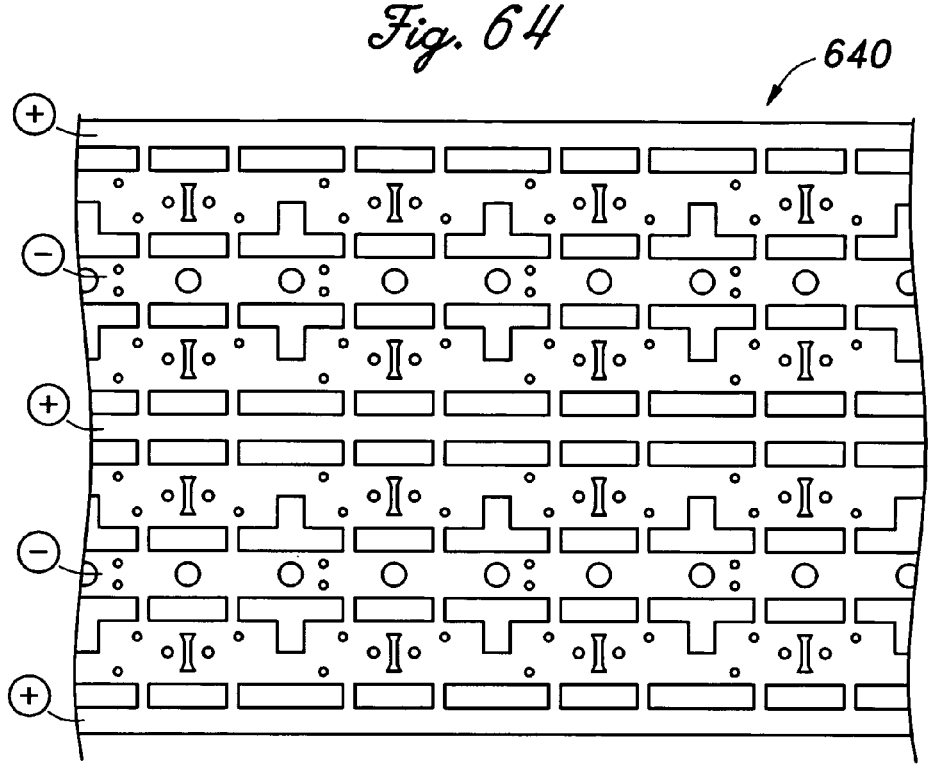
FIG. 64 is a partial plan view suitable for forming a light source assembly having light sources arranged in four rows.

FIG. 64 is a plan view showing an embodiment of a patterned conductor that can arrange light source in four lines. This patterned conductor 640 has a structure resulting from widthwise joining two patterned conductors shown in FIG. 63*a*, and it should be understood by applying power supply voltage as indicated in the drawing, each line of light sources can receive electric power appropriately. Thus, according to the present invention, there is provided a patterned conductor that can arrange the light sources in a plurality of lines, and by varying the parts to be cut off in the secondary processing, can achieve various connections of light sources, such as parallel, series, or series-parallel connections, in each line of light sources.

Figure 65:
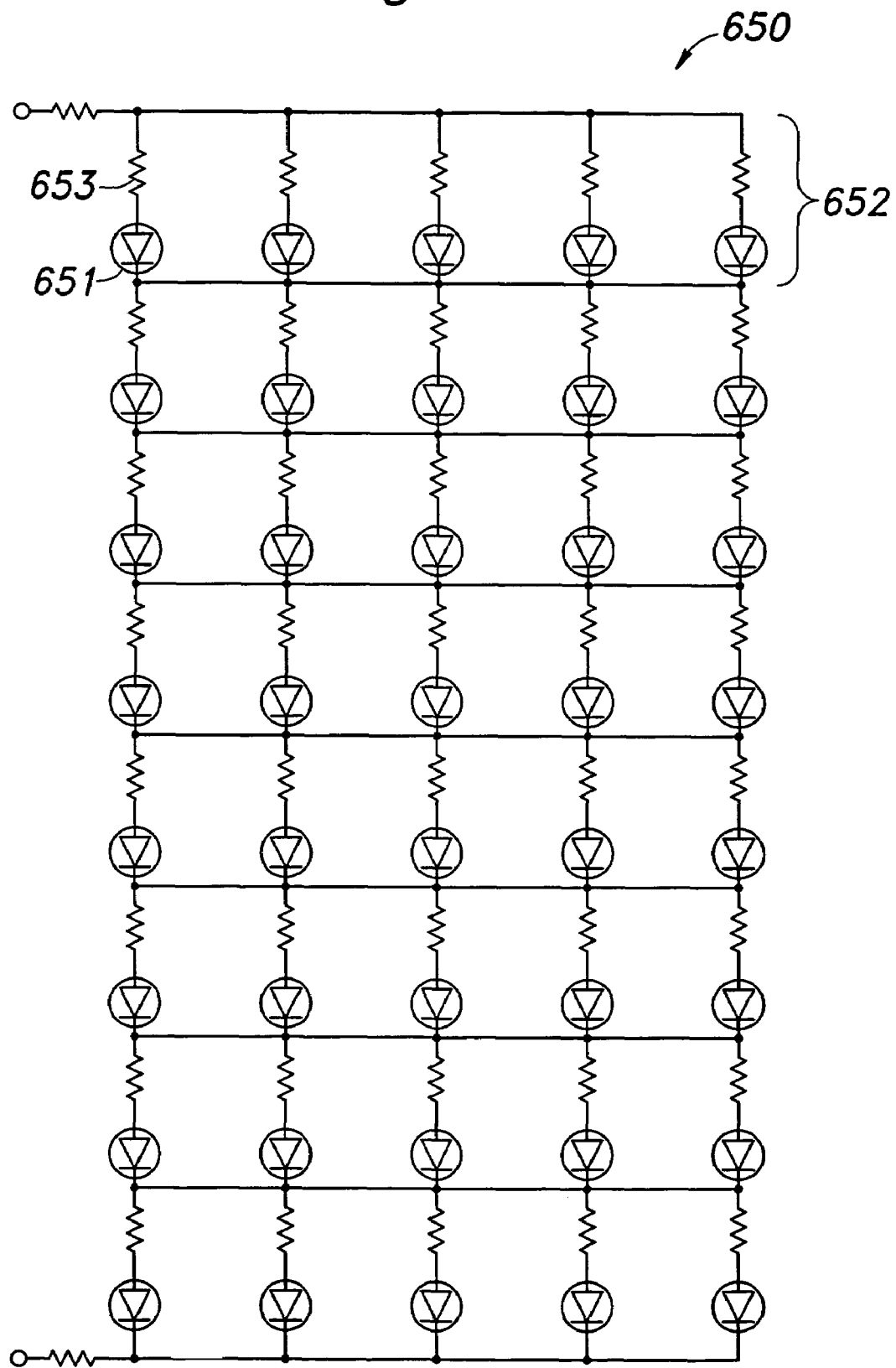
FIG. 65 is a circuit diagram showing a preferred embodiment of an LED circuit suitable for use as a traffic light.

Because LEDs have a benefit that they consume little power and have long lifetime, it has been proposed using LEDs as light sources to constitute a traffic light. In the case where the LEDs are connected in series or series-parallel connection, a single malfunctioning LED that bars electric current flow would prevent electric current from flowing through the other LEDs connected in series to the malfunctioning LED, and this can significantly reduce the brightness of the traffic light. Thus, it has been proposed to connect a plurality of LEDs in parallel, and to connect a plurality of thus-constituted parallel connections of LEDs in series to form a matrix circuit (see e.g., FIG. 9 of Japanese Utility Model Application Laid-Open No. 4-8454). In this circuit, even when a single LED breaks down and stops current conduction, electric current can flow through the LEDs connected in parallel with the malfunctioning LED, and thus significant decrease in the amount of light can be prevented. In such a circuit, however, if an LED undergoes a short-circuiting malfunction, the ends of the LEDs connected in parallel with the malfunctioning LED are all short-circuited so that the light emitted from these LEDs is lost, leading to a significant decrease in the amount of light. FIG. 65 is a schematic view showing an LED circuit suitable for a traffic light that can prevent significant decrease in the total amount of light even in case of such a short-circuiting failure of an LED.

In the LED circuit 650 shown in FIG. 65, eight parallel connections 652 of light sources, each of which includes five LEDs 651 connected in parallel, are connected in series to constitute a matrix circuit in the same manner as in the conventional embodiment. The LED circuit 650 can be characterized by that each LED 651 is connected in series with an associated resistor 653. Owing to such a structure, even if an LED 651 undergoes a short-circuiting failure, a voltage is maintained across the resistor 655 connected in series with the malfunctioning LED 651 and therefore, short-circuit of the ends of the other LEDs connected in parallel with the malfunctioning LED 651 is prevented and the light emission is maintained. Therefore, it is possible to prevent significant decrease in the total amount of light, even if a single LED 651 suffers a short-circuiting malfunction. It should be noted that the number of LEDs 651 connected in series as well as the number of light source parallel connections 652 connected in series can be varied arbitrarily.

Figure 66:
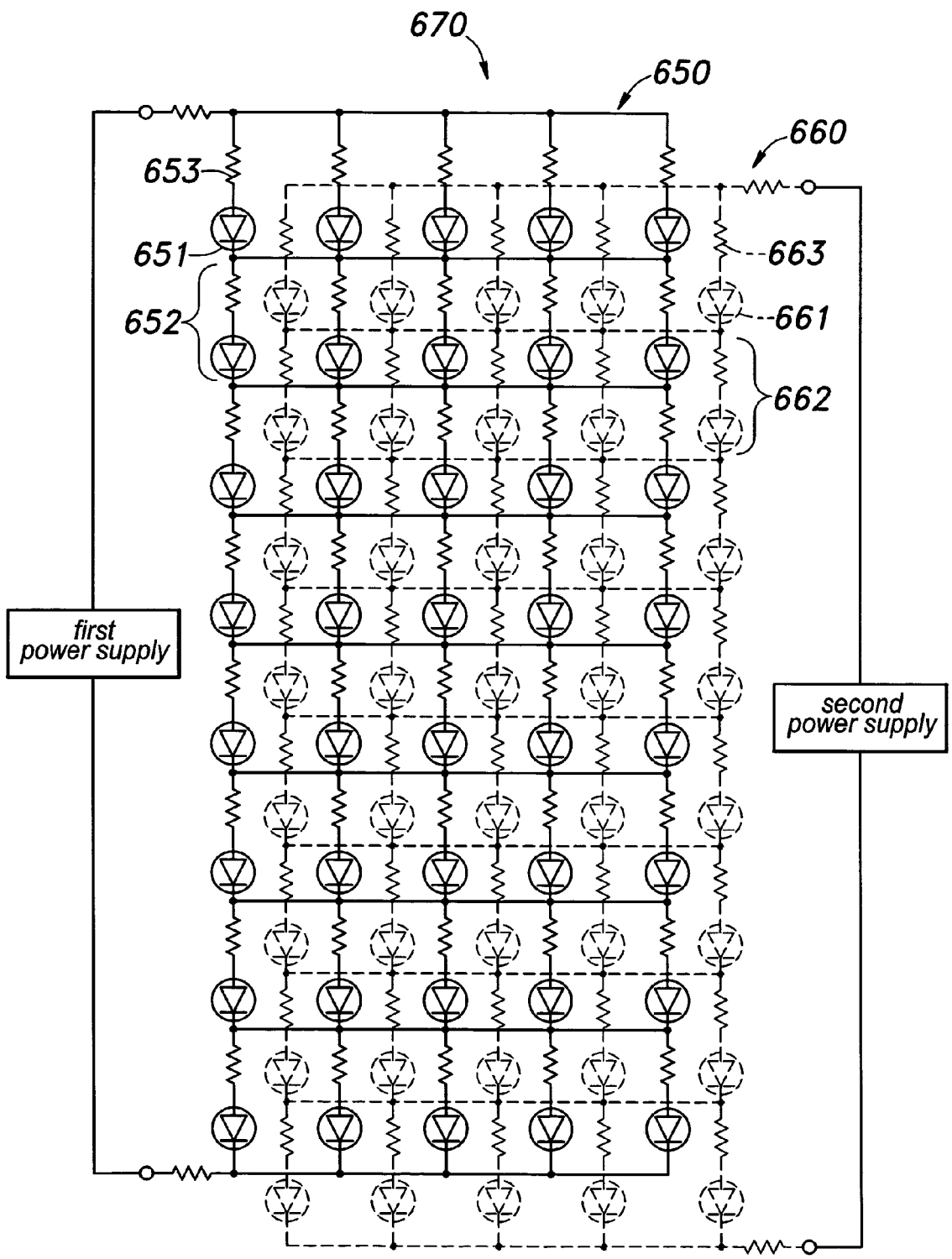
FIG. 66 is a circuit diagram showing another preferred embodiment of an LED circuit suitable for use as a traffic light.

As shown in FIG. 66, it is possible to form a light emitting apparatus 670 by additionally preparing another LED circuit 660 in which a plurality of light source parallel connections 662 are connected in series such that light sources 661 are connected in the matrix pattern in a similar manner as in the LED circuit 650 of FIG. 65, connecting the two LED circuits to respective, independent power supplies (first power supply and second power supply), and placing them such the that light sources 651, 661 substantially overlap each other,. By using the two circuits 650, 660 connected separate power supplies, it is possible to maintain minimum required brightness even when one of the power supplies fails.

Figure 67:
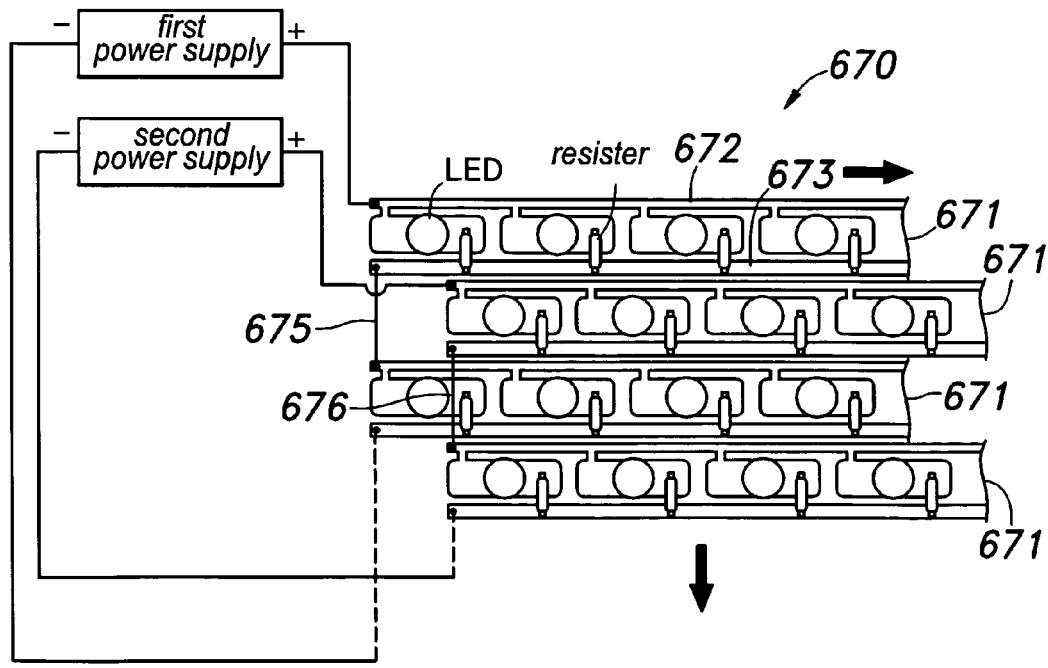
FIG. 67 is a schematic view showing a way of using a light source assembly to form a surface light emitting apparatus having an electric connection as shown in FIG. 66.

As shown in FIG. 67, a light emitting apparatus 670 having a circuit structure shown in FIG. 66 can be easily achieved by using light source assemblies 671 formed from patterned conductors according to the present invention. The light emitting apparatus 670 of FIG. 67 comprises a plurality of light source assemblies 671 arranged in the widthwise direction, and light source assemblies 671 connected different power supplies (first and second power supplies) are alternately placed in the widthwise direction. The LEDs contained in each light source assembly 671 are connected in parallel between a pair of trunk paths 672, 673 such that each LED is connected to one trunk path 673 via an associated resistor. Such a light source assembly can be easily formed by carrying out secondary processing of the patterned conductor 500 of FIG. 56, for example, to cut off parts thereof as required and using it to connect the LEDs functioning as light sources. One in every two light source assemblies 671 are connected by jumper wires 675, 676 to form two matrix LED circuits as shown in FIG. 65. The light source assemblies 671 located at both ends are attached to the first power supply or second power supply. In this way, a reliable surface light emitting apparatus suitable for a traffic light can be achieved using the light source assemblies 671 that can be formed from the patterned conductors (500, etc.).

Figure 68:
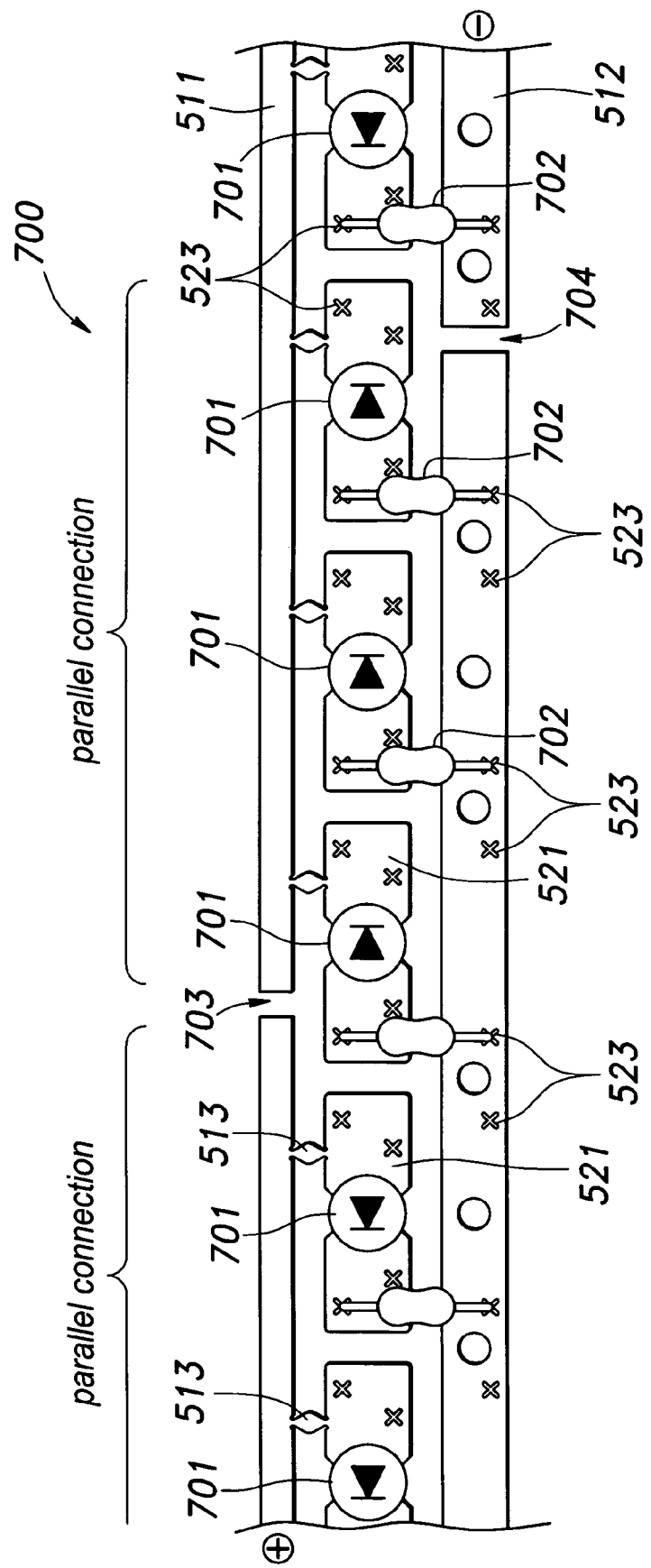
FIG. 68 is a schematic partial plan view showing an embodiment of a light source assembly having an electric connection as shown in FIG. 65 and adapted to provide a linear light emitting apparatus containing LEDs arranged in a line.

FIG. 68 is a schematic partial plan view showing another embodiment of a light source assembly according to the present invention, comprising a plurality of light sources spatially arranged in a line and electrically connected in a matrix pattern as shown in FIG. 65. In this drawing, orientations of the attached LEDs are each indicated by symbols of LEDs. This light source assembly can be also constituted by using a connective conductor structure made by cutting off parts of the patterned conductor 500 shown in FIG. 56 as required. In this drawing, parts similar to those shown in FIG. 56 are denoted with same reference numerals and detailed description thereof is omitted.

In a similar manner as in the above embodiments, this light source assembly 700 comprises a plurality of LEDs 701 as light sources longitudinally arranged in a line, and in this embodiment, a plurality of parallel connections of light source, each of which comprises three LEDs 701 connected in parallel, are connected in series. Of course, the number of LEDs 701 contained in each parallel connection is not limited to three, and other number of LEDs 701 may be included. Similarly to the above embodiment, the light source assembly 700 has first and second trunk paths 511, 512 interposing the LEDs 701 therebetween and extending in the longitudinal direction, and each of the LEDs 701 is connected between the trunk paths 511, 512 via associated branch paths 513 and resistors 702. However, the light source assembly 700 is different from the above embodiments in a sense that in this embodiment, the directions of LEDs 701 contained in adjoining parallel connections are opposite to each other and parts of the first and second trunk paths 511, 512 are cut off. In this way, when a DC voltage is applied with the polarity indicated by symbols, an electric current flows generally from the left to right in the drawing. It should be appreciated from the drawing that because the directions of LEDs 701 contained in adjoining parallel connections, cathodes of the LEDs 701 contained in an upstream one of the adjoining parallel connections are connected to anodes of the LEDs 701 contained in a downstream one. Further, the first and second trunk paths 511, 512 are cut at about a middle part between adjoining parallel connections (reference numerals 703, 704) such that anodes of the LEDs of the upstream one of the adjoining parallel connections are separated from cathodes of the LEDs of the downstream one and that the ends of each LED 701 are not short-circuited. Thus, according to this embodiment, a linear light emitting body can be obtained in which a plurality of parallel connections, each of which comprises a plurality of parallel connected light sources 701, are connected in series and the light sources 701 are arranged in a line.

Figure 69:
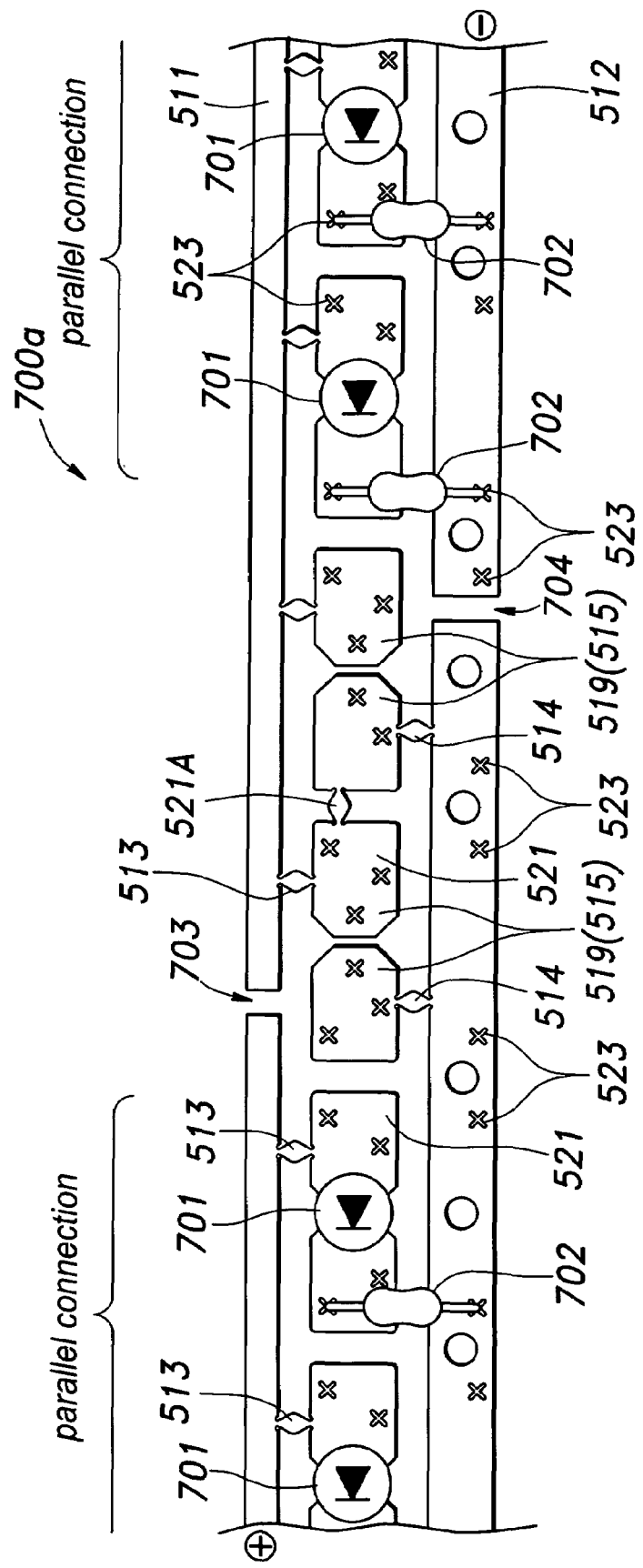
FIG. 69 is a schematic partial plan view showing another embodiment of a light source assembly having an electric connection as shown in FIG. 65 and adapted to provide a linear light emitting apparatus containing LEDs arranged in a line.

FIG. 69 is a schematic partial plan view showing another embodiment of a light source assembly having a similar electric circuit structure and light source arrangement. In this light source assembly 700a also, the power supply voltage is applied as indicated by the symbols and electric current flows generally from the left to right of the drawing. In this embodiment, the directions of the LEDs 701 used as light sources are the same, but in order to connect the cathodes of the LEDs 701 contained in the upstream one of the adjoining parallel connections (or the trunk path 512 connected to the cathodes) to the anodes of the LEDs 701 contained in the downstream one (or the other trunk path 513 connected to the anodes), two light source attachment portions 515 (or the terminal connection parts 519 contained therein) and the branch paths 513, 514 connecting them to the trunk paths 511, 512 are used. As a result, this embodiment has a drawback that the distance between adjoining parallel connections becomes larger than that in the embodiment shown in FIG. 68.

FIG. 70 is a partial plan view showing another embodiment of a patterned conductor suitable for constituting a light source assembly comprising a plurality of light sources spatially arranged in a line and electrically connected in a matrix pattern as shown in FIG. 65. A patterned conductor 500a of FIG. 70 is a modified embodiment of the patterned conductor 500 shown in FIG. 56, and thus in FIG. 70, parts similar to those of FIG. 56 are denoted with same reference numerals and detailed description thereof is omitted. Further, FIG. 71 is a partial plan view showing a light source assembly 700b formed by using the patterned conductor 500a shown in FIG. 70. In FIG. 71, the LEDs 701 are schematically shown so that the orientations of the LEDs 701 are indicated. The LEDs 701 may comprise either of the bullet-type LEDs or chip-type LEDs. In FIG. 71, parts similar to those of FIG. 68 are denoted with same reference numerals and detailed description thereof is omitted.

The patterned conductor 500a of FIG. 70 is different from the embodiment of FIG. 56 in that the present embodiment comprises additional branch paths 517, 518 at a middle part of each bridge portion 521A for connecting the bridge portion 521A to the first and second trunk paths 511, 512. In this way, when the bridge portions 521A to be located between adjoining light source parallel connections are cut off to make a connective conductor structure for connecting the LEDs as light sources, the middle part of the bridge portions 521A and the branch paths 517, 518 can be left uncut so that, as shown in FIG. 71, when the LEDs 701 are attached, cathodes of the LEDs 701 contained in the upstream one of adjoining light source parallel connections can be connected to anodes of the LEDs 701 contained in the downstream one.

The patterned conductor 500a of FIG. 70 has a side frame 524 widthwise spaced from the second trunk path 512 and extending in the longitudinal direction where the side frame 524 is formed with a plurality of pilot holes 526 for engaging with pilot pins of a press machine to allow progressive transportation/positioning of the patterned conductor 500a. The side frame 524 is joined to the second trunk path 512 by a plurality of widthwise extending joints 525. As described in detail later, by bending the joints 525, the side frame 524 can be used to create a space on the underside of the second trunk path 512 for accommodating connection wires and the like.

In the light source assembly 700b of FIG. 71, the first and second trunk paths 511, 512 and side frame 524 are cut at appropriate portions such that, as in the above embodiment, such that anodes of the LEDs of the upstream one of the adjoining light source parallel connections are separated from cathodes of the LEDs of the downstream one and that the ends of each LED 701 are not short-circuited.

FIG. 72a is a schematic diagram of a light emitting apparatus formed by using the light source assembly 700b shown in FIG. 71, and FIG. 72b is a cross-sectional view taken along the line b-b in FIG. 72a. As shown in the drawings, in the light source assembly 700b contained in a light emitting apparatus 710 of FIG. 72a, three light source parallel connections, each of which comprises three parallel connected LEDs 701, are connected in series. Of course the number of LEDs 701 contained in each light source parallel connection and the number of light source parallel connections connected in series can by varied arbitrarily. In FIG. 72a, the side frame 52 is not shown.

The light emitting apparatus 710 comprises a glass tube 711 for accommodating the light source assembly 700b, and a pair of caps 712, 713 provided on either side of the glass tube 711 so as to protect the light source assembly 700b from dust or the like. The caps 712, 713 are each provided with a pair of conductive pins 714, 714 and 715, 715 for electric connection. The pair of conductive pins 714, 714 of one cap 712 (the left one in the drawing) are passed through the cap 712 to be connected to a pair of input terminals of a diode bridge 716 disposed within the glass tube 711. Further, the pair of conductive pins 714, 714 of the cap 712 are connected to the corresponding pair of conductive pins 715, 715 via associated connecting wires 717, 718. In this way, when another light emitting apparatus 710a having an identical structure is axially joined to the light emitting apparatus 710, the power supply voltage can be easily transmitted to the another light emitting apparatus 710a via the connecting wires 717, 718 and the conductive pins 715, 715. One (a higher voltage side in this embodiment) of a pair of output terminal of the diode bridge 716 is connected to an anode side of the LEDs 701 of the electrically most upstream light source parallel connection in the light source assembly 700*b*, while the other (a lower voltage side in this embodiment) is connected to a cathode side of the electrically most downstream light source parallel connection via another connecting wire 719.

As shown in the cross-sectional view of FIG. 72*b*, by bending the joints 525 at positions indicated by arrows A and B in FIG. 71, the side frame 524 can be placed to face the second trunk path 512 so that a space is formed between the side frame 524 and the second trunk path 512 for accommodating the connecting wires 717, 718, 719. This can hold the connecting wires 717, 718, 719 in position within the glass tube 711.

Figure 73:
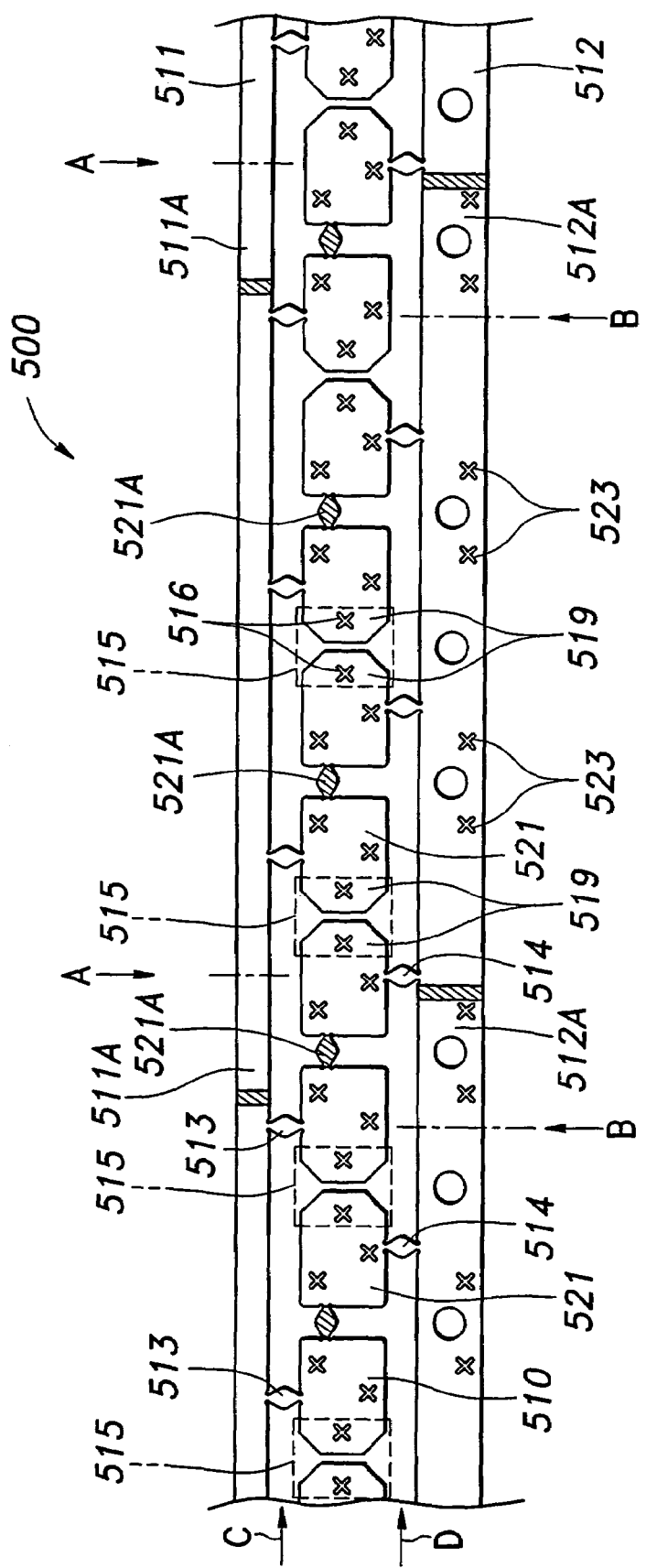
FIG. 73 is a partial plan view showing another example of a secondary processing of the patterned conductor shown in FIG. 56.
Figure 74:
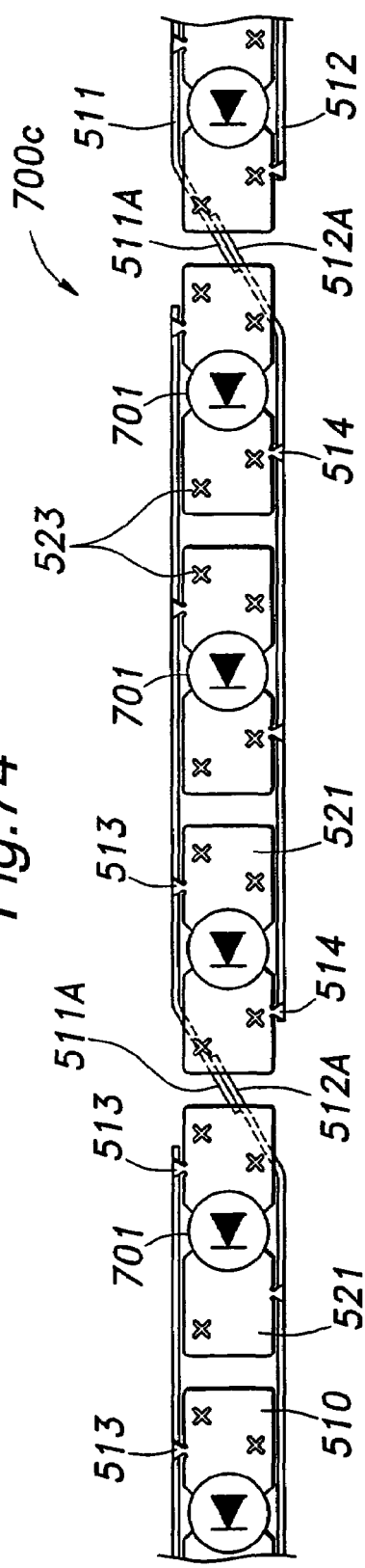
FIG. 74 is a partial plan view of a light source assembly formed by using the patterned conductor applied with the secondary processing shown in FIG. 73.

FIG. 73 is a partial plan view showing another way of secondary processing of the patterned conductor 500 shown in FIG. 56 for forming a light source assembly having a plurality of light sources spatially arranged in a line and electrically connected in a matrix pattern as shown in FIG. 65. In FIG. 73, parts similar to those of FIG. 56 are denoted with same reference numerals and detailed description thereof is omitted. Also, parts to be cut off are shown by hatching. FIG. 74 is a partial plan view showing a light source assembly achieved by using a connective conductor structure made from the patterned conductor applied with the secondary processing shown in FIG. 73. In FIG. 74, the LEDs 701 are shown schematically so that the orientations thereof are indicated.

As shown in FIGS. 73 and 74, in this embodiment, the bridge portions 521A are all cut off so that the LEDs 701 are connected in parallel between the first trunk path 511 and the second trunk path 512. Further, in a similar fashion as in the above embodiment, the first and second trunk paths 511, 512 are cut at an intermediate position between adjoining light source parallel connections.

In the embodiment of FIG. 73, the branch paths 513, 514 are left uncut, and the branch paths 513, 514 are bent at positions indicated by arrows C, D so that the principal surfaces of the first and second trunk paths 511, 512 are substantially perpendicular to the principal surface of the interconnection path 510. Further, the first and second trunk paths 511, 512 are bent at positions indicated by arrows A, B toward the center so that free end portions 511A, 512A formed by the cutting of first and second trunk paths 511, 512 are brought into contact with each other. The mutually contacting free end portions 511A, 512A are welded, for example, to form a conductive path (FIG. 74). As seen in FIG. 74, when the LEDs 701 as light sources are attached to corresponding light source attachment portions 515 such that the LEDs 701 are all disposed in the same direction, the conductive path can connect cathodes of the LEDs 701 contained in an electrically upstream one (left one in the drawing) of adjoining light source parallel connections are connected to anodes of the LEDs 701 contained in a downstream one (right one in the drawing), to whereby connect the light source parallel connections in series. Further, by cutting the first and second trunk paths 511, 512 at appropriate positions, anodes of the LEDs 701 contained in the electrically upstream one of the adjoining light source parallel connections are separated from cathodes of the LEDs 701 contained in the downstream one and the ends of each LED 701 are prevented from short-circuiting. It should be noted that in the embodiment of FIGS. 73 and 74, all of the branch paths 513, 514 are left uncut, although it may be possible to cut off some or all of the branch paths 513, 514 and instead use resistors having lead wires.

Figure 75:
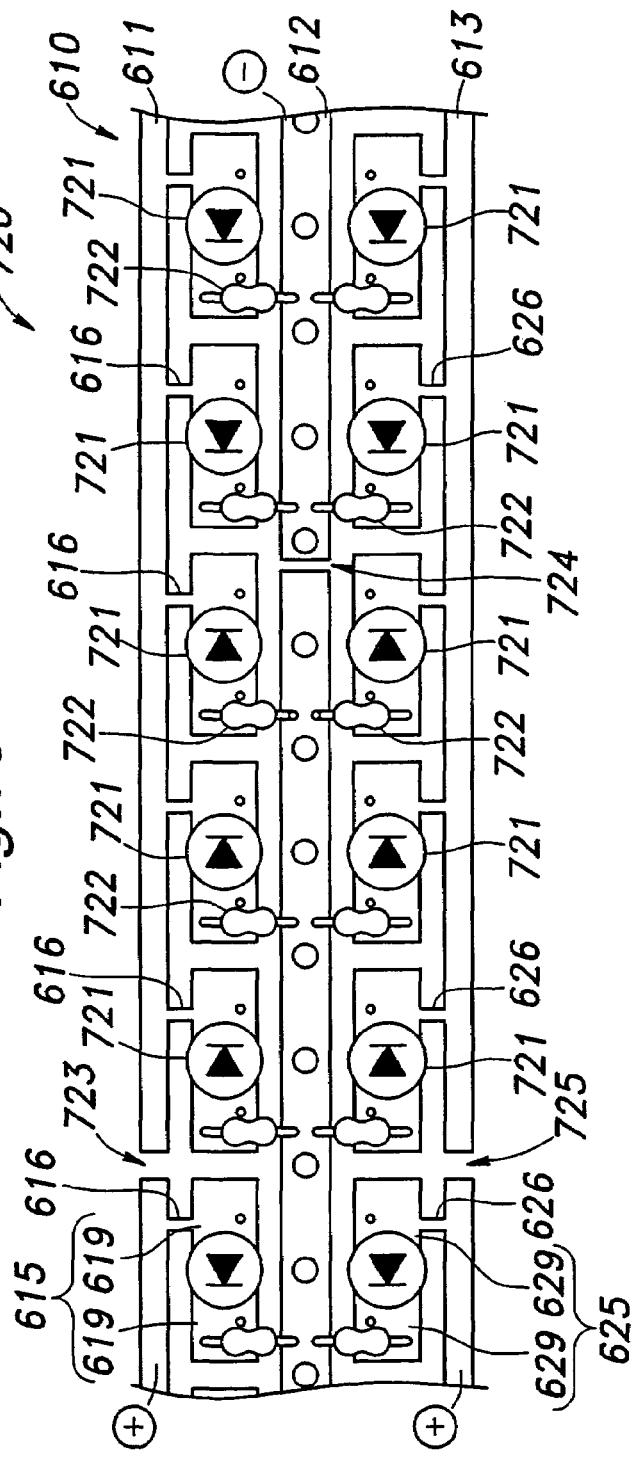
FIG. 75 is a schematic partial plan view showing an embodiment of a light source assembly for providing a linear light emitting body containing two rows of LEDs each having electric connection as shown in FIG. 65.

FIG. 75 is a schematic partial plan view showing a light source assembly formed by using the patterned conductor 610 suitable for arranging the light sources in two lines as shown in FIG. 63*a* such that the light sources are connected in a matrix pattern. In this drawing, parts similar to those of FIG. 63*a* are denoted with same reference numerals and detailed description thereof is omitted, and the LEDs are shown by their symbols so that the orientations thereof can be indicated. In FIG. 75, the patterned conductor 610 is shown in a state after parts thereof have been cut off as required (i.e., converted into a connective conductor structure). LEDs 721 are each connected between the first trunk path 611 and the second trunk path 612 or between the second trunk path 612 and the third trunk path 613 via associated branch paths 616, 626 and resistors 722. In each of the two lines of LEDs 721, a plurality of light source parallel connections, each of which comprises three parallel connected LEDs 721, are formed such that the orientations of LEDs 721 contained in adjoining parallel connections are opposite to each other, as shown by the symbols in the drawing. Further, parts of the first to third trunk paths 611-613 are cut off (reference numerals 723, 724, 725). In this way, each line of LEDs 721 constitutes a matrix circuit, and upon application of voltage with the polarity indicated by symbols, electric current flows generally from the left to right of the drawing.

Figure 76:
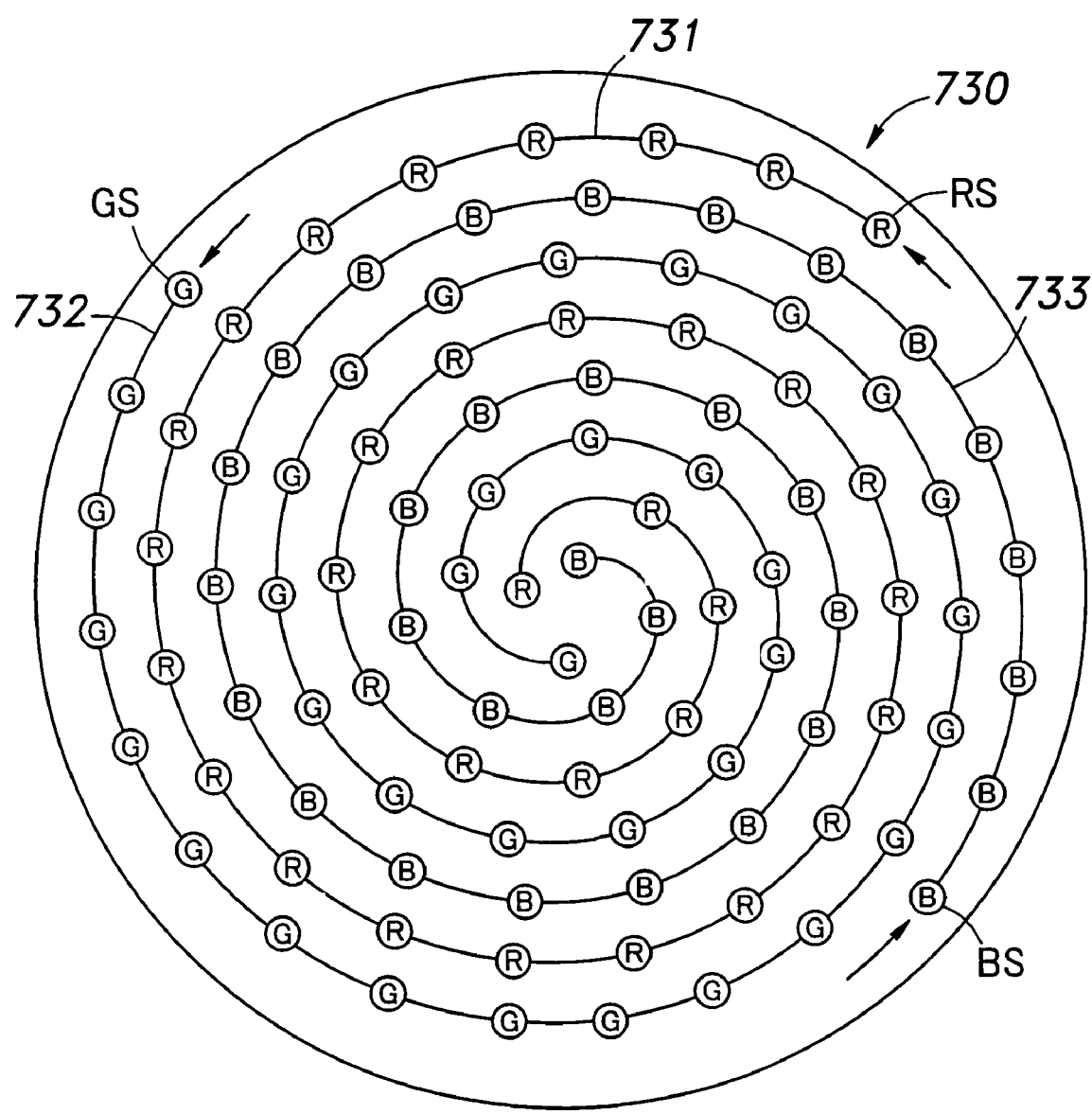
FIG. 76 is a schematic diagram showing a preferred arrangement of a plurality of light source assemblies used for forming a surface light emitting body.
Figure 77:
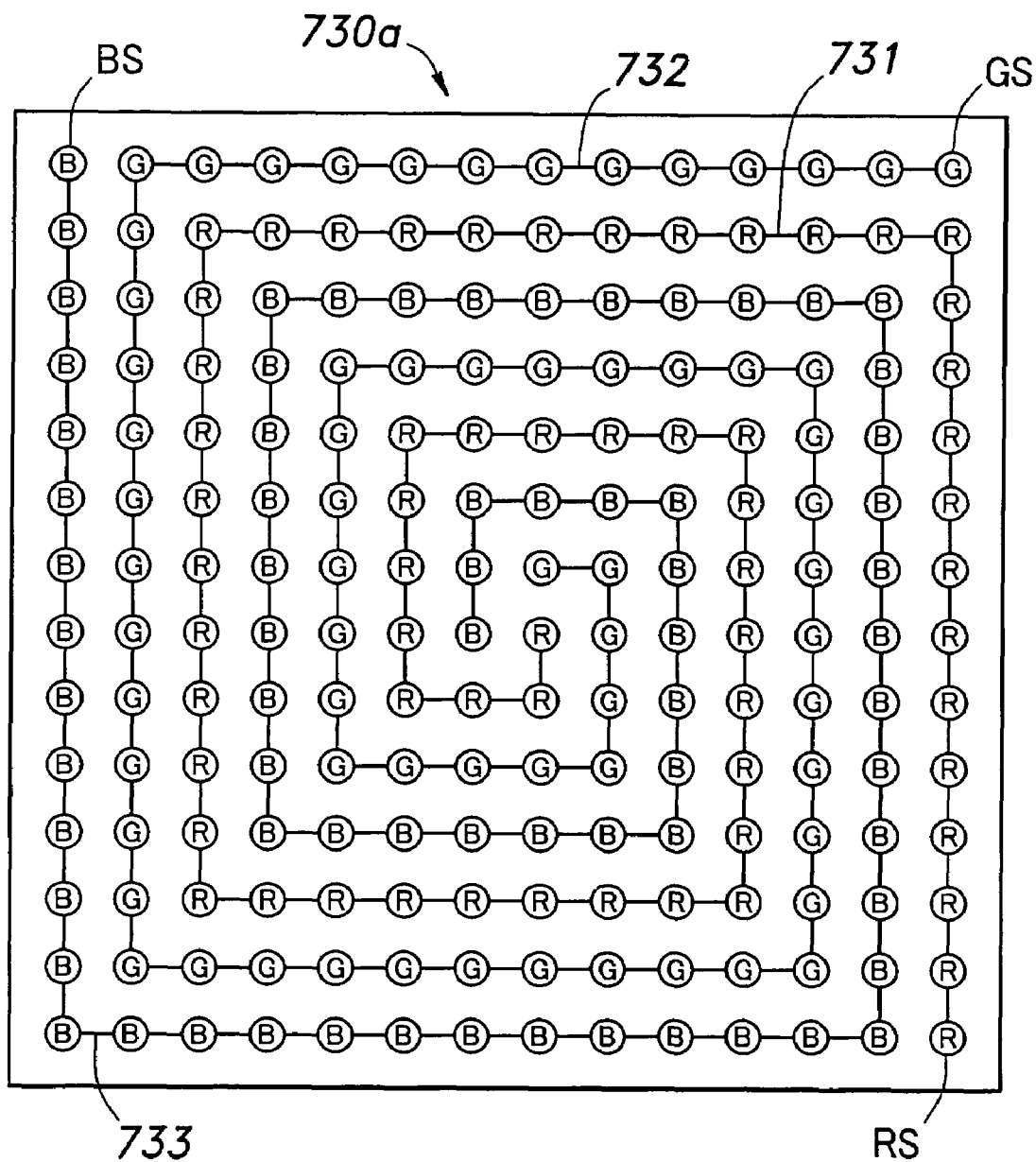
FIG. 77 is a schematic diagram showing another preferred arrangement of a plurality of light source assemblies used for forming a surface light emitting body.

FIG. 76 is a schematic view showing a preferred embodiment of a surface light emitting apparatus achieved by using a plurality of light source assemblies formed according to the present invention. In this embodiment, a red light source assembly 731 comprising a plurality of red LEDs (R), a green light source assembly 732 comprising a plurality of green LEDs (G), and a blue light source assembly 733 comprising a plurality of blue LEDs (B) are used to form a surface light emitting apparatus 730 having a circular light emitting surface. As shown in the drawing, the three light source assemblies 731, 732, 733 are arranged to form a spiral extending toward the center from their respective starting points RS, GS, BS which are circumferentially spaced substantially evenly from each other in a periphery of the light emitting surface. This can allow the light of each color to be emitted with the same brightness and in a substantially circular shape. FIG. 77 shows an embodiment of a square surface light emitting apparatus 730*a* formed in a similar manner. Thus, the shape of the surface light emitting apparatus formed can be arbitrarily selected. Further, although in the above embodiment one light source assembly is used for each color, it may be possible to use two light source assemblies for each color, for example, so that the light source assemblies are arranged to form spirals from total of six starting points. The number of colors used may not be limited to three, and may be two or more than three. Of course, it is also possible to use light sources of a same color in all of the light source assemblies.

Figure 78:
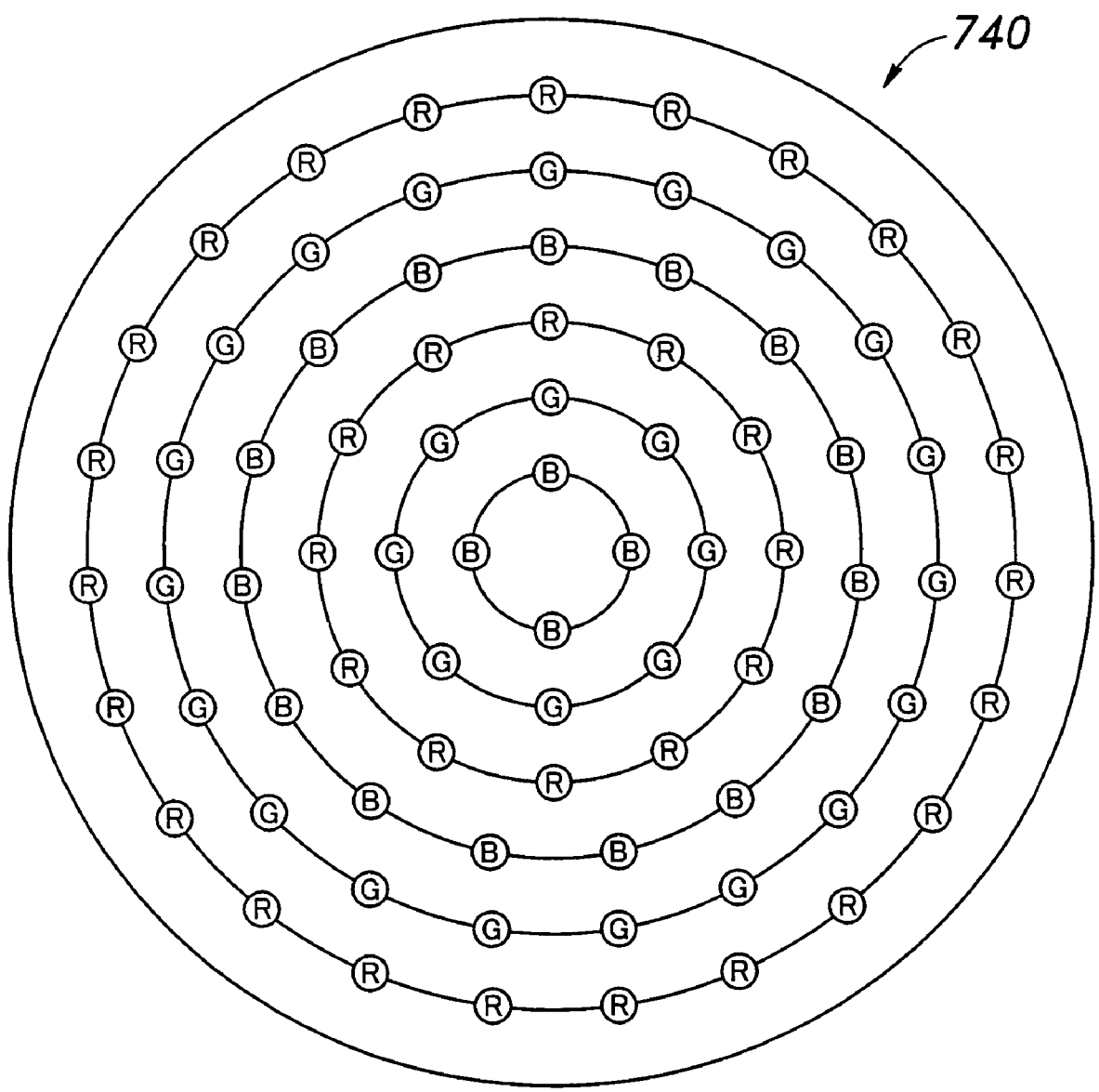
FIG. 78 is a schematic diagram showing yet another preferred arrangement of a plurality of light source assemblies used for forming a surface light emitting body.

FIG. 78 is a schematic view showing another embodiment of a surface light emitting apparatus using a plurality of light source assemblies formed in accordance with the present invention. As shown, in this surface light emitting apparatus 740, a plurality of red, blue, and green light source assemblies are arranged to form concentric circles. It will be understood that as in the above embodiment, such an arrangement also may not be limited to the circular shape.

Figure 79:
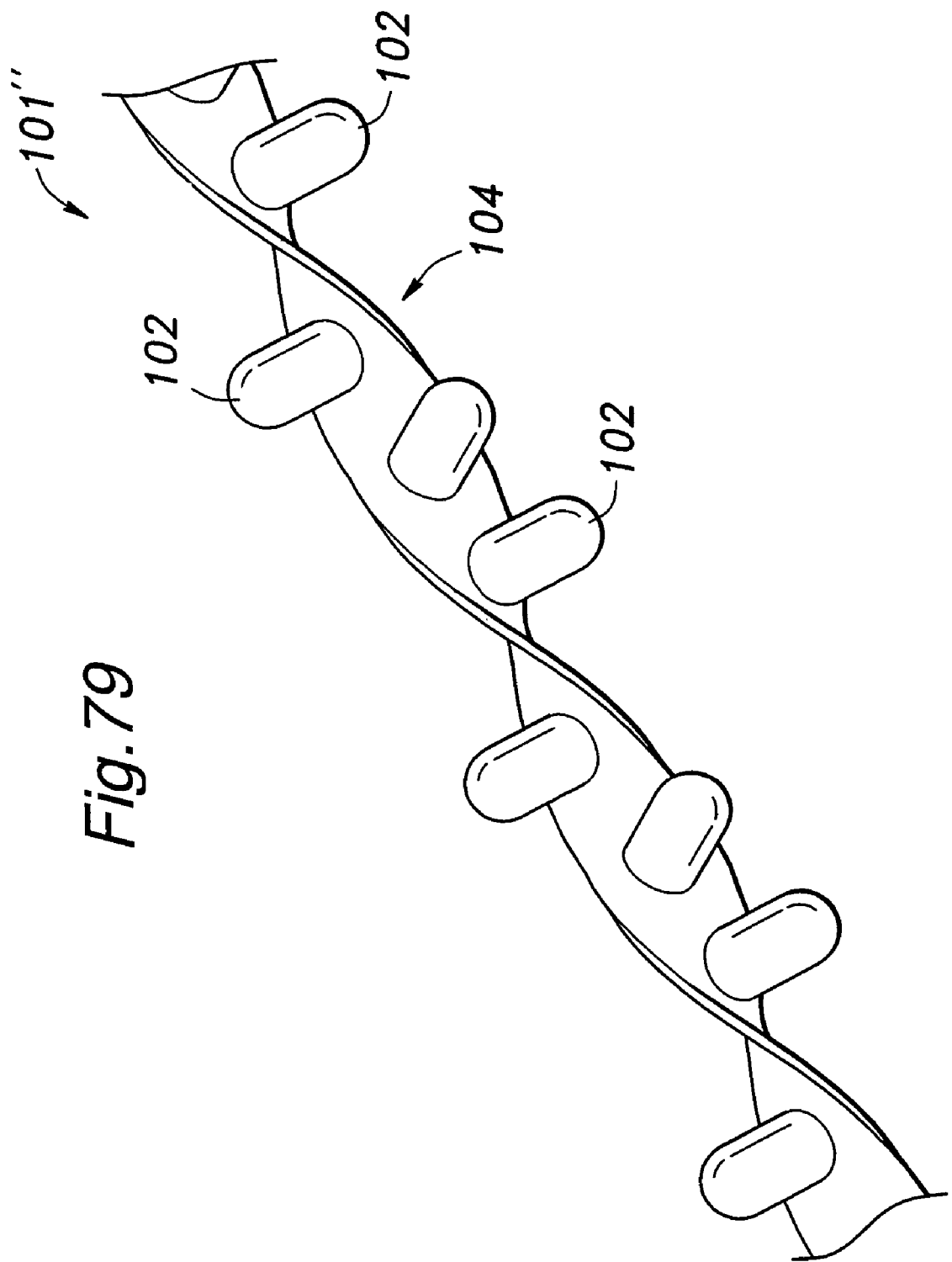
FIG. 79 is a schematic view showing an exemplary state of light source assembly in use.

FIG. 79 is a schematic view showing an example of use of a light source assembly (such as the light source assembly 101" shown in FIG. 36) according to the present invention. In this drawing, the details of the connective conductor structure 104 are not shown. Since the light source assemblies according to the present invention may assume flexibility, they can be twisted when in use as shown in the drawing. This can allow the light sources 102 to be arranged in a helix to thereby lighten the space around the light source assembly substantially evenly.

LEDs have considerably longer lifetime compared with incandescent lamps or the like, and therefore, have been recently used as light sources for automobile lamps such as stop lamps, tail lamp, or turn signal lamps, which require high reliability. When placed in corners of a vehicle body, for example, such an automobile lamp is required to have three dimensional configuration fitted to the overall design of the vehicle body, and the LEDs as light sources are accordingly required to be arranged in a three dimensional pattern.

Such an automobile lamp comprising LEDs arranged in a three dimensional pattern is disclosed in Japanese Patent Application Laid-Open No. 11-121807, for instance. The automobile lamp disclosed in this laid-open publication has a light emitting unit comprising plurality of LEDs, a base having a plurality of steps, and holders fitted in the plurality of steps and holding respective LEDs, and the light emitting unit is accommodated in a lamp chamber defined by a lens and a lamp body. Electric codes are sandwiched between the LEDs and holders to electrically connect the LEDs. Further, in order to strip off covers of the electric codes and expose core wires thereof when the LEDs are attached to the holders, the leads of each LED are formed with a slit having a width substantially corresponding to a diameter of the core wire. Also, each holder is formed with electric code insertion grooves for provisionally holding the electric codes before attachment of the LED thereto.

In such an automobile lamp, the light emitting unit, which is a primary element of the lamp, can be formed by first attaching the holders to the base, and then inserting the electrical codes into the insertion grooves of the holders, and thereafter fitting the LEDs in the holders to sandwich the electrical codes between the LEDs and holders. Alternatively, by exploiting the feature that the holders are separate from the base, it may be possible to first attach the electrical codes and LEDs to the holders to form a light source assembly, and then, attach the holders to the base to form the light emitting unit.

In such an automobile lamp, however, since the holders are separate from the base, the number of component parts is increased, which can lead to increase in the cost for managing the component parts as well as the manufacturing cost. If the holders are made unitary to the base, it will complicate the shape of the base, and can increase the cost of molding dies for forming such a base. Further, in either of the assembly processes described above, it is necessary to insert the electric codes into the insertion grooves of individual holders, and thus automation thereof is quite difficult. Also, the use of LEDs having leads of a special shape hinders use of LEDs available on market, which also can be a factor for increasing the manufacturing cost.

Figure 80:
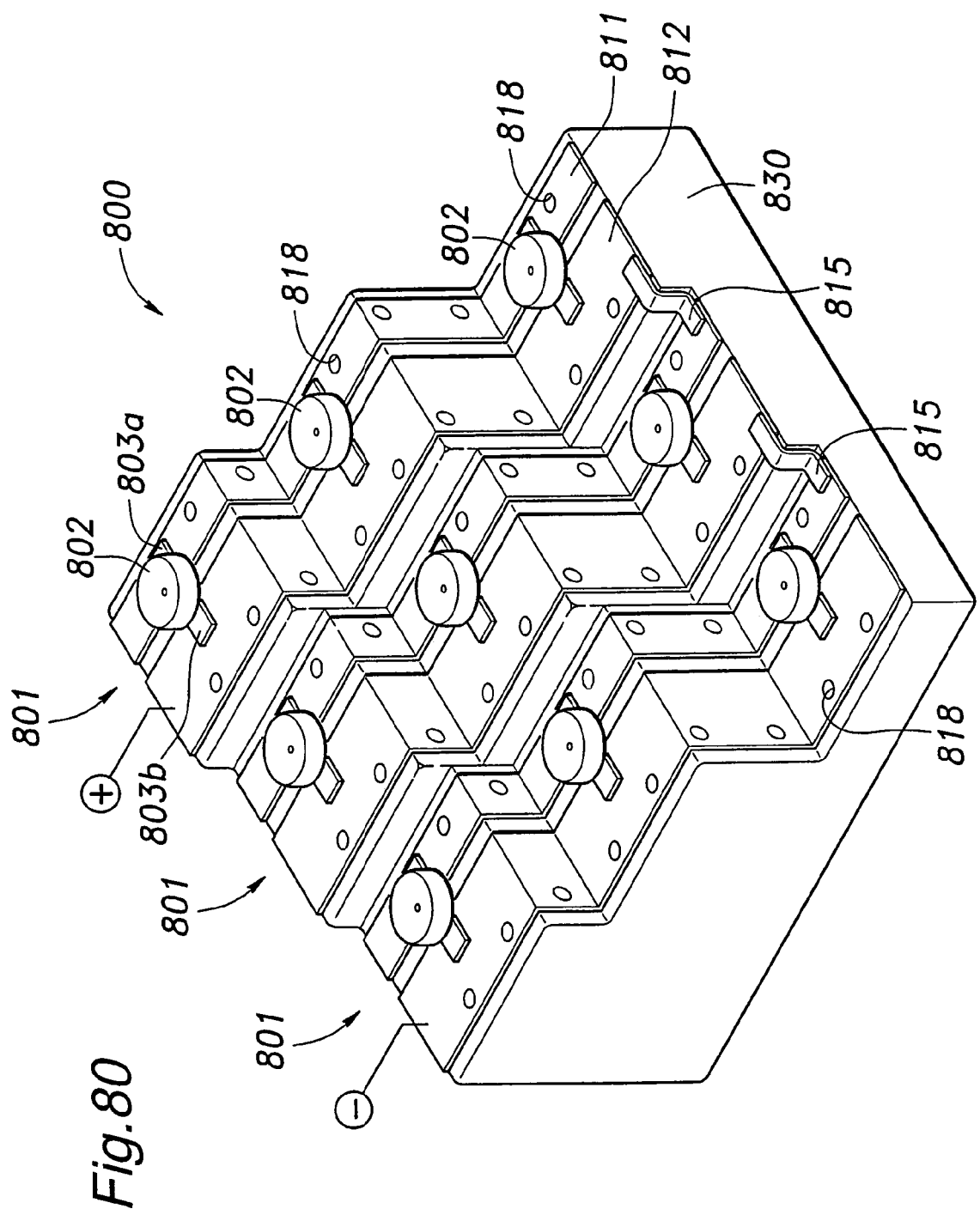
FIG. 80 is a perspective view showing an embodiment of a light emitting apparatus using a light source assembly according to the present invention and adapted for forming an automobile lamp.

FIG. 80 is a perspective view of an embodiment of a light emitting apparatus for use in automobiles using light source assemblies according to the present invention to solve the above problems. This light emitting apparatus 800 comprises a plurality (nine in this embodiment) of LEDs 802 as light sources, and a base (holder) 830 having a plurality of steps for arranging the LEDs 802 in a three dimensional pattern. Like the conventional embodiment, the light emitting apparatus 800 can be accommodated in a lamp chamber defined by a housing (not shown) constituting a part of the vehicle body and a lens (not shown) attached to the housing. In this embodiment, each LED 802 has a plate-shaped anode terminal 803*a* and cathode terminal 803*b*.

In this embodiment, three LEDs 802 are parallel connected to form a light source assembly 801, and three such light source assemblies 801 are connected in series by jumper members 815 to thereby form a so-called matrix circuit (or parallel-serial connection circuit). Though in this embodiment adjoining light source assemblies 801 are mutually connected at their end by the jumper member 815, it may be possible to use more than one jumper member 815 at a plurality of positions in order to decrease electric resistance, improve heat conductivity and so on, and the number of jumper members 815 can be arbitrarily determined. Also in this embodiment, the jumper member 815 consists of a plate-shaped conductor bent at appropriate portions, but it may consist of a covered conductive wire, etc.

FIG. 81 is a perspective view showing the light source assembly 801 before being bent to comply with the shape of the base 830, and FIG. 82 is an end view thereof. As shown, the light source assembly 801 comprises a connective conductor structure 804 for electrically connecting a plurality (three in this embodiment) of LEDs 802. The connective conductor structure 804 comprises a pair of conductors (trunk paths) 811, 812 extending in parallel in the longitudinal direction, and the anode terminal 803*a* and cathode terminal 803*b* of each LED 802 are welded to the associated trunk paths 811, 812 preferably by laser welding. In other words, in this embodiment, the pair of trunk paths 811, 812 include the light source attachment portions (or light source terminal connection parts).

In this embodiment, the trunk path 812 to which the cathode terminal 803*b* of each LED 802 is attached has a larger width than the trunk path 811 to which the anode terminal 803*a* is attached, and thus conducts heat more efficiently. Typically, in each LED 802, an LED chip (not shown) encapsulated in an LED package is directly attached on the plate-shaped cathode terminal 803*b* and connected to the anode terminal 803*a* via a lead wire or the like, and as a result, a large part of the heat generated from the LED chip is dissipated to outside through the cathode terminal 803*b*. Therefore, the larger width of the trunk path 812 to which the cathode terminal 803*b* is connected can achieve more efficient heat dissipation from the LEDs 802. The smaller width of the trunk path 811 to which the anode terminal 803*a* is connected and thus which makes little contribution to the heat dissipation can achieve a smaller width of the resulting light source assembly 801.

Figure 83:
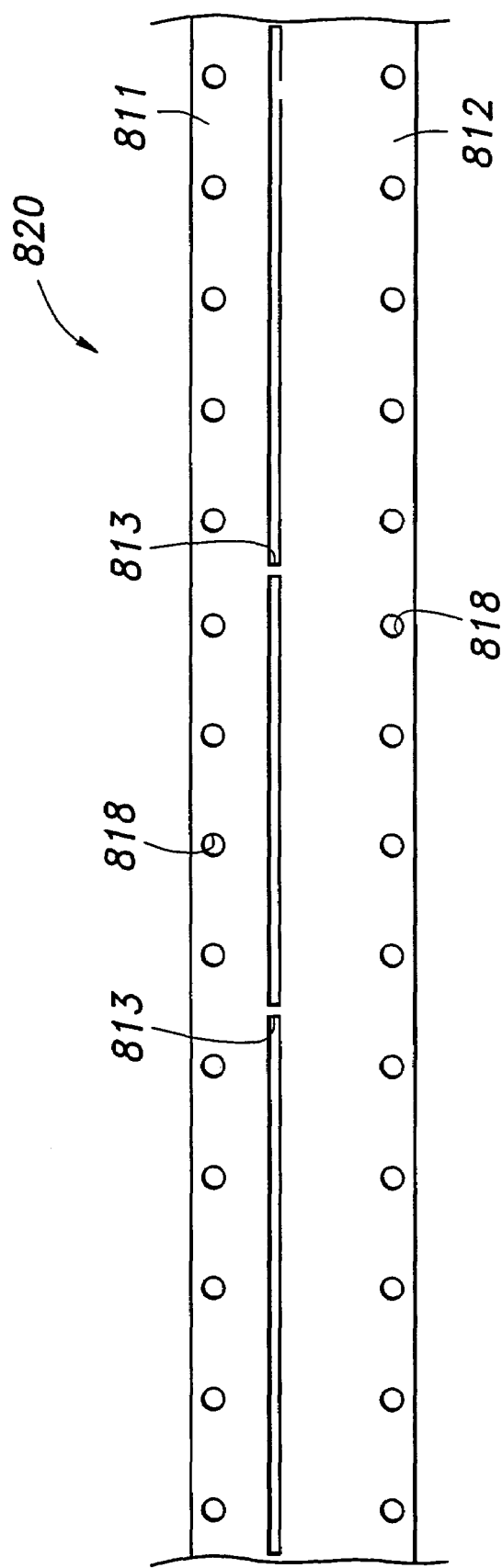
FIG. 83 is a partial plan view of an embodiment of a patterned conductor suitable for forming the light source assembly shown in FIG. 81.

In a similar manner as in the above embodiments, the light source assembly 801 can be formed by attaching the LEDs 802 at appropriate portions of a tape-shaped patterned conductor having a prescribed pattern, and thereafter cutting off parts of the patterned conductor as required to make a connective conductor structure 804 for parallel connecting the LEDs 802. FIG. 83 is a partial plan view of an embodiment of a patterned conductor suitable for forming the light source assembly comprising the parallel connected LEDs 802.

As shown, this patterned conductor 820 is of a flat tape shape, and comprises a pair of longitudinally extending conductors (trunk paths) 811, 812 and a plurality of branch paths widthwise connecting the trunk paths 811, 812. As described above, the trunk path 812 to which the cathode terminal 803*b* of the LED 802 is attached has a larger width than the trunk path 811 to which the anode terminal 803*a* is attached. Each trunk path 811, 812 is formed with a plurality of pilot holes 818 arranged in the longitudinal direction at a predetermined interval so that the holes 818 can be used in transportation/positioning of the patterned conductor in a progressive press machine (not shown).

The light source assembly 801 having an arbitrary number of LEDs 802 connected in parallel can be formed by attaching the LEDs 802 between the pair of trunk paths 811, 812 of the patterned conductor 820 by laser welding, for example, and cutting the branch paths 813 connecting the trunk paths 811, 812, followed by severing the patterned conductor 820 so as to be an appropriate length. Because the pair of trunk paths 811, 812 are mechanically joined by the branch paths before the attachment of LEDs 802, handling of the patterned conductor 820 is facilitated, and this can allow the processes such as attaching the LEDs 802 to the patterned conductor 820, cutting off of the branch paths 813, and severing of the trunk paths 811, 812 to be automated in a single manufacturing line comprising a progressive press machine and the like to improve production efficiency. Further, the LEDs 802 are attached to the patterned conductor 820 by laser welding or the like without using special holders, and this can reduce the number of component parts and the cost for managing the component parts.

By bending thus-formed light source assemblies 801 as shown in FIG. 81 at appropriate portions and attaching them to the base 830, the light emitting apparatus 800 for automobiles as shown in FIG. 80 can be obtained. The attachment of the light source assemblies 801 to the base 830 can be achieved by forming bosses (not shown) at prescribed portions of the base 830, and fitting the pilot holes 818 of the trunk paths 811, 812 of the light source assemblies 801 over the bosses, or by using adhesive.

Figure 84A:
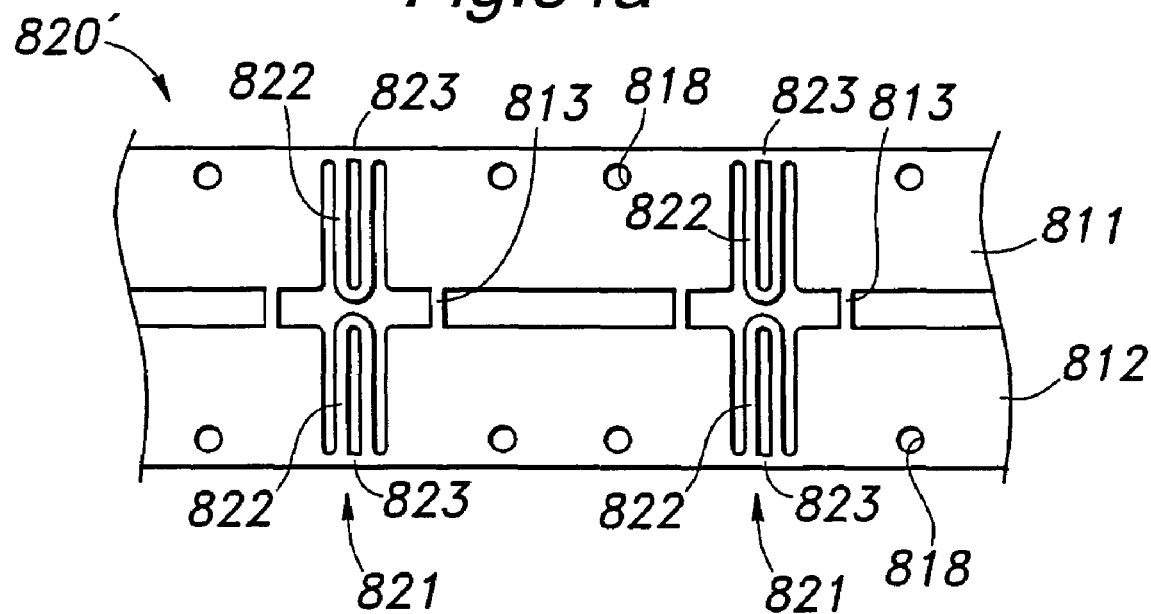
FIG. 84a is a partial plan view showing another embodiment of a patterned conductor for allowing adjustment of the position of LEDs.
Figure 84B:
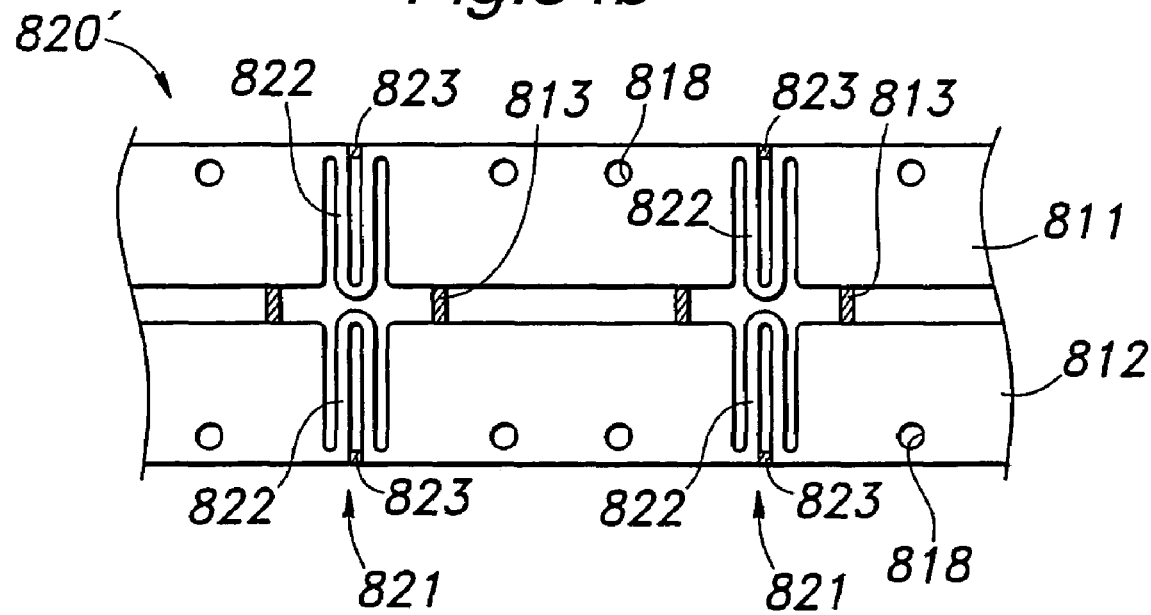
FIG. 84b is a view similar to FIG. 84a and illustrates the parts to be removed in a used state by hatching lines.

It is preferable that each LED 802 is placed at an appropriate position on the base 830 when the light source assembly 801 is attached to the base 830. However, if the processing accuracy in the bending of the light source assembly 801 is low, for example, the LEDs 802 may be displaced from the appropriate positions. In such a case, it will be desirable if the positions of the LEDs 802 can be adjusted to the appropriate positions. Further, though in the above embodiment the LEDs 802 in each light source assembly 803 are arranged in a line, there may be a case where it is desired that the direction of arrangement of the LEDs are offset or curved. FIG. 84*a* is a partial plan view showing another embodiment of a patterned conductor for allowing such adjustment of LED positions, and FIG. 84*b* is a view similar to FIG. 84*a* and shows the parts to be cut off in the useable state by hatching. In these drawings, parts similar to those of FIG. 83 are denoted with same reference numerals and detailed description thereof is omitted.

In the patterned conductor 820' shown in FIG. 84*a*, an expandable portion 821 is formed at a prescribed longitudinal position of each of the pair of trunk paths 811, 812 such that the expandable portions 821 functions to allow adjustment of LED positions. Preferably, the expandable portions 821 are formed between adjoining LED attachment positions. It should be noted that though the pair of trunk paths 811, 812 have a same width in FIG. 84*a*, they may have different widths as in the embodiment of FIG. 83.

In the embodiment of FIGS. 84*a* and 84*b*, each expandable portion 821 comprises a pair of substantially U-shaped narrow connection paths 822 formed in either trunk paths 811, 812 where a pair of opposing straight parts of each U-shaped connection path 822 extend substantially in a widthwise direction of the trunk paths 811, 812, and a curved bottom part of the same is disposed close to the center axis of the patterned conductor 820'. The expandable portion 821 further comprises longitudinally extending bridge portions 823 at either lateral edge portion of the trunk paths 811, 812 for connecting the ends of respective U-shaped connection paths 822 to usually prevent deformation of the expandable portion 821. In other words, the bridge portions 823 serve as a deformation prohibiting portion. When in use, deformation of desired expandable portions 821 is allowed by cutting off the bridge portions 823 as shown by hatching in FIG. 84*b*. Thus, by using the bridge portions 823, it is possible to selectively allow deformation of the expandable portions 821 to make the position of associated LEDs adjustable only at places where such adjustment is necessary, and thus prevent unnecessary decrease in the overall mechanical strength of the resulting light source assembly. Further, in a state before cutting off the bridge portions 822, the patterned conductor 820' or the light source assembly formed by using the same has a relatively high rigidity and thus the handling thereof is easy. Such extendable portions 821 and bridge portions 823 can be formed easily and at low cost by means of blanking in the press working process.

Figure 85A:
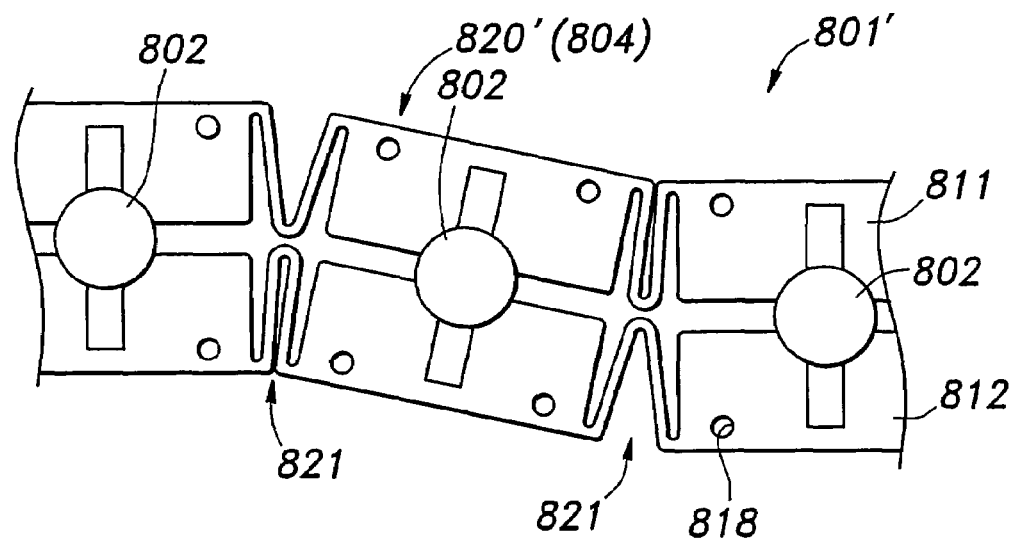
Figure 85B:
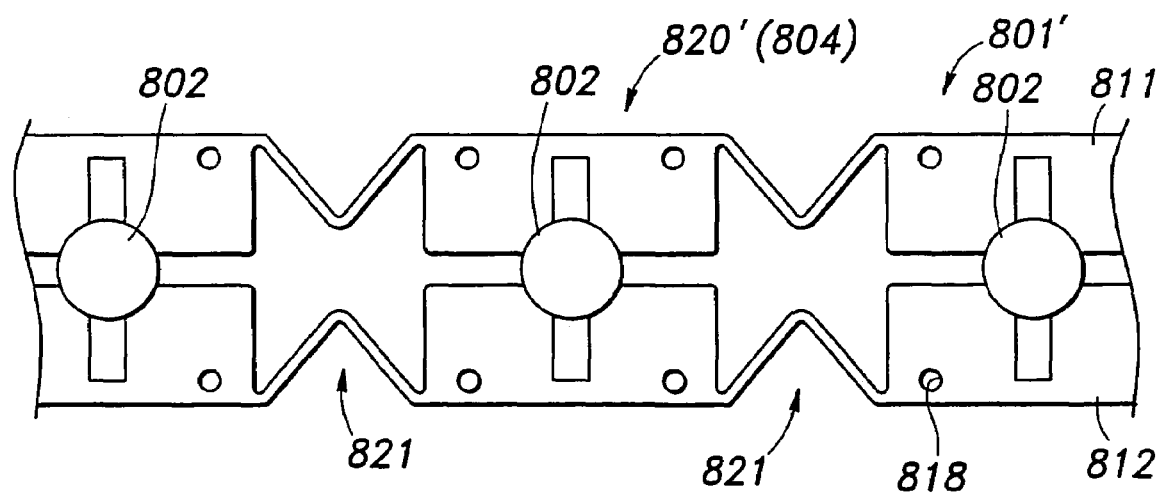

FIGS. 85*a* and 85*b* are partial plan view showing exemplary deformed states of a light source assembly 801' formed by using the patterned conductor 802' shown in FIG. 84*a*. In FIG. 85*a*, longitudinally adjoining two expandable portions 821 are deformed such that the direction of arrangement of the LEDs 802 (or a longitudinal axis of the light source assembly 801') is bent in a plane parallel to the principal surface of the patterned conductor 820' (or connective conductor structure 804), and as a result, the direction of arrangement of the LEDs 802 is displaced widthwise (or laterally) between the right end and left end of the drawing. In FIG. 85*b*, the expandable portions 821 are deformed to increase the distance between adjoining LEDs 802 in the longitudinal direction of the light source assembly 801'. Thus, in the light source assembly 801' using the patterned conductor 820' having the expandable portions 821, not only the positions of LEDs 802 can be adjustable to ensure that the LEDs 802 can be placed at appropriate positions on the base, but also various LED arrangements are possible, significantly improving the freedom of design of automobile lamps. Further, it may be possible to use a same light source assembly 801' for different bases if the difference is such a degree that can be absorbed by the deformation of the expandable portions 821 of the light source assembly 801'.

Figure 86A:
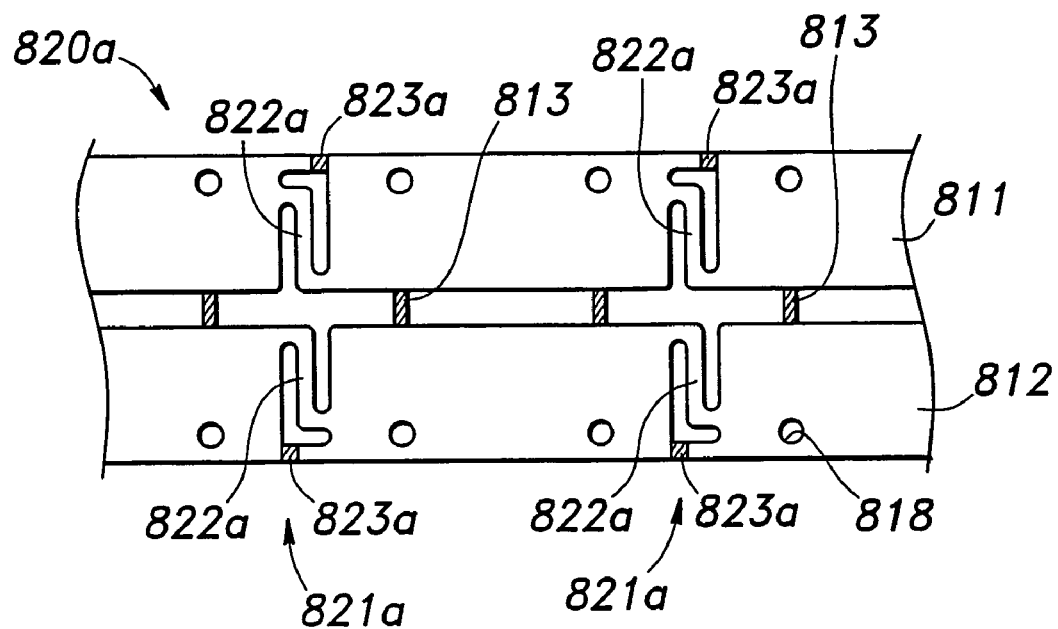
FIG. 86a is a partial plan view showing another embodiment of a patterned conductor having an extendable portion.
Figure 86B:
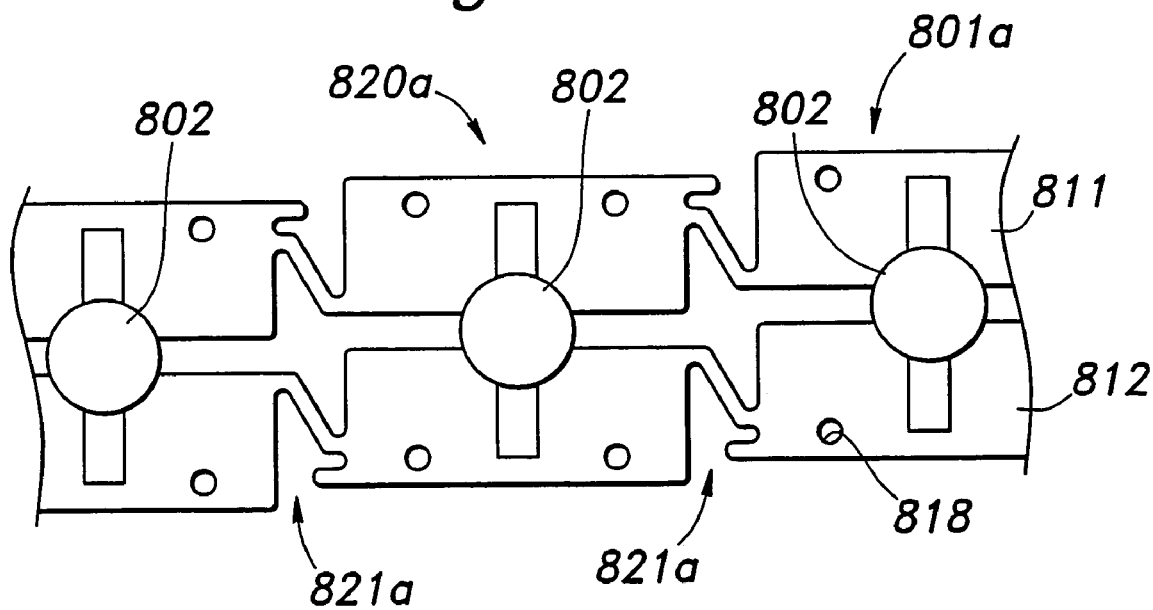
FIG. 86b is a partial plan view showing an example of a deformed state of a light source assembly using the patterned conductor.

FIG. 86*a* is a partial plan view showing yet another embodiment of a patterned conductor having an expandable portion, and FIG. 86*b* is a partial plan view showing an exemplary deformed state of a light source assembly using the patterned conductor. In these drawings, parts similar to those of FIGS. 84*a*-85*b* are denoted with same reference numerals and detailed description thereof is omitted. In FIG. 86*a*, parts to be cut off in the used state are indicated by hatching. As shown in FIG. 86*a*, in this patterned conductor 820*a*, each expandable portion 821*a* comprises a pair of substantially S-shaped narrow connection paths 822*a* extending in the widthwise direction of the corresponding trunk paths 811, 812. As in the above embodiment, in this patterned conductor 820*a* also, bridge portions 823*a* serving as a deformation prohibiting portion for selectively allowing deformation of the expandable portions 821*a* are provided at widthwise outer edge portions of respective trunk paths 811, 812 at positions corresponding to the expandable portions 821*a*. The expandable portions 821*a* and bridge portions (deformation prohibiting portions) 823*a* can be also preferably formed by blanking.

As shown in FIG. 86*b*, in a light source assembly 801*a* that uses the patterned conductor 820*a* shown in FIG. 86*a* also, deformation of the expandable portions 821*a* can allow adjustment of the LED positions laterally or longitudinally in a plane parallel to the principal surface (the surface to which the LEDs are mounted) of the patterned conductor 820a.

Figure 87A:
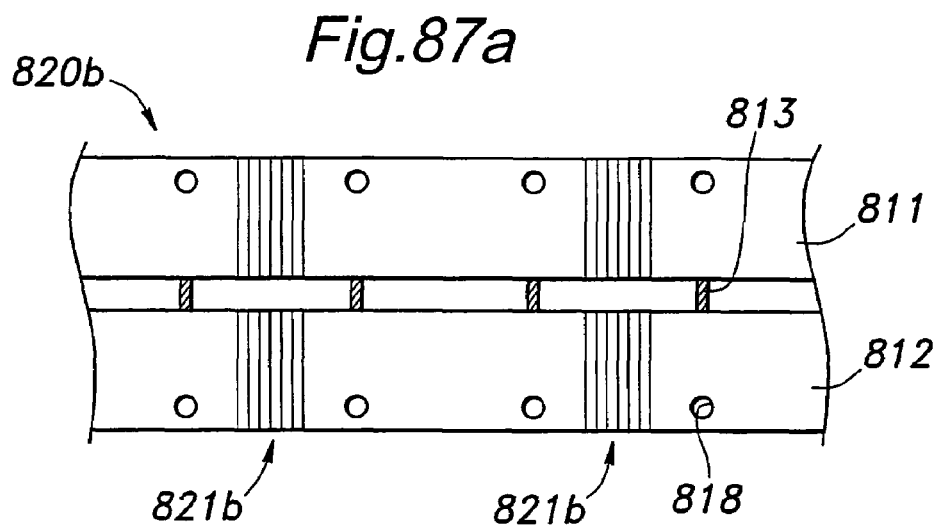
FIG. 87a is a partial plan view showing yet another embodiment of a patterned conductor having an extendable portion.
Figure 87B:
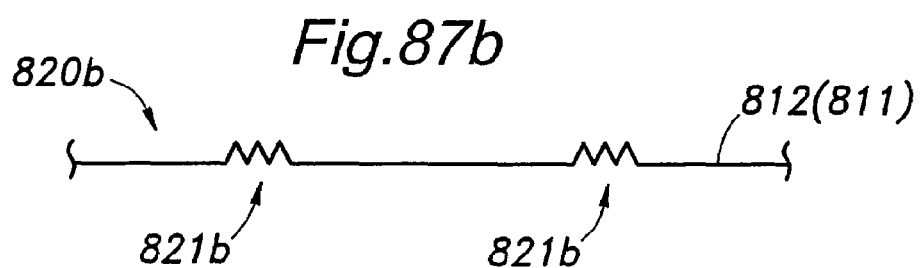
FIG. 87b is a front view of the patterned conductor shown in FIG. 87a, and FIG. 87c is a partial plan view showing an example of a deformed state of a light source assembly using the patterned conductor.
Figure 87C:
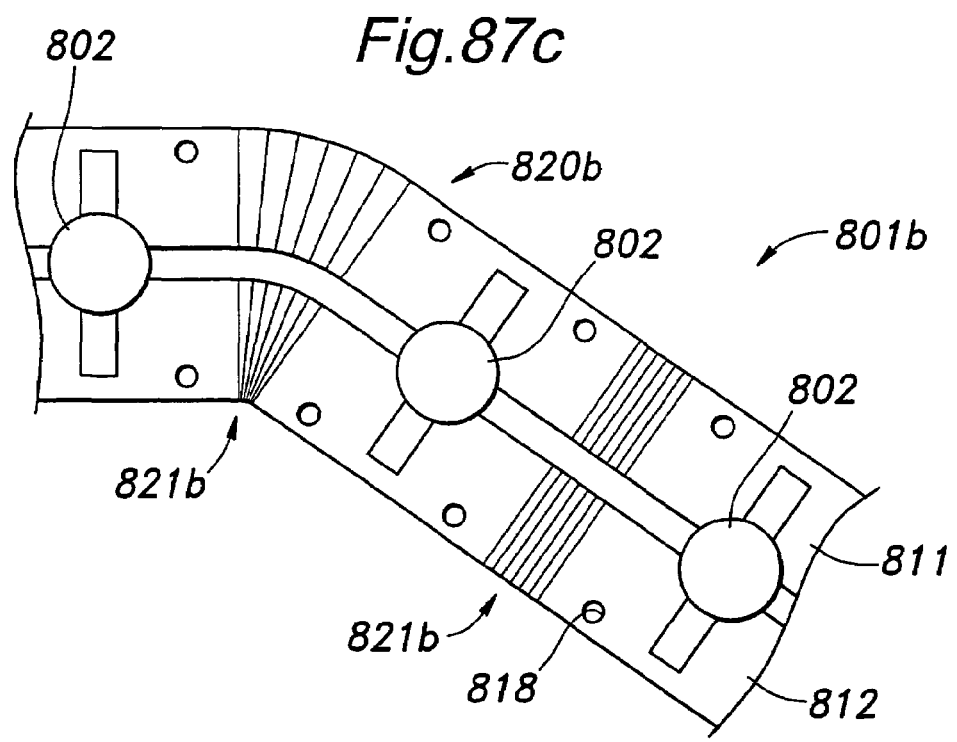

FIG. 87a is a partial plan view showing still another embodiment of a patterned conductor having an expandable portion, and FIG. 87b is a front view of the patterned conductor of FIG. 87a. Further, FIG. 87c is a partial plan view showing an exemplary deformed state of a light source assembly using the patterned conductor. In these drawings, parts similar to those shown in FIGS. 84a-85b are denoted with same reference numerals and detailed description thereof is omitted. As shown in the drawings, in this patterned conductor 820b, expandable portions 821b is of bellows-like or corrugated shape, and have a plurality of creases formed by folding the trunk paths 811, 812 along a plurality of bending lines extending in the widthwise direction of the patterned conductor 820b. Such expandable portions 821b can be easily formed by press working. In a light source assembly 801b that uses the patterned conductor 820b also, deformation of the expandable portions 821b can allow adjustment or alteration of the positions of LEDs 802 such as bending the direction of arrangement of the LEDs 802 in a plane parallel to the principal surface of the patterned conductor 820b as shown in FIG. 87c. Further, though not shown, it is also possible to deform the expandable portions to adjust the distance between adjoining LEDs 802.

Figure 88A:
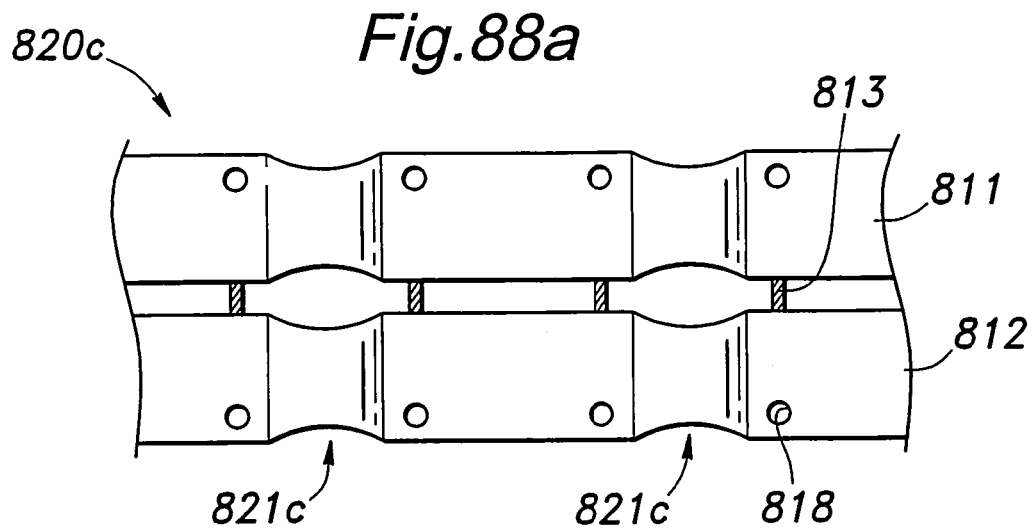
FIG. 88a is a partial plan view showing still another embodiment of a patterned conductor having an extendable portion.
Figure 88B:
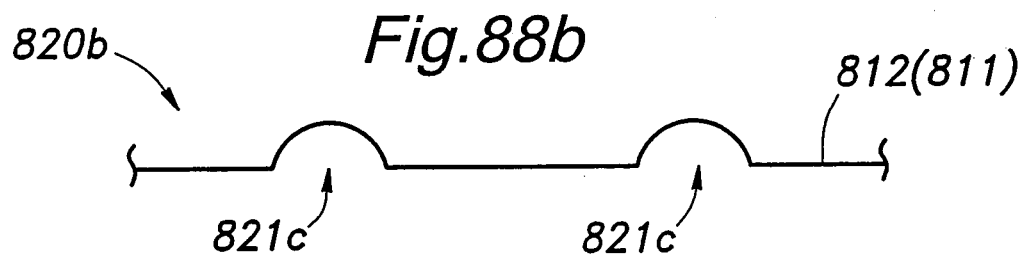
FIG. 88b is a front view of the patterned conductor shown in FIG. 88a, and FIG. 88c is a partial plan view showing an example of a deformed state of a light source assembly using the patterned conductor.
Figure 88C:
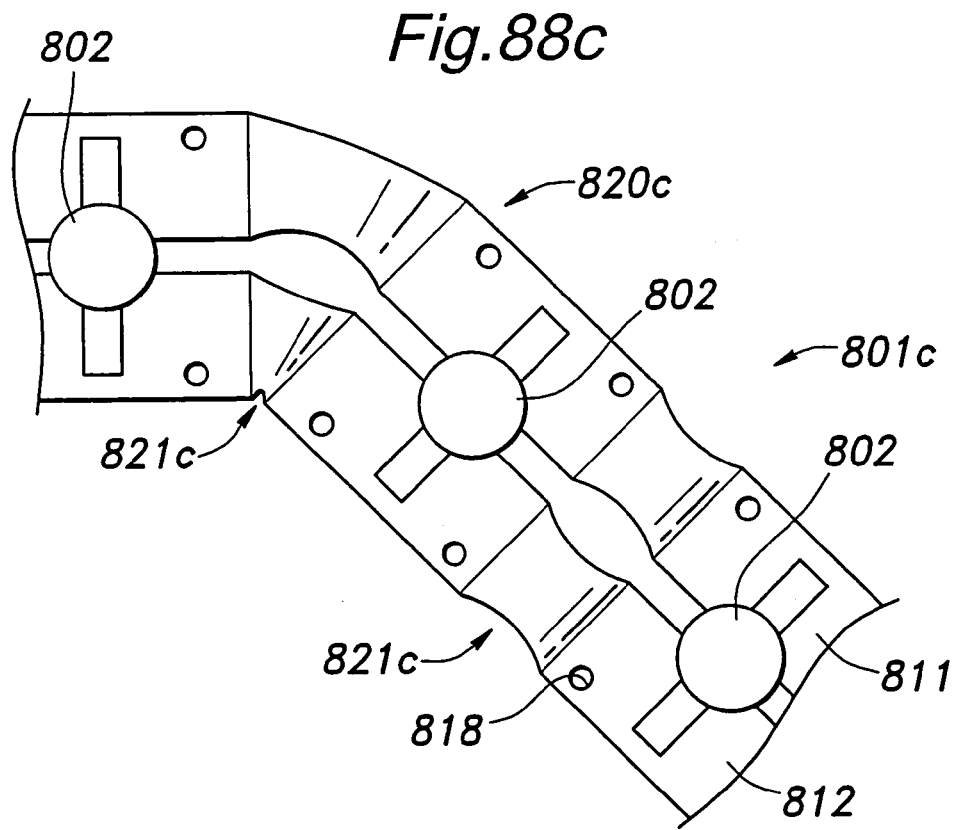

FIG. 88a is a partial plan view of yet another embodiment of a patterned conductor having an expandable portion, FIG. 88b is a front view of the patterned conductor of FIG. 88a, and FIG. 88c is a partial plan view showing an exemplary deformed state of a light source assembly using the patterned conductor. In these drawings, parts similar to those shown in FIGS. 84a-85b are denoted with same reference numerals and detailed description thereof is omitted. In this patterned conductor 820c, expandable portions 821c consist of curved portions raised in a direction of thickness of the patterned conductor 820c. Each curved portion 821c has a narrow longitudinally middle part so as to facilitate deformation. It can be said that this embodiment corresponds to a particular case of the embodiment shown in FIG. 87a-87c in which the number of creases is one. In a light source assembly 801c that uses the patterned conductor 820c also, deformation of the expandable portions 821c can allow adjustment or alteration of the positions of LEDs 802 such as bending the direction of arrangement of the LEDs 802 in a plane parallel to the principal surface of the patterned conductor as shown in FIG. 87c.

Figure 89A:
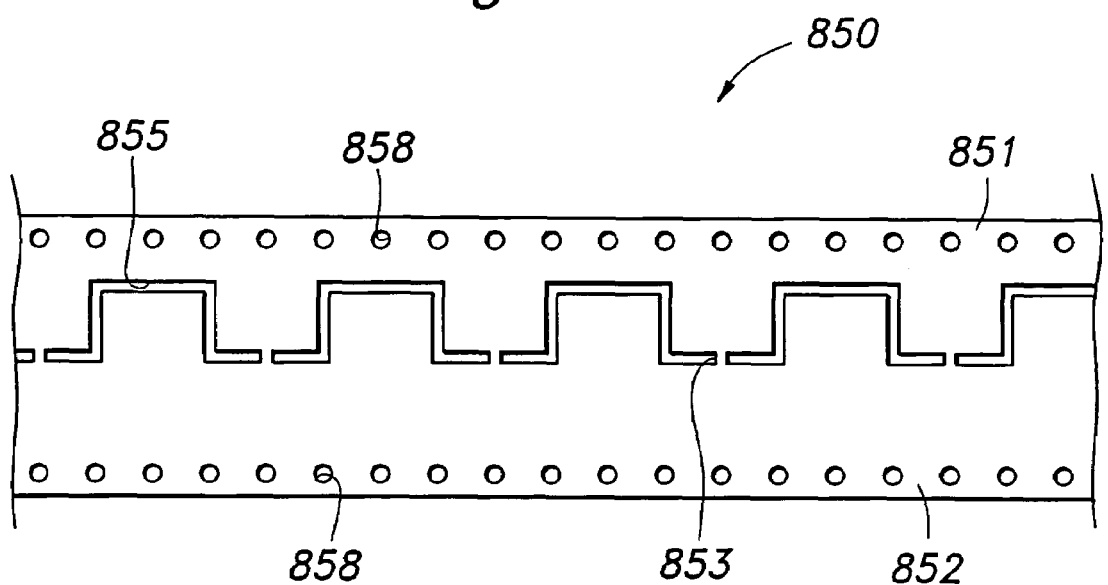
FIG. 89a is a partial plan view showing yet another embodiment of a patterned conductor.

FIG. 89a is a partial plan view showing another embodiment of a patterned conductor suitable for forming a light source assembly comprising a plurality of parallel-connected light sources according to the present invention. As shown, this patterned conductor 850 also has a substantially flat tape-like shape, and comprises a pair of longitudinally extending and mutually spaced apart conductors (trunk paths) 851, 852 and a plurality of branch paths 853 joining the trunk paths 851, 852. In this embodiment, it is intended that the upper trunk path 851 in the drawing is attached with an anode terminal of LEDs while the lower trunk path 852 is attached with a cathode terminal of LEDs. Thus, for the same reasons as described with respect to the embodiment of FIG. 81, the trunk path 852 has a larger area than the trunk path 851. Each trunk path 851, 852 is formed with a plurality of pilot holes 858 arranged in the longitudinal direction at a predetermined interval so that the holes 858 can be used in transportation/positioning of the patterned conductor in a progressive press machine (not shown).

In this patterned conductor 850, a gap 855 between the pair of trunk paths 851, 852 is not straight but is bent in a rectangular wave. In other words, mutually facing sides of the trunk paths 851, 852 are formed with protrusions and recesses alternating in the longitudinal direction such that the protrusions formed in one of the trunk paths 851, 852 are longitudinally aligned with the recesses formed in the other of the trunk paths 851, 852 whereby the former projects into the latter. Owing to such a structure, it is possible to displace the pair of trunk paths 851, 852 from one another to adjust the distance therebetween not only in the widthwise direction but also in the longitudinal direction. The above described patterned conductor 850 can be formed easily by press working a flat conductor.

Figure 89B:
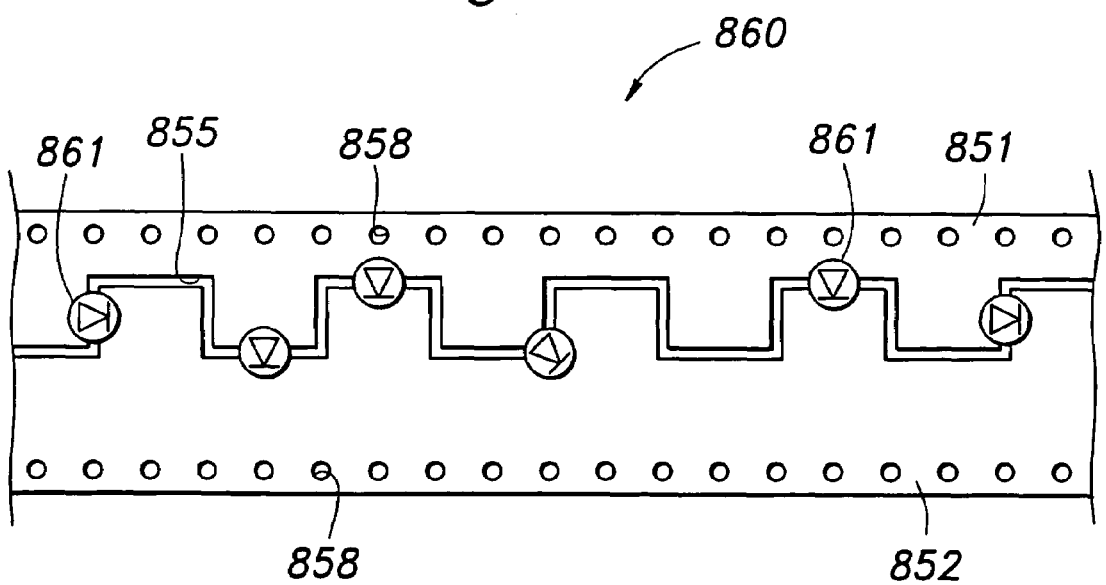

FIG. 89b is a plan view of a light source assembly formed by using the patterned conductor 850 of FIG. 89a. In this drawing, the LEDs are shown schematically to indicate the orientation thereof. This light source assembly 860 can be formed by attaching LEDs 861 to the patterned conductor 850 by laser welding, for example, and then adjusting the distance between the pair of trunk paths 851, 852 in the lateral and longitudinal directions as well as cutting off the branch paths 853. As shown, in this embodiment, the gap between the pair of trunk paths 851, 852 of the patterned conductor 850 is not straight, and has a part extending in the widthwise direction, and therefore, it is possible to significantly vary the positions of the LEDs 861 not only in the longitudinal direction but also in the lateral direction (widthwise direction). This allows light source assemblies 860 having various LED arrangement patterns to be formed by using the same patterned conductor 850. Thus, it is possible to cope with such a situation that the light source assemblies 860 are used in forming automobile lamps in which different LED arrangement patterns are demanded for different vehicles. This can lead to parts sharing and bring about significant economic benefits.

As described above, according to the present invention, various light source assemblies having different light source connection patterns can be formed in a same manufacturing line from a patterned conductor formed with a commonly usable prescribed circuit pattern, and therefore, it is possible to improve the production efficiency and significantly contribute to reducing the manufacturing cost. Further, because no printed circuit board is used and thus there is no solder used for connection with the printed circuit board, it is possible to eliminate concern about environmental problems as well as possibility that the LEDs may be damaged by heat generated along with the use of solder.

Although the present invention has been described in terms of preferred embodiments thereof, the embodiments are for illustrative purposes only and the present invention should not be limited by the embodiments. It is obvious to a person having ordinary skill in the art that various alterations and modifications are possible without departing from the scope of the present invention which is set forth in the appended claims. For instance, though in the embodiments of FIG. 16 and FIG. 29 the joint members 115, 116 are formed by insert molding, it may be possible to separately form upper and lower parts of the joint member, and in a state that the patterned conductor 120, 170 are interposed therebetween, bond the upper and lower parts by adhesive or the like to form the joint member. Also, though the LEDs are used as light sources in the embodiments, the present invention can be applied to other light sources (such as cap-less incandescent lamps).

The invention claimed is:

1. A light source assembly comprising:
a plurality of electrically connected light sources; and
a connective conductor structure extending in a direction of arrangement of the light sources to join the light sources, wherein the connective conductor structure is formed by cutting off parts of a substantially plate-like patterned conductor as required, the patterned conductor being provided with a prescribed pattern,
wherein each of the light sources has a pair of terminals;
wherein the patterned conductor is of a longitudinal tape-like shape, and comprises: a plurality of light source attachment portions arranged in a longitudinal direction for electrical connection with the light sources; an interconnection path for connecting the light source attachment portions in the longitudinal direction; a pair of trunk paths disposed on either side of the patterned conductor so as to interpose the interconnection patch and the light source attachment portions therebetween and extending in the longitudinal direction; and a plurality of branch paths widthwise connecting the trunk paths to the interconnection path;
each of the light source attachment portions has a pair of terminal connection parts corresponding to the pair of terminals of the light sources, and the interconnection patch comprises a plurality of connection paths each connecting the terminal connection parts contained in adjoining light source attachment portions such that each terminal connection part of each light source attachment portion is connected to one of the terminal connection part of an adjoining light source attachment portion by an associated connection path;
wherein the connective conductor structure is formed by cutting off a portion of the branch paths, interconnection patch or trunk patch of the patterned conductor to select one of series, parallel and series-parallel connections of the light sources.

2. A light source assembly according to claim 1, wherein a resistor is connected between at least one pair of adjoining light sources, and the interconnection path is cut at a position between the pair of adjoining light sources.

3. A light source assembly according to claim 1, further comprising a joint member extending in a widthwise direction of the connective conductor structure to hold the interconnection path and the trunk path in a unit.

4. A light source assembly according to claim 3, wherein the joint member is formed by insert molding.

5. A light source assembly according to claim 3, wherein the trunk path is formed with a widthwise recess or through-hole, and the joint member extends through the widthwise recess or through-hole.

6. A light source assembly according to claim 3, wherein the joint member is formed with a hole at a position aligned with the interconnection path such that the hole exposes the interconnection path, thereby allowing a part of the interconnection path exposed by the hole to be cut off.

7. A light source assembly according to claim 3, wherein the joint member comprises one or a plurality of insulating sheets.

8. A light source assembly according to claim 1, wherein the branch paths connecting the trunk path to the interconnection path are bent such that a principal surface of the trunk path is substantially perpendicular to a principal surface of the interconnection path.

9. A light source assembly according to claim 1, wherein the plurality of light sources comprise a chip-type LED, and the light source assembly comprises a socket for receiving the chip-type LED, the socket extending in a widthwise direction of the connective conductor structure to hold the interconnection path and the trunk path in a unit.

10. A light source assembly according to claim 1, wherein at least one of the light source attachment portions is not attached with a light source.

11. A light source assembly according to claim 1, wherein the pair of terminal connection parts of the light source attachment portions are arranged in the widthwise direction of the patterned conductor.

12. A light emitting apparatus comprising the light source assembly according to claim 1 and a holder for holding the light source assembly,
wherein the branch paths connecting the trunk paths to the interconnection path are bent such that a principal surface of each trunk path is substantially perpendicular to a principal surface of the interconnection path, and the trunk paths are inserted into corresponding holes or recesses provided to the holder to achieve attachment of the light source assembly to the holder.

13. A light emitting apparatus comprising the light source assembly according to claim 1, further comprising:
a light transmissive tubular member for accommodating the light source assembly therein; and
a pair of cap members attached to either end of the tubular member.

14. A light emitting apparatus according to claim 13, wherein a conductive pin for connection with an outside circuit is held in at least one of the pair of cap members, and the trunk path is connected to the conductive pin.

15. A light source assembly according to claim 1, wherein parts of the trunk path are cut off so that the connective conductor structure connects the light sources in series, and remaining parts of the trunk path are connected to the light source attachment portions via the branch paths.

16. A light source assembly according to claim 7, wherein the insulating sheet is attached to a light source attachment surface of the connective conductor structure.

17. A light emitting apparatus comprising the light source assembly according to claim 1 and a holder for holding the light source assembly,
wherein at least one surface of the holder is formed with a channel having opposing side walls in which longitudinally extending guide grooves are formed corresponding to the pair of trunk paths so that the light source assembly is attached to the holder by sliding the pair of the trunk paths into the guide grooves.

18. A light emitting apparatus comprising a plurality of light source assemblies according to claim 1,
wherein the plurality of light source assemblies are arranged in the widthwise direction, and adjoining light source assemblies are connected to each other so that the plurality of light source assemblies are connected in series.

19. A light source assembly according to claim 1,
wherein parts of the interconnection path and branch paths are cut off to form a plurality of light source parallel connections each comprising a plurality of light sources connected in parallel between the pair of trunk paths, and further, parts of the trunk paths are cut such that the light source parallel connections are connected in series.

20. A light source assembly according to claim 19, wherein each of the light sources consists of an LED,
wherein orientations of the LEDs contained in adjoining light source parallel connections are opposite to each other so that cathodes of the LEDs contained in an electrically upstream one of the adjoining light source parallel connections are connected to anodes of the LEDs contained in a downstream one via one of the pair of trunk paths, and wherein the pair of trunk paths are cut such that anodes of the LEDs contained in the upstream one of the adjoining parallel connections are separated from cathodes of the LEDs contained in the downstream one and that ends of each LED are not short-circuited.

21. A light source assembly according to claim 19, wherein each of the light sources consists of an LED, wherein portions of the pair of trunk paths are connected to each other via the branch paths and the light source attachment portions such that cathodes of the LEDs contained in an electrically upstream one of the adjoining light source parallel connections are connected to anodes of the LEDs contained in a downstream one, and wherein the pair of trunk paths are cut such that anodes of the LEDs contained in the upstream one of the adjoining parallel connections are separated from cathodes of the LEDs contained in the downstream one and that ends of each LED are not short-circuited.

\* \* \* \* \*